US008766706B2

(12) United States Patent
Lutz et al.

(10) Patent No.: US 8,766,706 B2
(45) Date of Patent: Jul. 1, 2014

(54) METHODS FOR TRAPPING CHARGE IN A MICROELECTROMECHANICAL SYSTEM AND MICROELECTROMECHANICAL SYSTEM EMPLOYING SAME

(71) Applicant: Robert Bosch GmbH, Stuttgart (DE)

(72) Inventors: Markus Lutz, Mountain View, CA (US); Aaron Patridge, Cupertino, CA (US); Brian H. Stark, San Francisco, CA (US)

(73) Assignee: Robert Bosch GmbH, Stuttgart (DE)

( * ) Notice: Subject to any disclaimer, the term of this patent is extended or adjusted under 35 U.S.C. 154(b) by 12 days.

(21) Appl. No.: 13/716,546

(22) Filed: Dec. 17, 2012

(65) Prior Publication Data

US 2013/0106497 A1 May 2, 2013

Related U.S. Application Data

(60) Division of application No. 12/908,506, filed on Oct. 20, 2010, now Pat. No. 8,343,790, which is a continuation of application No. 11/446,851, filed on Jun. 4, 2006, now Pat. No. 7,824,943.

(51) Int. Cl.
*H01H 85/04* (2006.01)

(52) U.S. Cl.
USPC .............................. 327/525; 438/51; 438/467

(58) Field of Classification Search
USPC .................................... 438/51, 467; 327/525
See application file for complete search history.

(56) References Cited

U.S. PATENT DOCUMENTS 2,933,650 A 4/1960 Tyrwhitt et al.
4,692,733 A 9/1987 Oakes
5,726,480 A 3/1998 Pister
6,122,964 A 9/2000 Mohaupt et al.
6,146,917 A 11/2000 Zhang et al.
6,240,782 B1 6/2001 Kato et al.
6,307,815 B1 10/2001 Polosky et al.

(Continued)

FOREIGN PATENT DOCUMENTS

WO WO 01/77008 10/2001
WO WO 01/77009 10/2001

OTHER PUBLICATIONS

Van Zant, P., "Microchip fabrication: a practical guide to semiconductor processing," 4th Ed. New York, McGraw-Hill, 2000, p. 549.

(Continued)

*Primary Examiner* — Charles Garber
*Assistant Examiner* — Stanetta Isaac
(74) *Attorney, Agent, or Firm* — Kenyon & Kenyon LLP

(57) ABSTRACT

Many inventions are disclosed. Some aspects are directed to MEMS, and/or methods for use with and/or for fabricating MEMS, that supply, store, and/or trap charge on a mechanical structure disposed in a chamber. Various structures may be disposed in the chamber and employed in supplying, storing and/or trapping charge on the mechanical structure. In some aspects, a breakable link, a thermionic electron source and/or a movable mechanical structure are employed. The breakable link may comprise a fuse. In one embodiment, the movable mechanical structure is driven to resonate. In some aspects, the electrical charge enables a transducer to convert vibrational energy to electrical energy, which may be used to power circuit(s), device(s) and/or other purpose(s). In some aspects, the electrical charge is employed in changing the resonant frequency of a mechanical structure and/or generating an electrostatic force, which may be repulsive.

26 Claims, 172 Drawing Sheets

(56) References Cited

U.S. PATENT DOCUMENTS

| | | | |
|---|---|---|---|
| 6,352,935 | B1 | 3/2002 | Collins et al. |
| 6,450,029 | B1 | 9/2002 | Sakai et al. |
| 6,477,901 | B1 | 11/2002 | Tadigadapa et al. |
| 6,500,348 | B2 | 12/2002 | Chase et al. |
| 6,501,107 | B1 | 12/2002 | Sinclair et al. |
| 6,507,082 | B2 | 1/2003 | Thomas |
| 6,509,623 | B2 | 1/2003 | Zhao |
| 6,577,040 | B2 | 6/2003 | Nguyen |
| 6,624,726 | B2 | 9/2003 | Niu et al. |
| 6,854,330 | B2 | 2/2005 | Potter |
| 6,897,110 | B1 | 5/2005 | He et al. |
| 6,916,679 | B2 | 7/2005 | Snyder et al. |
| 6,936,491 | B2 | 8/2005 | Partridge et al. |
| 6,936,902 | B2 | 8/2005 | Reichenbach et al. |
| 6,952,041 | B2 | 10/2005 | Lutz et al. |
| 7,177,505 | B2 | 2/2007 | Willcox |
| 7,242,141 | B2 | 7/2007 | Pschenitzka |
| 7,323,966 | B2 | 1/2008 | Yoshikawa |
| 7,400,489 | B2 | 7/2008 | Van Brocklin et al. |
| 7,425,472 | B2 | 9/2008 | Marr |
| 7,563,633 | B2 | 7/2009 | Ulm et al. |
| 8,088,638 | B1 | 1/2012 | Lagebrake et al. |
| 2001/0042887 | A1 | 11/2001 | Lee et al. |
| 2002/0111031 | A1 | 8/2002 | Chase et al. |
| 2003/0008420 | A1* | 1/2003 | Chang et al. .................... 438/4 |
| 2003/0089394 | A1 | 5/2003 | Chang-Chien et al. |
| 2003/0090346 | A1 | 5/2003 | Nikitin |
| 2003/0138986 | A1 | 7/2003 | Bruner |
| 2003/0160539 | A1 | 8/2003 | Ma et al. |
| 2003/0173864 | A1 | 9/2003 | Zalalutdinov et al. |
| 2004/0140497 | A1 | 7/2004 | Adams et al. |
| 2004/0165457 | A1 | 8/2004 | Park et al. |
| 2004/0183214 | A1 | 9/2004 | Partridge et al. |
| 2004/0245586 | A1 | 12/2004 | Partridge et al. |
| 2004/0248344 | A1 | 12/2004 | Partridge et al. |
| 2005/0095833 | A1 | 5/2005 | Lutz et al. |
| 2005/0124089 | A1 | 6/2005 | Gogoi et al. |
| 2005/0196099 | A1 | 9/2005 | Willcox |
| 2005/0221528 | A1 | 10/2005 | Bruner |
| 2006/0108652 | A1 | 5/2006 | Partridge et al. |
| 2007/0042521 | A1 | 2/2007 | Yama |
| 2007/0077675 | A1 | 4/2007 | Diem |
| 2007/0281379 | A1 | 12/2007 | Stark et al. |
| 2014/0002178 | A1* | 1/2014 | Teh et al. .................... 327/525 |

OTHER PUBLICATIONS

Kymissis et al., "Parasitic Power Harvesting in Shoes", Proceedings of the Second International Symposium on Wearable Computers, Oct. 1998, pp. 132-139.

* cited by examiner

METHODS FOR TRAPPING CHARGE IN A MICROELECTROMECHANICAL SYSTEM AND MICROELECTROMECHANICAL SYSTEM EMPLOYING SAME

CROSS-REFERENCE TO RELATED APPLICATION

This application is a divisional of, and claims priority under 35 U.S.C. §120 to, U.S. patent application Ser. No. 12/908,506, filed on Oct. 20, 2010, which is a continuation of, and claims priority under 35 U.S.C. §120 to, U.S. patent application Ser. No. 11/446,851, filed on Jun. 4, 2006, now U.S. Pat. No. 7,824,943, all of which are expressly incorporated by reference herein, in their entireties.

BACKGROUND INFORMATION

This invention relates to electromechanical systems and techniques for fabricating microelectromechanical and/or nanoelectromechanical systems; and more particularly, in one aspect, to fabricating or manufacturing microelectromechanical and/or nanoelectromechanical systems having a mechanical structure encapsulated using thin film or wafer bonding encapsulation techniques and electrical charge supplied to, stored on and/or trapped on one or more portions of the structure.

Microelectromechanical systems ("MEMS"), for example, gyroscopes, resonators and accelerometers, utilize micromachining techniques (i.e., lithographic and other precision fabrication techniques) to reduce mechanical components to a scale that is generally comparable to microelectronics. MEMS typically include a mechanical structure fabricated from or on, for example, a silicon substrate using micromachining techniques.

MEMS often operate through the movement of certain elements or electrodes, relative to fixed or stationary electrodes, of the mechanical structures. This movement tends to result in a change in gap distances between moving electrodes and stationary or fixed electrodes (for example, the gap between opposing electrodes). (See, for example, U.S. Pat. Nos. 6,240,782, 6,450,029, 6,500,348, 6,577,040, 6,624,726, and U.S. Patent Applications 2003/0089394, 2003/0160539, and 2003/0173864). For example, the MEMS may be based on the position of a deflectable or moveable electrode of a mechanical structure relative to a stationary electrode.

The mechanical structures are typically sealed in a chamber. The delicate mechanical structure may be sealed in, for example, a hermetically sealed metal container (for example, a TO-8 "can", see, for example, U.S. Pat. No. 6,307,815), bonded to a semiconductor or glass-like substrate having a chamber to house, accommodate or cover the mechanical structure (see, for example, U.S. Pat. Nos. 6,146,917; 6,352,935; 6,477,901; and 6,507,082), or encapsulated by a thin film using micromachining techniques during, for example, wafer level packaging of the mechanical structures. (See, for example, International Published Patent Applications Nos. WO 01/77008 A1 and WO 01/77009 A1).

In the context of the hermetically sealed metal container, the substrate on, or in which the mechanical structure resides may be disposed in and affixed to the metal container. The hermetically sealed metal container also serves as a primary package as well.

In the context of the semiconductor or glass-like substrate packaging technique, the substrate of the mechanical structure may be bonded to another substrate whereby the bonded substrates form a chamber within which the mechanical structure resides. In this way, the operating environment of the mechanical structure may be controlled and the structure itself protected from, for example, inadvertent contact. The two bonded substrates may or may not be the primary package for the MEMS as well.

Thin film wafer level packaging employs micromachining techniques to encapsulate the mechanical structure in a chamber using, for example, a conventional oxide ($SiO_2$) deposited or formed using conventional techniques (i.e., oxidation using low temperature techniques (LTO), tetraethoxysilane (TEOS) or the like). (See, for example, WO 01/77008 A1, FIGS. 2-4). When implementing this technique, the mechanical structure is encapsulated prior to packaging and/or integration with integrated circuitry.

MEMS have been proposed for a variety of miniaturized systems. For example, miniaturized systems have been proposed to provide distributed sensing capability. In some such systems, miniaturized sensors monitor conditions and transmit signals back to a host receiver. Such systems may prove useful in many applications including for example, automotive tires, homeland security industrial monitoring and weather prediction. However, such systems require electrical power in order to operate.

Current miniature battery technology provides enough energy to power many of such systems, at least for a period of time. It would be desirable, however, to have the ability to power such systems for a longer period of time without the need to replace the electrical power source.

In that regard, it has been proposed to power such systems utilizing energy from the environment (sometimes referred to as "energy scavenging" or "energy harvesting"). Some of the most common sources of such energy are vibrational energy, stress (pressure) energy and thermal energy. Of these, vibrational energy may be the most readily available.

To that effect, methods have been proposed to use MEMS to convert vibrational energy into electrical energy. One such method proposes to use a MEMS having a variable capacitor formed of movable semiconductor plates. Electrical charge is placed on the plates of the variable capacitor. Thereafter, when vibrational energy causes the plates to move apart, the variable capacitor produces electrical energy. The electrical energy can be stored and/or used to power one or more devices and/or systems.

One roadblock to implementing such a method has been a difficulty encountered in trying to retain the electrical charge on the plates of the capacitor. For example, contaminants within the chamber can result in leakage currents that quickly drain the electrical charge from the plates of the capacitor.

There is a need for, among other things, a MEMS and/or a technique for fabricating a MEMS that overcomes one, some or all of the shortcomings described above. There is a need for, among other things, a MEMS having a mechanical structure that is encapsulated using thin film encapsulation and/or wafer bonding techniques and that possesses an improved ability to store charge. There is a need for, among other things, a MEMS having a mechanical structure that is encapsulated using wafer level thin film and/or wafer bonding encapsulation techniques, and include one or more structures for use in storing charge within such MEMS.

SUMMARY OF THE INVENTION

There are many inventions described and illustrated herein. The present invention is neither limited to any single aspect nor embodiment, nor to any combinations and/or permutations of such aspects and/or embodiments. Moreover, each of the aspects and/or embodiments of the present invention may be employed alone or in combination with one or more of the other aspects of the present invention and/or embodiments. For the sake of brevity, many of those permutations and combinations will not be discussed separately herein.

In one aspect, the present invention includes a method for use in association with an electromechanical device having a substrate and an encapsulation structure, the encapsulation structure being disposed over at least a portion of the substrate and defining at least a portion of a chamber, the electromechanical device further having a micromechanical structure that includes a mechanical structure disposed in the chamber, where the method comprises supplying electrical charge to the mechanical structure of the micromechanical structure through an electrical connection disposed in the chamber; and electrically isolating the mechanical structure, wherein electrically isolating the mechanical structure includes breaking the electrical connection.

In one embodiment, the micromechanical structure comprises a micromachined mechanical structure. In another embodiment, the mechanical structure comprises a semiconductor material. In another embodiment, the semiconductor material is comprised of polycrystalline silicon, amorphous silicon, silicon carbide, silicon/germanium, germanium, or gallium arsenide. In another embodiment, electrically isolating the mechanical structure includes electrically isolating the mechanical structure such that at least a portion of the electrical charge is stored on the mechanical structure for a period of at least one day.

In another embodiment, electrically isolating the mechanical structure includes electrically isolating the mechanical structure such that at least a portion of the electrical charge will be stored on the mechanical structure for a period of at least one month.

In another embodiment, electrically isolating the mechanical structure includes electrically isolating the mechanical structure such that at least a portion of the electrical charge will be stored on the mechanical structure for a period of at least one year.

In another embodiment, electrically isolating the mechanical structure includes electrically isolating the mechanical structure such that at least a portion of the electrical charge will be stored on the mechanical structure for a period of at least ten years.

In another embodiment, supplying electrical charge to the mechanical structure through an electrical connection disposed in the chamber includes supplying electrical charge to the mechanical structure through an electrical connection between the mechanical structure and another mechanical structure disposed in the chamber.

In another embodiment, electrically isolating the mechanical structure includes irreversibly breaking the electrical connection. In another embodiment, supplying electrical charge to the mechanical structure through an electrical connection disposed in the chamber includes supplying electrical charge to the mechanical structure through a fuse disposed in the chamber.

In another embodiment, breaking the electrical connection includes blowing at least one portion of the fuse. In another embodiment, blowing at least one portion of the fuse includes melting at least one portion of the fuse.

In an embodiment, blowing at least one portion of the fuse includes supplying at least one portion of the fuse with electrical current to heat the at least one portion of the fuse. In another embodiment, blowing at least one portion of the fuse includes supplying at least one portion of the fuse with electrical current to cause the at least one portion of the fuse to dissipate energy and reach or exceed a temperature at which the at least one portion of the fuse blows.

In an embodiment, the micromechanical structure further includes a first electrode and a second electrode each disposed in the chamber, the fuse includes a first portion and a second portion, the first portion having a first end coupled to the first electrode and a second end coupled to the second electrode, the second portion having a first end coupled to the first portion of the fuse and a second end coupled to the mechanical structure, and blowing at least one portion of the fuse includes blowing at least one portion of the first portion of the fuse and blowing at least one portion of the second portion of the fuse.

In another embodiment, supplying electrical charge to the mechanical structure through an electrical connection disposed in the chamber includes supplying electrical charge to the mechanical structure through an electrical connection that includes at least one portion of at least one movable structure disposed in the chamber.

In another embodiment, supplying electrical charge to the mechanical structure through an electrical connection disposed in the chamber includes moving at least one portion of the at least one movable structure disposed in the chamber to provide electrical contact between a first contact surface and a second contact surface.

In another embodiment, moving at least one portion of the at least one movable structure disposed in the chamber to provide electrical contact between a first contact surface and a second contact surface includes controlling the at least one portion of the at least one movable structure to provide electrical contact between the first contact surface and the second contact surface.

In another embodiment, controlling the at least one portion of the at least one movable structure to provide electrical contact between the first contact surface and the second contact surface includes providing at least one electrical signal that causes at least one electrostatic force that causes the at least one portion of the at least one movable structure to move and provide electrical contact between the first contact surface and the second contact surface.

In another embodiment, controlling the at least one portion of the at least one movable structure to provide electrical contact between the first contact surface and the second contact surface includes controlling the at least one portion of the at least one movable structure to provide electrical contact between a contact surface of the at least one portion of the at least one movable structure and a contact surface of the mechanical structure.

In another embodiment, controlling the at least one portion of the at least one movable structure to provide electrical contact between the first contact surface and the second contact surface includes driving the at least one portion of the at least one movable structure into mechanical resonance.

In another embodiment, driving the at least one portion of the at least one movable structure into mechanical resonance includes providing at least one electrical signal that causes at least one electrostatic force that causes the at least one portion of the at least one movable structure to resonate at one or more frequencies.

In an embodiment, driving at least one portion of the at least one movable structure into mechanical resonance includes driving the at least one portion of the at least one movable structure into mechanical resonance, the first contact surface making electrical contact with the second contact surface during a portion of the mechanical resonance.

In an embodiment, driving at least one portion of the at least one movable structure into mechanical resonance includes driving the at least one portion of the at least one movable structure into mechanical resonance, the first contact surface not making electrical contact with the second contact surface during a portion of the mechanical resonance.

In another aspect, the present invention includes a method for use in association with an electromechanical device having a mechanical structure, where the method comprises: depositing a sacrificial layer over the mechanical structure; depositing a first encapsulation layer over the sacrificial layer; forming at least one vent through the first encapsulation layer to allow removal of at least a portion of the sacrificial layer; removing at least a portion of the sacrificial layer to form the chamber; depositing a second encapsulation layer over or in the vent to seal the chamber; supplying electrical charge to at least one portion of the mechanical structure through an electrical connection disposed in the chamber; and electrically isolating the at least one portion of the mechanical structure.

In one embodiment, the mechanical structure comprises a semiconductor material. In one embodiment, the first encapsulation layer comprises a semiconductor material. In another embodiment, the second encapsulation layer comprises a semiconductor material.

In another aspect, the present invention includes a method for use in association with an electromechanical device having a substrate and an encapsulation structure, the encapsulation structure being disposed over at least a portion of the substrate and defining at least a portion of a chamber, the electromechanical device further having a micromechanical structure that includes a mechanical structure disposed in the chamber, the method comprising: supplying electrical charge to the mechanical structure of the micromechanical structure through a breakable link disposed in the chamber; and irreversibly breaking at least a portion of the breakable link.

In one embodiment, the mechanical structure comprises a semiconductor material.

In another embodiment, supplying electrical charge to the mechanical structure through a breakable link includes supplying electrical charge to the mechanical structure through a fuse disposed in the chamber. In another embodiment, irreversibly breaking at least one portion of the breakable link includes blowing at least one portion of the fuse.

In another aspect, the present invention includes a method for use in association with an electromechanical device having a substrate and an encapsulation structure, the encapsulation structure being disposed over at least a portion of the substrate and defining at least a portion of a chamber, the electromechanical device further having a micromechanical structure that includes a mechanical structure disposed in the chamber, where the method includes: controlling at least one portion of at least one movable mechanical structure disposed in the chamber to provide an electrical connection; supplying electrical charge to the mechanical structure of the micromechanical structure through the electrical connection; and breaking the electrical connection.

In one embodiment, the mechanical structure comprises a semiconductor material.

In another embodiment, controlling at least one portion of at least one movable mechanical structure disposed in the chamber to provide an electrical connection includes controlling at least one portion of the at least one movable structure to provide electrical contact between a first contact surface and a second contact surface.

In another embodiment, controlling at least one portion of at least one movable mechanical structure disposed in the chamber to provide an electrical connection includes driving at least one portion of the at least one movable structure into mechanical resonance.

In another aspect, the present invention includes a method for use in association with an electromechanical device having a substrate and an encapsulation structure, the encapsulation structure being disposed over at least a portion of the substrate and defining at least a portion of a chamber, the electromechanical device further having a micromechanical structure that includes a mechanical structure disposed in the chamber, where the method includes supplying the mechanical structure of the micromechanical structure with electrical charge from a thermionic electron source disposed in the chamber.

In one embodiment, the mechanical structure comprises a semiconductor material.

In one embodiment, supplying the mechanical structure with electrical charge from a thermionic electron source includes electrically connecting the thermionic electron source to a power source disposed outside the chamber.

In another embodiment, supplying the mechanical structure with electrical charge from a thermionic electron source includes heating at least one portion of the thermionic electron source to a temperature at which electrons are emitted therefrom.

In another embodiment, supplying the mechanical structure with electrical charge from a thermionic electron source includes supplying the thermionic electron source with electrical current to heat at least one portion of the thermionic electron source to a temperature at which electrons are emitted from the surface thereof.

In another embodiment, supplying the mechanical structure with electrical charge from a thermionic electron source includes supplying the mechanical structure with electrical charge from thermionic electron source having a filament heated to a temperature at which electrons are emitted therefrom.

In another embodiment, the method further includes electrically isolating the mechanical structure.

In another embodiment, the method further includes storing at least a portion of the electrical charge on the mechanical structure for at least a first period of time.

In another embodiment, storing at least a portion of the electrical charge on the mechanical structure for at least a first period of time includes storing at least a portion of the electrical charge on the mechanical structure for a period of at least one day.

In another embodiment, storing at least a portion of the electrical charge on the mechanical structure for at least a first period of time includes storing at least a portion of the electrical charge on the mechanical structure for a period of at least one month.

In another embodiment, storing at least a portion of the electrical charge on the mechanical structure for at least a first period of time includes storing at least a portion of the electrical charge on the mechanical structure for a period of at least one year.

In another embodiment, storing at least a portion of the electrical charge on the mechanical structure for at least a first period of time includes storing at least a portion of the electrical charge on the at least one portion for a period of at least ten years.

In another aspect, the present invention includes a method for use in association with an electromechanical device having a mechanical structure, where the method includes depositing a sacrificial layer over the mechanical structure, depositing a first encapsulation layer over the sacrificial layer, forming at least one vent through the first encapsulation layer to allow removal of at least a portion of the sacrificial layer, removing at least a portion of the sacrificial layer to form the chamber, depositing a second encapsulation layer over or in the vent to seal the chamber, and supplying at least one portion of the mechanical structure with electrical charge from a thermionic electron source disposed in the chamber.

In another embodiment, the mechanical structure comprises a semiconductor material. In another embodiment, the first encapsulation layer comprises a semiconductor material. In another embodiment, the second encapsulation layer comprises a semiconductor material. In another aspect, the present invention includes an electromechanical device including a chamber; a micromechanical structure that includes a mechanical structure disposed in the chamber, and a thermionic electron source disposed in the chamber to supply electrical charge to the mechanical structure of the micromechanical structure. In one embodiment, the electromechanical device includes a substrate and an encapsulation structure disposed over at least a portion of the substrate and defining at least a portion of the chamber. In one embodiment, the mechanical structure comprises a semiconductor material.

In another embodiment, the semiconductor material is comprised of polycrystalline silicon, amorphous silicon, silicon carbide, silicon/germanium, germanium, or gallium arsenide.

In another embodiment, the thermionic electron source includes one or more portions arranged in a "U" shape. In another embodiment, the thermionic electron source is configured to receive an electrical current that results in heating of at least one portion of the thermionic electron source to a temperature at which electrons are emitted from the surface thereof. In another embodiment, the micromechanical structure further includes first and second electrodes disposed in the chamber, the thermionic electron source being electrically connected between the first electrode and the second electrode. In another embodiment, the first electrode is electrically connected to a power source disposed outside the chamber and the second electrode is electrically connected to a power source disposed outside the chamber.

In another embodiment, the micromechanical structure further includes a beam shaper disposed in the chamber, the beam shaper including a first electrode.

In another embodiment, the beam shaper further includes a second electrode spaced apart from the first electrode. In another embodiment, the encapsulation structure includes a first encapsulation layer having at least one vent and a second encapsulation layer deposited over or in the vent to thereby seal the chamber.

In another embodiment, the first encapsulation layer comprises a semiconductor material. In another embodiment, the second encapsulation layer comprises a semiconductor material.

In another aspect, the present invention includes an electromechanical device, where the electromechanical device includes a substrate, an encapsulation structure disposed over at least a portion of the substrate and defining at least a portion of a chamber, the encapsulation structure including a first encapsulation layer and a second encapsulation layer, the first encapsulation layer including at least one vent through the first encapsulation layer, the second encapsulation being deposited over or in the vent, a mechanical structure disposed in the chamber, a thermionic electron source disposed in the chamber to supply electrical charge to the mechanical structure.

In another aspect, the present invention includes an electromechanical device comprising a substrate; an encapsulation structure disposed over at least a portion of the substrate and defining at least a portion of a chamber; a micromechanical structure that includes a first mechanical structure disposed in the chamber and further includes one or more mechanical structures disposed in the chamber, the one or more mechanical structures having a first state in which the one or more micromechanical structures provides an electrical connection for conduction of electrical charge to the first mechanical structure, the one or more mechanical structures further having a second state in which the one or more mechanical structures do not provide the electrical connection for conduction of electrical charge to the first mechanical structure, the one or more mechanical structures being configured to receive power and to provide at least one of the first state and the second state in response at least thereto, and wherein with the one or more mechanical structures in the second state, the first mechanical structure is electrically isolated.

In one embodiment, the first mechanical structure comprises a semiconductor material. In another embodiment, the electrical connection includes a breakable link.

In another embodiment, the breakable link comprises a fuse. In another embodiment, with the one or more mechanical structures in the second state, at least one portion of the fuse is blown. In another embodiment, the fuse includes a conductive path having a meandering shape. In another embodiment, the fuse includes a conductive path having a serpentine shape. In another embodiment, the fuse includes at least one suspended portion. In another embodiment, the at least one suspended portion includes at least one end suspended from the at least one portion of the first mechanical structure.

In another embodiment, the one or more mechanical structures includes a second electrode, the fuse including a first portion electrically connected between the first electrode and the second electrode. In another embodiment, the first electrode is electrically connected to a power source disposed outside the chamber and the second electrode is electrically connected to a power source disposed outside the chamber. In another embodiment, with the one or more mechanical structures in the second state, the first portion of the fuse is blown. In another embodiment, with the one or more mechanical structures in the second state, at least one portion of the fuse is melted.

In another embodiment, the one or more mechanical structures includes a movable structure. In another embodiment, the one or more mechanical structures includes a first electrode and with the one or more mechanical structures in the first state, the movable structure electrically connects the first electrode to the at least one portion of the first mechanical structure.

In another embodiment, with the one or more mechanical structures in the second state, the movable structure is spaced apart from the first mechanical structure.

In another embodiment, the micromechanical structure includes a transducer that includes the first mechanical structure. In another embodiment, the micromechanical structure includes a capacitive transducer that includes the micromechanical structure.

In another embodiment, the resonator comprises a spring portion and a mass portion. In another embodiment, the encapsulation structure comprises a semiconductor material. In another embodiment, the encapsulation structure includes a first encapsulation layer having at least one vent and a second encapsulation layer deposited over or in the vent to thereby seal the chamber.

In another embodiment, the first encapsulation layer comprises a semiconductor material. In another embodiment, the second encapsulation layer comprises a semiconductor material. In another aspect, the present invention includes an electromechanical device, where the electromechanical device includes a substrate, an encapsulation structure disposed over at least a portion of the substrate and defining at least a portion of a chamber, the encapsulation structure including a first encapsulation layer and a second encapsulation layer, the first encapsulation layer including at least one vent through the first encapsulation layer, the second encapsulation being deposited over or in the vent, a first mechanical structure disposed in the chamber, one or more mechanical structures disposed in the chamber, the one or more mechanical structures having a first state in which the one or more mechanical structures provide an electrical connection for conduction of electrical charge to the first mechanical structure, the one or more mechanical structures further having a second state in which the one or more mechanical structures do not provide the electrical connection for conduction of electrical charge to the first mechanical structure, the one or more mechanical structures being configured to receive power and to provide at least one of the first state and the second state in response at least thereto, and wherein with the one or more mechanical structures in the second state, the first mechanical structure is electrically isolated.

In another aspect, the present invention includes an electromechanical device comprising a substrate; an encapsulation structure disposed over at least a portion of the substrate and defining at least a portion of a chamber; a micromechanical structure that includes a mechanical structure disposed in the chamber, and a breakable link disposed in the chamber, the breakable link having a first state in which the breakable link provides an electrically conductive path for conduction of electrical charge to the mechanical structure, the breakable link having a second state in which the breakable link does not provide the electrically conductive path to the mechanical structure, the breakable link being configured to receive power and to provide the second state in response at least thereto, and wherein with the breakable link in the second state, the mechanical structure is electrically isolated.

In another aspect, the present invention includes an electromechanical device, where the electromechanical device includes a substrate, an encapsulation structure disposed over at least a portion of the substrate and defining at least a portion of a chamber, the encapsulation structure including a first encapsulation layer and a second encapsulation layer, the first encapsulation layer including at least one vent through the first encapsulation layer, the second encapsulation being deposited over or in the vent, a mechanical structure disposed in the chamber, and a breakable link disposed in the chamber, the breakable link having a first state in which the breakable link provides an electrically conductive path for conduction of electrical charge to at least one portion of the mechanical structure, the breakable link having a second state in which the breakable link does not provide the electrically conductive path to the mechanical structure, the breakable link being configured to receive power and to provide the second state in response at least thereto, and wherein with the breakable link in the second state, the mechanical structure is electrically isolated.

In another aspect, the present invention includes an electromechanical device comprising a substrate; an encapsulation structure disposed over at least a portion of the substrate and defining at least a portion of a chamber; a micromechanical structure that includes a mechanical structure disposed in the chamber, and a movable mechanical structure disposed in the chamber, the movable structure having a first position in which the movable structure contacts the mechanical structure, the movable structure further having a second position in which the movable structure does not contact the mechanical structure, the movable structure being configured to receive an excitation and to move to at least one of the first position and the second position in response at least thereto, and wherein with the movable structure in the second position, the mechanical structure is electrically isolated.

In another aspect, the present invention includes an electromechanical device, where the electromechanical device includes a substrate, an encapsulation structure disposed over at least a portion of the substrate and defining at least a portion of a chamber, the encapsulation structure including a first encapsulation layer and a second encapsulation layer, the first encapsulation layer including at least one vent through the first encapsulation layer, the second encapsulation being deposited over or in the vent, a first mechanical structure disposed in the chamber, a movable mechanical structure disposed in the chamber, the movable mechanical structure having a first position in which the movable structure contacts the mechanical structure, the movable structure further having a second position in which the movable structure does not contact the first mechanical structure, the movable structure being configured to receive an excitation and to move to at least one of the first position and the second position in response at least thereto, and wherein with the movable structure in the second position, the first mechanical structure is electrically isolated.

In another aspect, the present invention includes an electromechanical device comprising a chamber, a mechanical structure disposed in the chamber; and means for conducting electrical charge to the mechanical structure and electrically isolating the mechanical structure.

In one embodiment, the micro mechanical structure comprises a semiconductor material.

In another aspect, the present invention includes an electromechanical device, where the electromechanical device includes a substrate, an encapsulation structure disposed over at least a portion of the substrate and defining at least a portion of a chamber, the encapsulation structure including a first encapsulation layer and a second encapsulation layer, the first encapsulation layer including at least one vent through the first encapsulation layer, the second encapsulation being deposited over or in the vent, a mechanical structure disposed in the chamber, and means, disposed in the chamber, for conducting electrical charge to at least one portion of mechanical structure and electrically isolating the at least one portion of the mechanical structure.

In another aspect, a system, device, circuit and/or method employs one or more of the electromechanical devices and/or one or more of the methods set forth above and/or hereinafter.

Again, there are many inventions described and illustrated herein. This Summary of the Invention is not exhaustive of the scope of the present inventions. Moreover, this Summary of the Invention is not intended to be limiting of the invention and should not be interpreted in that manner. Thus, while certain aspects and embodiments have been described and/or outlined in this Summary of the Invention, it should be understood that the present invention is not limited to such aspects, embodiments, description and/or outline. Indeed, many others aspects and embodiments, which may be different from and/or similar to, the aspects and embodiments presented in this Summary, will be apparent from the description, illustrations and/or claims, which follow.

In addition, although various features, attributes and advantages have been described in this Summary of the Invention and/or are apparent in light thereof, it should be understood that such features, attributes and advantages are not required, and except where stated otherwise, need not be present in the aspects and/or the embodiments of the present invention. Moreover, various objects, features and/or advantages of one or more aspects and/or embodiments of the present invention will become more apparent from the following detailed description and the accompanying drawings. It should be understood however, that any such objects, features, and/or advantages are not required, and except where stated otherwise, need not be present in the aspects and/or embodiments of the inventions.

It should be understood that the various aspects and embodiments of the present invention that are described in this Summary of the Invention and do not appear in the claims that follow are preserved for presentation in one or more divisional/continuation patent applications. It should also be understood that all aspects and/or embodiments of the present invention that are not described in this Summary of the Invention and do not appear in the claims that follow are also preserved for presentation in one or more divisional/continuation patent applications.

BRIEF DESCRIPTION OF THE DRAWINGS

In the course of the detailed description to follow, reference will be made to the attached drawings. These drawings show different aspects of the present invention and, where appropriate, reference numerals illustrating like structures, components, materials and/or elements in different figures are labeled similarly. It is understood that various combinations of the structures, components, materials and/or elements, other than those specifically shown, are contemplated and are within the scope of the present invention.

DETAILED DESCRIPTION

Figure 1:
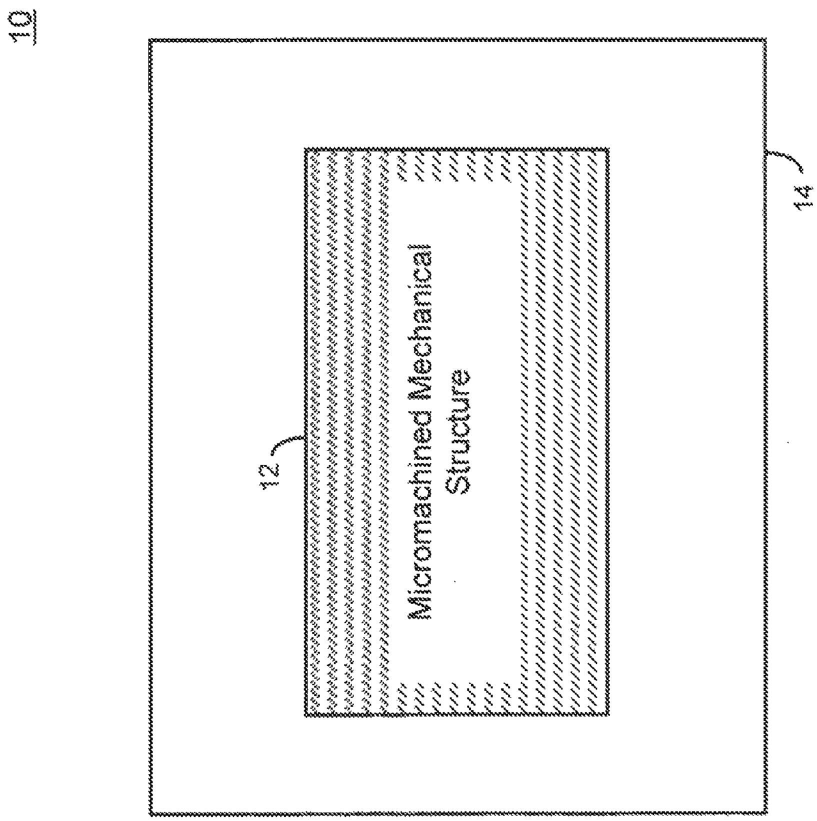
FIG. 1 illustrates a plan view of a portion of a microelectromechanical structure (MEMS)

There are many inventions described and illustrated herein. In one aspect, the present invention is directed to a thin film or wafer encapsulated MEMS, and a technique of fabricating or manufacturing a thin film or wafer encapsulated MEMS that supplies, stores and/or traps electrical charge on one or more (i.e., one, some or all) portions of the MEMS. In some embodiments, after encapsulation of MEMS, electrical charge is supplied to, stored on and/or trapped on, a portion of a micromachined mechanical structure disposed in a chamber. In some embodiments, the micromachined mechanical structure includes a capacitive transducer and the electrical charge is supplied to, stored on and/or trapped on a portion thereof, thereby enabling the capacitive transducer to convert vibrational energy to electrical energy. The electrical energy may be used to power one or more circuits and/or devices and/or for other purpose(s).

Some embodiments have the ability to store at least a portion of the electrical charge for at least ten years. In one such embodiment, a capacitive transducer on which the electrical charge is supplied, stored and/or trapped, will have the ability to generate electrical energy for at least ten years. To that effect, the environment and the surfaces within the chamber are sufficiently free of contaminants to prevent leakage currents that would otherwise lead to excessive drain of the electrical charge stored on and/or trapped on the portion of the micromachined mechanical structure. Notably, structures outside the chamber may have more contamination and/or greater potential for leakage current and/or drain than structures inside the chamber. Thus, some embodiments have the ability to provide electrical isolation to conductive structures inside and/or outside the chamber.

Some embodiments may not need to store a portion of the electrical charge for at least ten years. For example, in some applications, it is sufficient to store a portion of the electrical charge for at one year, one month, or one day. Thus, some embodiments have the ability store at least a portion of the electrical charge for at least one year, at least one month and/or at least one day. Notably, some of such embodiments may be able to operate with more contamination, less electrical isolation, more leakage and/or more drain of electrical charge than embodiments that that require the ability to store a portion of the electrical charge for at least ten years.

In some embodiments, one or more methods and/or structures may be employed to supply, store and/or trap the electrical charge a portion of a micromachined mechanical structure. In one embodiment, a breakable link is employed to supply and trap the electrical charge. In one such embodiment, the breakable link comprises a fuse. In another embodiment, a thermionic electron source is employed to supply and trap the electrical charge. In another embodiment, a movable mechanical structure is employed to supply and trap the electrical charge. In one such embodiment, the movable structure comprises a resonator, e.g., a resonant mode cantilever.

In some embodiments, electrical charge is supplied, stored and/or trapped on a mechanical structure to change the resonant frequency of the mechanical structure. In some embodiments, stored electrical charge is employed in generating an electrostatic force. In some embodiments, the electrostatic force comprises a repulsive force. In some embodiments, the electrostatic force is employed to change the resonant frequency of a mechanical structure.

With reference to FIG. 1, in one exemplary embodiment, a MEMS 10 includes a micromachined mechanical structure 12 disposed on substrate 14, for example, an undoped semiconductor-like material, a glass-like material, or an insulator-like material.

The micromachined mechanical structure 12 may be any type of micromachined mechanical structure including, for example, but not limited to an energy harvesting device (e.g., a vibrational energy to electrical energy converter), an accelerometer, a gyroscope or other type of transducer (for example, microphone, vibration sensor, pressure sensor, strain sensor, tactile sensor, magnetic sensor and/or temperature sensor), a resonator, a resonant filter, and/or any combination thereof.

In some embodiments, micromachined mechanical structure 12 is a micromachined mechanical structure that includes a capacitive transducer, which may be any type of capacitive transducer, for example, an energy harvesting device (e.g., a vibrational energy to electrical energy converter), a sensor (e.g., an accelerometer, a gyroscope, a microphone, a vibration sensor, a pressure sensor, a strain sensor, a tactile sensor, a magnetic sensor and/or a temperature sensor), a resonator, a resonant filter, and/or a combination thereof.

The micromachined mechanical structure 12 may also include mechanical structures of a plurality of energy harvesting devices (e.g., vibrational energy to electrical energy converters), transducers and/or sensors (including, for example, one or more accelerometers, gyroscopes, vibration sensors, pressure sensors, microphones, tactile sensors and/or temperature sensors), resonators, resonant filters and/or any combination thereof. Where the micromachined mechanical structure 12 is an accelerometer, the micromachined mechanical structure may include comb-like finger electrode arrays that comprise the sensing features of the accelerometer (see, for example, U.S. Pat. No. 6,122,964).

FIGS. 2A-2D and FIGS. 3A-3E illustrate plan views and cross sectional views, respectively, of a portion of one embodiment of micromachined mechanical structure 12 employed in the MEMS of FIG. 1. This embodiment of micromachined mechanical structure 12 includes a transducer 16, one or more portions of which may have electrical charge supplied thereto, stored on and/or trapped thereon, in accordance with certain aspects of the present invention. The transducer 16 may be any type of transducer, for example, an energy harvesting device (e.g., a vibrational energy to electrical energy converter), a sensor (e.g., an accelerometer, a gyroscope, a microphone, a vibration sensor, a pressure sensor, a strain sensor, a tactile sensor, a magnetic sensor and/or a temperature sensor), a resonator, a resonant filter, and/or a combination thereof. In this embodiment, transducer 16 comprises a capacitive transducer, however, the transducer 16 is not limited to such.

In this embodiment, transducer 16 includes a plurality of mechanical structures disposed on, above and/or in substrate 14, including, for example, a first electrode 19, a second electrode 20 and a third electrode 22.

The first, second and third electrodes 19, 20, 22, and/or other mechanical structure(s) of transducer 16 may be comprised of any suitable material, for example, a semiconductor material, for example, silicon, (whether doped or undoped), germanium, silicon/germanium, silicon carbide, gallium arsenide and combinations thereof, materials in column IV of the periodic table, for example silicon, germanium, carbon; also combinations of these, for example, silicon germanium, or silicon carbide; also of III-V compounds for example, gallium phosphide, aluminum gallium phosphide, or other III-V combinations; also combinations of III, IV, V, or VI materials, for example, silicon nitride, silicon oxide, aluminum carbide, or aluminum oxide; also metallic silicides, germanides, and carbides, for example, nickel silicide, cobalt silicide, tungsten carbide, or platinum germanium silicide; also doped variations including phosphorus, arsenic, antimony, boron, or aluminum doped silicon or germanium, carbon, or combinations like silicon germanium; also these materials with various crystal structures, including single crystalline, polycrystalline, nanocrystalline, or amorphous; also with combinations of crystal structures, for instance with regions of single crystalline and polycrystalline structure (whether doped or undoped).

The electrodes 19, 20, 22, and/or other mechanical structure(s) of transducer 16 may have any configuration (e.g., size, shape, orientation). In the illustrated embodiment, for example, first electrode 19 includes a fixed mechanical structure 26 and a movable mechanical structure 28 supported thereby. The movable mechanical structure 28 includes a spring portion 30 and a mass portion 32. The spring portion 30 is disposed between the second and third electrodes 20, 22. The second and third electrodes 20, 22 define fixed mechanical structures having generally rectangular shapes disposed on opposite sides of the spring portion 30 and a reference plane 33.

Figure 2A:
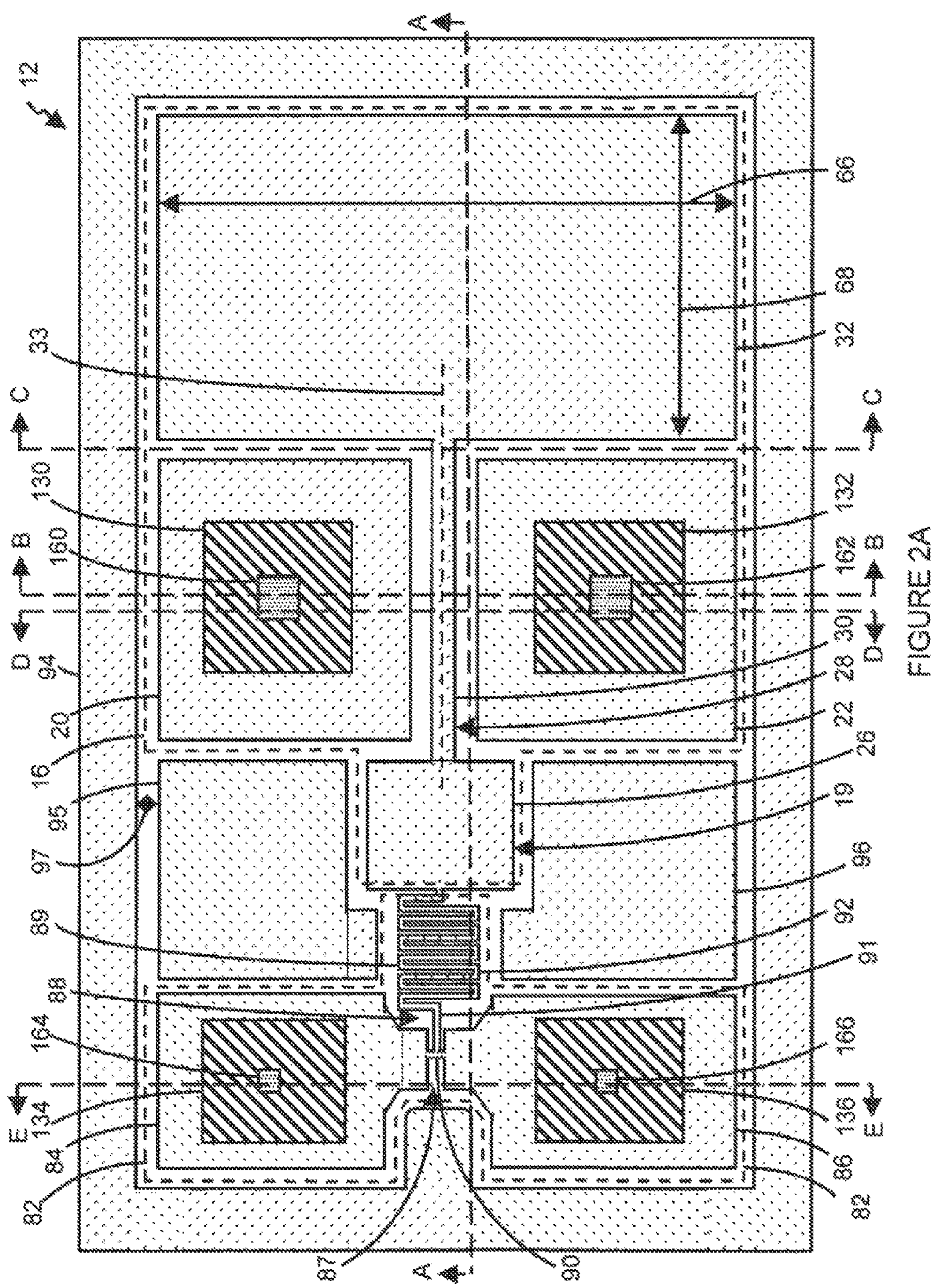
FIG. 2A illustrates a plan view of a portion of a micromachined mechanical structure that employs charge supplying, storing and/or trapping and may be employed in the MEMS of FIG. 1, in accordance with certain aspects of the present invention.
Figure 2B:
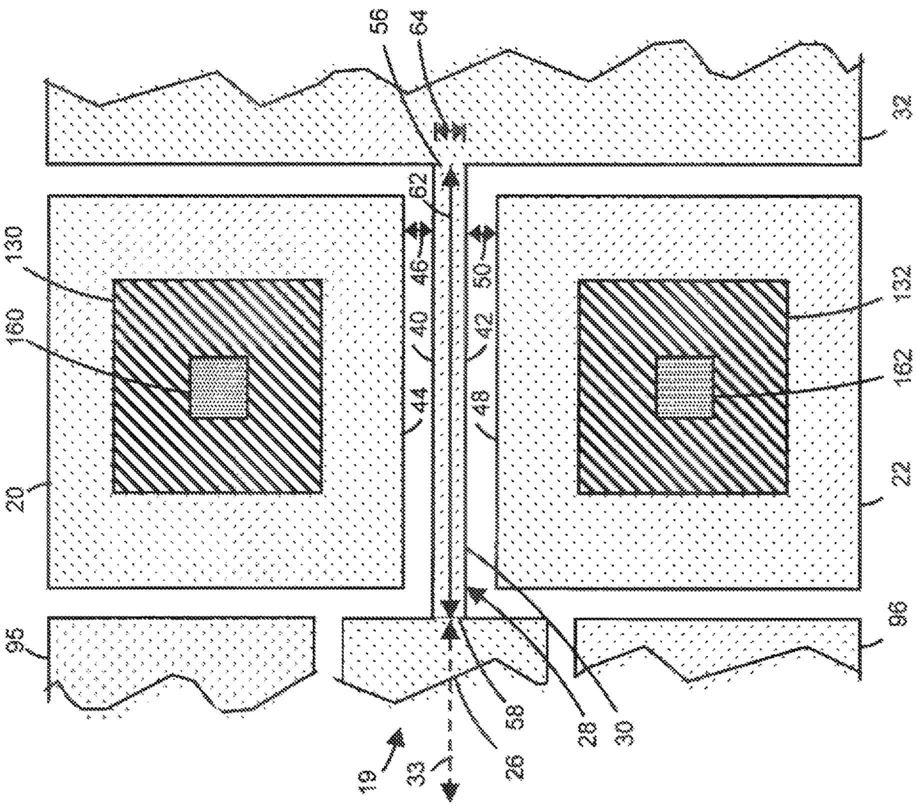
FIGS. 2B-2D illustrate enlarged plan views of portions of the micromachined mechanical structure of FIG. 2A, in accordance with certain aspects of the present invention.

With reference to FIG. 2B, the movable mechanical structure 28 may include first and second surfaces 40, 42. First surface 40 may face in a direction toward a first surface 44 of the second electrode 20 and may be spaced therefrom by a first gap 46. Second surface 42 may face in a direction toward a first surface 48 of the third electrode 22 and may be spaced therefrom by a second gap 50.

The spring portion 30 may be elongated and may include first and second ends 56, 58. The first end 56 may connect to the mass portion 32. The second end 58 may connect to the fixed mechanical structure 26. The mass portion 32 may have a generally rectangular configuration and/or a length 66 and a width 68. The spring portion 30 may have a length 62 and a width 64. In some embodiments, the length 66 of the mass portion 32, the width 68 of the mass portion 32 and the length 62 of the spring portion 30 are each at least five times as large as the width 64 of the spring portion 30. In one embodiment, the spring portion 30 has a length 62 and a width 64 of about 300 microns and about 5 to 10 microns, respectively, and the mass portion 32 has a length 66 and a width 68 of at least about 540 microns and at least about 300 microns, respectively. In one embodiment, the structures have a thickness in a range of at least about 20 microns to about 150 microns.

Figure 2C:
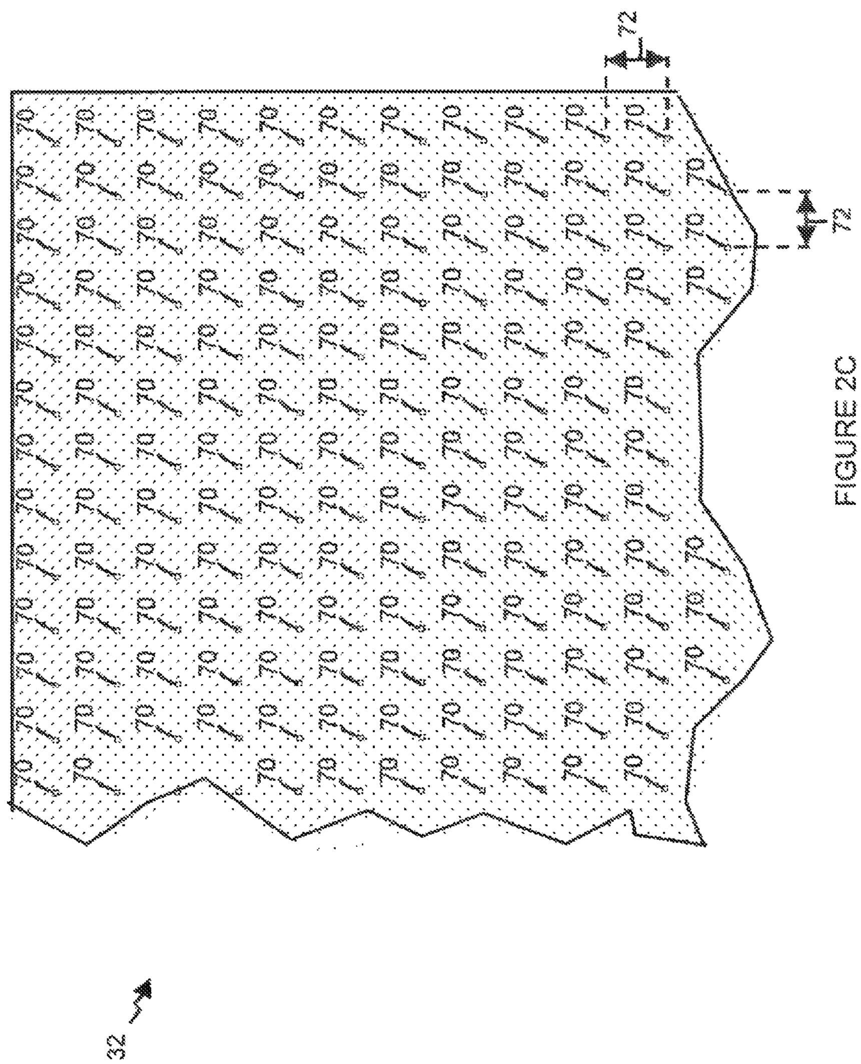

With reference to FIG. 2C, the mass portion 32 may include a plurality of openings 70 to facilitate etching and/or removal of sacrificial material from beneath the mass portion 32 during fabrication of the micromachined mechanical structure 12, as further described hereinafter. The plurality of openings 70 may have any configuration (e.g., shape, arrangement). For example, openings 70 may be rectangular (or generally rectangular) and similar to one another, as shown, but are not limited to such. In some embodiments, each opening 70 has a generally square shape that measures approximately 1 micron on a side, and is spaced apart from one another by a distance 72 of approximately 10 microns.

One or more clearances, e.g., clearances 76*a*, 76*b* (FIG. 3A), may be provided between the movable mechanical structure 28 and one or more other portions of the micromachined mechanical structure 12. Such clearances, e.g., clearances 76*a*, 76*b*, may reduce the possibility of friction and/or interference between the movable mechanical structure 28 and the one or more other portions of the micromachined mechanical structure 12. In some embodiments, the one or more clearances, e.g., 76*a*, 76*b*, provide clearance around each surface of the movable mechanical structure 28 except at end 58 where the movable mechanical structure 28 connects to the fixed mechanical structure 26, such that the movable structure is suspended from the fixed mechanical structure 26.

The first and second electrodes 19, 20 collectively define a first capacitance. The first and third electrodes 19, 22 collectively define a second capacitance. The magnitude of the first capacitance depends (at least in part) on the configurations of the first and second electrodes 19, 20 and on the relative positioning of the first and second electrodes 19, 20. The magnitude of the second capacitance depends (at least in part) on the configurations of the first and third electrodes 19, 20 and relative positioning of the first and third electrodes 19, 22.

In some embodiments, the first capacitance and second capacitance each have a value in a range of from about one femptofarad to about one nanofarad (i.e., with the movable mechanical structure of the first electrode centered between the second electrode and the third electrode), more preferably a first capacitance and a second capacitance each having a value equal to about one picofarad (i.e., with the movable mechanical structure of the first electrode centered between the second electrode and the third electrode). In some embodiments, large values of capacitances may require more area and/or volume than small values of capacitance.

As further described hereinafter, exposing the micromachined mechanical structure 12 to an excitation (e.g., vibration) having a lateral component causes the movable mechanical structure 28 of the first electrode 19 to move in a lateral direction and that causes a change in the magnitude of the first capacitance and the magnitude of the second capacitance. In the absence of an excitation the spring portion 30 may be stationary and disposed at a position that is centered about the reference plane 33 (i.e., equidistant or at least approximately equidistant between the first and second electrodes 20, 22). With such positioning of the movable mechanical structure 28, the first capacitance and the second capacitance may be approximately equal to one another.

The micromachined mechanical structure 12 further includes one or more mechanical structures 82 disposed on, above and/or in substrate 14, for use in supplying and/or trapping electrical charge on the first electrode 19 of the transducer 16 (and/or any other portion(s) of micromachined mechanical structure 12 on which charge is stored).

Unless specified otherwise, the phrase "trap electrical charge" means to provide electrical isolation such that at least a portion of the electrical charge is stored for at least some period of time. Similarly, the phrase "trapping electrical charge" means providing electrical isolation such that at least a portion of the electrical charge is retained for at least some period of time.

In addition, unless specified otherwise, the term "store" includes but is not limited to store, retain, keep and/or leave. The phrase "store on" includes, but is not limited to, store on, store in, retain on, retain in, keep on, keep in, leave on, and/or leave in. Similarly, unless specified otherwise, the term "storing" and other forms (i.e., store, stored) includes but is limited to storing, retaining, keeping and/or leaving. The phrase "storing on" and other forms (i.e., store on, stored on) includes, but is not limited to, storing on, storing in, retaining on, retaining in, keeping on, keeping in, leaving on, and/or leaving in. Storing may be carried out using any method(s) and/or structure(s) including, for example, but not limited to by trapping.

In this embodiment, the one or more mechanical structures 82 include a first electrode 84, a second electrode 86 and a breakable link 88. The one or more mechanical structures 82 may be comprised of, any suitable material for example, a semiconductor material, for example, silicon, (whether doped or undoped), germanium, silicon/germanium, silicon carbide, gallium arsenide and combinations thereof, materials in column IV of the periodic table, for example silicon, germanium, carbon; also combinations of these, for example, silicon germanium, or silicon carbide; also of III-V compounds for example, gallium phosphide, aluminum gallium phosphide, or other III-V combinations; also combinations of III, IV, V, or VI materials, for example, silicon nitride, silicon oxide, aluminum carbide, or aluminum oxide; also metallic silicides, germanides, and carbides, for example, nickel silicide, cobalt silicide, tungsten carbide, or platinum germanium silicide; also doped variations including phosphorus, arsenic, antimony, boron, or aluminum doped silicon or germanium, carbon, or combinations like silicon germanium; also these materials with various crystal structures, including single crystalline, polycrystalline, nanocrystalline, or amorphous; also with combinations of crystal structures, for instance with regions of single crystalline and polycrystalline structure (whether doped or undoped).

The one or more mechanical structures 82 may have any configurations (e.g., size, shape, orientation). In the illustrated embodiment, for example, the first and second electrodes 84, 86 include fixed mechanical structures having generally rectangular shapes spaced apart from one another by one or more one or more gaps, e.g., a gap 87. The breakable link 88 includes a fuse 89.

Figure 2D:
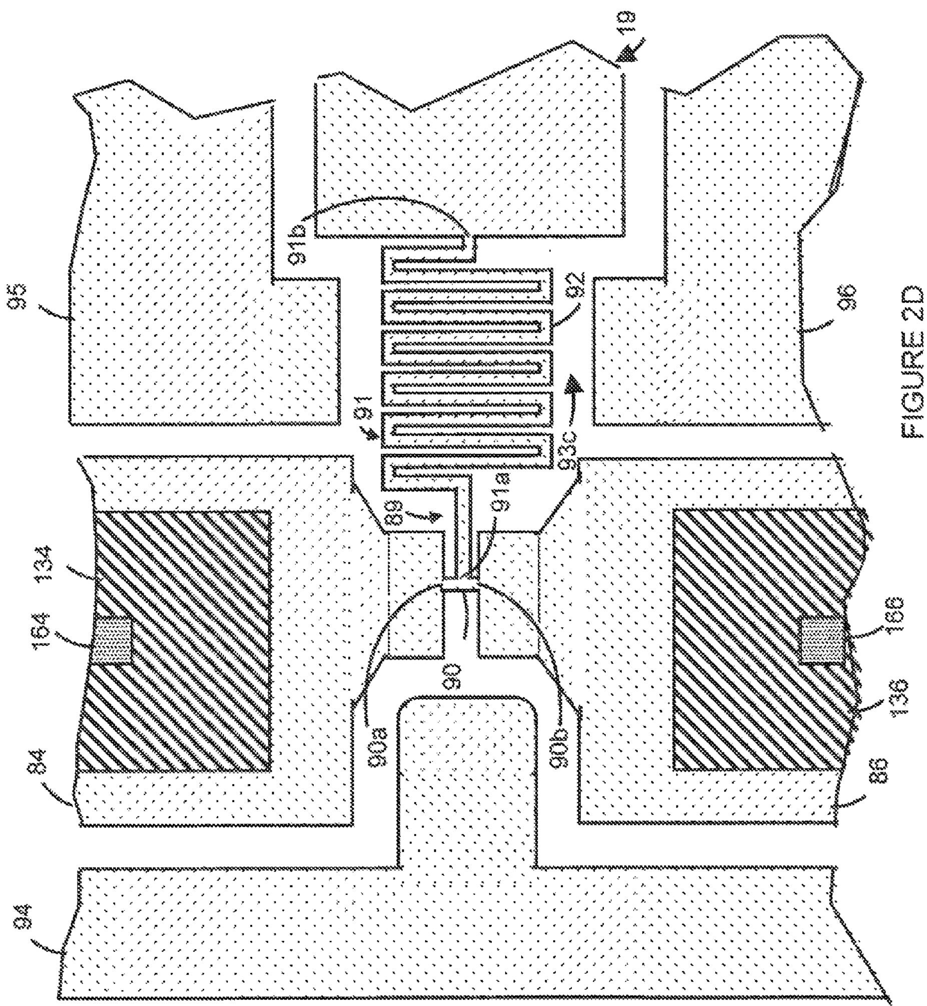
Figure 3A:
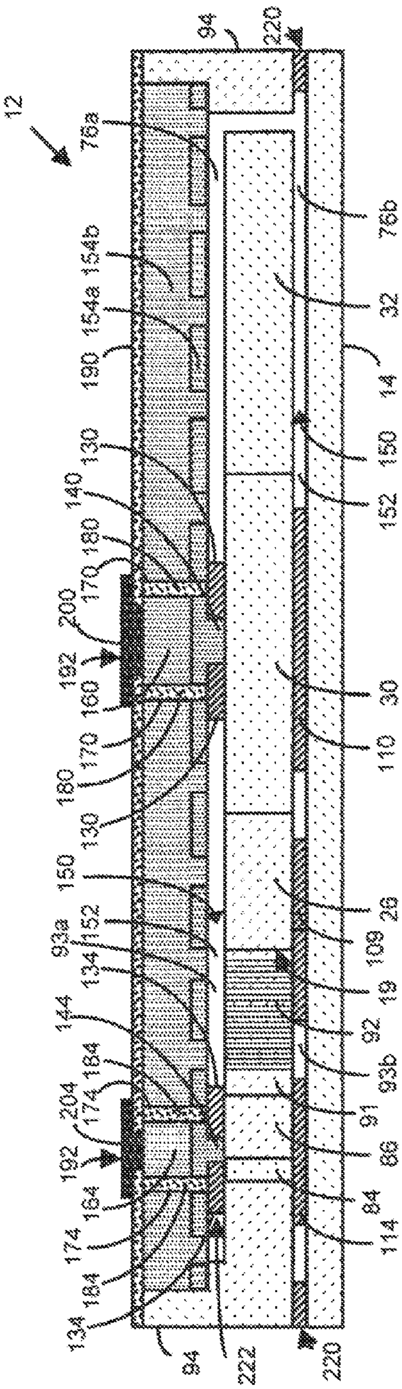
FIG. 3A illustrates a cross-sectional view (taken in the direction A-A of FIG. 2A) of the portion of the micromachined mechanical structure of FIG. 2A and one embodiment of an encapsulation structure that may be employed therewith, in accordance with certain aspects of the present invention.
Figure 3C:
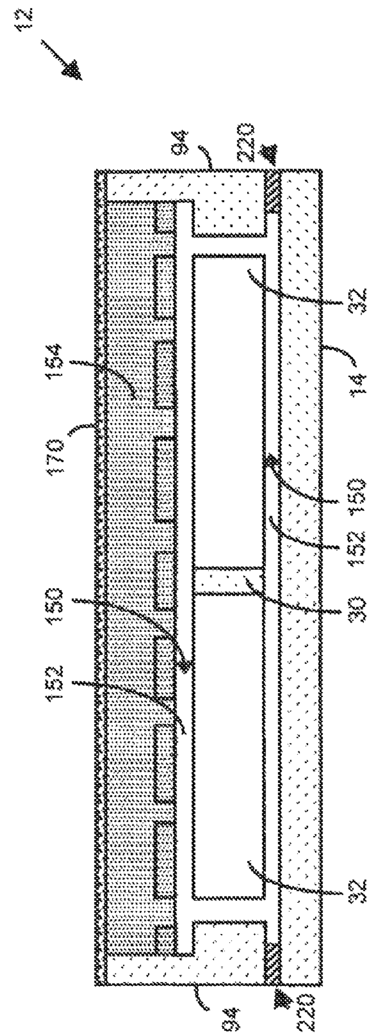
FIG. 3C illustrates a cross-sectional view (taken in the direction C-C of FIG. 2A) of the portion of the micromachined mechanical structure of FIG. 2A and one embodiment of an encapsulation structure that may be employed therewith, in accordance with certain aspects of the present invention.
Figure 3B:
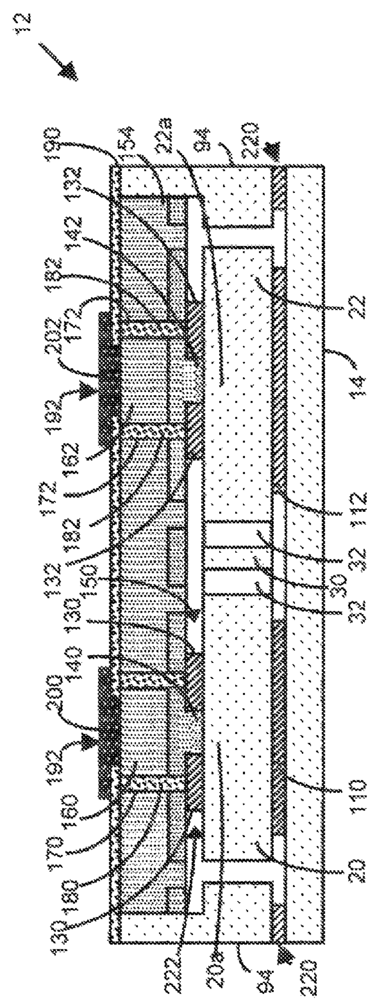
FIG. 3B illustrates a cross-sectional view (taken in the direction B-B of FIG. 2A) of the portion of the micromachined mechanical structure of FIG. 2A and one embodiment of an encapsulation structure that may be employed therewith, in accordance with certain aspects of the present invention.
Figure 3D:
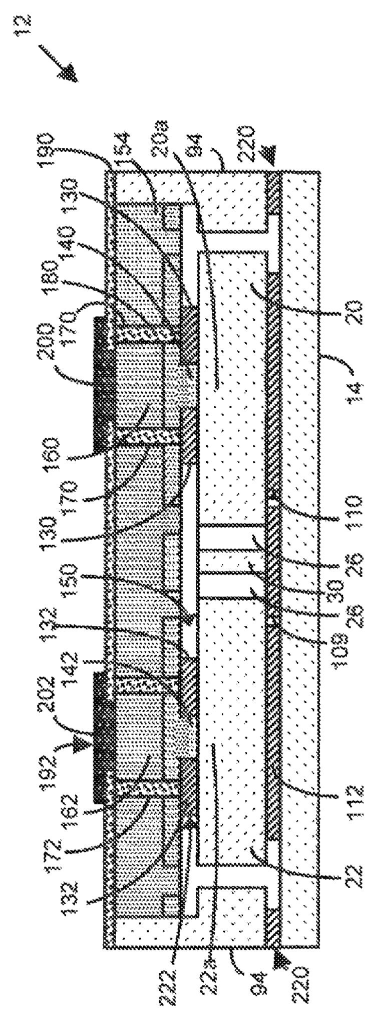
FIG. 3D illustrates a cross-sectional view (taken in the direction D-D of FIG. 2A) of the portion of the micromachined mechanical structure of FIG. 2A and one embodiment of an encapsulation structure that may be employed therewith, in accordance with certain aspects of the present invention.
Figure 3E:
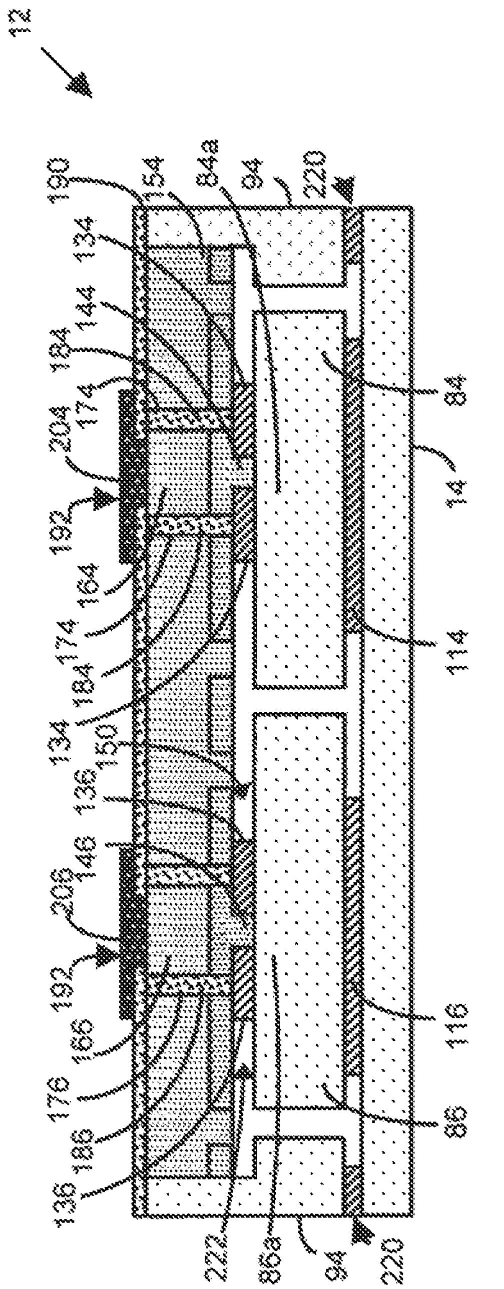
FIG. 3E illustrates a cross-sectional view (taken in the direction E-E of FIG. 2A) of the portion of the micromachined mechanical structure of FIG. 2A and one embodiment of an encapsulation structure that may be employed therewith, in accordance with certain aspects of the present invention.

With reference to FIG. 2D, the fuse 89 may include first and second portions 90, 91. The first portion 90 may have a first end 90*a* connected to the first electrode 84 and a second end 90*b* connected to the second electrode 86. The second portion 91 may have a first end 91*a* connected to the first portion 90 of the fuse 89 and a second end 91*b* connected to the first electrode 19 of the transducer 16.

As further described hereinafter, the fuse 89 has two states. In a first state, the fuse 89 defines an electrically conductive path that connects at least one of the one or more mechanical structures 82, e.g., electrodes 84, 86, to the first electrode 19 of transducer 16 (and/or any other portion(s) of micromachined mechanical structure 12 on which charge is to be stored). In the second state, one or more portions of the fuse 89 is "blown" (e.g., melted and/or ruptured) to break the connection between the at least one of the one or more of mechanical structures 82, e.g., electrodes 84, 86, and the first electrode 19 of transducer 16 (and/or any other portion(s) of micromachined mechanical structure 12 on which charge is to be stored).

To this effect, one or more portions of the fuse 89 may have a configuration adapted to increase the thermal resistance of such portions, which may reduce the amount of energy needed to heat one or more portions of the fuse to a temperature that causes one or more of such portions to "blow". In this embodiment, for example, fuse 89 includes a portion 92 that defines a conductive path having a meandering shape. The meandering shape may be regular (e.g., serpentine, as shown) or irregular. In some embodiments, such portion(s) define a major portion (e.g., more than half of the conductive path of fuse 89.

One or more clearances, e.g., clearances 93*a* (FIG. 3A), 93*b* (FIG. 3A), 93*c* (FIG. 2B), may be provided between one or more portions of the fuse 89 and one or more other portions of the micromachined mechanical structure 12. Such clearances, e.g., clearances 93*a*-93*c*, may help reduce the thermal conductivity between the fuse and the rest of the micromachined mechanical structure 12, which may in turn reduce the amount of energy needed to heat one or more portions of the fuse 89 to a temperature that causes the fuse 89 to "blow". In some embodiments, the one or more clearances, e.g., clearances 93*a*-93*c*, define a clearance around each surface of the fuse 89 except at ends 90*a*, 90*b*, 91*b* where the fuse 89 connects to the first and second electrode 86, 88 of the one or more mechanical structures 82 and the first electrode 19 of the transducer 16, respectively, such that the fuse 89 is suspended from the first and second electrodes 84, 86 of the one or more mechanical structures 82 and the first electrode 19 of the transducer 16.

Figure 6A:
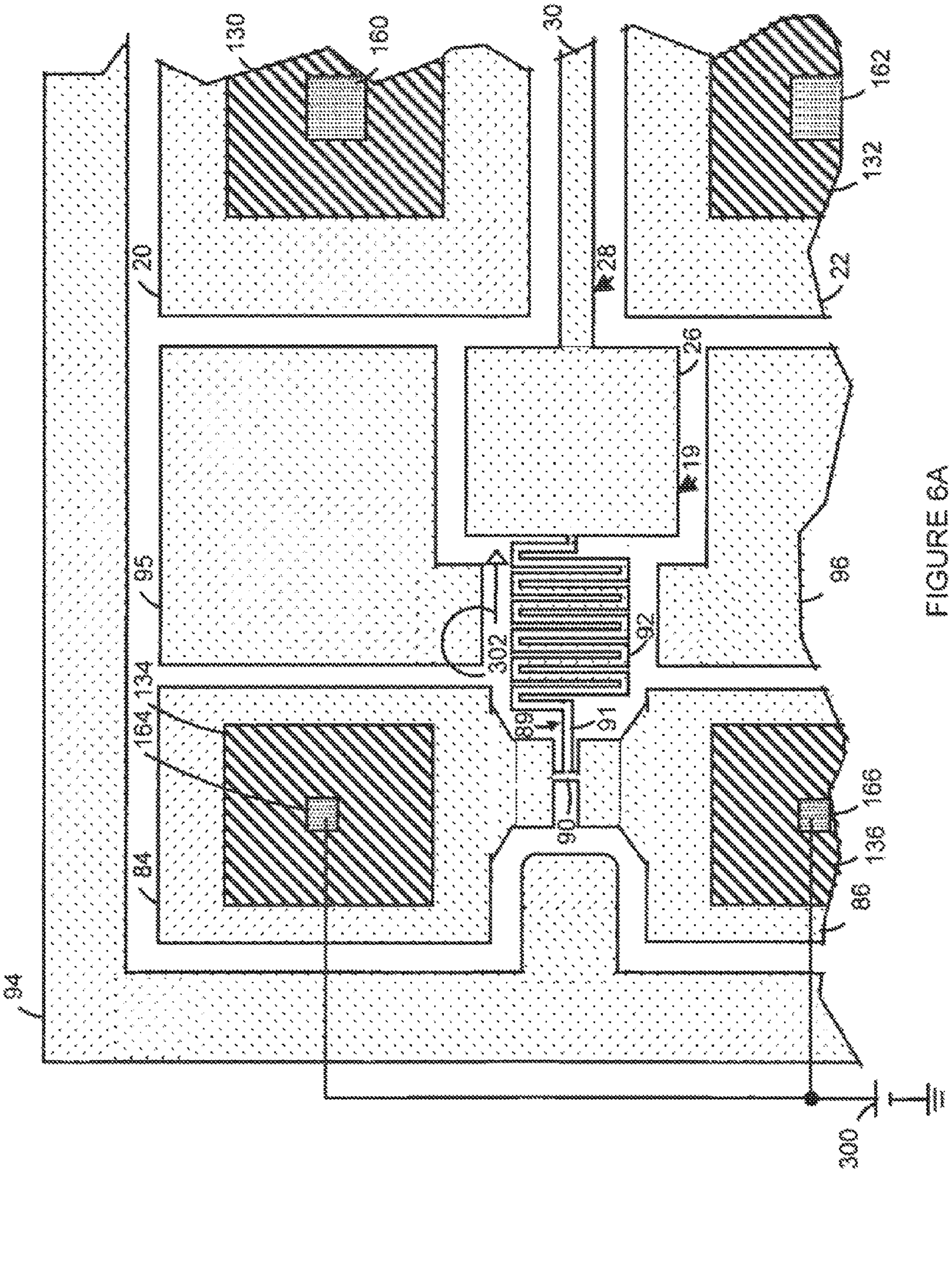
FIGS. 6A-6D illustrate plan views of the portion of micromachined mechanical structure of FIG. 2A, in conjunction with power sources that may be employed therewith, showing various stages that may be employed in storing charge on the first electrode 19 of the transducer 16 (and/or one or more portion(s) of the micromachined mechanical structure 12 on which charge is to be stored), according to certain aspects of the present invention.
Figure 6B:
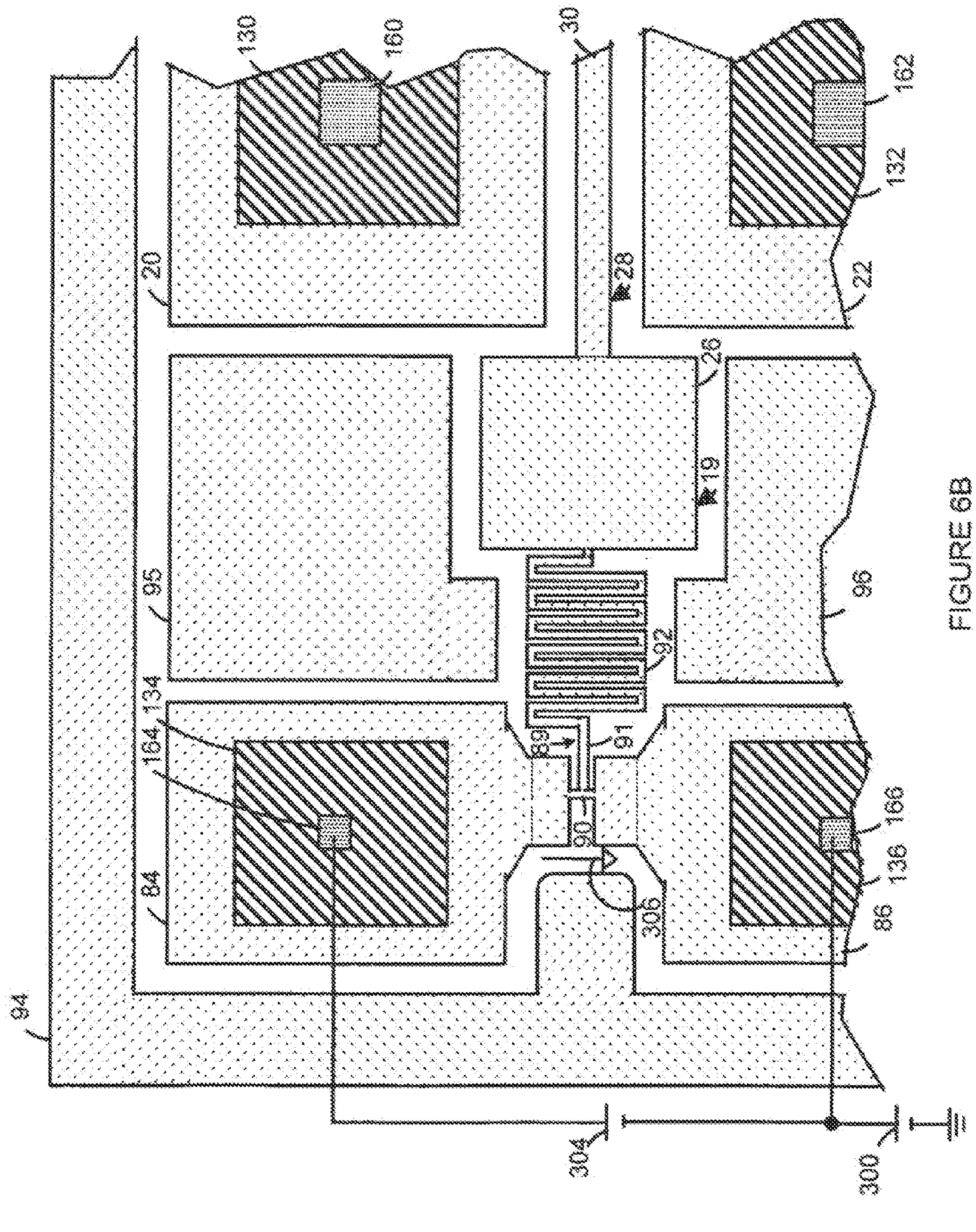
Figure 6C:
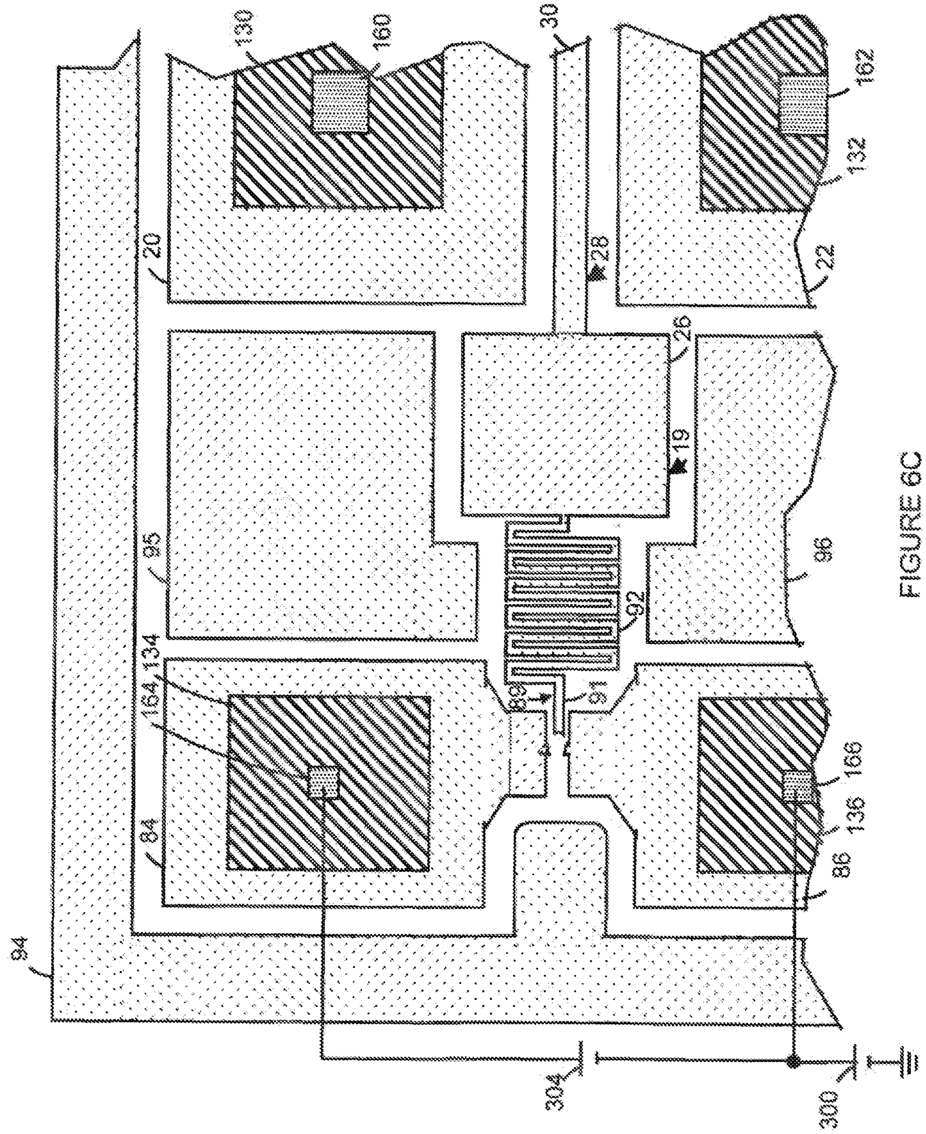

One or more of electrodes 20, 22, 84, 86, may include contact areas, e.g., contact areas 84*a*, 86*a*, 20*a*, 22*a*, respectively, which may provide electrical paths between electrodes 20, 22, 84, 86, and one or more other circuits and/or devices, e.g., one or more other circuits and/or devices 226, 330 (FIGS. 10A-10L), charge storing circuit 332 (FIGS. 10B-10E, 10K-10L), DC/DC converter circuit 362 (FIGS. 10E, 10G, 10L), data processing electronics 386 (FIG. 11 and FIGS. 12A-12D), interface circuitry 388 (FIG. 11 and FIGS. 12A-12D), and/or power sources, e.g., voltage sources 300, 304 (FIGS. 6A-6C).

The micromachined mechanical structure 12 may further define one or more field areas, e.g., field areas 94, 95, 96, disposed on, above, or in substrate 14. In some embodiments, one or more of the field areas (1) provide mechanical support for one or more portions of the MEMS 10 and/or (2) define one or more substrate areas for fabrication of electronic or electrical components or integrated circuits (for example, transistors, resistors, capacitors, inductors and other passive or active elements). The one or more field areas may comprise any material or materials, for example, monocrystalline silicon, polycrystalline silicon and/or a combination thereof. One or more clearances, e.g., clearance 97, may be provided between one or more of the field areas and/or one or more other structures within the micromachined mechanical structure 12. Such clearances, e.g., clearance 97, may have any size, for example, about 1 micron.

Referring to FIGS. 3A-3E, the micromachined mechanical structure 12 may further define one or more insulation areas, e.g., insulation areas 109, 110, 112, 114, 116, to anchor the one or more mechanical structures, e.g., electrodes 19, 20, 22, 84, 86, respectively, to the substrate 14, while providing electrical isolation between the substrate and such mechanical structures, e.g., electrodes 19, 20, 22, 84, 86, respectively. In this embodiment, insulation area 109 is disposed between the substrate 14 and the fixed mechanical structure 26 of electrode 19 to anchor the first electrode 19 to the substrate 14 while providing electrical isolation between the substrate 14 and the electrode 19. Insulation area 110 is disposed between the substrate and electrode 20 to anchor electrode 20 to the substrate 14 while providing electrical isolation between the substrate 14 and electrode 20. Insulation area 112 is disposed between the substrate 14 and electrode 22 to anchor electrode 22 to the substrate while providing electrical isolation between the substrate 14 and electrode 22. Insulation area 114 is disposed between the substrate 14 and electrode 84 to anchor electrode 84 to the substrate 14 while providing electrical isolation between the substrate 14 and electrode 84. Insulation area 116 is disposed between the substrate and electrode 86 to anchor electrode 86 to the substrate 14 while providing electrical isolation between the substrate 14 and electrode 86. The one or more insulation areas, e.g., insulation areas 109, 110, 112, 114, 116, may comprise, for example, silicon dioxide or silicon nitride.

The micromachined mechanical structure 12 may further define one or more insulation areas, e.g., insulation areas 130, 132, 134, 136, disposed superjacent one or more of the mechanical structures, e.g., electrodes 20, 22, 84, 86, to partially, substantially or entirely surround contact areas 20*a*, 22*a* 84*a*, 86*a*, of electrodes 20, 22, 84, 86, respectively, as may be desired. One or more of such insulation areas, e.g., insulation areas 130, 132, 134, 136, may define one or more openings, e.g., openings 140, 142, 144, 146, to facilitate electrical contact to the mechanical structures, e.g., electrodes 20, 22, 84, 86, respectively. In this embodiment, for example, insulation area 130 is disposed superjacent electrode 20 and defines opening 140 to facilitate contact to electrode 20. Insulation area 132 is disposed superjacent electrode 22 and defines opening 142 to facilitate contact to electrode 22. Insulation area 134 is disposed superjacent electrode 84 and defines opening 144 to facilitate contact to electrode 84, as may be desired. Insulation area 136 is disposed superjacent electrode 86 and defines opening 146 to facilitate contact to electrode 86. The one or more insulation areas, e.g., insulation areas 130, 132, 134, 136, may comprise, for example, silicon dioxide or silicon nitride.

Surfaces of the one or more insulation areas, e.g., insulation areas 109, 110, 112, 114, 116 and insulation areas 130, 132, 134, 136, are sufficiently free of contaminants that would otherwise result in excessive reduction in electrical isolation, excessive leakage current and/or excessive drain of the electrical charge to be supplied to, stored on and/or trapped on the first electrode 19 of the transducer 16 (and/or any other portion(s) of micromachined mechanical structure 12 on which charge is desired to be stored), relative to any requirements, in such embodiments, that relate, directly and/or indirectly, to contamination, electrical isolation, leakage and/or drainage of the electrical charge.

Notably, some embodiments may be able to operate with more contamination, less electrical isolation, more leakage and/or more drain of electrical charge than other embodiments. For example, some embodiments that store a portion of the electrical charge for one day may be able to tolerate more contamination, less electrical isolation, more leakage and/or more drain of electrical charge than embodiments that require the ability to store at least a portion of the charge for a period of at least ten years.

Thus, as used herein, the term "sufficiently free" means "sufficiently free" relative to any requirements, in any given embodiment, that relate, directly and/or indirectly, to contamination. For example, a surface and/or atmosphere that is not "sufficiently contaminant free" for one embodiment may nonetheless be "sufficiently contaminant free" for another embodiment. Similarly, the term "excessive" means "excessive" relative to any requirements, in any given embodiment, that relate, directly and/or indirectly, to electrical isolation, leakage current and/or drain. For example, an "excessive reduction in electrical isolation" in one embodiment may not be an "excessive reduction in electrical isolation" in another embodiment. An "excessive leakage current" in one embodiment may not be an "excessive leakage current" in another embodiment.

Unless specified otherwise, the terms "electrically isolating" (and other forms, e.g., "electrically isolate", electrically isolated") mean separating (separate, separated, respectively) from electrically conductive structures by means of one or more electrical insulators. An electrically conductive structure may be an electrically conductive structure and/or an electrically conductive portion of a structure. An electrical insulator may be an electrical insulator and/or an electrical insulator portion of a structure. An electrical insulator may or may not be an ideal or near ideal electrical insulator. Rather, an electrical insulator may be any type of electrical insulator (e.g., quality, composition, form, e.g., solid, liquid, gas, vacuum) and may have any configuration (e.g., shape, size) so long as any requirements, relating to insulation resistance, which can vary from embodiment to embodiment, are met.

Electrically isolating results in electrical isolation. The electrical isolation provided in any given embodiment depends, at least in part, on the characteristics of the one or more electrical insulators that provide the electrical isolation as well as the characteristics of any contaminants in, on and/or around such electrical insulators. Thus, some embodiments may require and/or provide different electrical isolation than other embodiments. For example, some embodiments may employ different electrical insulator(s) and/or may have different amounts of contamination than the electrical insulator (s) and contamination in other embodiments. In some embodiments, electrical isolation may be characterized in terms of an electrical resistance provided thereby.

In some embodiments, the electrical isolation desired between the first electrode 19 (and/or one or more other portions of the micromachined mechanical structure on which electrical charge is desired to be stored) and the substrate 14 (and/or other portions of micromachined mechanical structure, e.g., e.g., electrodes 19, 20, 22, 84, 86) is at least ten teraohms. Electrical isolation of at least this magnitude helps make it possible to store at least a portion of the electrical charge on the one or more portions of the micromachined mechanical structure for at least one day. However some embodiments employ an electrical isolation much greater than ten teraohms, for example, to help make it possible to store at least a portion of the electrical charge for periods of time greater than one day and/or to help make it possible to store a greater portion of the electrical charge. Some embodiments employ an electrical isolation greater than 10.sup.17 ohms, preferably greater than 10.sup.18 ohms. In some embodiments, the electrical isolation is greater than 10.sup.19 ohms, more preferably greater than 10.sup.20 ohms. Some other embodiments, however, may employ electrical isolation less than ten teraohms.

The micromachined mechanical structure 12 further defines a chamber 150 having an atmosphere 152 "contained" therein. In some embodiments, the atmosphere contained in the chamber 150 may provide mechanical damping for the mechanical structures of one or more micromachined mechanical structures (for example, an accelerometer, a pressure sensor, a tactile sensor and/or temperature sensor).

In this embodiment, atmosphere 152 is sufficiently free of contaminants that would otherwise result in excessive reduction in electrical isolation, excessive surface contamination and/or surface leakage and thereby lead to excessive drain of the electrical charge to be supplied to, stored on and/or trapped on the first electrode 19 of the transducer 16 (and/or any other portion(s) of micromachined mechanical structure 12 on which charge is desired to be stored), relative to any requirements, in such embodiments, that relate, directly and/or indirectly, to contamination, electrical isolation, leakage and/or drainage of the electrical charge.

As stated above, some embodiments may be able to tolerate more contamination, less electrical isolation, more leakage and/or more drain of electrical charge than other embodiments. In that regard, as stated above, the term "sufficiently free" means "sufficiently free" relative to any requirements, in any given embodiment, that relate, directly and/or indirectly, to contamination. For example, a surface and/or atmosphere that is not "sufficiently contaminant free" for one embodiment may nonetheless be "sufficiently contaminant free" for another embodiment.

The chamber 150 may be formed, at least in part, by one or more encapsulation layer(s) 154. In some embodiments, one or more of the one or more encapsulation layer(s) 154 are formed using one or more of the encapsulation techniques described and illustrated in U.S. Pat. No. 6,936,491 issued to Partridge et al. and entitled "Microelectromechanical Systems Having Trench Isolated Contacts, and Methods of Fabricating Same", filed on Jun. 4, 2003 and assigned Ser. No. 10/455,555 (hereinafter "Microelectromechanical Systems Having Trench Isolated Contacts Patent"). For the sake of brevity, the inventions described and illustrated in the Microelectromechanical Systems Having Trench Isolated Contacts Patent will not be repeated but will only be summarized. It is expressly noted, that the entire contents of the Microelectromechanical Systems Having Trench Isolated Contacts Patent, including, for example, the features, attributes, alternatives, materials, techniques and advantages of all of the inventions, are incorporated by reference herein, although, unless stated otherwise, the aspects and/or embodiments of the present invention are not limited to such features, attributes alternatives, materials, techniques and advantages.

Other types of encapsulation, now known or later developed, including for example, but not limited to, other types of thin film encapsulation techniques and/or structures (see, for example, WO 01/77008 A1 and WO 01/77009 A1), may also be employed.

The one or more encapsulation layers 154 may define one or more conductive regions, e.g., conductive regions 160, 162, 164, 166, disposed superjacent one or more of the mechanical structures, e.g., electrodes 20, 22, 84, 86, respectively, to facilitate electrical contact therewith. The one or more encapsulation layers 154 may further define one or more trenches, e.g., trenches 170, 172, 174, 176, disposed about one or more of the conductive regions to electrically isolate the conductive regions, e.g., conductive regions 160, 162, 164, 166, respectively, from one or more other portions of the micromachined mechanical structure 12. Insulating material may be deposited in one or more of the trenches, e.g., trenches 170, 172, 174, 176, to form one or more isolation regions, e.g., isolation regions 180, 182, 184, 186, respectively.

The micromachined mechanical structure may further define an insulation layer 190 and a conductive layer 192 disposed superjacent encapsulation layer(s) 154. The insulation layer 190 may provide electrical isolation between conductive layer 192 and one or more other portions of the micromachined mechanical structure 12, as may be desired. The conductive layer 192 may define one or more conductive regions, e.g., conductive regions 200, 202, 204, 206, that form part of the electrical connection to one or more of the mechanical structures, e.g., electrodes 20, 22, 84, 86, respectively.

FIGS. 4A-4J and FIGS. 5A-5J illustrate cross-sectional views of one embodiment of the fabrication of the micromachined mechanical structure 12 of FIG. 2A, including one embodiment of encapsulation that may be employed therewith, at various stages of the process, according to certain aspects of the present invention.

An exemplary method of fabricating or manufacturing a thin film encapsulated MEMS 10 is described and illustrated in the Microelectromechanical Systems Having Trench Isolated Contacts Patent. It has been determined that the methods and techniques described in the Microelectromechanical Systems Having Trench Isolated Contacts Patent provide a stable vacuum cavity that is well suited for use in association with the methods and structures disclosed herein. For the sake of brevity, those discussions and illustrations will not be repeated but will only be summarized. It is expressly noted, however, that the entire contents of the Microelectromechanical Systems Having Trench Isolated Contacts Patent, including, for example, the features, attributes, alternatives, materials, techniques and advantages of all of the inventions, are incorporated by reference herein, although, unless stated otherwise, the aspects and/or embodiments of the present invention are not limited to such features, attributes alternatives, materials, techniques and advantages.

Figure 4A:
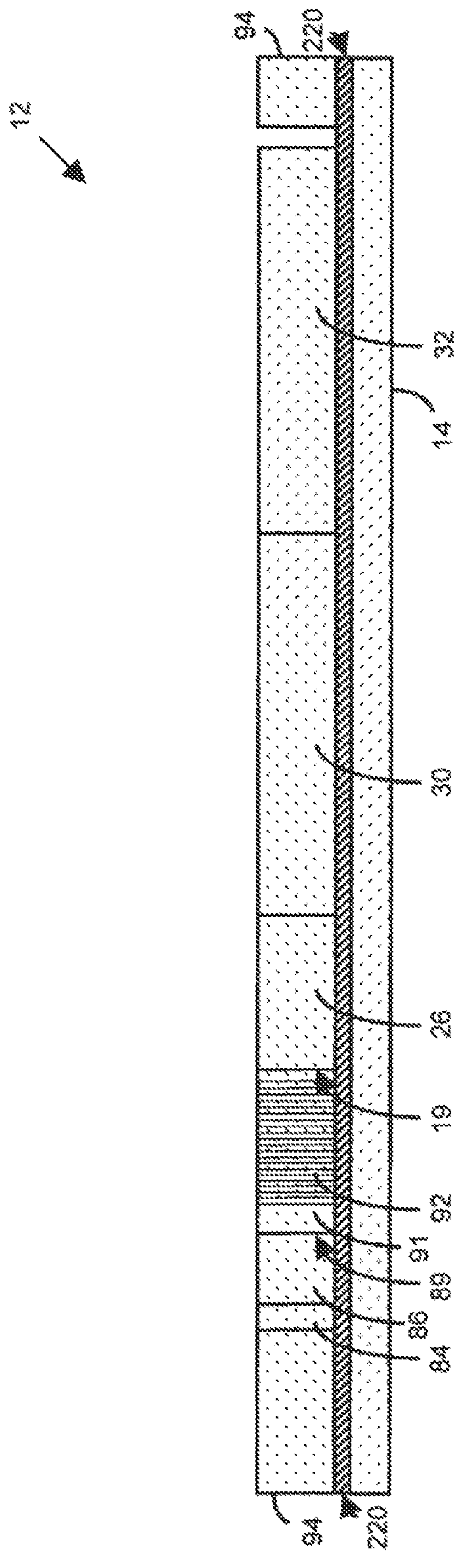
FIGS. 4A-4J illustrate cross-sectional views (taken in the direction A-A of FIG. 2A) of one embodiment of the fabrication of the portion of the micromachined mechanical structure of FIG. 2A, including one embodiment of encapsulation that may be employed therewith, at various stages of the process, according to certain aspects of the present invention.
Figure 5A:
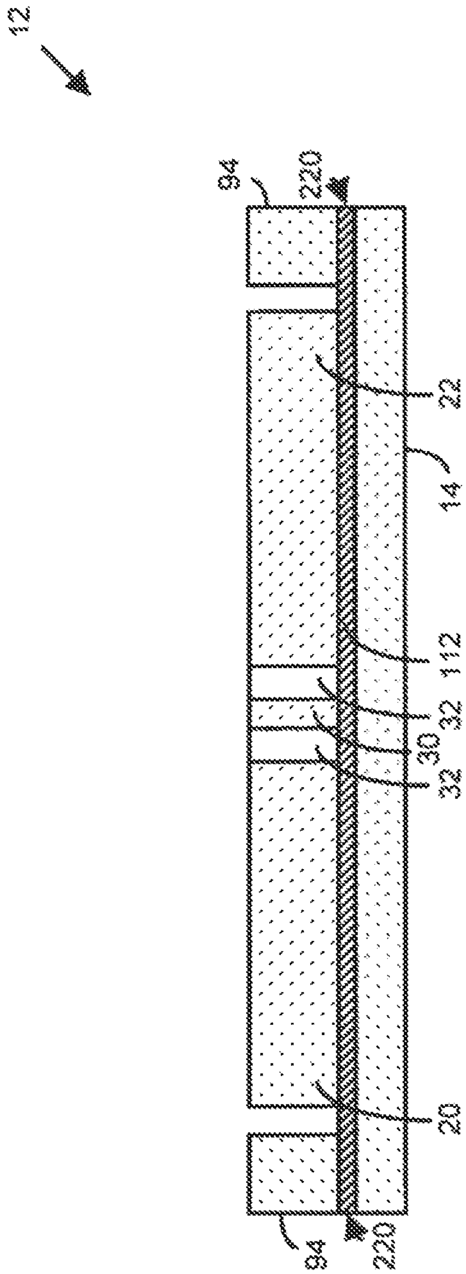
FIGS. 5A-5J illustrate further cross-sectional views (taken in the direction B-B of FIG. 2A) of the fabrication of the portion of micromachined mechanical structure of FIG. 2A, including one embodiment of an encapsulation that may be employed therewith, at various stages of the process, according to certain aspects of the present invention.

With reference to FIG. 4A and FIG. 5A, fabrication of MEMS 10 may begin with an SOI substrate partially formed device including mechanical structures, e.g., electrodes 19, 20, 22, 84, 86 and fuse 89, and disposed on a first sacrificial layer 220, for example, silicon dioxide or silicon nitride.

The mechanical structures, e.g., electrodes 19, 20, 22, 84, 86 and fuse 89, may be formed using well-known deposition, lithographic, etching and/or doping techniques as well as from well-known materials (for example, semiconductors such as silicon, germanium, silicon-germanium or gallium-arsenide).

Field regions, e.g., field regions 94, 95, 96, and a first sacrificial layer 220 may be formed using well-known silicon-on-insulator fabrication techniques or well-known formation, lithographic, etching and/or deposition techniques using a standard or over-sized ("thick") wafer (not illustrated).

In some embodiments, one or more of the mechanical structures and/or one or more of the field regions are comprised of, for example, any suitable material, for example, a semiconductor material, for example, silicon, (whether doped or undoped), germanium, silicon/germanium, silicon carbide, gallium arsenide and combinations thereof, materials in column IV of the periodic table, for example silicon, germanium, carbon; also combinations of these, for example, silicon germanium, or silicon carbide; also of III-V compounds for example, gallium phosphide, aluminum gallium phosphide, or other III-V combinations; also combinations of III, IV, V, or VI materials, for example, silicon nitride, silicon oxide, aluminum carbide, or aluminum oxide; also metallic silicides, germanides, and carbides, for example, nickel silicide, cobalt silicide, tungsten carbide, or platinum germanium silicide; also doped variations including phosphorus, arsenic, antimony, boron, or aluminum doped silicon or germanium, carbon, or combinations like silicon germanium; also these materials with various crystal structures, including single crystalline, polycrystalline, nanocrystalline, or amorphous; also with combinations of crystal structures, for instance with regions of single crystalline and polycrystalline structure (whether doped or undoped).

Figure 4B:
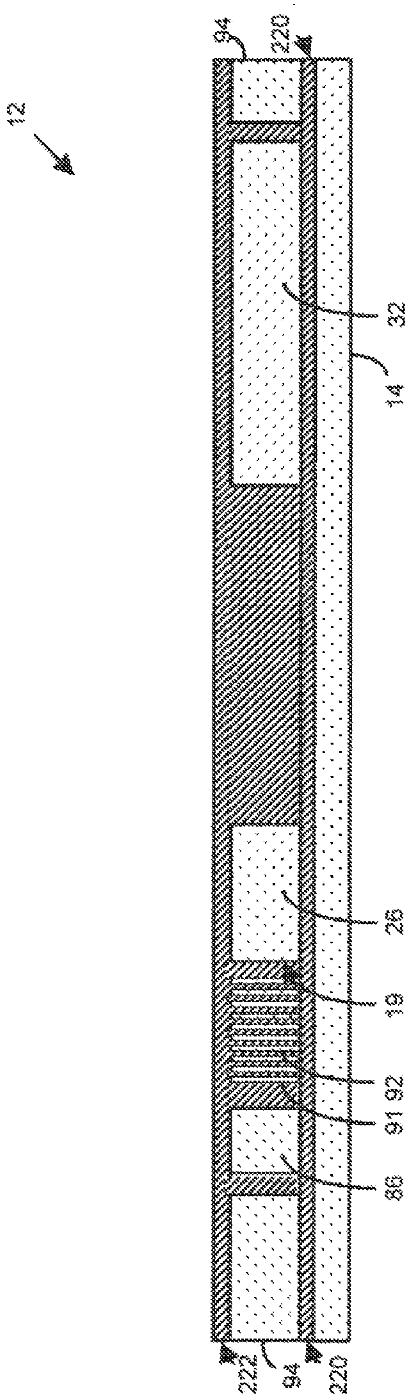
Figure 5B:
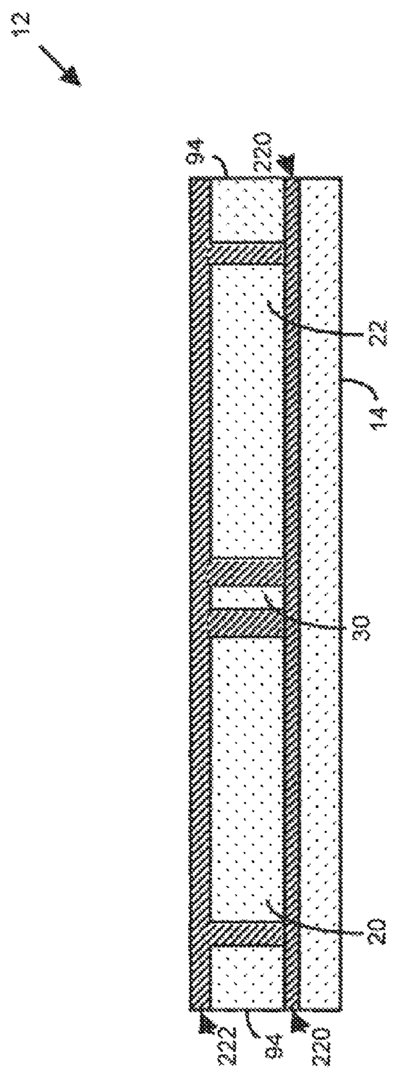

With reference to FIG. 4B and FIG. 5B, following formation of the mechanical structures, e.g., electrodes 19, 20, 22, 84, 86 and fuse 89, a second sacrificial layer 222, for example, silicon dioxide or silicon nitride, may be deposited and/or formed to secure, space and/or protect the mechanical structures, e.g., electrodes 19, 20, 22, 84, 86 and fuse 89, during subsequent processing, including the encapsulation process.

Figure 4C:
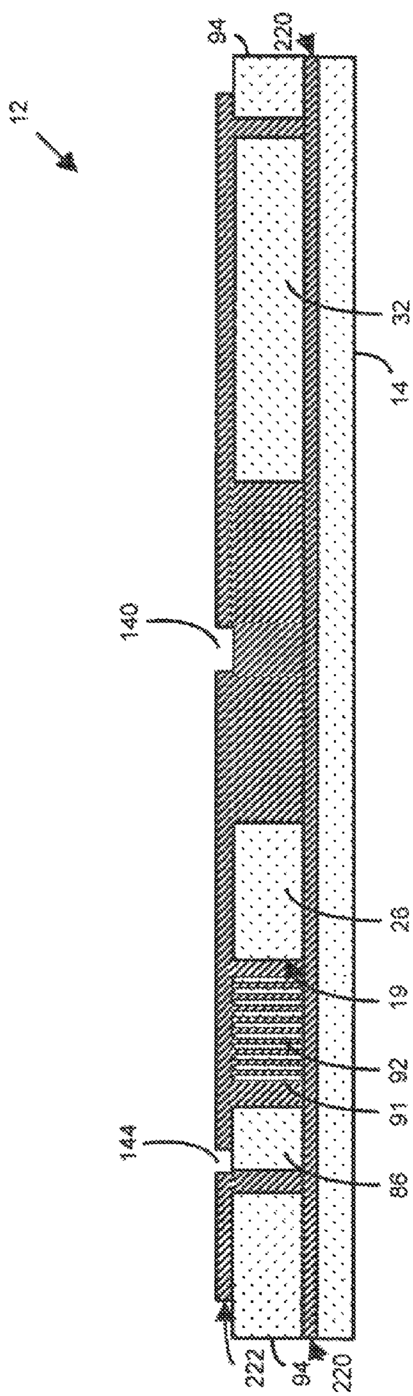
Figure 5C:
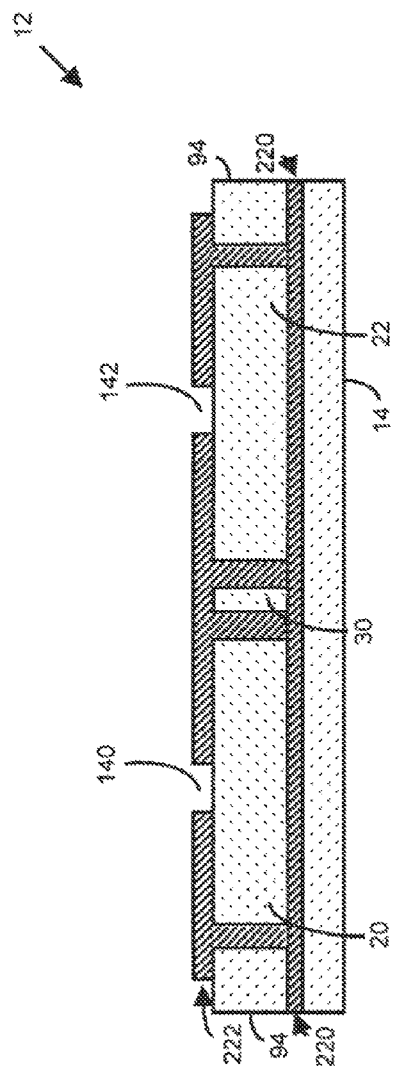

Referring to FIG. 4C and FIG. 5C, one or more openings, e.g., openings 140, 142, 144, 146, may be etched and/or formed in second sacrificial layer 222 to facilitate subsequent electrical contact to one or more of the mechanical structures, e.g., electrodes 20, 22, 84, 86, respectively. The openings, e.g., openings 140, 142, 144, 146, may be provided using, for example, well known masking techniques (such as a nitride mask) prior to and during deposition and/or formation of second sacrificial layer 222, and/or well known lithographic and etching techniques after deposition and/or formation of second sacrificial layer 222.

Figure 4D:
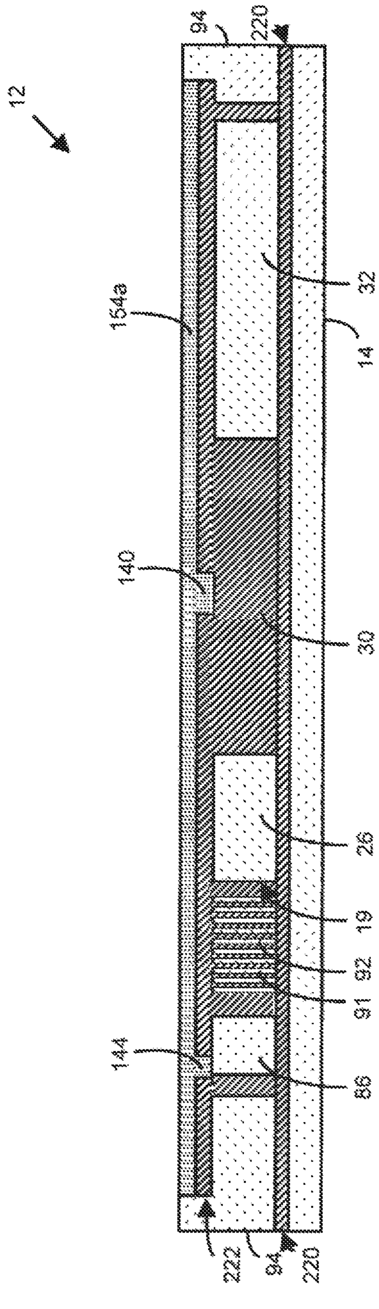
Figure 5D:
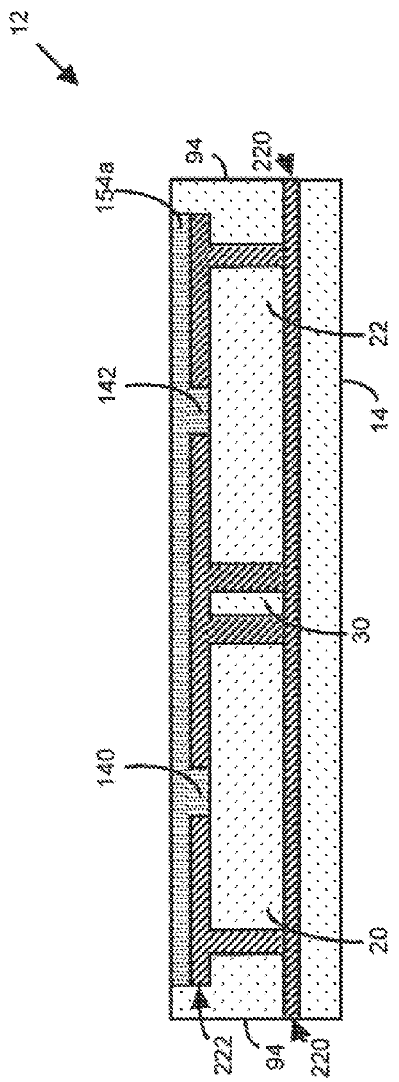

With reference to FIG. 4D and FIG. 5D, thereafter, first encapsulation layer 154*a* may be deposited, formed and/or grown on second sacrificial layer 222. In one embodiment, the thickness of first encapsulation 154*a* in the region overlying second sacrificial layer 222 may be between 0.1 .mu.m and 5.0 .mu.m. The external environmental stress on, and internal stress of first encapsulation layer 154*a* after etching second sacrificial layer 222 may impact the thickness of first encapsulation layer 154*a*. Slightly tensile films may self-support better than compressive films which may buckle.

Figure 4E:
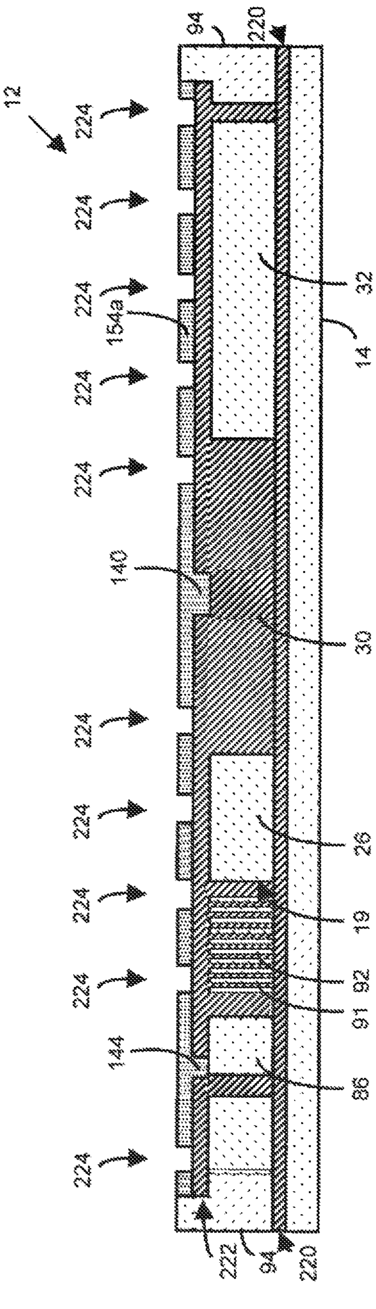
Figure 5E:
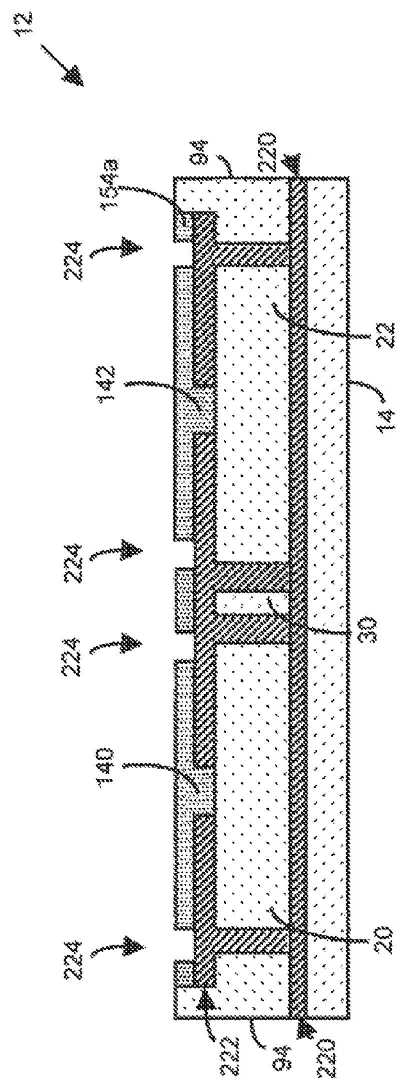

Referring to FIG. 4E and FIG. 5E, the first encapsulation layer 154*a* may be etched to form passages or vents, e.g., vents 224. In one exemplary embodiment, vents 224 have a diameter or aperture size of between 0.1 .mu.m to 2 .mu.m. In some embodiments, the vents have a diameter or aperture size of about 1 um and are spaced apart by about 10 um.

Figure 4F:
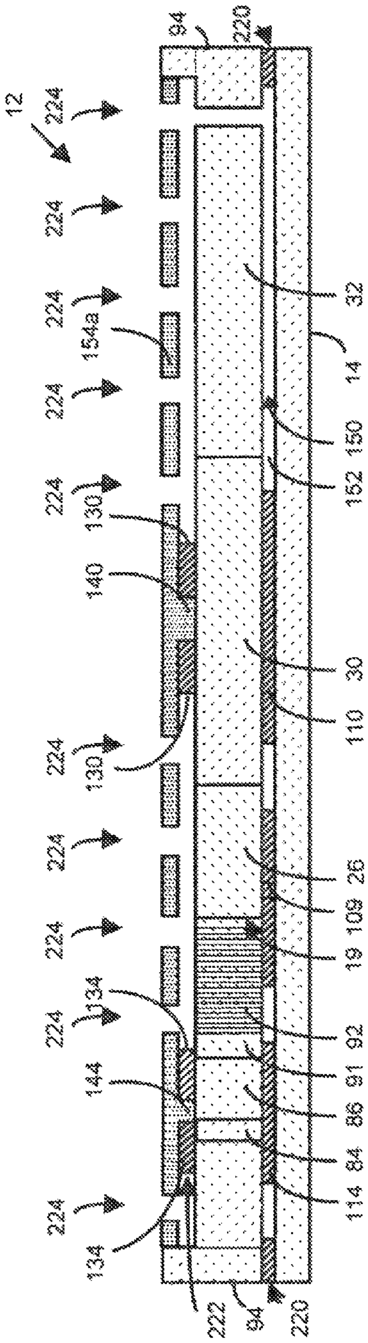
Figure 5F:
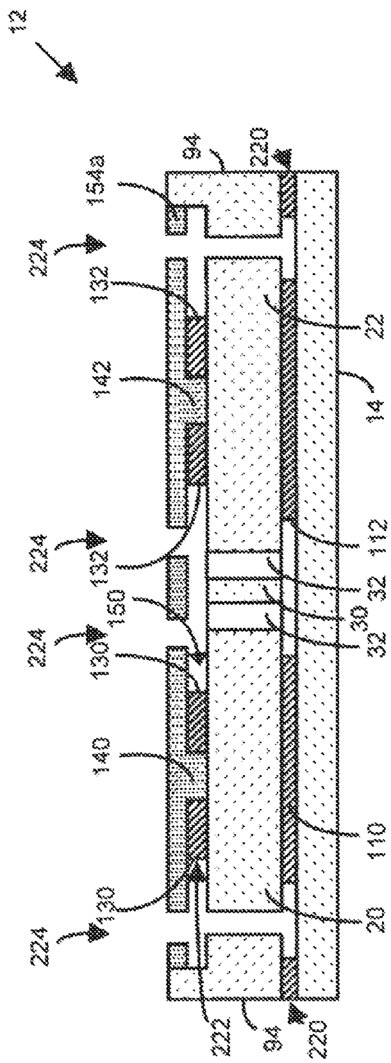

Referring to FIG. 4F and FIG. 5F, the vents 224 permit etching and/or removal of at least selected portions of first and second sacrificial layers 220 and 222, to release one or more portions of one or more of the mechanical structures, e.g., electrodes 19, 20, 22, 84, 86. As stated above, the mass portion 32 may define a plurality of openings, e.g., openings 70 (FIG. 2C) to facilitate etching and/or removal of sacrificial material from beneath the mass portion 32.

After the etching and/or removal of at least selected portions of first and second sacrificial layers 220, 222, one or more areas of the mechanical structures, e.g., electrodes 19, 20, 22, 84, 86, may remain partially, substantially or entirely surrounded by portions of first sacrificial layer 220 and/or second sacrificial layer 222. For example, one or more portions of first sacrificial layer 220 may remain to define one or more insulation areas, e.g., insulation areas 109, 110, 112, 114, 116, to support one or more of the mechanical structures, e.g., electrodes 19, 20, 22, 84, 86, respectively, and/or to electrically isolate one or more of the mechanical structures, e.g., electrodes 19, 20, 22, 84, 86, respectively, from the substrate 14. One or more portions of the first sacrificial layer 220 and/or the second sacrificial layer 222, e.g., areas 130, 132, 134, 136, of second sacrificial layer 222, may remain to partially, substantially or entirely surround contact areas 20*a*, 22*a* 84*a*, 86*a* of electrodes 20, 22, 84, 86, respectively.

In this regard, one or more of the methods mentioned in the Microelectromechanical Systems Having Trench Isolated Contacts Patent may be employed. As mentioned in the Microelectromechanical Systems Having Trench Isolated Contacts Patent, the contact area may remain partially, substantially or entirely surrounded by portions of first and second sacrificial layers. For example, with reference to FIG. 4F of the Microelectromechanical Systems Having Trench Isolated Contacts Patent, while mechanical structures are released from their respective underlying oxide columns, a portion of second sacrificial layer (i.e., juxtaposed electrical contact area) may remain after etching or removing second sacrificial layer. Such portion of second sacrificial layer may function as an etch stop during later processing.

Figure 4G:
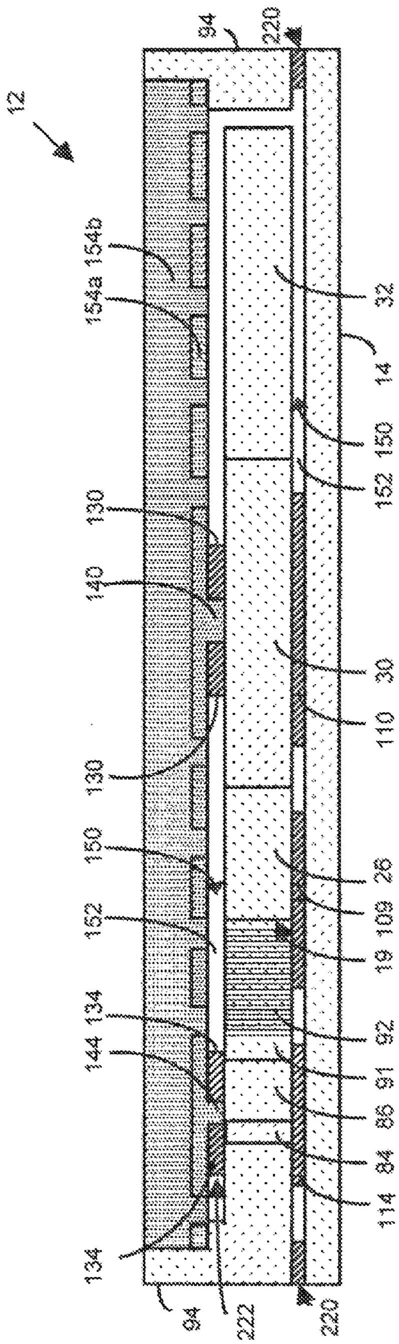
Figure 4H:
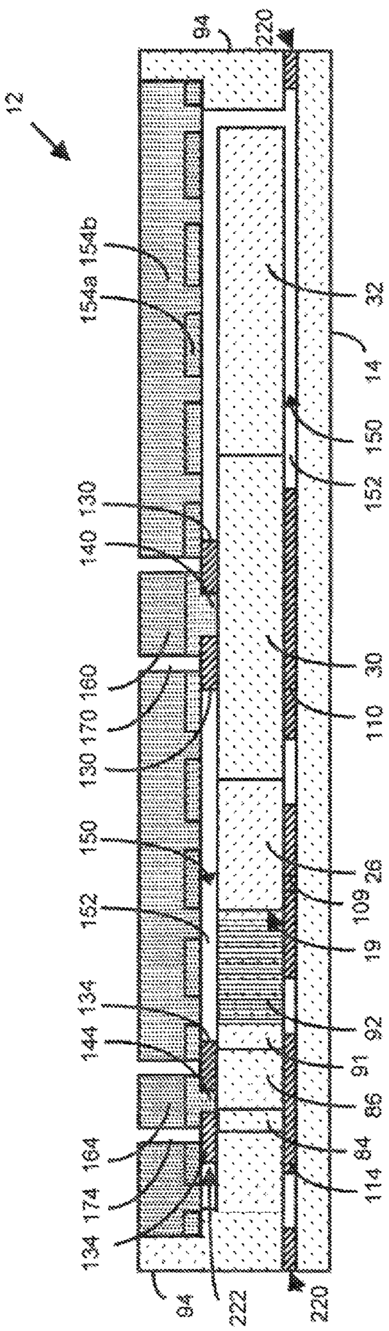
Figure 4I:
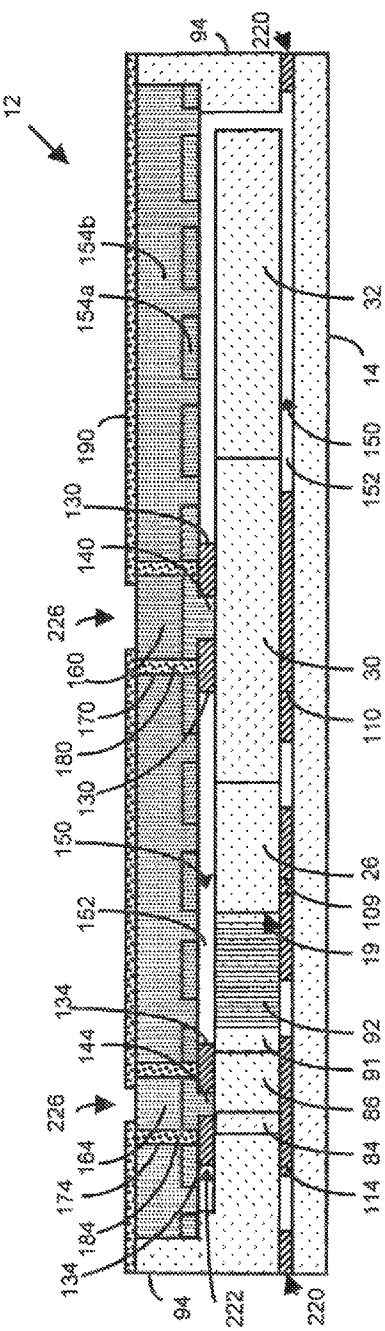
Figure 5G:
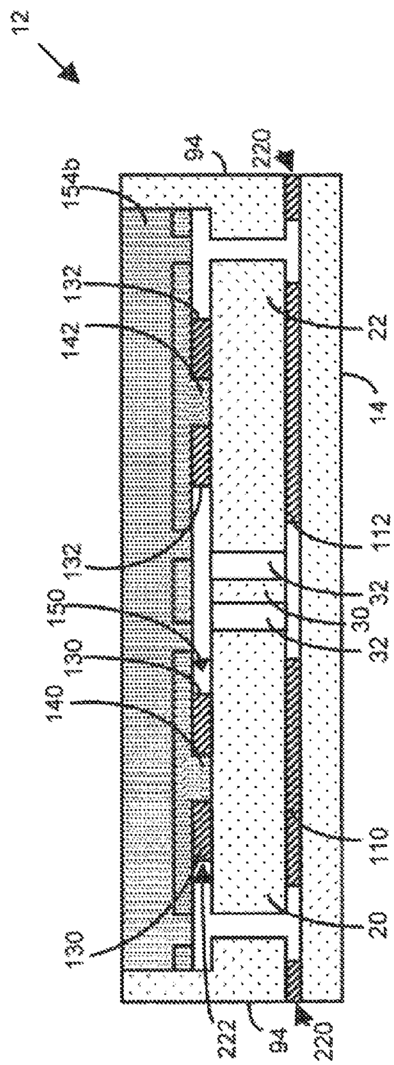
Figure 5H:
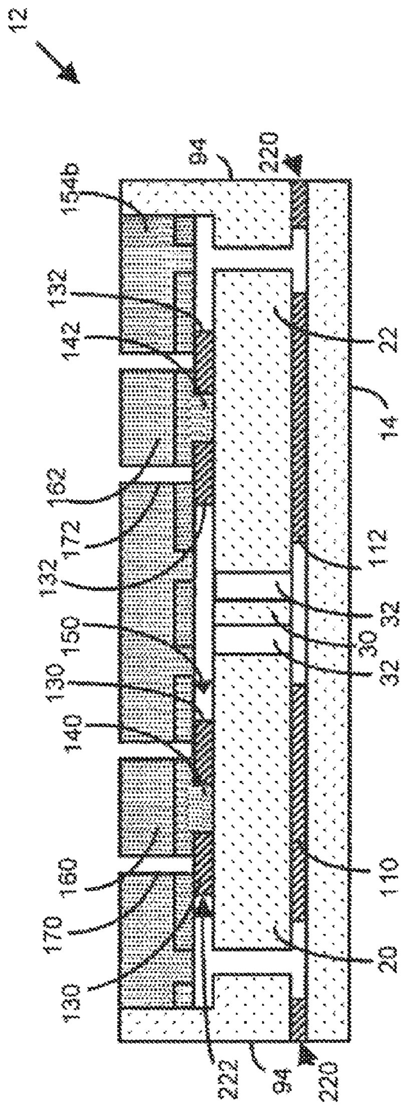
Figure 5I:
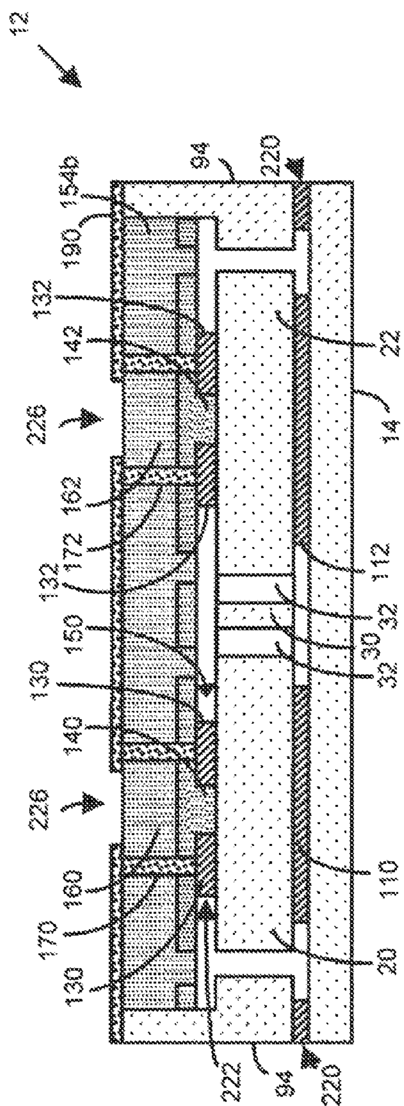

With reference to FIG. 4G and FIG. 5G, after releasing one or more portions of the mechanical structures, e.g., electrodes 19, 20, 22, 84, 86, second encapsulation layer 154*b* may be deposited, formed and/or grown. The second encapsulation layer 154*b* may be, for example, a silicon-based material (for example, a polycrystalline silicon or silicon-germanium), which is deposited using, for example, an epitaxial, a sputtering or a CVD-based reactor (for example, APCVD, LPCVD, or PECVD). The deposition, formation and/or growth may be by a conformal process or non-conformal process. The material may be the same as or different from first encapsulation layer 154*a*.

With reference to FIG. 4H-4I and FIG. 5H-5I, one or more contact areas of one or more of the mechanical structures, e.g., contact areas 20*a*, 22*a*, 84*a*, 86*a*, of electrodes 20, 22, 84, 86, respectively, may thereafter be dielectrically isolated from the surrounding conductor and/or semiconductor layers. For example, trenches, e.g., trenches 170, 172, 174, 176, may be etched (see FIG. 4H and FIG. 5H). As described below, an insulating material may be deposited in the trenches, e.g., trenches 170, 172, 174, 176, to form dielectric isolation regions, e.g., dielectric isolation regions 180, 182, 184, 186, respectively (See FIG. 4I and FIG. 5I). The insulating material may be, for example, silicon dioxide, silicon nitride, BPSG, PSG, or SOG. The trenches, e.g., trenches 170, 172, 174, 176, may include a slight taper in order to facilitate the formation of the dielectric isolation regions, e.g., dielectric isolation regions 180, 182 184, 186, respectively.

The insulating layer 190 may be deposited, formed and/or grown on the exposed surface of second encapsulating layer 154*b* to provide insulation between the various surrounding conductive and/or semiconductor layers and the subsequent conductive layer. During deposition, formation and/or growth of insulation layer 190, trenches may also be filled to form the dielectric isolation regions 180, 182, 184, 186. Thereafter, openings 226 may be formed and/or etched in insulation layer 190, for example, using conventional etching techniques. Openings 226 may facilitate electrical connection to contact areas of mechanical structures, e.g., contact areas 20*a*, 22*a*, 84*a*, 86*a* of electrodes 20, 22, 84, 86, respectively.

Figure 4J:
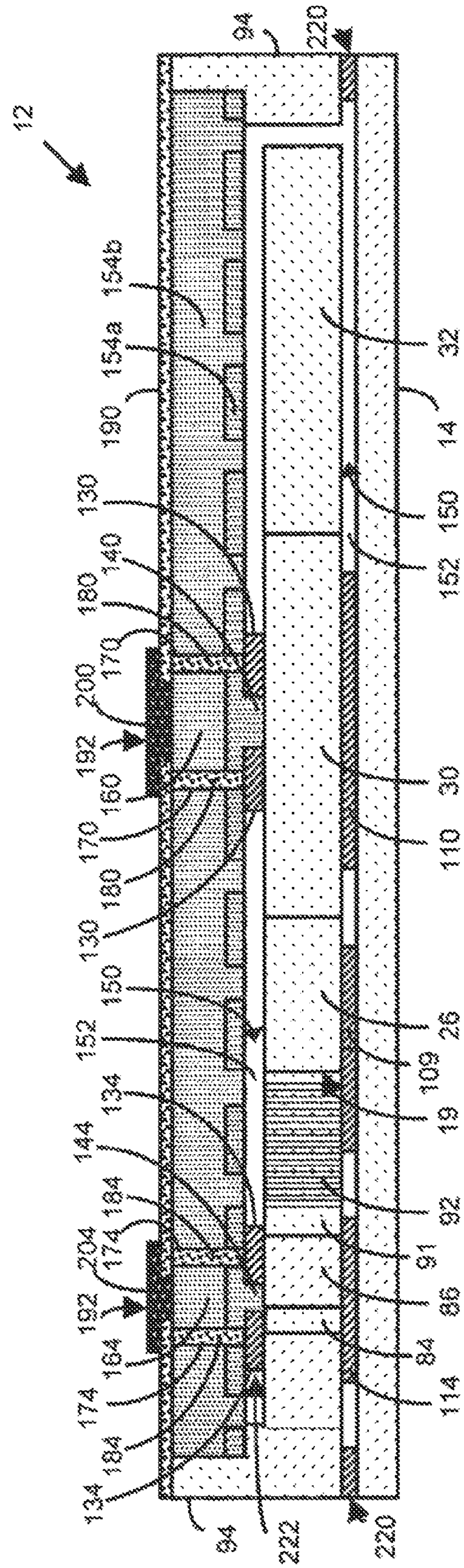
Figure 5J:
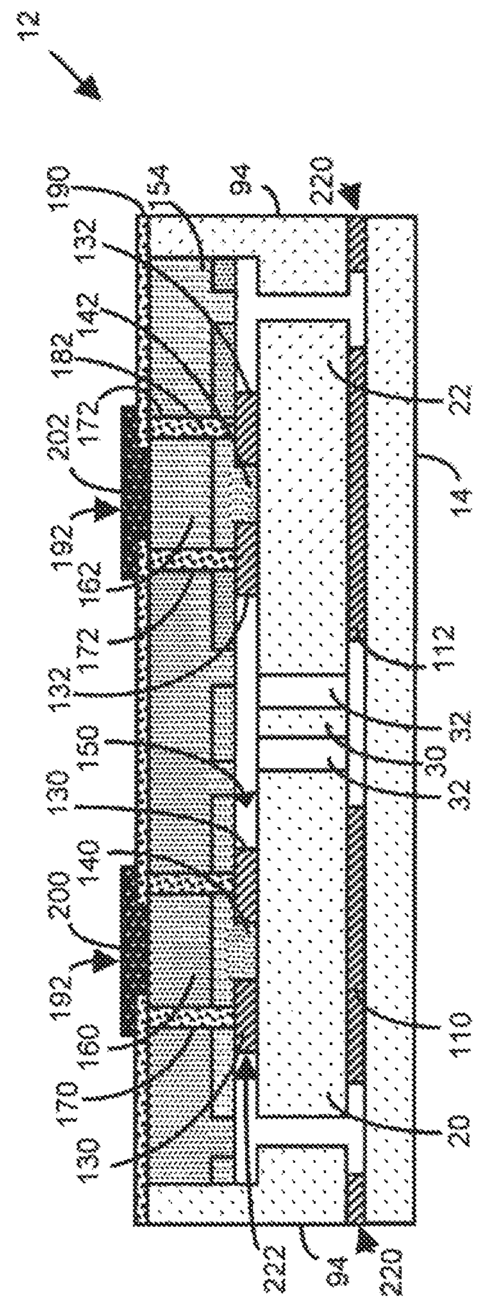

Referring to FIG. 4J and FIG. 5J, the conductive layer 192 may then be deposited and/or formed. Conductive layer 192 may be patterned to provide one or more conductive regions, e.g., conductive regions 200, 202, 204, 206, respectively, to provide electrical connections to one or more contact areas of one or more of the mechanical structures, e.g., contact areas 20*a*, 22*a*, 84*a*, 86*a*, of electrodes 20, 22, 84, 86, respectively.

Patterning of conductive layer 192 may begin, for example, by applying a layer of photoresist over the conductive layer 192. The photoresist may thereafter be patterned (e.g., portions of the photoresist are exposed and developed away) to expose the portions of the conductive layer 192 that are to be removed. An etch may subsequently be performed wherein the photoresist covered portions of the conductive layer 192 (i.e., the portions of the conductive layer defining the conductive regions 192) are left intact and the other portions of the conductive layer 192 are removed.

In this embodiment, conductive layer 192 comprises any type of conductive material, for example, metal (e.g., aluminum, chromium, gold, silver, molybdenum, platinum, palladium, tungsten, titanium, copper, and/or an alloy of one or more thereof, non-metal and/or conductive adhesive material. In some embodiments, conductive layer 192 comprises one or more portions that are sputtered and, if necessary patterned. In addition, shadow mask technology may be employed to deposit and/or pattern conductive layer 192.

Fluid may be disposed within the chamber. The state of the fluid within chamber 150 (for example, the pressure), after deposition and/or formation of chamber may be determined using conventional techniques and/or using those techniques described and illustrated in U.S. Patent Application Publication 20040183214 of non-provisional patent application entitled "Electromechanical System having a Controlled Atmosphere, and Method of Fabricating Same", which was filed on Mar. 20, 2003 and assigned Ser. No. 10/392,528 (hereinafter "the Electromechanical System having a Controlled Atmosphere Patent Application Publication"). For the sake of brevity, all of the inventions regarding controlling the atmosphere within chamber 150 which are described and illustrated in the Electromechanical System having a Controlled Atmosphere Patent Application Publication will not be repeated here. It is expressly noted, however, that the entire contents of the Electromechanical System having a Controlled Atmosphere Patent Application Publication, including, for example, the features, attributes, alternatives, materials, techniques and advantages of all of the inventions, are incorporated by reference herein, although, unless stated otherwise, the aspects and/or embodiments of the present invention are not limited to such features, attributes alternatives, materials, techniques and advantages.

As stated above, in this embodiment, insulation areas 109, 110, 112, 114, 116, insulation areas 130, 132, 134, 136, and the atmosphere contained within the chamber 150 are sufficiently free of surface contaminants that would otherwise result in excessive reduction in electrical isolation, excessive surface leakage and/or excessive drainage of the electrical charge on the one or more portions of the micromachined mechanical structure on which electrical charge is desired to be stored (relative to any requirements, in such embodiments, that relate, directly and/or indirectly, to contamination, electrical isolation, leakage and/or drainage of the electrical charge).

In that regard, as stated above, some embodiments may be able to tolerate more contamination, less electrical isolation, more leakage and/or more drain of electrical charge than other embodiments. To that effect, as stated above, the term "sufficiently free" means "sufficiently free" relative to any requirements, in any given embodiment, that relate, directly and/or indirectly, to contamination. For example, a surface and/or atmosphere that is not "sufficiently contaminant free" for one embodiment may nonetheless be "sufficiently contaminant free" for another embodiment.

In some embodiments, the surfaces on the insulation areas 109, 110, 112, 114, 116, 130, 132, 134, 136, and the atmosphere within the chamber 150 are provided sufficiently free of surface contaminants by removing the at least selected portions of first and second sacrificial layers 220, 222 and sealing the chamber using techniques that leave the surfaces of the remaining portions, e.g., insulation areas 109, 110, 112, 114, 116, insulation areas 130, 132, 134, 136, and the atmosphere within the chamber 150 sufficiently free of surface contaminants that would otherwise result in excessive reduction in electrical isolation, excessive surface leakage and/or excessive drainage of the electrical charge on the one or more portions of the micromachined mechanical structure on which electrical charge is desired to be stored.

In this regard, it has been determined that the surfaces on the insulation areas 109, 110, 112, 114, 116, 130, 132, 134, 136, and the atmosphere within the chamber 150 may be provided sufficiently free of surface contaminants by removing the at least selected portions of first and second sacrificial layers 220, 222 and subsequently sealing the chamber using technique(s) set forth in (1) Electromechanical System having a Controlled Atmosphere Patent Application Publication, (2) Microelectromechanical Systems Having Trench Isolated Contacts Patent, (3) U.S. Patent Application Publication No. 20040248344 of non-provisional patent application entitled "Microelectromechanical Systems, and Method of Encapsulating and Fabricating Same", which was filed on Jun. 4, 2003 and assigned Ser. No. 10/454,867 (hereinafter "Microelectromechanical Systems and Method of Encapsulating Patent Application Publication") and/or (4) U.S. Pat. No. 6,952,041 issued to Lutz et al. and entitled "Anchors for Microelectromechanical Systems Having an SOI Substrate, and Method for Fabricating Same", which was filed on Jul. 25, 2003 and assigned Ser. No. 10/627,237 (hereinafter the "Anchors for Microelectromechanical Systems Patent"), for example, as described above with respect to FIGS. 4A-4J and FIGS. 5A-5J. The entire contents of the Electromechanical System having a Controlled Atmosphere Patent Application Publication, the Microelectromechanical Systems Having Trench Isolated Contacts Patent, the Microelectromechanical Systems and Method of Encapsulating Patent Application Publication and the Anchors for Microelectromechanical Systems Patent, including, for example, the features, attributes, alternatives, materials, techniques and advantages of all of the inventions, are incorporated by reference herein, although, unless stated otherwise, the aspects and/or embodiments of the present invention are not limited to such features, attributes alternatives, materials, techniques and advantages.

Thus some embodiments, employ technique(s) set forth in (1) Electromechanical System having a Controlled Atmosphere Patent Application Publication, (2) Microelectromechanical Systems Having Trench Isolated Contacts Patent, (3) Microelectromechanical Systems and Method of Encapsulating Patent Application Publication and//or (4) Anchors for Microelectromechanical Systems Patent, for example, as described above with respect to FIGS. 4A-4J and FIGS. 5A-5J.

Some embodiments have the ability to supply electrical charge to the first electrode 19 (and/or other portion(s) of micromachined mechanical structure 12) and to store at least a portion of the electrical charge on the electrode 19 (and/or other portion(s) of micromachined mechanical structure 12) for a period of at least ten years.

In such embodiments, insulation areas 109, 110, 112, 114, 116, insulation areas 130, 132, 134, 136, and the atmosphere contained within the chamber 150 are sufficiently free of surface contaminants that would otherwise result in excessive reduction in electrical isolation, excessive surface leakage and/or excessive drainage of the electrical charge (relative to any requirements, in such embodiments, that relate, directly and/or indirectly, to contamination, electrical isolation, leakage and/or drainage of the electrical charge), so as to help provide the ability to store at least a portion of the electrical charge for a period of at least ten years.

In that regard, some of such embodiments employ technique(s) set forth in (1) Electromechanical System having a Controlled Atmosphere Patent Application Publication, (2) Microelectromechanical Systems Having Trench Isolated Contacts Patent, (3) Microelectromechanical Systems and Method of Encapsulating Patent Application Publication and//or (4) Anchors for Microelectromechanical Systems Patent, for example, to remove the at least selected portions of first and second sacrificial layers 220, 222 and subsequently seal the chamber so as to leave the surfaces of the remaining portions, e.g., insulation areas 109, 110, 112, 114, 116, insulation areas 130, 132, 134, 136, and the atmosphere within the chamber 150 sufficiently free of surface contaminants that would otherwise result in excessive reduction in electrical isolation, excessive surface leakage and/or excessive drainage of the electrical charge for such embodiment (relative to any requirements, in such embodiments, that relate, directly and/or indirectly, to contamination, electrical isolation, leakage and/or drainage of the electrical charge), so as to help provide the ability to store at least a portion of the electrical charge for a period of at least ten years.

Some other embodiments may not provide the ability to store at least a portion of the electrical charge for a period of at least ten years. For example, as further described below, in some applications, there is no need to store at least a portion of the electrical charge for ten years. In that regard, some applications require the ability to store at least a portion of the electrical charge for at least one day. To that effect, some embodiments provide the ability to store at least a portion of the electrical charge for a period of at least one day. Some other applications require the ability to store at least a portion of the electrical charge for a period of at least one month. To that effect, some embodiments provide the ability to store at least a portion of the electrical charge for a period of at least one month. Some other applications require the ability to store at least a portion of the electrical charge for a period of at least one year. To that effect, some embodiments provide the ability to store at least a portion of the electrical charge for a period of at least one year.

In such embodiments, the insulation areas 109, 110, 112, 114, 116, insulation areas 130, 132, 134, 136, and the atmosphere contained within the chamber 150 are sufficiently free of surface contaminants that would otherwise result in excessive reduction in electrical isolation, excessive surface leakage and/or excessive drainage of the electrical charge, (relative to any requirements, in the respective embodiment, that relate, directly and/or indirectly, to contamination, electrical isolation, leakage and/or drainage of the electrical charge), so as to help provide the ability to store at least a portion of the electrical charge for at least the period of time required in the respective embodiment, i.e., at least one day, at least one month and/or at least one year.

To that effect, some of such embodiments employ technique(s) set forth in (1) Electromechanical System having a Controlled Atmosphere Patent Application Publication, (2) Microelectromechanical Systems Having Trench Isolated Contacts Patent, (3) Microelectromechanical Systems and Method of Encapsulating Patent Application Publication and//or (4) Anchors for Microelectromechanical Systems Patent, for example, to remove the at least selected portions of first and second sacrificial layers 220, 222 and subsequently seal the chamber so as to leave the surfaces of the remaining portions, e.g., insulation areas 109, 110, 112, 114, 116, insulation areas 130, 132, 134, 136, and the atmosphere within the chamber 150 sufficiently free of surface contaminants that would otherwise result in excessive reduction in electrical isolation, excessive surface leakage and/or excessive drainage of the electrical charge (relative to any requirements, in the respective, that relate, directly and/or indirectly, to contamination, electrical isolation, leakage and/or drainage of the electrical charge), so as to help provide the ability to store at least a portion of the electrical charge for at least the period of time required in the respective embodiment, i.e., at least one day, at least one month and/or at least one year.

Other types of encapsulation, now known or later developed, may be employed in addition to and/or in lieu of the encapsulation described above.

FIGS. 6A-6D illustrate stages that may be employed in supplying, storing and/or trapping charge on the first electrode 19 of the transducer 16 (and/or any other portion(s) of the micromachined mechanical structure 12 on which charge is to be stored), in accordance with certain aspects of the present invention. Referring to FIG. 6A, in a first stage, one or more of the first and second electrodes 84, 86 are electrically connected to a first power source, e.g., a first voltage source 300. The first power source, e.g., first voltage source 300, supplies an electric current 302 that flows through one or more of the electrodes 84, 86 and the fuse 89 to supply charge to the first electrode 19 of the transducer (or other mechanical structure(s) on which charge is to be stored). The charge supplied to the first electrode 19 of the transducer 16 (or other mechanical structure(s) on which charge is to be stored) may cause an increase in the voltage thereof.

The charge supplying process may continue until a desired amount of charge has been supplied, e.g., until the electrode 19 (or other mechanical structure(s) on which charge is to be stored) has a desired voltage. In some embodiments, first power source, e.g., first voltage source 300, supplies a voltage that is equal to the voltage desired for electrode 19 (or other mechanical structure(s) on which charge is to be stored), and the charge supplying process proceeds until the voltage of the electrode 19 (or other mechanical structure(s) on which charge is to be stored) is equal to the voltage supplied by the first power source, e.g., voltage source 300, and then stops. As further described hereinafter, in some embodiments, the desired voltage is within a range of from about 100 volts to about one thousand volts.

In some embodiments, MEMS 10 has one or more characteristics (e.g. a voltage, a resonant frequency) indicative of the amount of charge that has been supplied to the electrode 19 (and/or other mechanical structure(s) on which charge is to be stored). In such embodiments, one or more of such characteristics may be measured and compared to one or more reference magnitudes to determine whether the desired amount of charge has been supplied. For example, movable mechanical structure 28 of first electrode 19 (and/or other mechanical structure(s) on which charge is to be stored) may have a resonant frequency indicative of the amount of charge supplied to the first electrode 19 (and/or other mechanical structure(s) on which charge is to be stored). The resonant frequency of the movable mechanical structure 28 may thus be measured and compared to a reference magnitude indicative of a resonant frequency that would be exhibited by the movable mechanical structure 28 if the first electrode 19 (and/or other mechanical structure(s) on which charge is to be stored) has the desired amount of charge stored thereon), so as to determine whether the desired amount of charge has been supplied thereto. The charge supplying process may be stopped if it is determined that the desired amount of charge has been supplied (e.g., reached or exceeded).

The charge supplying process may be continuous or discontinuous (periodic or non-periodic), fixed in rate or time varying in rate, and/or combinations thereof. In that regard, the electric current 302 may be continuous or discontinuous (e.g., periodic or non-periodic), fixed in magnitude or time varying in magnitude, direct current or alternating current, and/or any combination of the above.

After a desired amount of charge has been supplied, it may be desirable to "blow" (e.g., melt and/or rupture), one or more portions of the breakable link 88, e.g., fuse 89, so as to break the connection between the electrodes 84, 86 and the electrode 19 of the transducer (or other mechanical structure(s) on which charge is to be stored) and thereby disconnect the first power source, e.g., first voltage source 300, from such electrode 19 (or other mechanical structure(s) on which charge is to be stored).

To that effect, and with reference to FIG. 6B, a second power source, e.g., a second voltage source 304, may be connected to one or more of the first and second electrodes 84, 86. The second power source, e.g., second voltage source 304, may be used to supply an electric current 306 that flows through electrode 84, one or more portions of fuse 89 and electrode 86. The current 306 cause one or more portions of the fuse 89 to dissipate power and produce heat.

Figure 6D:
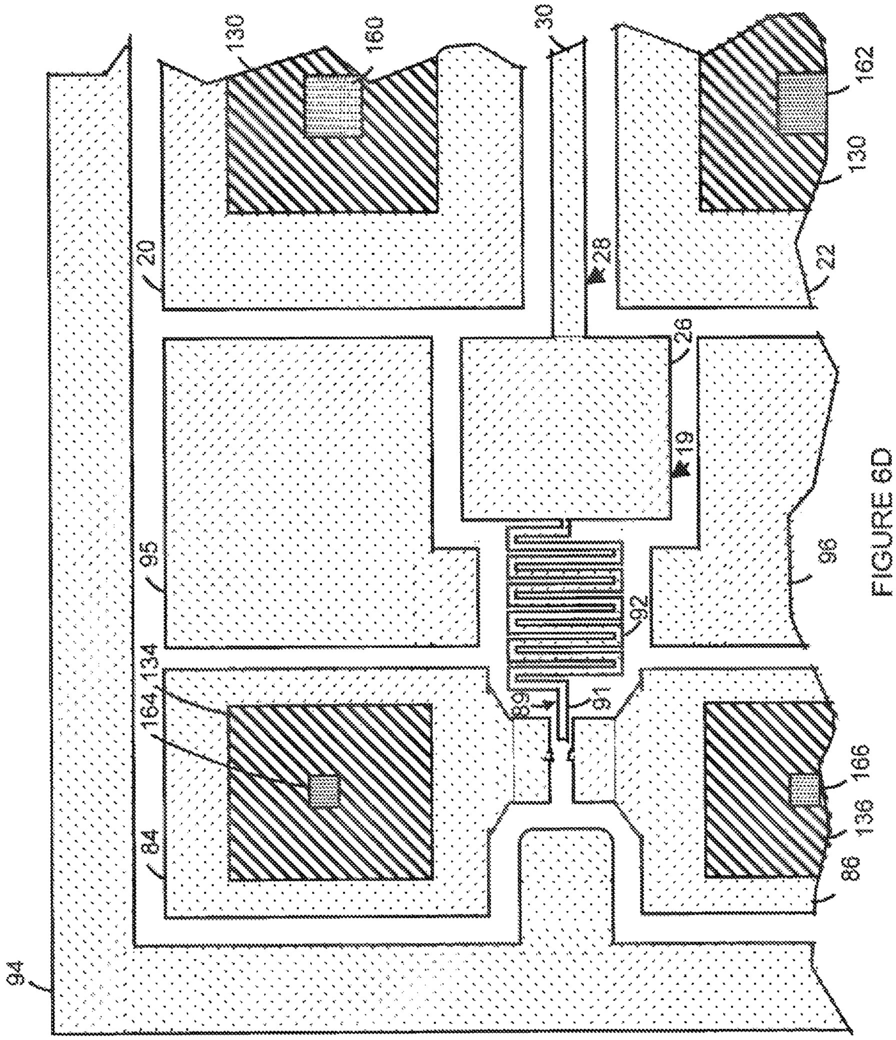

With reference to FIG. 6C, if the heat is of sufficient magnitude and/or duration, one or more portions of the fuse 89, e.g., first portion 90, reaches or exceeds a temperature at which such portion(s) "blow" (e.g., melt and/or rupture), thereby breaking the connection between the electrodes 84, 86 and the electrode 19 (or other mechanical structure(s) on which charge is to be stored) and disconnecting the first power source, e.g., first voltage source 300, from the electrode 19 (or other mechanical structure(s) on which charge is to be stored). With reference to FIG. 6D, thereafter, micromachined mechanical structure 12 may be disconnected from the first power source, e.g., the first voltage source 300, and the second power source, e.g., the second voltage source 304.

Unless specified otherwise, the term "breaking" includes but is limited to suspending, interrupting, halting, stopping, melting, blowing (e.g., melting, rupturing and/or exploding), fracturing, shattering, bursting, and/or destroying. Likewise, the term “break” includes but is limited to suspend, interrupt, halt, stop, melt, blow (e.g., melt, rupture and/or explode), fracture, shatter, burst, and/or destroy. Breaking may be reversible or irreversible and/or a combination thereof. Irreversible breaking includes fracturing, shattering, bursting, melting, blowing (e.g., melting, rupturing and/or exploding) and/or destroying.

Notably, at the end of the charge supplying process employed in the embodiment of FIGS. 6A-6D, the first electrode 19 (and/or any other portion(s) of the structure on which charge is to be stored) is electrically isolated from all other electrically conductive structures within the chamber and outside of the chamber.

In some embodiments, an electrical isolation of at least ten teraohms or another a high DC resistance is provided between the first electrode 19 and other electrically conductive structures within the chamber including, for example, each of the other electrodes 20, 22 and the electrodes 84, 86 temporarily connected to the power source during the charge supplying process. Such a configuration helps reduce the possibility of excessive surface leakage within the chamber and/or leakage through electrodes 84, 86 and out the chamber that could otherwise lead to excessive drain of the electrical charge on the one or more portions of the micromachined mechanical structure on which electrical charge is desired to be stored.

In addition, as stated above, at the end of the charge supplying process employed in this embodiment, the first electrode 19 (and/or any other portion(s) of the structure on which charge is to be stored) is also electrically isolated from electrically conductive structures outside the chamber. As stated above, structures outside the chamber may have more contamination and/or greater potential for leakage current and/or drain than structures inside the chamber. Thus, providing electrical isolation from conductive structures outside of the chamber may significantly reduce leakage current and/or drain.

In some embodiments, an electrical isolation of at least ten teraohms or another high DC resistance is provided, thereby reducing the possibility of excessive leakage through the one or more mechanical structures 82 to points outside the chamber that could otherwise lead to excessive drain of the electrical charge on the first electrode 19 (and/or any other portion (s) of the structure on which charge is to be stored).

Notably, some embodiments may not need to electrically isolate the first electrode 19 (and/or any other portion(s) of the structure on which charge is to be stored and/or trapped) from electrically conductive structures outside the chamber. For example, the leakage and/or drain without such isolation may not be excessive for some embodiments. In some such embodiments, a permanent electrical connection (and/or other configuration) may be employed instead of a breakable link. Alternatively, the one or more mechanical structures 82 may be eliminated and first electrode 19 (and/or any other portion(s) of the structure on which charge is to be stored) may be provided with a contact area electrically connected to one or more electrically conductive structures outside the chamber.

In some embodiments, the first power source, e.g., the first voltage source 300, may include a current limiter (not shown) to limit the magnitude of the electric current 302 to a magnitude that is low enough to reduce the possibility of blowing (e.g., melting and/or rupturing) the fuse 89 before a desired amount of charge has been supplied to the electrode 19 (or other mechanical structure(s) on which charge is to be stored).

Any number and type of considerations may be employed in determining the amount of charge to be supplied to the electrode 19 (or other mechanical structure(s) on which charge is to be stored). For example, it may be desirable to supply an amount of charge that is sufficient to facilitate a desired level of performance (e.g., efficiency, signal to noise ratio, accuracy and/or speed) on the part of the MEMS 10. In some embodiments, for example, MEMS 10 may not provide a desired level of performance (e.g., efficiency and/or signal to noise ratio), in whole or in part, unless a sufficient amount of charge is supplied to the electrode 19 (or other mechanical structure(s) on which charge is to be stored). Thus, for example, if the transducer is employed as an energy harvesting device, it may be advantageous to supply enough electrical charge to allow the transducer to generate enough electrical energy to allow the device to meet a desired level of performance. If a transducer is employed as sensor, it may be advantageous to supply enough electrical charge to allow the transducer to meet the desired level of performance of the sensor.

Performance requirements may vary from application to application. For example, a device having a sensor and an interface circuit for wireless communication may require twice as much, or more, electrical power than a similar device without wireless communication. Moreover, the amount of power required by a device may depend greatly on the type of sensor and/or the sample rate in the application. Some sensors require more power than other sensors and increasing the sample rate of a given sensor generally increases the amount of power required by that sensor. Some applications require a higher sample rate than others. A pollution monitoring application, for example, may employ a sample rate of one sample per minute or one sample per ten minutes. A tire monitoring application may employ a sample rate of one sample per second or one sample per minute. On the other hand, an airbag application may employ a sample rate of one thousand samples per second or higher.

Another possible consideration is breakdown voltage. Some gaps and structures (e.g., insulators and/or non-conductive structures) have a breakdown voltage associated therewith. Undesirable consequences (e.g., arcing and/or breakdown) can occur if the voltage across a gap or structure exceeds the breakdown voltage of such gap or structure. Thus, it may be advantageous to limit the stored charge to an amount that is small enough to ensure that the voltage across any gap or structure does not exceed the breakdown voltage thereof. In some embodiments, insulators and/or non conductive structures have a dielectric strength of $1\times10^{9}$ volts/meter, a thickness of $1\times10^{4}$ meters and a breakdown voltage of approximately 1000 volts. In some embodiments, the relationship between the breakdown voltage of an insulator and/or non conductive structure, the dielectric strength of the insulator and/or non conductor and the thickness of the insulator and/or non conductor is as follows:

$$\text{breakdown voltage}=\text{dielectric strength}\times\text{thickness} \qquad (1)$$

where breakdown voltage is expressed in volts, dielectric strength is expressed, for example, in volts/meter and thickness is expressed, for example, in meters.

Even if the breakdown voltage is not exceeded, a voltage across an insulator and/or non-conductive structure may cause the properties thereof to degrade over time. Thus, if a MEMS is to operate for a long period of time, it may be desirable to limit the stored charge to an amount that is small enough to ensure that the properties of the insulator and/or non conductive structure do not degrade excessively over the desired operational life of the MEMS. In some embodiments, it may be desirable to limit the stored charge to an amount that is small enough to ensure that the voltage across an insulator and/or non conductive structure does not exceed a small fraction, e.g., 10 percent, of the breakdown voltage of thereof. For example, if the breakdown voltage of an insulator and/or non conductive structure is 1000 volts, and the desired operational lifetime of the MEMS is 10 years, it may be desirable to limit the stored charge to an amount that is small enough to ensure that the voltage across such insulators and/or non conductive structures does not exceed 100 volts (i.e., 0.1×1000 volts). In some embodiments, it may be possible to take advantage of the fact that leakage may cause the amount of electrical charge to decrease over time.

Other considerations may include the distance and/or the attraction force between structures, e.g., (1) the distance and/or the attraction force between the second electrode 20 and the first electrode 19 and (2) the distance and/or the attraction force between the third electrode 22 and the first electrode 19. In some embodiments, for example, if an excitation (e.g., vibrational energy) causes one of the structures to move toward another structure by an amount greater than one third of the distance separating the structures in the absence of the excitation, the attraction force between such structures may increase to a magnitude that causes the structure to continue to move toward the other structure until the two structures contact one another. Thus, the attractive force may have the effect of placing limits on one or more of the parameters to be selected, for example, but not limited to, the maximum amount of charge, the minimum spring constant and/or the minimum distance between structures (e.g., the minimum distance between the second electrode 20 and the first electrode 19, the minimum distance between the third electrode 22 and the first electrode 19). In some embodiments, for example, the design of the micromachined mechanical structure ensures that a maximum expected excitation (e.g., vibrational energy) does not cause the distance between structures to decrease by an amount greater than one third of the distance separating the structures in the absence of the excitation.

Another possible consideration is the electrical isolation. In some embodiments, for example, the electrical isolation affects whether electrical charge drains from electrode 19 (and/or any other portion on which electrical charge is stored) over time, and if so, the rate of at which the charge drains. Increasing the electrical isolation may reduce the rate at which charge drains, if any, from electrode 19 (and/or any other portion on which electrical charge is stored). Decreasing the electrical isolation may increase the rate of decrease. In some embodiments, the rate of decrease is time dependent. For example, in some embodiments, the magnitude of the voltage on the first electrode 19 (and/or any other portion on which electrical charge is stored) is time dependent and in accordance with the following equation:

$$V=V_0e^{-t/RC} \quad (2)$$

where $V_0$ is the magnitude of the voltage on electrode 19, expressed in volts, at the time that electrode 19 is initially electrically isolated, t is the number of seconds since electrically isolating the first electrode 19, R is the magnitude of the insulation resistance expressed in ohms, C is the magnitude of the capacitance, expressed in farads.

Another consideration is the duration of the application. In that regard, some applications have a duration of ten years. For example, the useful life of some automobile tires and/or other automobile components is ten years, depending on the conditions and the number of miles driven each year. If a sensor is to be employed to monitor a condition of such tires, it is desirable to employ a sensor having a useful life that is as least as long as that of the tires. Thus, in some embodiments, it is desirable to have the ability to store at least a portion of the electrical charge for a period of at least ten years.

However, many applications have a duration of less than ten years. Some applications may involve sensing conditions during an event or activity of less than ten years and/or a characteristic of a device having a useful life of less than ten years. In either of such applications, there may be no need to store charge for ten years. Rather, it may be sufficient to store at least a portion of the electrical charge for period at least as long as the duration of such applications.

Some applications have a duration of up to five years. In the field of consumer electronics, for example, some devices (e.g., example, laptop computers, portable data assistants (PDA's) and calculators) may be replaced at least every five years, for example, because the devices are worn out and/or to take advantage of a new design that has become available. If a sensor is to be employed in such an application, there may be no need for a sensor having a useful life of ten years. However, it would be advantageous to have the ability to employ a sensor having a useful life that is at least five years, and/or at least as long as the expected life of the device. Thus, if the sensor employs stored electrical charge, it would be desirable to have the ability to store at least a portion of the electrical charge for a period of at least five years or at least as long as the expected life of the component.

Some applications have a duration of one year or less. Some disposable devices, for example, are replaced annually, semi-annually, or more frequently because the devices are worn out and/or because better devices are available. In the field of auto racing, for example, the useful life of many components (e.g., tires) is often less than one year. Indeed, in professional auto racing circuits, the useful life of tires is often less than one day or race. Moreover, new tire designs may become available each year or season. If a sensor is to be employed in such an application, for example, to monitor a condition relating to a tire, there may be no need for a sensor having a useful life of ten years. However, it would be advantageous to have the ability to employ a sensor having a useful life that is at least one year, and/or at least as long as the application or the expected life of the component. Thus, if the sensor employs stored electrical charge, it would be desirable to have the ability to store at least a portion of the electrical charge for a period of at least one year or at least as long as the duration of the application or the expected life of the component.

Some applications last a week or less. For example, in the field of trucking, i.e., transporting goods on trucks, shipping time is usually one week or less. In the field of overnight shipping, shipping time is typically less than one day. If a sensor is to be employed in such applications, for example, to monitor conditions (e.g., conditions relating to the shipping container and/or goods being shipped) during the shipment (via truck or overnight), it would be advantageous to employ a sensor having a useful life that is at least one week or at least as long as the duration of the application (e.g., shipment or other activity). If the sensor employs stored electrical charge, it would be advantageous to have the ability to store at least a portion of the electrical charge for a period of at least one week or at least as long as the duration of the application (e.g., shipment or other activity).

The supplying of charge may be carried out at any time(s). In some embodiments, the supplying of charge is carried out by a manufacturer of the part (and/or a manufacturer of a device that employs the part) before shipping the part (or a device employing the part) to a customer. In some embodiments, the supplying of charge is carried out by a purchaser or an end user of the part (or a device that employs the part) before, or at the time that the part (or a device that employs the part) is put into service in an application. In some embodiments, the supplying of charge is carried out during or after the application and/or in any combination of any of the above times.

If the supplying of charge is to be carried out by the manufacturer, e.g., at a factory, it may be desirable to have the ability to store charge for a period of at least one month (or some other desired period of time), even if the duration of the application is as short as a day or a week. Providing the ability to store charge for a period of at least one month (or another desired period of time) helps make it possible for a manufacturer to complete processing of the part (and/or a device employing the part), if needed, and to ship the part (or a device employing the part) to a distributor and/or end user, for use in such application, before the period expires.

As stated above, some embodiments employ a capacitance in a range of from about one femptofarad to about one nanofarad and/or a voltage in a range of from about one volt to about one thousand volts. In some embodiments, the amount of electrical charge is a range of from one femptocoulomb (one volt on a capacitance of one femptofarad) to about one micro coulomb (one thousand volts on a capacitance of one nanofarad). An equation relating charge, voltage and capacitance is as follows:

$$Q=CV \tag{3}$$

where Q is the amount of charge expressed in coulombs,

C is the magnitude of the capacitance expressed in farads and

V is the magnitude of the voltage expressed in volts.

Some embodiments supply the greatest possible amount of charge, limited, if appropriate, by one or more of the considerations set forth above, e.g., breakdown voltage, deratings, if any, and/or the available area and/or volume to provide the capacitance.

In some embodiments, it is advantageous (e.g., due to performance considerations) to have the ability to store a large percentage (i.e., at least 60%-100%) of the electrical charge supplied to electrode 19 (and/or any other portion on which electrical charge is stored). However, in some embodiments, it is satisfactory and/or desirable (e.g., for derating in long applications and/or controlling manufacturing cost) to have the ability to store a smaller percentage (i.e., at least 20% to 50%) or at least a small percentage of the electrical charge initially supplied. In some embodiments, it is satisfactory and/or desirable (e.g., for derating in long applications and/or controlling manufacturing cost) to retain a smaller percentage (i.e., 0.01% to 10%) or at least a small percentage of the electrical charge initially supplied.

In some embodiments, it may be desirable to test each part to determine the amount of electrical charge stored therein and/or the rate of any decrease in electrical charge, and to sort, sell and/or use the parts based on the results thereof. For example, each part may be sorted based on whether it has a high rate of decrease or a low rate of decrease. Parts having a high rate of decrease may be sold for and used in applications of short duration. Parts having a low rate of decrease may be sold for and used in applications of long duration.

Figure 7A:
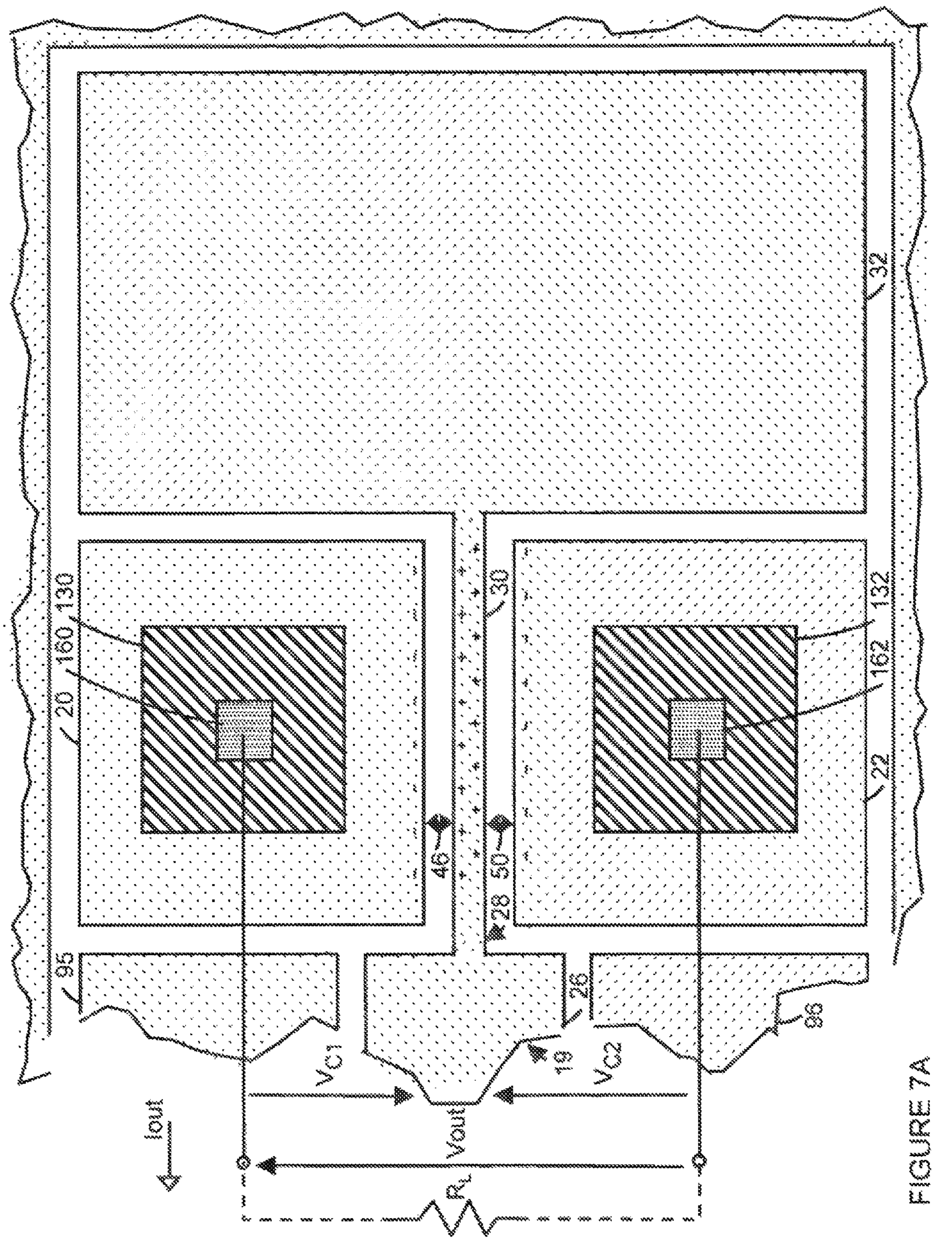
FIGS. 7A-7C illustrate plan views of the portion of micromachined mechanical structure of FIG. 2A, showing stages that may be employed in the operation of the transducer, according to certain aspects of the present invention.
Figure 7B:
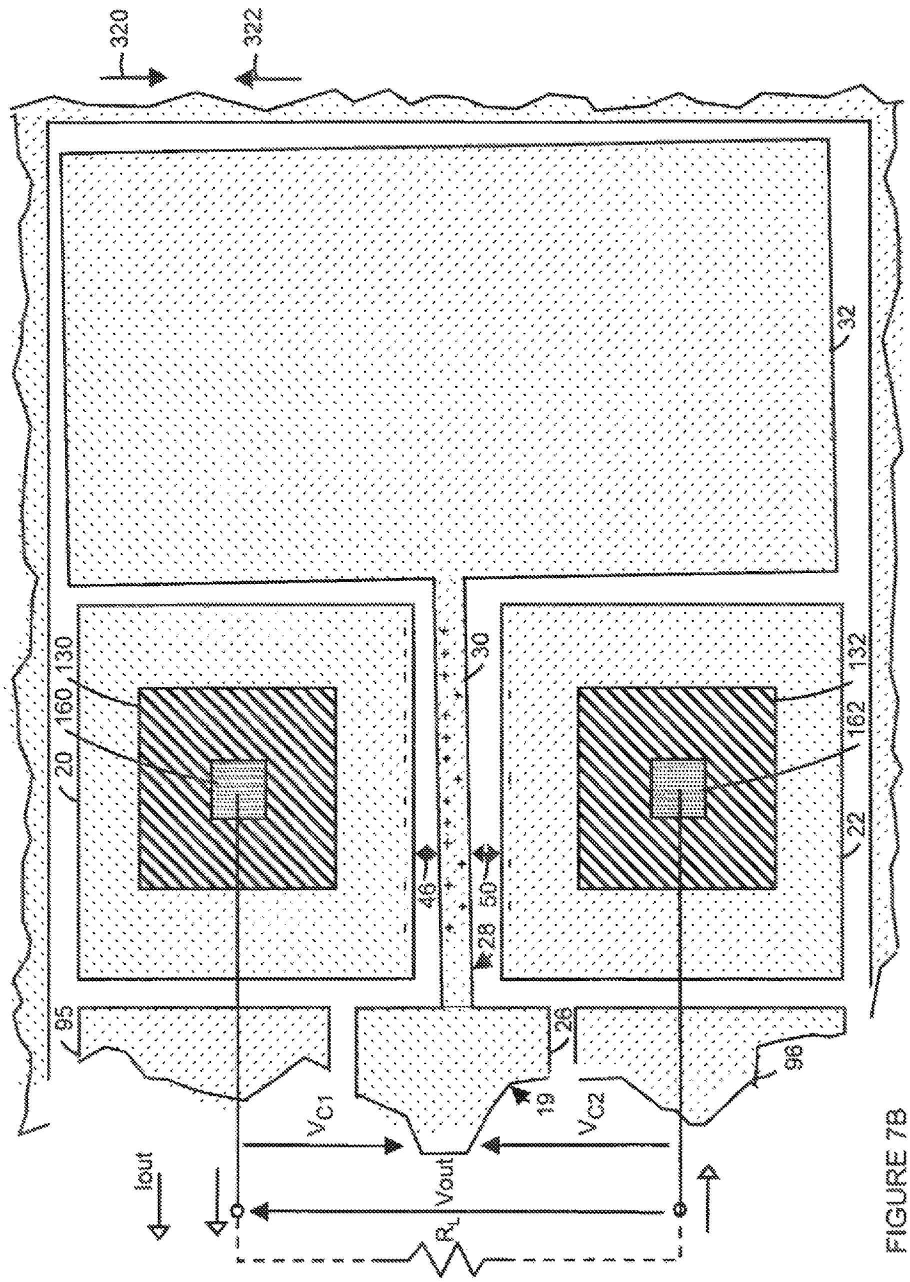
Figure 7C:
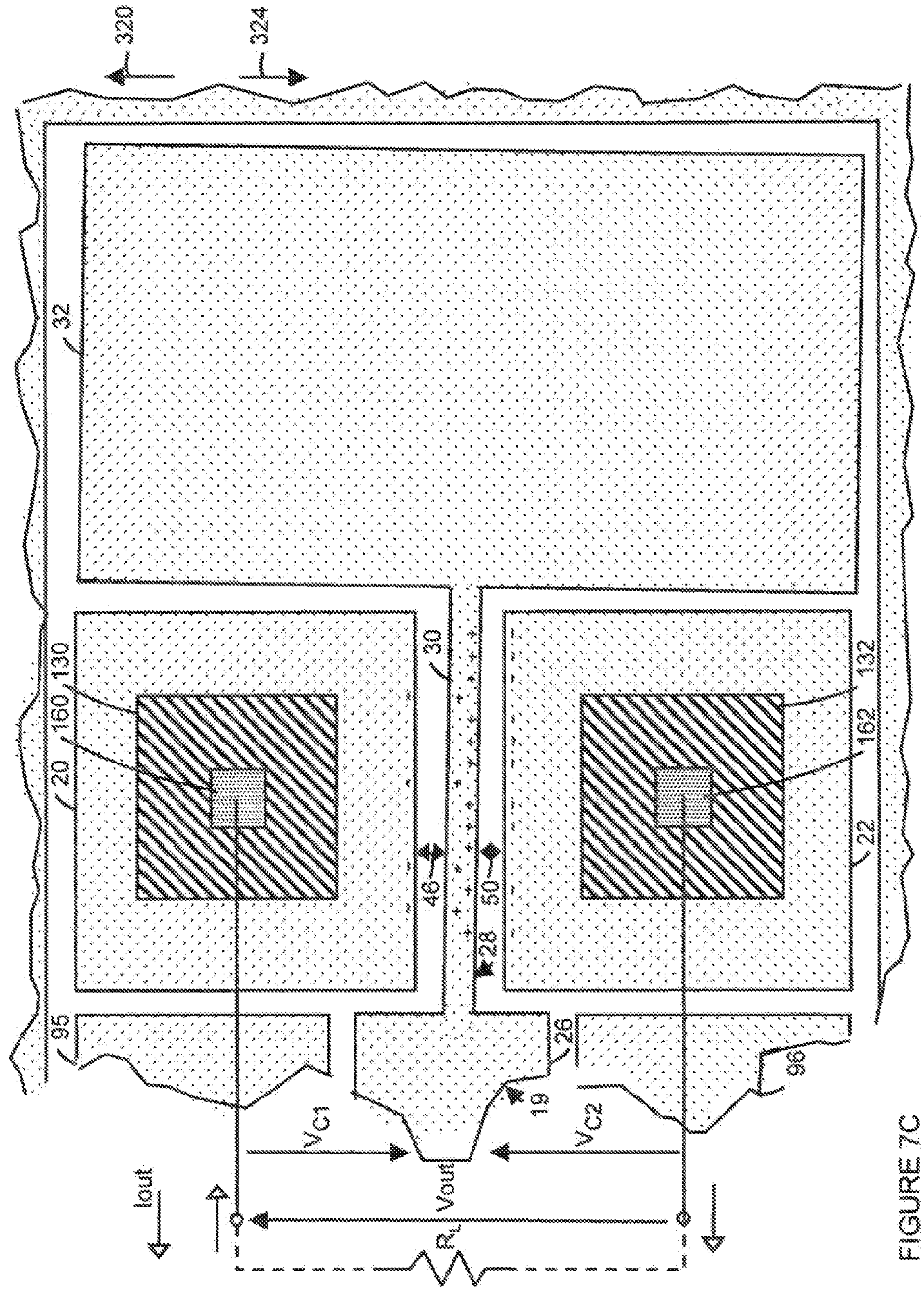

FIGS. 7A-7C illustrate plan views of a portion of the micromachined mechanical structure 12 showing stages that may be employed in the operation of the transducer, in accordance with certain aspects of the present invention. Referring to FIG. 7A, as stated above, in the absence of an excitation (e.g., vibration) the movable mechanical structure 28 of the first electrode 19 may be stationary and disposed at a position approximately centered between the second electrode 20 and the third electrode 22. With the movable mechanical structure 28 at such position, the width of the first gap 46 may be approximately equal to the width of the second gap 50. The charge stored on the first electrode 19 results in a first voltage V1 across the first capacitance (e.g., defined by the second electrode 20 and the first electrode 19) and a second voltage V2 across the second capacitance (e.g., defined by the third electrode 22 and the first electrode 19). A relationship between charge, voltage and capacitance is set forth by equation (2) set forth above.

With the movable structure 28 stationary and centered between the second electrode 20 and the third electrode 22, the first voltage V1 and the second voltage V2 may be equal to and opposite one another (or approximately equal to and opposite one another).

The first and second voltages V1 and V2 result in laterally directed, electrostatic forces on the movable structure 28. With the movable structure 28 stationary and centered, as shown, the laterally directed electrostatic force due to the voltage V1 across the first capacitance may be equal to and opposite (or approximately equal to and opposite) the laterally directed, electrostatic force due to the voltage V2 across the second capacitance, so that the net electrostatic force on the movable structure 28 in the lateral direction may be equal to zero.

With reference to FIG. 7B, providing an excitation (e.g., vibration) having a lateral component, e.g., lateral component 320, causes the movable mechanical structure 28 of electrode 19 to begin to move in a lateral direction, e.g., lateral direction 322. For example, if the lateral component 320 is directed toward the third electrode 22, the movable mechanical structure 28 begins to move in a direction 322 toward the second electrode 20, as shown, such that the size of the first gap 46 decreases and the size of the second gap 50 increases. The decrease in the size of the first gap 46 causes an increase in the magnitude of the first capacitance (e.g., defined by the second electrode 20 and first electrode 19). Because electrical charge is trapped on the first electrode 19, the decrease in the size of the first gap 46 also causes an electrical current out of the second electrode 20, thereby decreasing the voltage of the first electrode and increasing the charge differential and the voltage differential across the first capacitance. The increase in the size of the second gap 50 causes a decrease in the magnitude of the second capacitance (e.g., defined by the third electrode 22 and first electrode 19). Because electrical charge is trapped on the first electrode 19, the increase in the size of the second gap 50 also causes an electrical current into the third electrode 22, thereby increasing the voltage of the second electrode and decreasing the charge differential and the voltage differential across the second capacitance.

With reference to FIG. 7C, if the lateral component 320 is directed toward the second electrode 20, the movable mechanical structure 28 begins to move in a direction 324 toward the third electrode 22, such that the size of the first gap 46 increases and the size of the second gap 50 decreases. The increase in the size of the first gap 46 causes a decrease in the magnitude of the first capacitance (e.g., defined by the second electrode 20 and first electrode 19). Because electrical charge is trapped on the first electrode 19, the increase in the size of the first gap 46 also causes an electrical current into the second electrode 20, which in turn decreases the charge across the first capacitance. The decrease in the size of the second gap 50 causes an increase in the magnitude of the second capacitance (e.g., defined by the third electrode 22 and the first electrode 19). Because electrical charge is trapped on the first electrode 19, the decrease in the size of the second gap 50 also causes and an electrical current out of the third electrode 22, which in turn increases the charge across the second capacitance.

If the transducer 16 is employed as an energy harvesting device, one or more portions of the electrical energy generated by the transducer 16 may be supplied, directly and/or indirectly, to one or more circuits and/or devices, and/or used, directly and/or indirectly, in powering one or more portions of one or more circuits and/or devices. For example, one or more of the voltages and/or one or more of the currents generated by the transducer 16 may be supplied, directly or indirectly, to one or more circuits and/or devices, and/or used, directly and/or indirectly, in powering one or more portions of one or more circuits and/or devices. In some embodiments, the electrical energy supplied by the transducer 16 is in the form of AC power, e.g., one or more AC voltages and/or currents.

Many types of MEMS and/or miniature devices (e.g., miniature sensors and/or miniature systems) require electrical power to operate and thus typically receive power from an external power source, for example, in the form of an AC drive signal used to generate a DC voltage to power the circuits and/or devices of the MEMS and/or miniature device. In some embodiments, the power from transducer 16 is sufficient to operate a MEMS and/or a miniature device and thus there may be no need for additional power e.g., from an external power source and/or battery. For example, the power from transducer may be sufficient to power each device and/or circuit of the MEMS and/or miniature device that requires such power.

In some other embodiments, the power from the transducer 16 may not be sufficient to eliminate the need for additional power from an external power source and/or battery. Nonetheless, the power from the transducer may reduce the amount power required from an external power source and/or a battery. That is, the amount of power required from an external power source and/or a battery may be less than the amount of power that would be required from the external power source and/or battery if the MEMS and/or miniature device did not receive power from the transducer 16. Reducing and/or eliminating the need for power from an external power source and/or a battery, may help make it possible to employ MEMS and/or miniature devices in additional applications and/or may help improve the performance of MEMS and/or miniature devices in existing applications.

In some embodiments, the amount of power generated by the transducer depends at least in part on the amount of energy supplied thereto, e.g., the amount of vibrational energy supplied to the transducer. In some embodiments, the transducer receives vibrational energy and has an efficiency that may be expressed in terms of power/acceleration. In some such embodiments, the efficiency of the transducer may be in a range of from 10 nanowatts/(1 m/s.sup.2) (i.e., 10 nanowatts/g) to 1 microwatt/1 m/s.sup.2 (i.e., 1 microW/g).

If the transducer 16 is employed as a sensor (e.g., a vibration sensor and/or accelerometer), one or more portions of the electrical energy generated by the transducer 16 may be supplied, directly and/or indirectly, to one or more circuits and/or devices, and/or used directly and/or indirectly, as an indication of one or more physical quantities (e.g., vibration and/or acceleration) sensed by the transducer 16. For example, one or more of the electrical signals (e.g., one or more of the voltages (e.g., the voltage across the first and/or second capacitance) generated by the transducer 16 and/or one or more of the currents (e.g., the current into and/or out of the first and/or second electrodes 19,20)) generated by the transducer 16, may be supplied, directly or indirectly, to one or more circuits and/or devices and/or employed as an indication of the one or more physical quantities (e.g., vibration and/or acceleration) sensed by the transducer 16. In some embodiments the transducer 16 may operate without electrical power, for example, as described above. In some other embodiments, transducer 16 may be a type of transducer that does not operate fully without electrical power.

The amount of the movement observed in the movable structure of the first electrode 19 may depend at least in part on the magnitude of the excitation (e.g., vibrational energy) applied to the micromachined mechanical structure 12, the spring constant of the spring portion 30 and the mass of the mass portion 32. In some embodiments, the mass of the mass portion 32 is in a range of from 0.01 milligram or about 0.01 milligram to one milligram or about one milligram.

In some embodiments, it may be advantageous to employ a spring portion 30 and a mass portion 32 that cause the movable mechanical structure 28 to have a resonant frequency equal to, or approximately equal to, a frequency of the excitation (e.g., vibrational energy to be converted to electrical energy) to be converted to electrical energy, in order to improve and/or maximize the efficiency of the transducer. The resonant frequency of a harmonic oscillator employing a spring and a mass may be expressed by the equation: resonant frequency=(k/m), where k is equal to the spring constant and m is equal to the mass. Thus, the resonant frequency of the movable mechanical structure 28 may be adjusted by increasing/decreasing the spring constant of the spring portion 30 and/or by increasing/decreasing the mass of the mass portion 32. The spring constant may be decreased by increasing the length 62 of the spring portion 30 and/or by decreasing the width 64 of the spring portion 30 (or portions thereof). The spring constant may be increased by decreasing the length 62 of the spring portion 30 and/or by increasing the width 64 of the spring portion 30 (or portions thereof. The mass of the mass portion 32 may be adjusted by changing the dimensions and/or density of one or more portions of the mass portion 32.

However, there is no requirement to employ a movable mechanical structure 28 having a resonant frequency equal to the frequency of the excitation (e.g., vibrational energy to be converted to electrical energy). For example, some embodiments may have one or more constraints that preclude a resonant frequency equal to the frequency of the excitation. For example, it may not be possible to increase the length of the spring portion 30 and/or the dimensions or density of the mass portion 32 without an unacceptable increase in the size of the MEMS 10 and/or the cost associated therewith.

Thus, some embodiments employ a movable mechanical structure 28 having a resonant frequency greater than the frequency of the excitation (e.g., vibrational energy to be converted to electrical energy). In some embodiments, the frequency of the excitation is less than or equal to 100 Hertz (Hz) and the resonant frequency of the movable mechanical structure 28 is greater than 100 Hz, for example, in a range from greater than 100 HZ but less than or equal to 1000 Hz. Some other embodiments employ a movable structure having a resonant frequency that is less than the frequency of the excitation.

Some embodiments may employ a movable mechanical structure 28 having more than one resonant frequency. For example, some embodiments may employ more than one spring portion and/or more than one mass portion arranged in and/or a geometric shape now know or later developed that includes provides the movable mechanical structure 28 with more than one spring constant and/or more than one mass.

Some embodiments may be exposed to more than one excitation frequency. In such embodiments, the movable mechanical structure 28 may have one or more resonant frequencies equal to one or more of the excitation frequencies, one or more resonant frequencies greater than one or more of excitation frequencies and/or one or more resonant frequencies less than one or more of excitation frequencies.

Figure 8A:
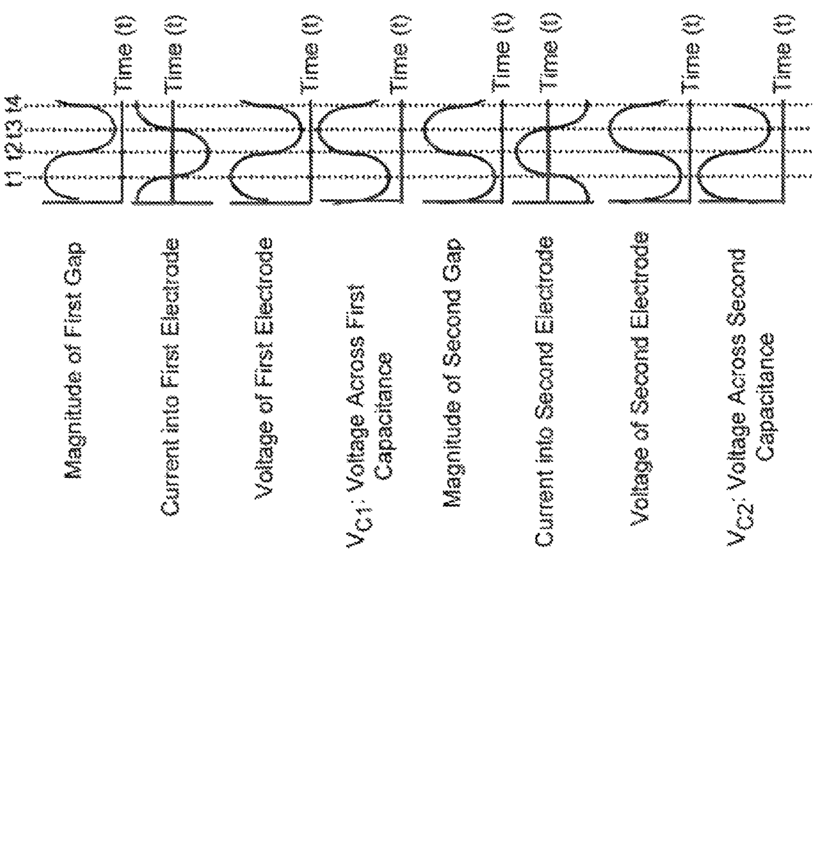
FIG. 8A illustrates a graphical representation of the magnitude of the first gap, the magnitude of the second gap, the current into the first electrode, the current into the second electrode, the voltage of the first electrode, the voltage of the second electrode, the voltage across the first capacitance and the voltage across the second capacitance, for one embodiment of the micromachined mechanical structure of FIG. 2A, under steady state conditions, according to certain aspects of the present invention.

FIG. 8A illustrates a graphical representation of the magnitude of the first gap, the magnitude of the second gap, the current into the first electrode, the current into the second electrode, the voltage of the first electrode, the voltage of the second electrode, the voltage across the first capacitance and the voltage across the second capacitance, under steady state conditions, for one embodiment in which micromachined mechanical structure 12 has a mechanical time constant that is greater than its electrical time constant and a resistive load, e.g., represented as RL, provided between the first and second electrodes 20, 22 of the transducer 16. In this embodiment, the output voltage, Vout, is defined as the voltage of the second electrode 20 minus the voltage of the third electrode 22. The output current, Iout, is defined as the current out of the second electrode 20.

Figure 8B:
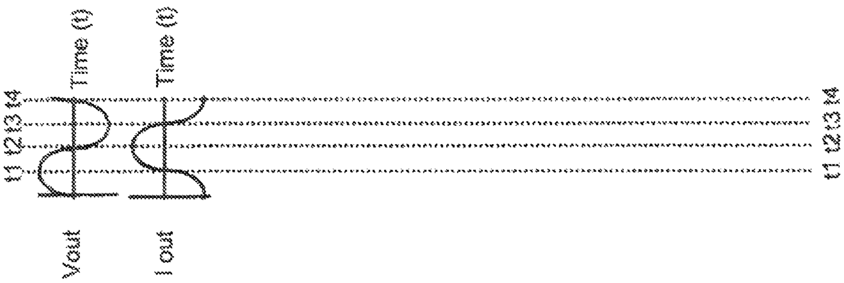
FIG. 8B illustrates a graphical representation of Vout and Iout for the embodiment of the micromachined mechanical structure illustrated in FIG. 8A, under steady state conditions, according to certain aspects of the present invention.

FIG. 8B illustrates a graphical representation of Vout and Iout for the embodiment of the micromachined mechanical structure illustrated in FIG. 8A, under steady state conditions, according to certain aspects of the present invention.

With reference to FIG. 8A and FIG. 8B, at a time t1, the magnitude of the first gap 46 is at a maximum value, the current into the first electrode is zero, the voltage of the first electrode is at a maximum value and the voltage across the first capacitance is at a minimum value. In addition, at time t1, the magnitude of the second gap 50 is at a minimum value, current into the second electrode is zero, the voltage of the second electrode is at a minimum value and the voltage across the second capacitance is at a maximum value. As a result, at time t1, the voltage Vout is at a maximum value and the current Iout is zero.

At a time t2, the magnitude of the first gap 46 is at a midpoint between a minimum value and the maximum value, the current out of the first electrode is at a maximum value, the voltage of the first electrode is at a midpoint between a minimum value and the maximum value and the voltage across the first capacitance is at a midpoint between the minimum value and a maximum value. In addition, at time t2, the magnitude of the second gap 50 is at a midpoint between the minimum value and a maximum value, the current into the second electrode is at a maximum value, the voltage of the second electrode is at a midpoint between the minimum value and a maximum value and the voltage across the second capacitance is at a midpoint between a minimum value and the maximum value. As a result, at time t2, the voltage Vout is zero and the current Iout is at a maximum value.

At a time t3, the magnitude of the first gap 46 is at the minimum value, the current into the first electrode is zero, the voltage of the first electrode is at the minimum value and the voltage across the first capacitance is at the maximum value. In addition, at time t3, the magnitude of the second gap 50 is at the maximum value, current into the second electrode is zero, the voltage of the second electrode is at the maximum value and the voltage across the second capacitance is at the minimum value. As a result, at time t3, the voltage Vout is at a minimum value and the current Iout is zero.

At a time t4, the magnitude of the first gap 46 is at the midpoint between the minimum value and the maximum value, the current into the first electrode is at a maximum value, the voltage of the first electrode is at the midpoint between the minimum value and the maximum value and the voltage across the first capacitance is at the midpoint between the minimum value and the maximum value. In addition, at time t4, the magnitude of the second gap 50 is at the midpoint between the minimum value and the maximum value, the current out of the second electrode is at a maximum value, the voltage of the second electrode is at the midpoint between the minimum value and the maximum value and the voltage across the second capacitance is at the midpoint between the minimum value and the maximum value. As a result, at time t4, the voltage Vout is zero and the current Iout is at a maximum negative value.

Figure 9A:
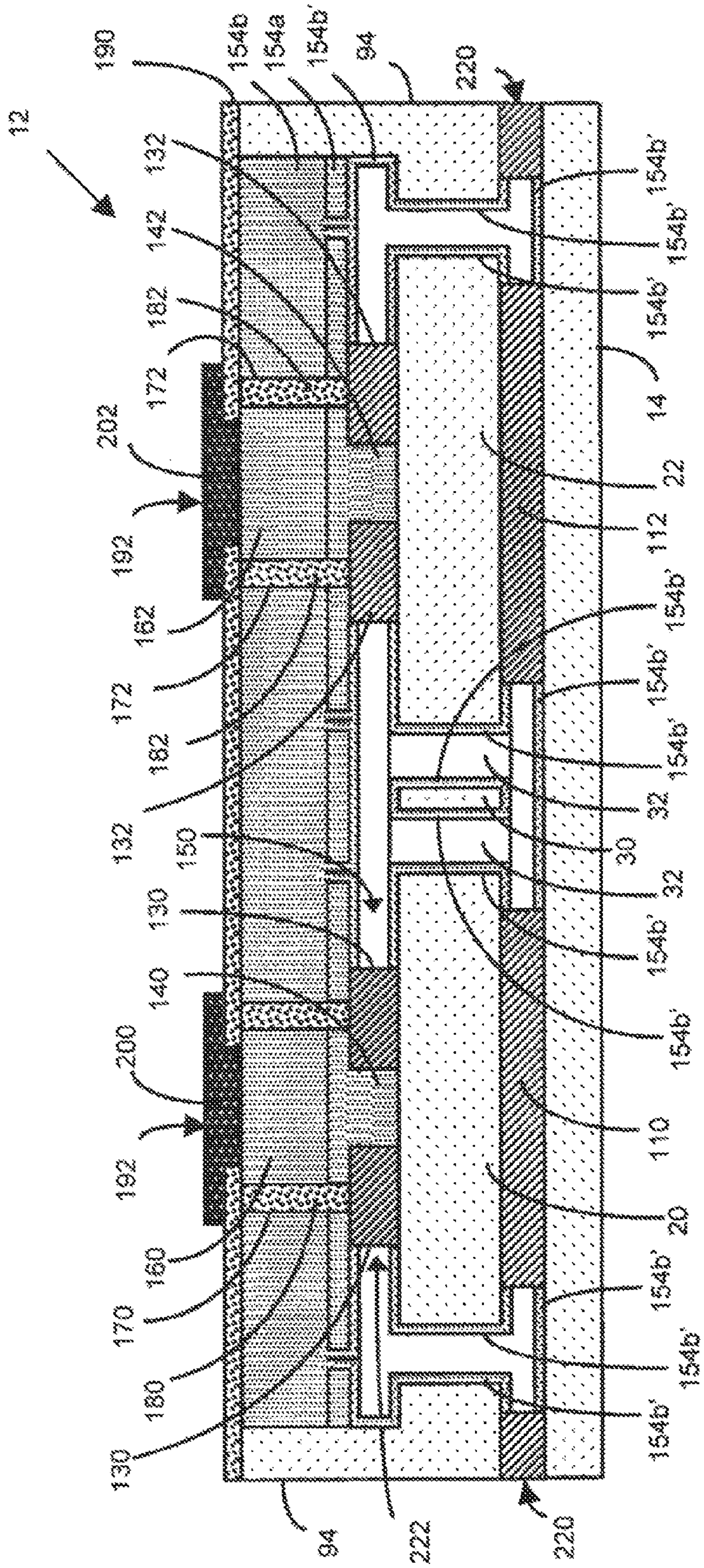
FIG. 9A illustrates a cross-sectional view (taken in the direction B-B of FIG. 2A) of one embodiment of the portion of the micromachined mechanical structure of FIG. 2A that includes a microstructure that includes a layer of an encapsulation layer deposited thereon, and one embodiment of an encapsulation structure that may be employed therewith, in accordance with certain aspects of the present invention.

With reference to FIG. 9A, in some instances, the material comprising the second encapsulation layer 154*b* may deposit, form or grow over surfaces in chamber 150 (for example, surfaces of electrodes 20, 22, surfaces of portions 30, 32 of electrode 19 and surfaces of field area 94) as the chamber is sealed or encapsulated. In those instances where the material comprising a second or subsequent encapsulation layer (for example, second encapsulation layer 154*b*) deposits, forms or grows over selected surfaces of the structures in chamber 150 (see for example, surfaces of electrodes 20, 22, surfaces of portions 30, 32 of electrode 19 and surfaces of field area 94) as chamber 150 is sealed or encapsulated, it may be advantageous to design and fabricate mechanical structures (e.g., electrodes 19, 20, 22, 84, 86, fuse 89 and field areas 94, 95, 96) to account for the deposition, formation or growth of the additional material 154*b*'. In some embodiments, the thickness of the additional material 154*b*' on the surfaces of mechanical structures (e.g., electrodes 19, 20, 22, 84, 86, fuse 89 and field areas 94, 95, 96) may be approximately equal to the width or diameter of vent 224. In some other embodiments, the thickness of the additional material 154*b*' on the surfaces of mechanical structures (e.g., electrodes 19, 20, 22, 84, 86, fuse 89 and field areas 94, 95, 96) may be less than the width or diameter of vent 224. In some embodiments, the additional material 154*b*' may have a first thickness on one or more surfaces of the mechanical structures and a different thickness on one or more other surfaces of the mechanical structures. For example, the thickness of the additional material 154*b*' on a particular surface may be inversely proportional to the distance between the surface and the nearest vent 224. Accordingly, in one set of embodiments, the design (for example, thickness, height, width and/or lateral and/or vertical relation to other structures in chamber 150) of mechanical structures (e.g., electrodes 19, 20, 22, 84, 86, fuse 89 and field areas 94, 95, 96) incorporates therein such additional material 154*b*' and the fabrication of mechanical structures (e.g., electrodes 19, 20, 22, 84, 86, fuse 89 and field areas 94, 95, 96) to provide a final structure includes at least two steps. A first step which fabricates mechanical structures (e.g., electrodes 19, 20, 22, 84, 86, fuse 89 and field areas 94, 95, 96) according to initial dimensions (for example, as described with respect to FIG. 4A) and a second step that includes the deposition, formation or growth of material 154*b*' as a result of deposition, formation or growth of at least one encapsulation layer, for example, second encapsulation layer 154*b* and/or subsequent encapsulation layer.

Figure 9B:
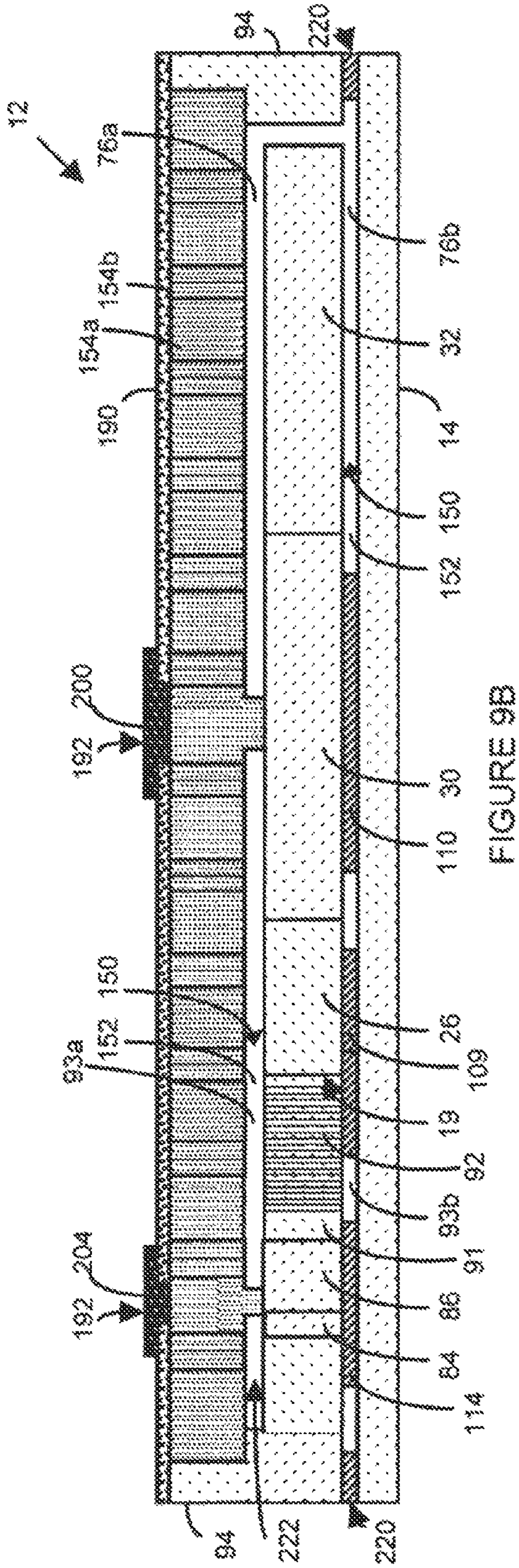
FIG. 9B illustrates a cross-sectional view (taken in the direction A-A of FIG. 2A) of the micromachined mechanical structure illustrated in FIG. 2A in conjunction with another embodiment of encapsulation that may be employed therewith, in accordance with certain aspects of the present invention.

With reference to FIG. 9B, in some embodiments, one or more of the encapsulation layer(s) 154 are formed using one or more of the thin film encapsulation techniques described and illustrated in the Microelectromechanical Systems and Method of Encapsulating Patent Application Publication. In this regard, any and all of the embodiments described herein may employ one or more of the structures and/or techniques disclosed in the Microelectromechanical Systems and Method of Encapsulating Patent Application Publication. For the sake of brevity, the inventions described and illustrated in the Microelectromechanical Systems and Method of Encapsulating Patent Application Publication, will not be repeated. It is expressly noted, however, that the entire contents of the Microelectromechanical Systems and Method of Encapsulating Patent Application Publication, including, for example, the features, attributes, alternatives, materials, techniques and advantages of all of the embodiments and/or inventions, are incorporated by reference herein, although, unless stated otherwise, the aspects and/or embodiments of the present invention are not limited to such features, attributes alternatives, materials, techniques and advantages.

The present invention may also be employed in conjunction with wafer-bonding encapsulation techniques.

It should be understood that transducer 16 is not limited to the embodiments described above. As stated above, the transducer 16 may be any type of transducer, for example, an energy harvesting device, a sensor (e.g., an accelerometer, a gyroscope, a microphone, a vibration sensor, a pressure sensor, a strain sensor, a tactile sensor, a magnetic sensor and/or a temperature sensor), a resonator, a resonant filter, and/or a combination thereof.

Figure 10A:
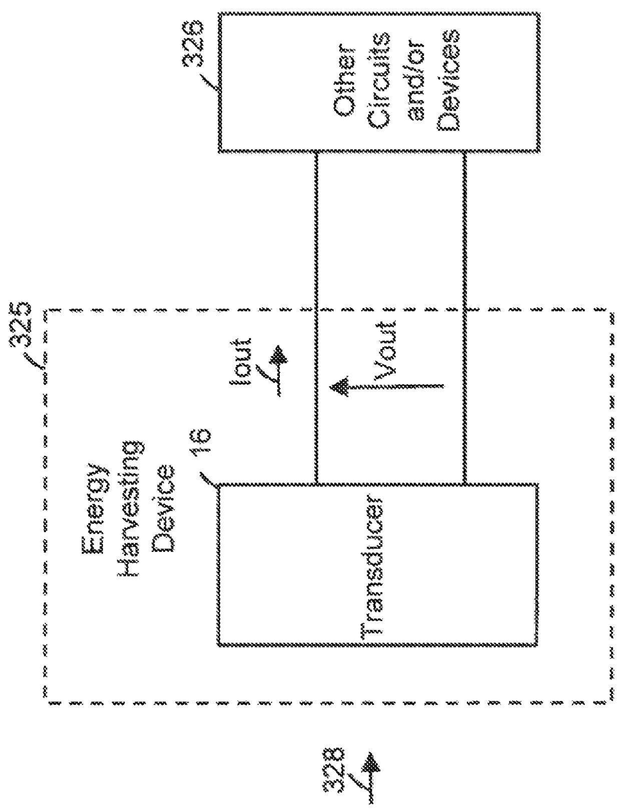
FIG. 10A illustrates a schematic diagram of the micromachined mechanical structure illustrated in FIG. 2A in conjunction with one or more circuits and/or devices that may be coupled thereto, in accordance with certain aspects of the present invention.

FIG. 10A illustrates an energy harvesting device 325 that employs the transducer 16 of micromachined mechanical structure 12, in conjunction with one or more other circuits and/or devices 326 that may be coupled thereto, in accordance with certain aspects of the present invention.

In operation, vibrational energy 328 is supplied to the transducer 16 of the energy harvesting device 325, which converts at least a portion of such energy to electrical energy. One or more portions of such electrical energy may be supplied, directly and/or indirectly, to the one or more other circuits and/or devices 326 and/or may be used, directly and/or indirectly, in powering one or more portions of the one or more other circuits and/or devices 326. For example, one or more of the voltages and/or currents generated by the transducer 16 of the energy harvesting device 325 may be supplied, directly or indirectly, to one or more circuits and/or devices 326, and/or used, directly and/or indirectly, in powering one or more portions of one or more circuits and/or devices 326.

Unless specified otherwise, the term "device" includes, for example, but is not limited to, any type of element and/or assembly. An element may have any form including, for example, but not limited to that of a mechanical element, an electrical element and/or a combination thereof. An element may stand alone or may be connected to and/or integrated with other elements. For example, an electrical element may be a portion of an integrated circuit and electrically connected to on or more other electrical elements within the integrated circuit. An electrical element may be any type of electrical element including, for example, but not limited to a passive electrical element, an active electrical element and/or an integrated combination thereof in the form of a die that includes one or more integrated circuits. Passive electrical elements include but are not limited to any type of resistor, capacitor, inductor or combination thereof. Active electrical elements include but are not limited to any type of diode, transistor or circuit that includes one or more diodes or transistors. An assembly may also have any form including, for example, but not limited to an assembly that includes one or more mechanical elements, one or more electrical elements and/or any combination thereof. Thus, an assembly may comprise a plurality of electrical elements electrically connected to form one or more circuits. As used herein, the term circuit includes but is not limited to an integrated circuit, a discrete circuit made up of discrete devices and/or any combination thereof. A circuit may include but is not limited passive electrical elements, active electrical elements, other circuits and/or a combination thereof.

Figure 10B:
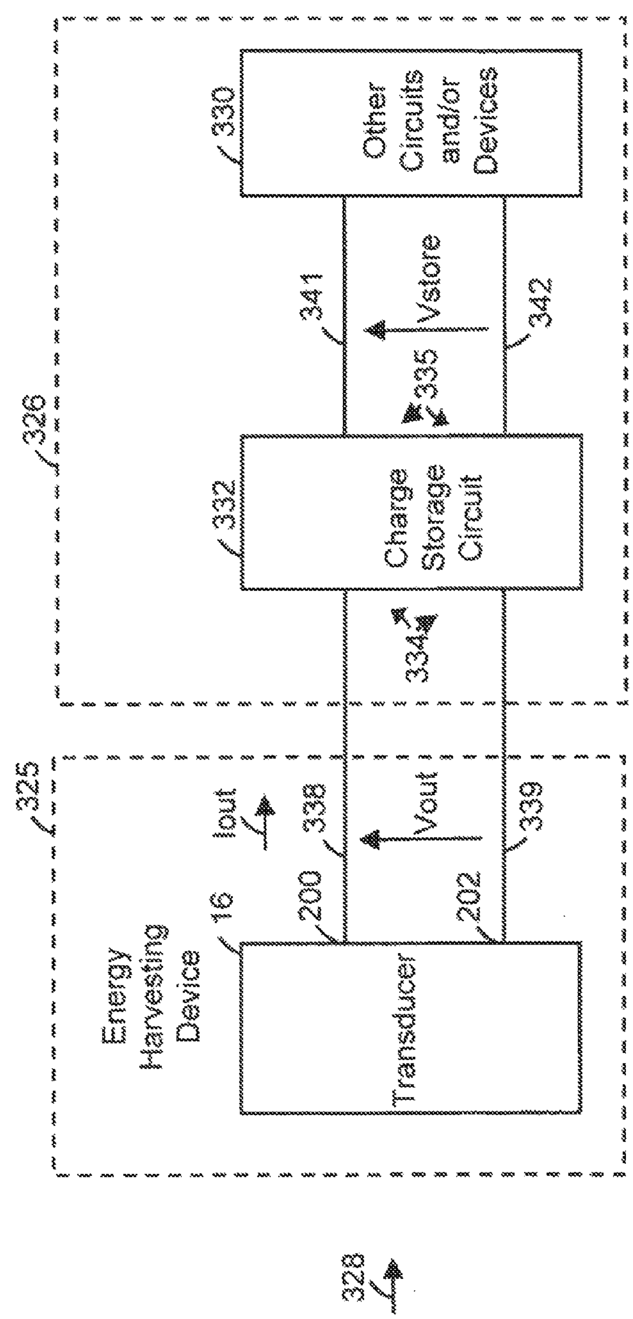
FIG. 10B illustrates a schematic diagram of the micromachined mechanical structure illustrated in FIG. 2A in conjunction with one embodiment of the other circuits and/or devices of FIG. 10A, which includes a charge storing circuit and one or more circuits and/or devices that may be coupled thereto, in accordance with certain aspects of the present invention.

FIG. 10B illustrates the energy harvesting device 325 in conjunction with a charge storage circuit 332 and one or more other circuits and/or devices 330 that may be coupled thereto, in accordance with certain aspects of the present invention. In this embodiment, charge storage circuit 332 has an input port 334 and an output port 335. The input port 334 of the charge storage circuit 332 is coupled via signal lines 338, 339 to the transducer 16. The output port 335 of the charge storage circuit 332 is coupled via signal lines 341, 342 to the one or more other circuits and/or devices 330.

In operation, vibrational energy 328 is supplied to the transducer 16 of micromachined mechanical structure 12, which converts at least a portion of such energy to electrical energy, at least a portion of which may be supplied through signal lines 338, 339 to the charge storage circuit 332. The charge storage circuit 332 stores one or more portions of the electrical energy supplied thereto and may supply electrical energy, directly and/or indirectly, to the one or more other circuits and/or devices 330, which may use one or more portions of the electrical energy supplied thereto for power and/or any other purpose(s).

Figure 10C:
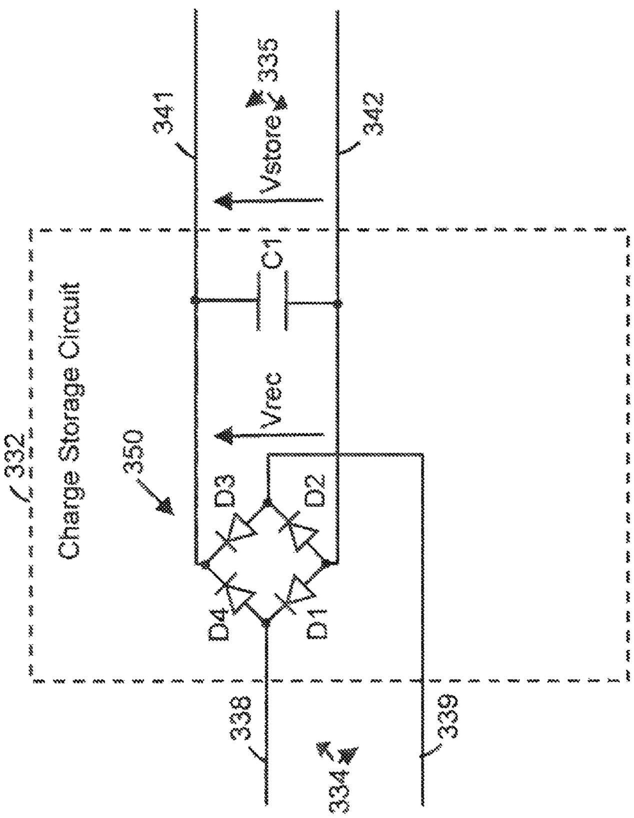
FIG. 10C illustrates a schematic diagram of one embodiment of the charge storage circuit illustrated in FIG. 10B, according to certain aspects of the present invention.
Figure 10D:
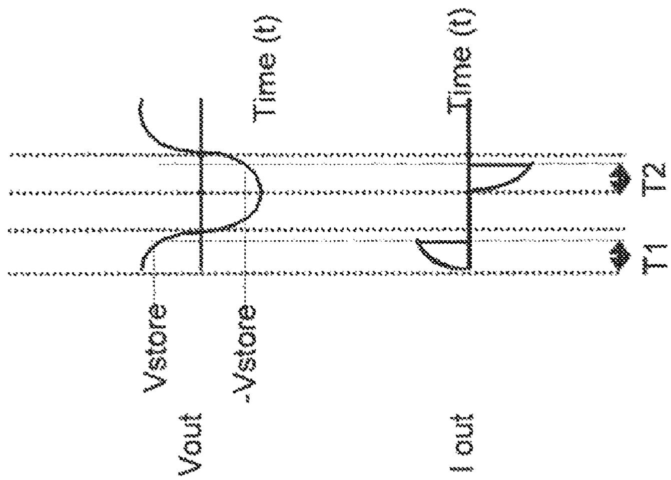
FIG. 10D illustrates a graphical representation of Vout and Iout for the micromachined mechanical structure illustrated in FIG. 10B, under steady state conditions, according to certain aspects of the present invention.

FIG. 10C shows one possible embodiment of the charge storing circuit 332. In this embodiment, charge storing circuit 332 includes a rectifier circuit, e.g., a full wave bridge 350, and one or more energy storage devices, e.g., capacitor C1. The input of bridge 350 is coupled to the input port 334 of charge storing circuit 332. The output of bridge 350 is coupled to the one or more storage devices, e.g., capacitor C1, which is also coupled to the output port 335 of charge storing circuit 332.

The full wave bridge 350 includes four switching devices, e.g., diodes D1, D2, D3, D4. A first terminal of the first switching device, e.g., diode D1, is connected to a first terminal of the second switching device, e.g., diode D2. A second terminal of the second switching device, e.g., diode D2, is connected to a first terminal of the third switching device, e.g., diode D3. A second terminal of the first switching device, e.g., diode D1 is connected to a first terminal of the fourth switching device, diode D4. The second terminal of the fourth switching device, e.g., diode D4, is connected to the second terminal of the third switching device, e.g., diode D3.

The operation of the charge storing circuit 332 is as follows. Electrical energy from the energy harvesting device 325 is supplied through the input port 334 to the input of the rectifier, e.g., the full wave bridge 350, which generates a rectified voltage, Vrec. For example, second and fourth switching devices, e.g., diodes D2, D4, of full wave bridge 350 conduct during a time interval T1 (FIG. 10D) for which the output voltage Vout from the energy harvesting device 325 is greater than the magnitude of the voltage across the one or more energy storage devices, e.g., capacitor C1, plus the forward voltage drop across the second and fourth switching devices. During such interval, the fourth switching device, e.g., diode D4, receives current through signal line 338 and supplies current to a first terminal of the one or more storage devices, e.g. capacitor C1, to thereby transfer charge to the one or more storage devices, e.g., capacitor C1. Current from the second terminal of the one or more storage devices, e.g., capacitor C1, is supplied to the second switching device, e.g., diode D2, which supplies current to signal line 339, which returns such current to the energy harvesting device 325.

The first and third switching devices, e.g., diodes D1, D3, conduct during a time interval T2 (FIG. 10D) for which the output voltage Vout from the energy harvesting device 325 is negative and has an absolute value greater than the magnitude of the voltage Vstore across the one or more storage devices plus the forward voltage drop across the first and third switching devices. During such interval, the third switching device, e.g., diode D3, receives current through signal line 339 and supplies current to the first terminal of the one or more storage devices, e.g. capacitor C1, to thereby transfer charge to the one or more storage devices, e.g., capacitor C1. Current from the second terminal of the one or more storage devices, e.g., capacitor C1, is supplied to the first switching device, e.g., diode D1, which supplies current to signal line 338, which returns the current to the energy harvesting device 325. The capacitor C1 may have any suitable magnitude. In some embodiments, capacitor C1 has a magnitude of 47 microfarads (uf).

It should be understood that the charge storing circuit 332 is not limited to a circuit having a capacitor and a full wave bridge configured as described above. The charge storing circuit may include any number and type of storage device(s) in any type of configuration. If the charge storing circuit includes a rectifier, the rectifier may include any number and type of switching devices connected in any type of configuration. If the rectifier includes a bridge, the bridge may be any type of bridge for example but not limited to a full wave bridge and/or a half wave bridge.

Figure 10E:
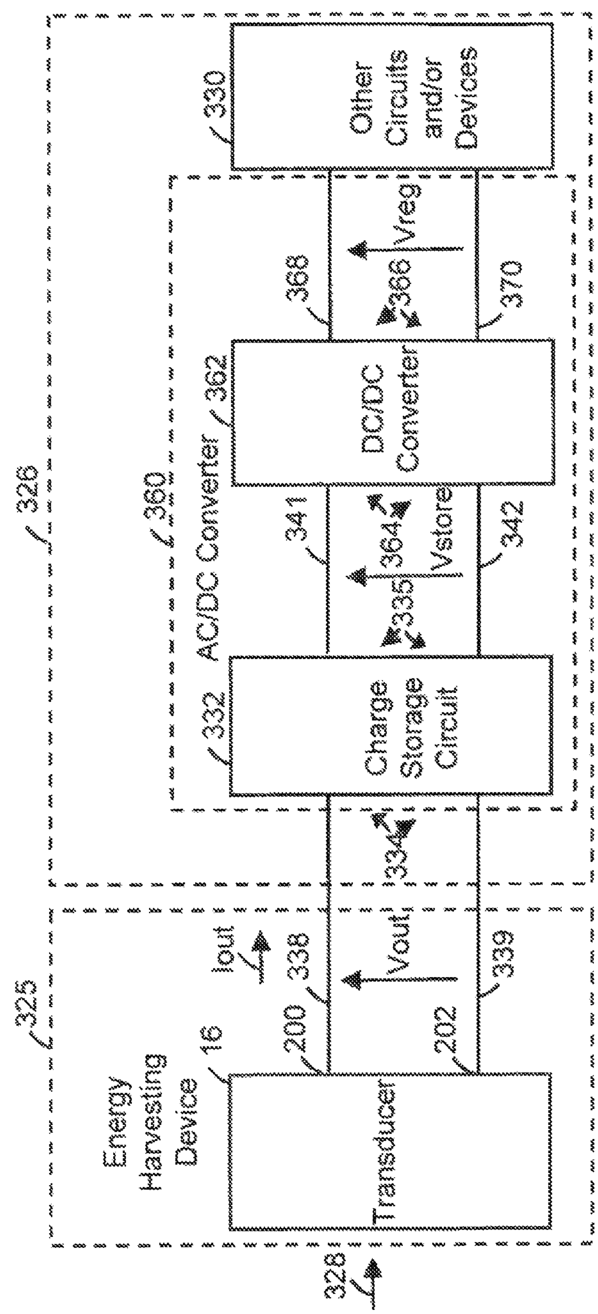
FIG. 10E illustrates a schematic diagram of the micromachined mechanical structure illustrated in FIG. 2A in conjunction with one embodiment of the other circuits and/or devices of FIG. 10A, which includes a power conditioning circuit and one or more other circuits and/or devices that may be coupled thereto, in accordance with certain aspects of the present invention.

FIG. 10E illustrates the energy harvesting device 325 that includes the transducer 16 of micromachined mechanical structure 12 in conjunction with a power conditioning circuit 360, such as for example, an AC/DC converter circuit, and one or more other circuits and/or devices 330 that may be coupled thereto, in accordance with certain aspects of the present invention. In this embodiment, power conditioning circuit 360 includes a charge storage circuit 332 and a regulator, e.g., a DC/DC converter circuit 362. The charge storage circuit 332 has an input port 334 and an output port 335. The DC/DC converter circuit 362 has an input port 364 and an output port 366. The input port 334 of the charge storage circuit 332 is coupled via signal lines 338, 339 to the energy harvesting device 325. The output port 335 of the charge storage circuit 332 is coupled via signal lines 341, 342 to the input port 364 of the DC/DC converter circuit 362. The output port 366 of the DC/DC converter circuit 362 is coupled via signal lines 368, 370 to one or more other circuits and/or devices 330.

In operation, vibrational energy 328 is supplied to the energy harvesting device 325 of micromachined mechanical structure 12, which converts at least a portion of such energy to electrical energy, at least a portion of which may be supplied through signal lines 338, 339 to the charge storing circuit 332. The charge storing circuit 332 stores at least a portion of the electrical energy supplied thereto and generates a voltage, Vstore, which is supplied on signal lines 341, 342 to the DC/DC converter circuit 362. The DC/DC converter circuit 362 generates a regulated DC voltage, Vreg, which may be supplied, directly or indirectly, to the one or more other circuits and/or devices 330 and/or may be used, directly and/or indirectly, in powering one or more portions of one or more circuits and/or devices and/or for any other purpose(s).

Figure 10F:
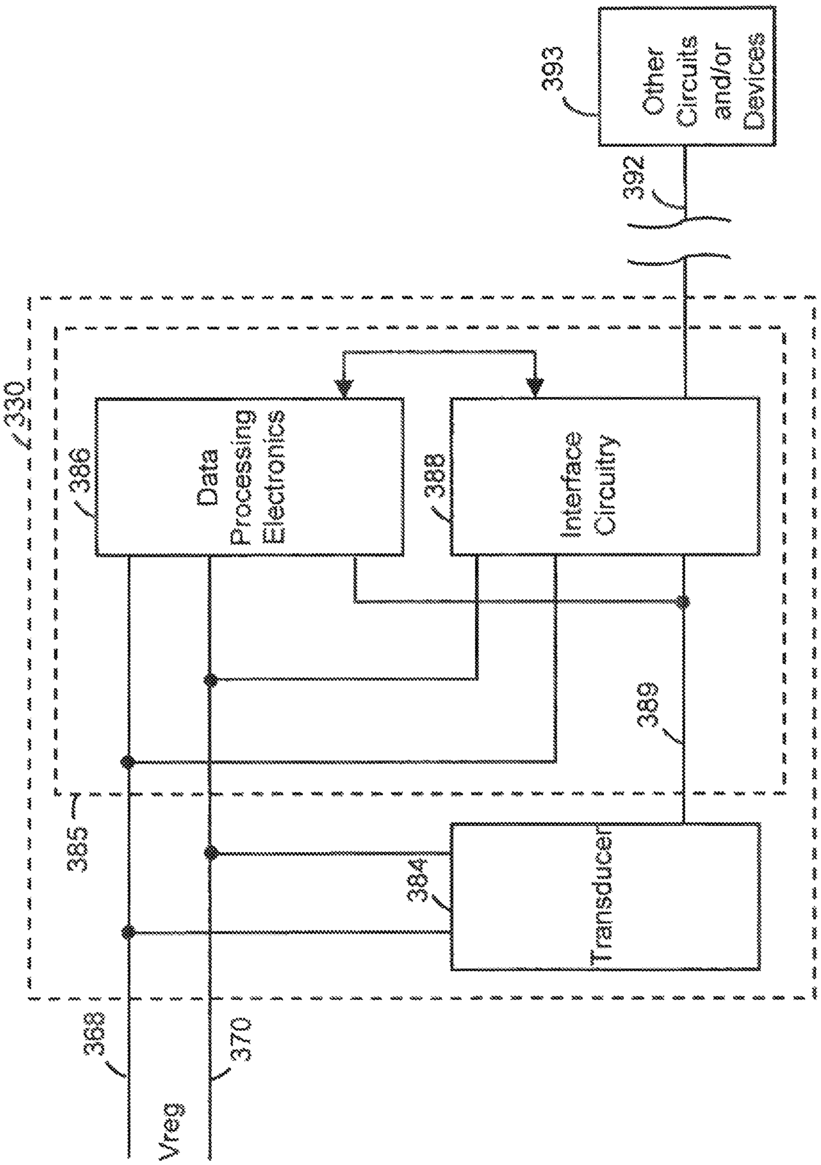
FIG. 10F illustrates a schematic diagram of one embodiment of the one or more other circuits and/or devices of FIG. 10E, which includes a transducer, data processing electronics and interface circuitry, which may be coupled to the micromachined mechanical structure illustrated in FIG. 2A, in conjunction with other circuits and/or devices which may be coupled to the interface circuitry, in accordance with certain aspects of the present invention.

With reference to FIG. 10F, in some embodiments, the one or more other circuits and/or devices 330 includes a transducer 384 and one or more circuits and/or devices 385 coupled thereto. In such embodiments, one or more portions of the electrical energy generated by the energy harvesting device 325 may be supplied, directly and/or indirectly, to the transducer 384 and/or the one or more circuits and/or devices 385 and/or used, directly and/or indirectly, to power one or more portions of the transducer 384 and/or one or more portions of the one or more circuits and/or devices 385. For example, the regulated DC voltage, Vreg, (and/or or one or more other portions of the electrical energy generated by energy harvesting device 325) may be supplied, directly and/or indirectly, to the transducer 384 and/or the one or more circuits and/or devices 385 and may be used, directly and/or indirectly, in powering one or more portions of the transducer 384 and/or one or more portions of the one or more circuits and/or devices 385.

The transducer 384 may be any type of transducer including, for example, but not limited to a sensor (e.g., an accelerometer, a gyroscope, a microphone, a vibration sensor, a pressure sensor, a strain sensor, a tactile sensor, a magnetic sensor and/or a temperature sensor). In some embodiments, the transducer 384 comprises a transducer defined by micromachined mechanical structure 12 and/or disposed in or on, and/or integrated in or on, MEMS 10. In some embodiments, the transducer 384 is disposed in or on, and/or integrated in or on, the same MEMS 10 as the micromachined mechanical structure 12 defining transducer 16 of energy harvesting device 325. In some embodiments, transducer comprises a transducer 16 having electrical charge stored thereon in accordance with certain aspects of the present invention. For example, electrical charge may be stored on an electrode (see for example, first electrode 19 (FIGS. 2A-2C, 3A-3E 14A-14B, 15A-15B, 20A-20B, 21A-21C, 26A-26B, 27A-27C, 32A-32B, 33A-33B, 38A-38C, 42-45, 46A-46B, 47A-47B, 53-56)). In some such embodiments, the transducer 16 may be able to operate and/or supply one or more of the one or more signals without a battery and/or an external power supply.

In some embodiments, the one or more circuits and/or devices 385 include data processing electronics 386 and/or interface circuitry 388. In such embodiments, the regulated DC voltage, Vreg, may be supplied, directly or indirectly, to the data processing electronics 386 and/or the interface circuitry 388 and may be used, directly and/or indirectly, in powering one or more portions of one or more of such circuits 386, 388 and/or for any other purpose(s). One or more portions of the one or more circuits may be disposed in or on MEMS 10, integrated in or on MEMS 10, and/or disposed in any other location.

The transducer 384 may be coupled to the data processing electronics 386 and/or the interface circuitry 388, for example, via one or more signal lines, e.g., signal line 389. In operation, transducer 384 may generate a signal indicative of a physical quantity (e.g., vibration) sensed by the transducer 384, which may be supplied to the data processing electronics 386 and/or the interface circuitry 388, for example, via the one or more signal lines, e.g., signal line 389. In some embodiments, for example, the signal from the transducer 384 may be supplied to data processing electronics 368, which may generate a signal in response at least thereto. The signal from the data processing electronics 368 may be supplied to the interface circuitry 388, which may generate a signal, in response thereto, e.g., to be provided via a link 392 to other circuits and/or devices 393, further described below.

In some embodiments, the transducer 384 and/or the one or more circuits and/or devices 385 are powered entirely by one or more portions of the electrical power generated by the energy harvesting device 325, such that transducer 384, one or more circuits and/or devices 385 and/or a device employing transducer 384 and/or one or more circuits and/or devices 385 are able to operate and/or supply information indefinitely (or at least a desired period of time) without any need for a battery and/or an external power supply.

Data processing electronics 386 may be any type of data processing electronics including, for example, but not limited to data processing electronics to (1) process and/or analyze information generated by transducer 384, micromachined mechanical structure 12 and/or any other circuits and/or devices and/or (2) control and/or monitor the operation of transducer 384, micromachined mechanical structure 12 and/or any other circuits and/or devices. Notably, information may be in any form, including, for example, but not limited to, analog and/or digital (a sequence of binary values, i.e. a bit string). Data processing circuitry may comprise a processor. As further discussed below with respect to FIG. 12H, a processor may be any type of processor.

Interface circuitry 388 may be any type of interface circuitry, including for example, but not limited to interface circuitry to (1) provide information from transducer 384, micromachined mechanical structure 12, data processing electronics 386 and/or any other circuits and/or devices to one or more external devices (FIGS. 12C-12D), for example, a computer, indicator/display and/or a sensor and/or (2) provide information to transducer 384, micromachined mechanical structure 12, data processing electronics 386 and/or any other circuits and/or devices from one or more external devices (FIGS. 12C-12D), for example, a computer, indicator/display and/or a sensor. As further described hereinafter, interface circuitry 388 may be a portion of a communication system and/or a communication link.

Figure 57A:
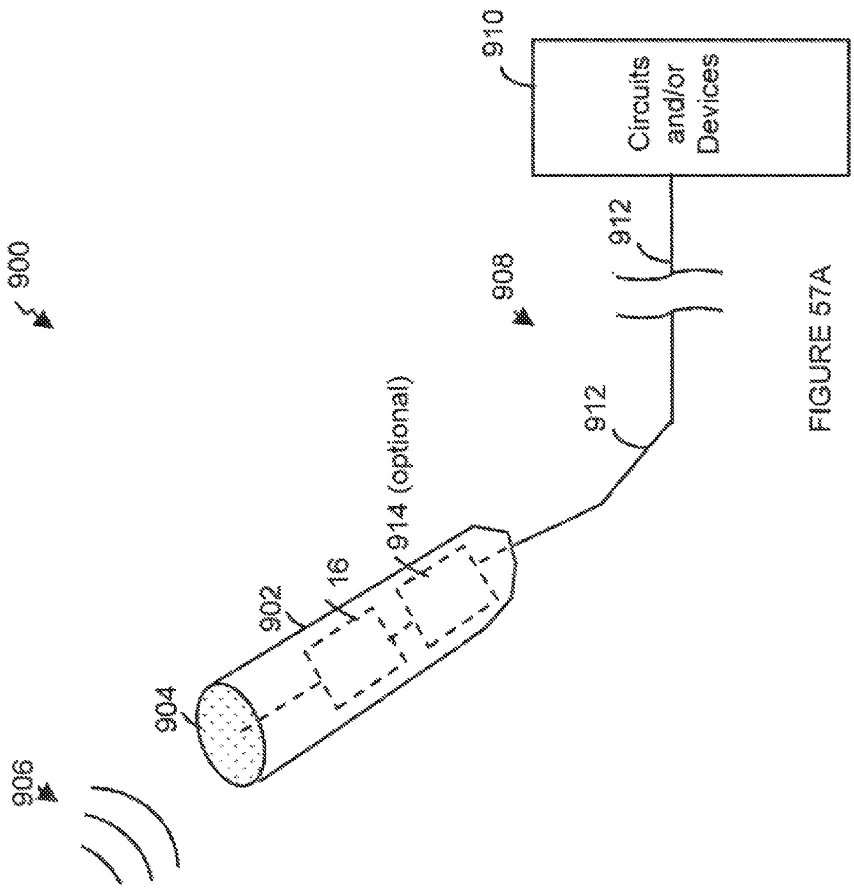
FIGS. 57A-57F illustrate schematic diagrams of various embodiments of a microphone that includes a transducer, e.g., the transducer of the micromachined mechanical structure illustrated in FIGS. 36A-36B and FIGS. 37A-37B, in conjunction with one or more external circuits and/or devices that may be coupled thereto, in accordance with certain aspects of the present invention.
Figure 57B:
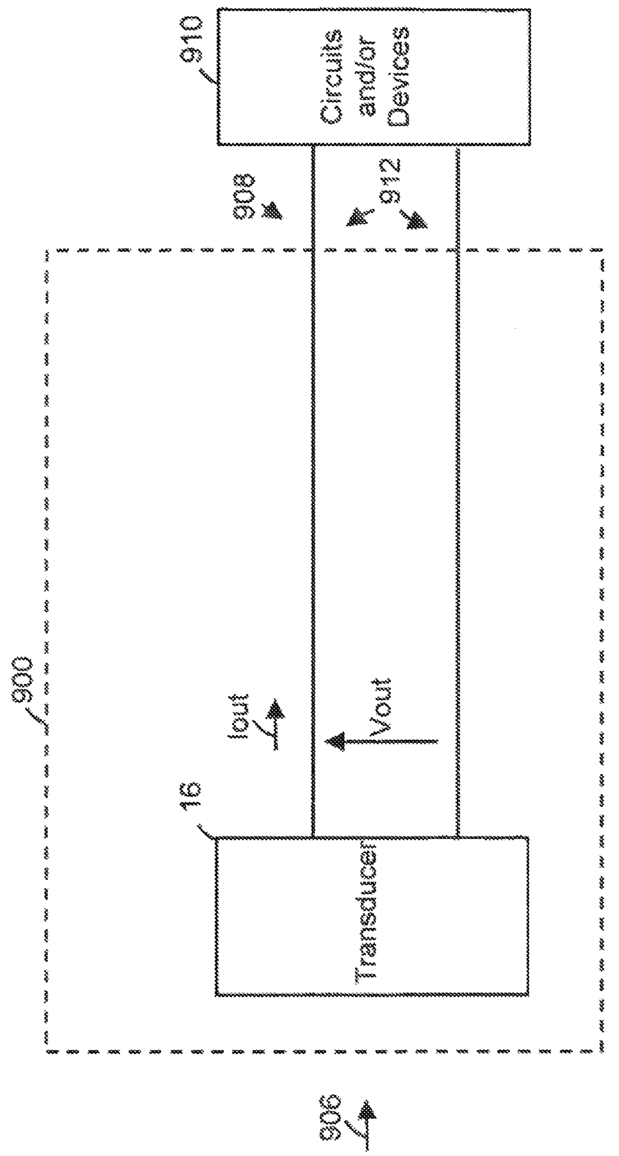

Some embodiments employ the transducer 384 without the one or more circuits and/or devices 385 (see, for example, microphone 900 (FIG. 57B) including transducer 16 (FIG. 57B). Some other embodiments employ the one or more circuits and/or devices 385 without the transducer 384.

Figure 10G:
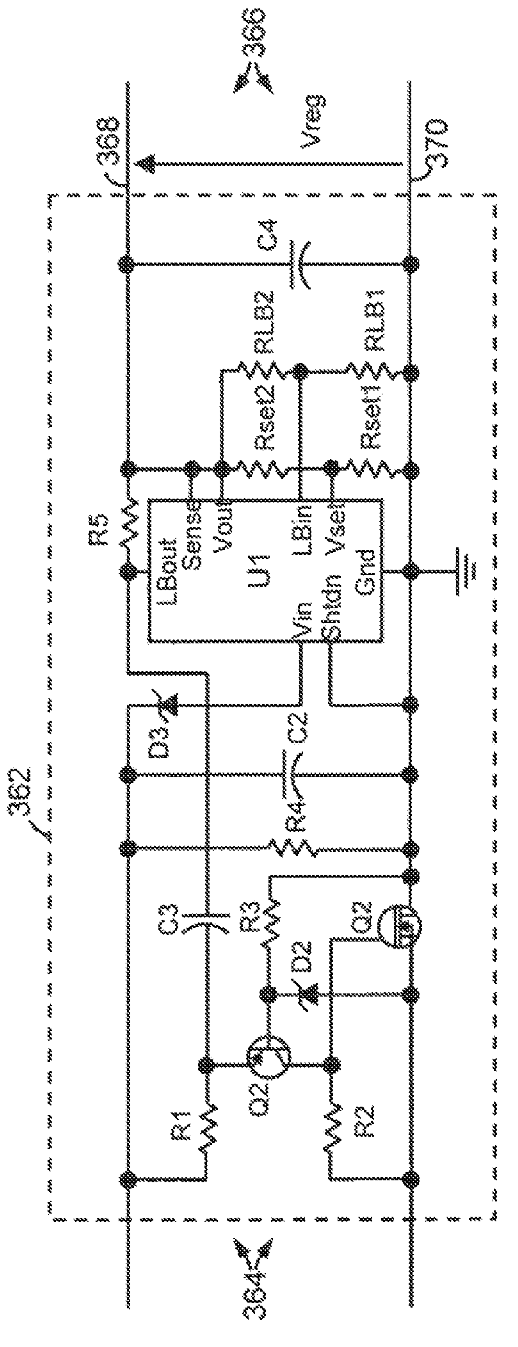
FIG. 10G illustrates a schematic diagram of one embodiment of the DC/DC converter circuit of the power conditioning circuit illustrated in FIG. 10E, according to certain aspects of the present invention.

With reference to FIG. 10G, in one embodiment, DC/DC converter circuit 362 comprises a circuit disclosed in Knut Graichen, Ph. D. Thesis, Universitat Stuttgart, Institut fur Systemdynamik and Regelungstechnik (ISR), Parasitic Power Harvesting for Automotive Tire Sensors, 2002 (hereinafter, the "Parasitic Power Harvesting for Automotive Tire Sensors" paper). It is expressly noted, that the entire contents of the Parasitic Power Harvesting for Automotive Tire Sensors paper are incorporated by reference herein, however, unless stated otherwise, the aspects and/or embodiments of the present inventions are not limited in any way by the description and/or illustrations in such paper.

In such embodiment of DC/DC converter circuit 362, the input port 364 receives an input voltage, Vstore, from the charge storing circuit 332. A transistor Q1 conducts if the magnitude of the input voltage exceeds a first voltage magnitude equal to a forward voltage drop across the base emitter junction of transistor Q1 plus a voltage drop across zener diode D2. The conduction by transistor Q1 latches transistor Q1 in the conduction state and causes transistor Q2 to conduct, thereby creating a return path (i.e., a return path through resistor R1, and transistors Q1, Q2) through which the one or more energy storage devices, e.g., capacitor C1, of the charge storing circuit 332 discharges. In some embodiments, transistors Q1 and Q2 are a 2N3906 type transistor and a VN2222L type transistor, respectively. Zener diode D2 may be, for example, a 12 volt zener diode.

The magnitudes of resistors R1, R2 and R3 are selected to provide a desired biasing for transistors Q1, Q2 and to provide a high impedance across the input port 364 of the DC/DC converter circuit while the transistors Q1, Q2 are not conducting. In one embodiment, the magnitudes of R1, R2, R3, R4 and R5 are 560 k.OMEGA., 1 M.OMEGA., 10 k.OMEGA., 820 k.OMEGA. and 100 k.OMEGA., respectively.

This embodiment of DC/DC converter circuit 362 includes a linear regulator Ul, for example, a MAX666 low power linear regulator manufactured by MAXIM, which has an input terminal Vin and an output terminal Vout. The input terminal Vin is coupled to the input port 364 through zener diode D3. The zener diode D3 has the effect of reducing leakage current when the input voltage supplied to the input port 364 reaches the first magnitude. In one embodiment, zener diode D3 is a 2.7 volt zener diode. The output terminal supplies a regulated output voltage, Vreg. In one embodiment, Vreg has a magnitude of 3 volts. The magnitude of the output voltage Vreg is determined by the magnitude of resistors Rset1 and Rset2, for example, 560 k.OMEGA. and 820 k.OMEGA., respectively, for an output voltage of 3 volts. If the magnitude of the voltage at the input terminal Vin falls below a second voltage magnitude, e.g., 2.6 volts, then a voltage at a terminal LBin ("low-battery-in") is pulled low by the linear regulator and the voltage at a terminal LBout ("low-battery-out") is momentarily driven to ground, thereby sending a negative pulse through capacitor C3, which causes transistor Q1 to turn off. The turning off of transistor Q1 causes transistor Q2 to turn off, and thereby initiates a charging cycle for the one or more energy storage devices, e.g., capacitor C1, of the charge storing circuit 332. In one embodiment, resistors RLB1 and RLB2 each have a magnitude of 680 k.OMEGA. Capacitors C2, C3 and C4 may have any suitable magnitude, for example, 0.1 microfarads (uf). In some embodiments, one or more portions of the circuits and/or devices 326 (e.g., charge supplying circuit 332, DC/DC converter circuit 362 and/or circuits and/or devices 330) are disposed in or on, and/or integrated in or on, MEMS 10.

It should be understood that the power conditioning circuitry 360 and the DC/DC converter circuit 362 are not limited to the circuits described above. Some embodiments may employ a power conditioning circuit similar to that disclosed in J. Kymissis, C. Kendall, J. Paradiso, and N. Gershenfeld, "Parasitic Power Harvesting in Shoes", In Proc. of the Second IEEE International Conference on Wearable Computing (ISWC), IEEE Computer Society Press, October 1998, pages pp. 132-139, also published as, J. Kymissis, C. Kendall, J. Paradiso and N. Gershenfeld, "Parasitic Power Harvesting in Shoes", Proceedings of the Second International Symposium on Wearable Computers, October 1998, pp. 132-139 (hereinafter, the "Parasitic Power Harvesting in Shoes" paper). It is expressly noted, that the entire contents of the Parasitic Power Harvesting in Shoes paper are incorporated by reference herein, however, unless stated otherwise, the aspects and/or embodiments of the present invention are not limited in any way by the description and/or illustrations set forth in such paper.

Figure 10H:
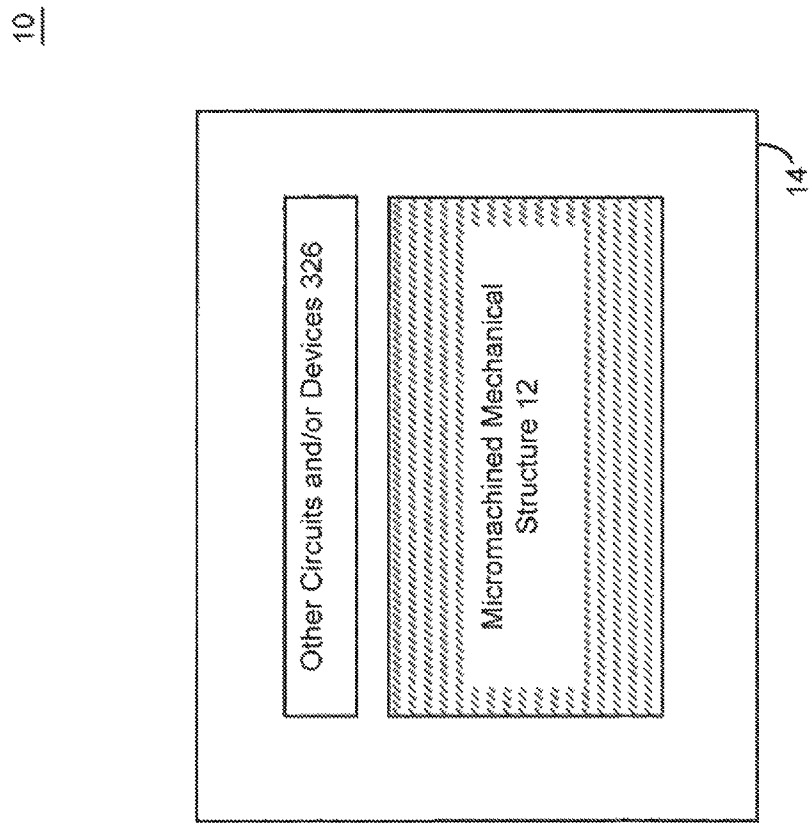
FIG. 10H is a block diagram of a microelectromechanical system (MEMS) disposed on a substrate, in conjunction one or more other circuits and/or devices that may be coupled thereto, in accordance with certain aspects of the present invention.

With reference to FIG. 10H, in one exemplary embodiment, MEMS 10 includes the micromachined mechanical structure 12 disposed on substrate 14, for example, an undoped semiconductor-like material, a glass-like material, or an insulator-like material and further includes one or more portions of one or more other circuits and/or devices 326 (e.g., charge supplying circuit 332, DC/DC converter circuit 362 and/or one or more other circuits and/or devices 330) that are disposed in or on, and/or integrated in or on, MEMS 10 and which may be coupled, directly and/or indirectly, to the micromachined mechanical structure 12.

As stated above, one or more portions of the electrical energy generated by the energy harvesting device 325 may be supplied, directly and/or indirectly, to the one or more circuits and/or devices 326 and/or may be used, directly and/or indirectly, in powering one or more portions of the circuits and/or devices 326 and/or for any other purpose(s). The MEMS 10 may be a monolithic structure including mechanical structure 12 and one or more portions (i.e., one, some or all portions) of the one or more other circuits and/or devices 326. In some embodiments, MEMS 10 is a monolithic structure that includes mechanical structure 12 and all portions of the one or more other circuits and/or devices 326. In some other embodiments, the one or more other circuits and/or devices 326 include one or more discrete devices and/or one or more portions that reside on a separate, discrete substrate that, after fabrication, is mounted on and/or bonded to or on substrate 14 (or any other portion of MEMS 10).

Figure 10I:
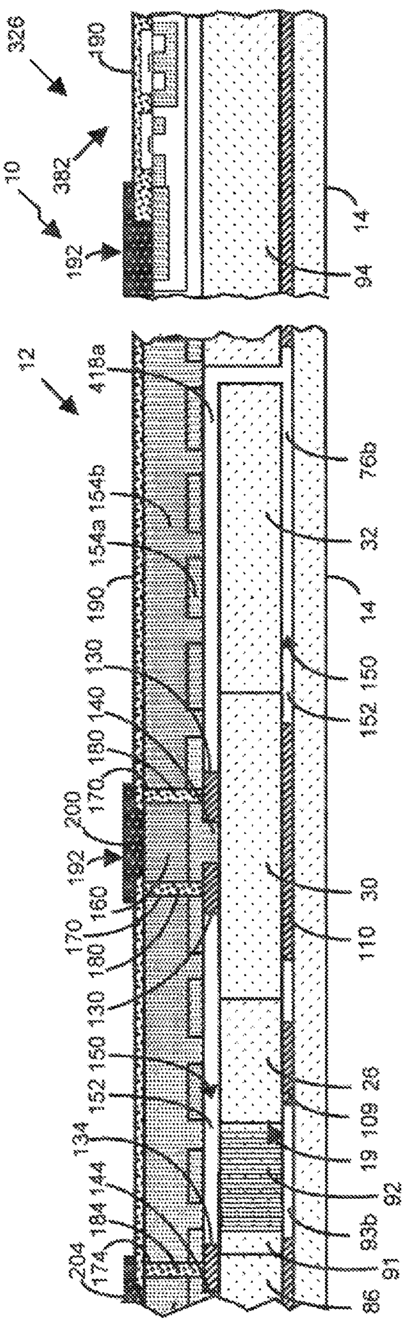
FIG. 10I illustrates a cross-sectional view of a MEMS according to certain aspects of the present inventions, including the portion of the micromachined mechanical illustrated in FIG. 2A (cross sectional view thereof taken in the direction A-A of FIG. 2A) and an integrated circuit portion, both portions of which are disposed or integrated on or in a common substrate.
Figure 10J:
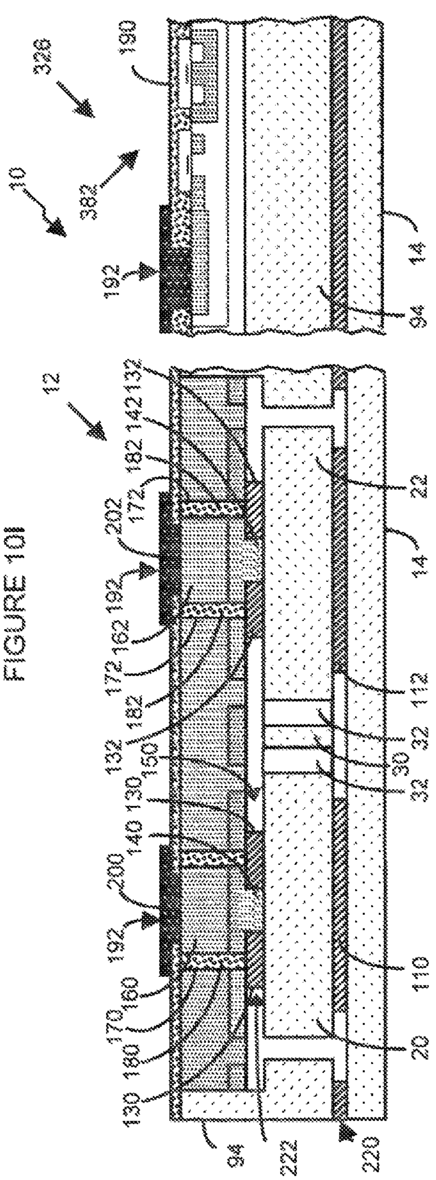
FIG. 10J illustrates a cross-sectional view of a MEMS according to certain aspects of the present inventions, including the portion of the micromachined mechanical illustrated in FIG. 2A (cross sectional view thereof taken in the direction B-B of FIG. 2A) and an integrated circuit portion, both portions of which are disposed or integrated on or in a common substrate.

For example, with reference to FIGS. 10I and 10J, one or more integrated circuits 382 of the one or more other circuits 326 may be fabricated using conventional techniques after definition of mechanical structure 12 using, for example, the techniques described and illustrated in Microelectromechanical Systems and Method of Encapsulating Patent Application Publication and/or Microelectromechanical Systems Having Trench Isolated Contacts Patent. In this regard, after fabrication and encapsulation of mechanical structure 12, integrated circuits 382 may be fabricated using conventional techniques and interconnected, for example, to one or more contact areas, e.g., one or more of contact areas 84*a*, 86*a*, 20*a*, 22*a*, of one or more mechanical structures, e.g., electrodes 84, 86, 20, 22, respectively, of micromachined mechanical structure 12 by way of conductive layer 192. In particular, as is also illustrated and described in Microelectromechanical Systems and Method of Encapsulating Patent Application Publication (for example, FIGS. 12A-12C thereof and/or Microelectromechanical Systems Having Trench Isolated Contacts Patent (for example, FIGS. 14A-14E thereof, a contact area (e.g., one or more of contact areas 84*a*, 86*a*, 20*a*, 22*a*) of a mechanical structure (one or more of electrodes 84, 86, 20, 22, respectively) may be accessed directly by integrated circuitry 382 via a low resistance electrical path (e.g., conductive layer 192) that facilitates a good electrical connection. An insulation layer (e.g., insulation layer 190) may be deposited, formed and/or grown and patterned and, thereafter, a conductive layer (e.g., a conductive layer 192) (for example, a heavily doped polysilicon or metal such as aluminum, chromium, gold, silver, molybdenum, platinum, palladium, tungsten, titanium, and/or copper) may be formed.

Figure 10K:
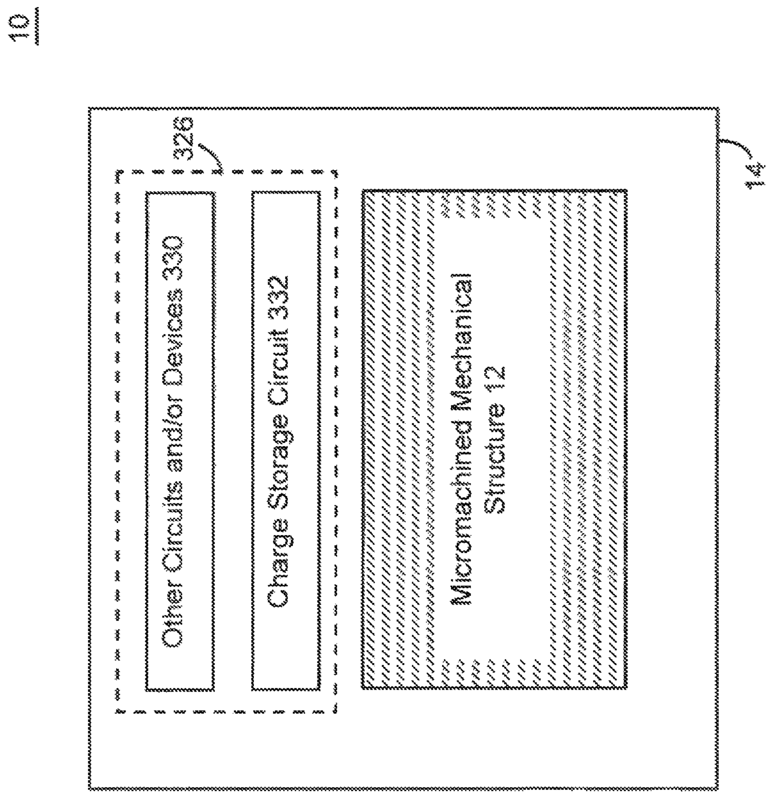
FIG. 10K is a block diagram of a microelectromechanical system (MEMS) disposed on a substrate, in conjunction with one embodiment of the one or more other circuits and/or devices that may be coupled thereto, in accordance with certain aspects of the present invention.

With reference to FIG. 10K, in some embodiments the other circuits and/or devices 326 includes charge storage circuit 332 and one or more other circuits and/or devices 330 disposed in or on, and/or integrated in or on, MEMS 10. As stated above, in operation, vibrational energy 328 may be supplied to the energy harvesting device 325, which may convert at least a portion of such energy to electrical energy, one or more portions of which may be supplied to the charge storage circuit 332. The charge storage circuit 332 may store one or more portions of the electrical energy supplied thereto and may supply electrical energy, directly and/or indirectly, to the one or more other circuits and/or devices 330, which may use one or more portions of the electrical energy supplied thereto for power and/or any other purpose(s).

Figure 10L:
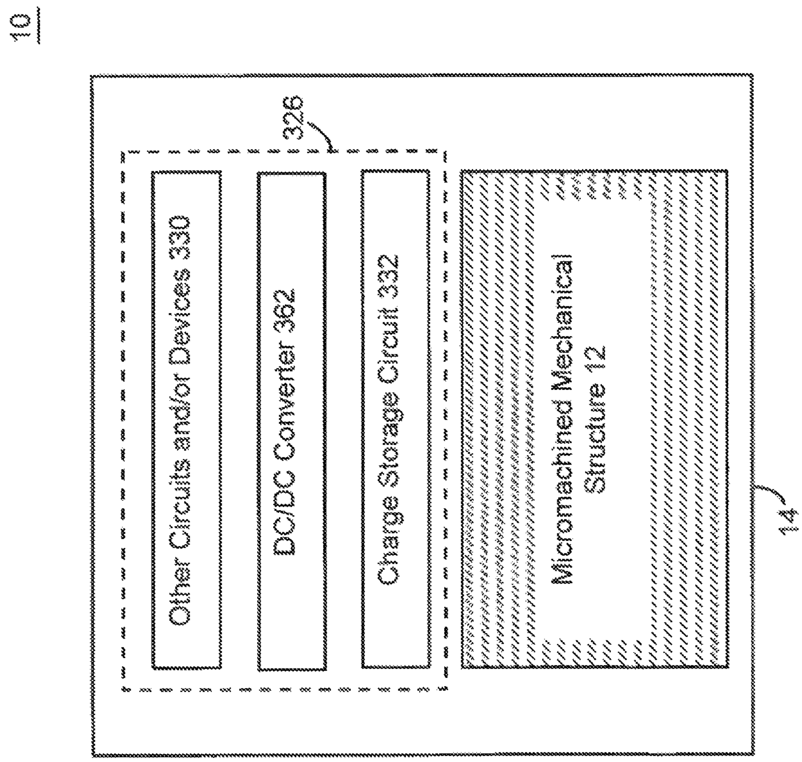
FIG. 10L is a block diagram of a microelectromechanical system (MEMS) disposed on a substrate, in conjunction with one embodiment of the one or more other circuits and/or devices that may be coupled thereto, in accordance with certain aspects of the present invention.

With reference to FIG. 10L, in some embodiments the other circuits and/or devices 326 includes charge storage circuit 332, DC/DC converter circuit 362 and one or more other circuits and/or devices 330 disposed in or on, and/or integrated in or on, MEMS 10. As stated above, in operation, vibrational energy 328 may be supplied to the energy harvesting device 325, which may convert at least a portion of such energy to electrical energy, one or more portions of which may be supplied to the charge storing circuit 332. The charge storing circuit 332 stores at least a portion of the electrical energy supplied thereto and generates a voltage, Vstore, which may be supplied to the DC/DC converter circuit 362. The DC/DC converter circuit 362 may generate a regulated DC voltage, Vreg, which may be supplied, directly or indirectly, to the one or more other circuits and/or devices 330 and/or may be used, directly and/or indirectly, in powering one or more portions of one or more circuits and/or devices and/or for any other purpose(s).

Figure 11:
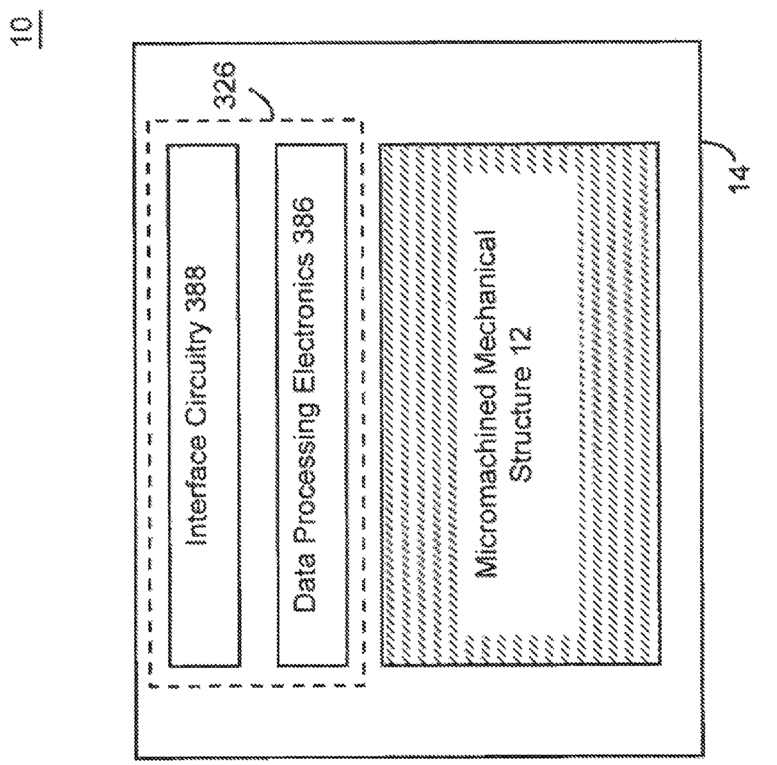
FIG. 11 is a block diagram of a microelectromechanical system (MEMS) disposed on a substrate, in conjunction with one embodiment of the one or more other circuits and/or devices that may be coupled thereto, which includes data processing electronics and interface circuitry, in accordance with certain aspects of the present invention.

With reference to FIG. 11, in some embodiments, the one or more circuits and/or devices 326 includes data processing electronics 386 and/or interface circuitry 388 disposed in or on, and/or integrated in or on, MEMS 10. In one exemplary embodiment, MEMS 10 includes the micromachined mechanical structure 12 disposed on substrate 14, for example, an undoped semiconductor-like material, a glass-like material, or an insulator-like material and further includes data processing electronics 386 and interface circuitry 388 disposed in or on, and/or integrated in or on, MEMS 10. As stated above, data processing electronics 386 may be any type of data processing electronics including, for example, but not limited to data processing electronics to (1) process and/or analyze information generated by transducer 384, micromachined mechanical structure 12 and/or any other circuits and/or devices, and/or (2) control and/or monitor the operation of transducer 384, micromachined mechanical structure 12 and/or any other circuits and/or devices. As stated above, data processing circuitry may comprise a processor. Interface circuitry 388 may be any type of interface circuitry including, for example, but not limited to interface circuitry to (1) provide information from a transducer, micromachined mechanical structure 12, data processing electronics 386, and/or any other circuits and/or devices to one or more external devices (FIGS. 12C-12D), for example, a computer, indicator/display and/or sensor and/or (2) provide information to a transducer, micromachined mechanical structure 12, data processing electronics 386 and/or any other circuits and/or devices from one or more external devices (FIGS. 12C-12D), for example, a computer, indicator/display and/or a sensor.

The data processing electronics 386 and/or interface circuitry 388 may be integrated in or on substrate 14. In this regard, MEMS 10 may be a monolithic structure including mechanical structure 12, data processing electronics 386 and interface circuitry 388. One or more portions of data processing electronics 386 and/or interface circuitry 388 may also reside on a separate, discrete substrate that, after fabrication, is bonded to or on substrate 14.

Figure 12A:
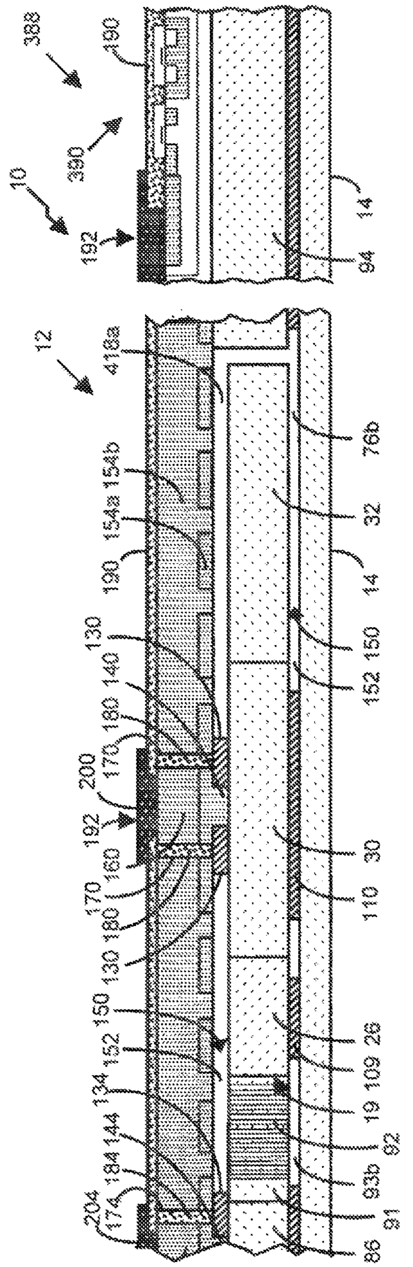
FIG. 12A illustrates a cross-sectional view of a MEMS according to certain aspects of the present inventions, including the portion of the micromachined mechanical illustrated in FIG. 2A (cross sectional view thereof taken in the direction A-A of FIG. 2A) and an integrated circuit portion, both portions of which are disposed or integrated on or in a common substrate.
Figure 12B:
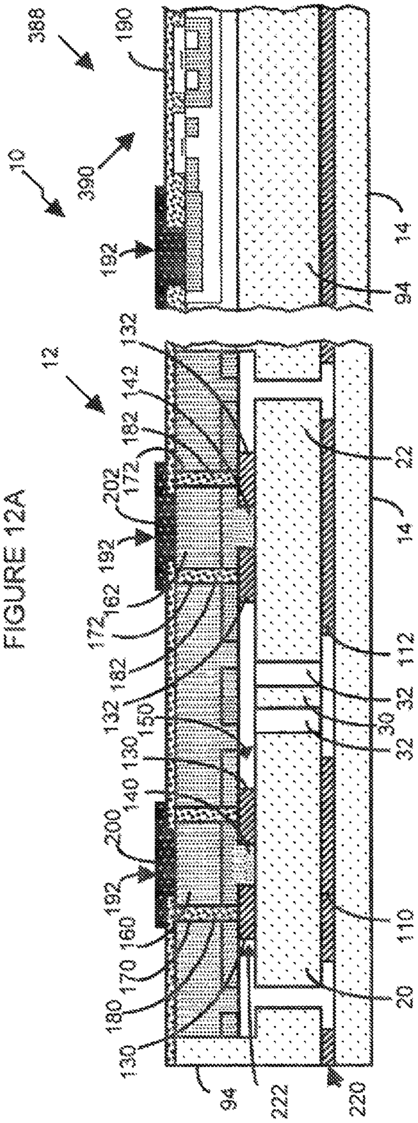
FIG. 12B illustrates a cross-sectional view of a MEMS according to certain aspects of the present inventions, including the portion of the micromachined mechanical illustrated in FIG. 2A (cross sectional view thereof taken in the direction B-B of FIG. 2A) and an integrated circuit portion, both portions of which are disposed or integrated on or in a common substrate.
Figure 12C:
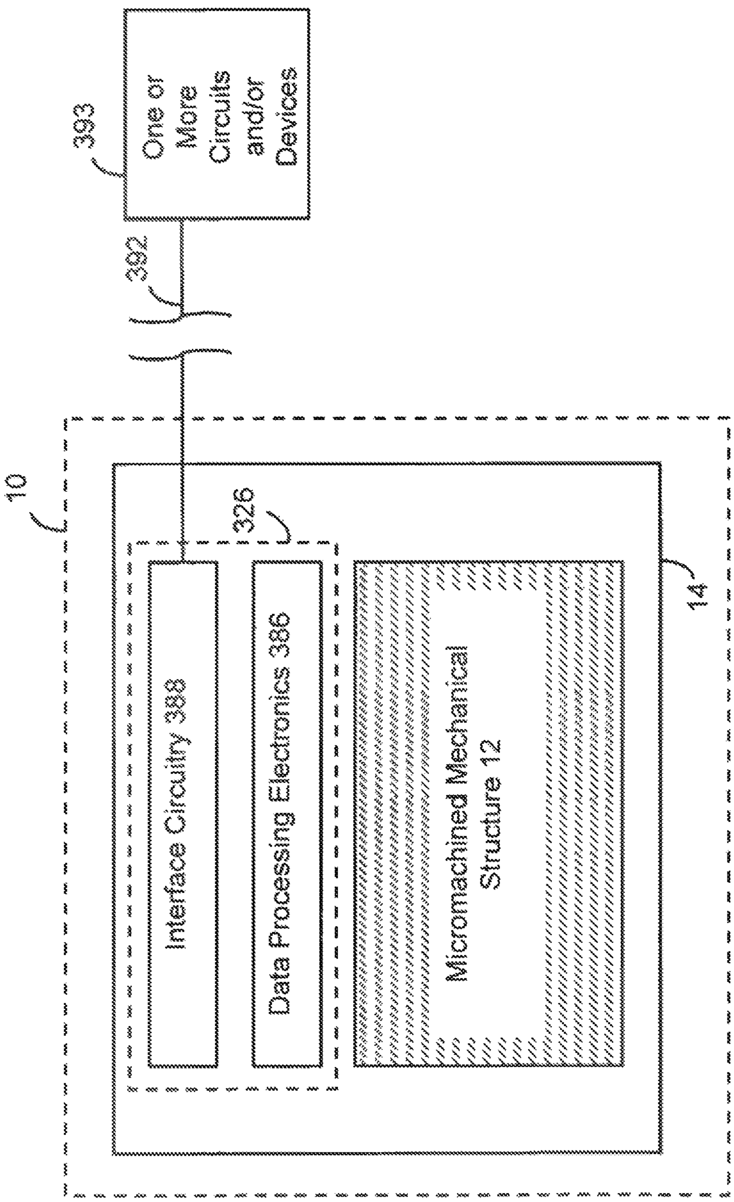
FIG. 12C is a block diagram of a microelectromechanical system (MEMS) disposed on a substrate, in conjunction with one embodiment of the one or more other circuits and/or devices that may be coupled thereto, which includes data processing electronics, interface circuitry, and one or more external circuits and/or devices that may be coupled to the interface circuitry, in accordance with certain aspects of the present invention.
Figure 13A:
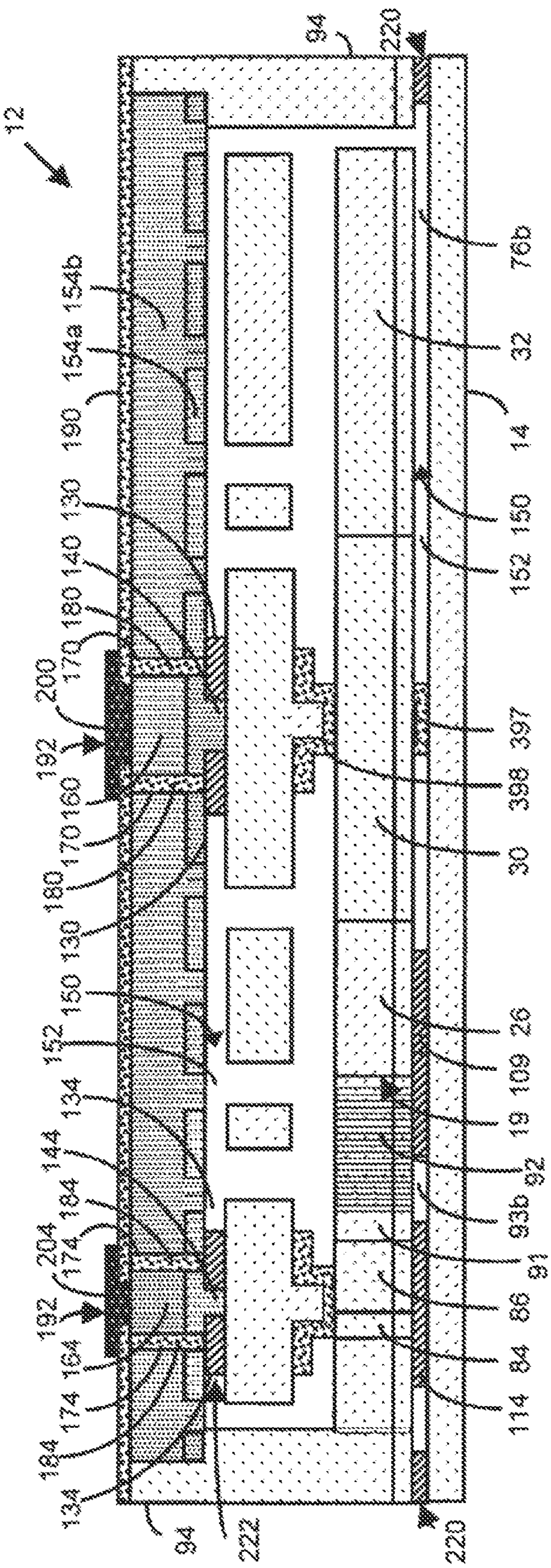
FIGS. 13A-13B illustrate cross-sectional views of micromechanical structures, which may be monolithically integrated on or within the substrate of a MEMS, in accordance with certain aspects of the present invention.
Figure 13B:
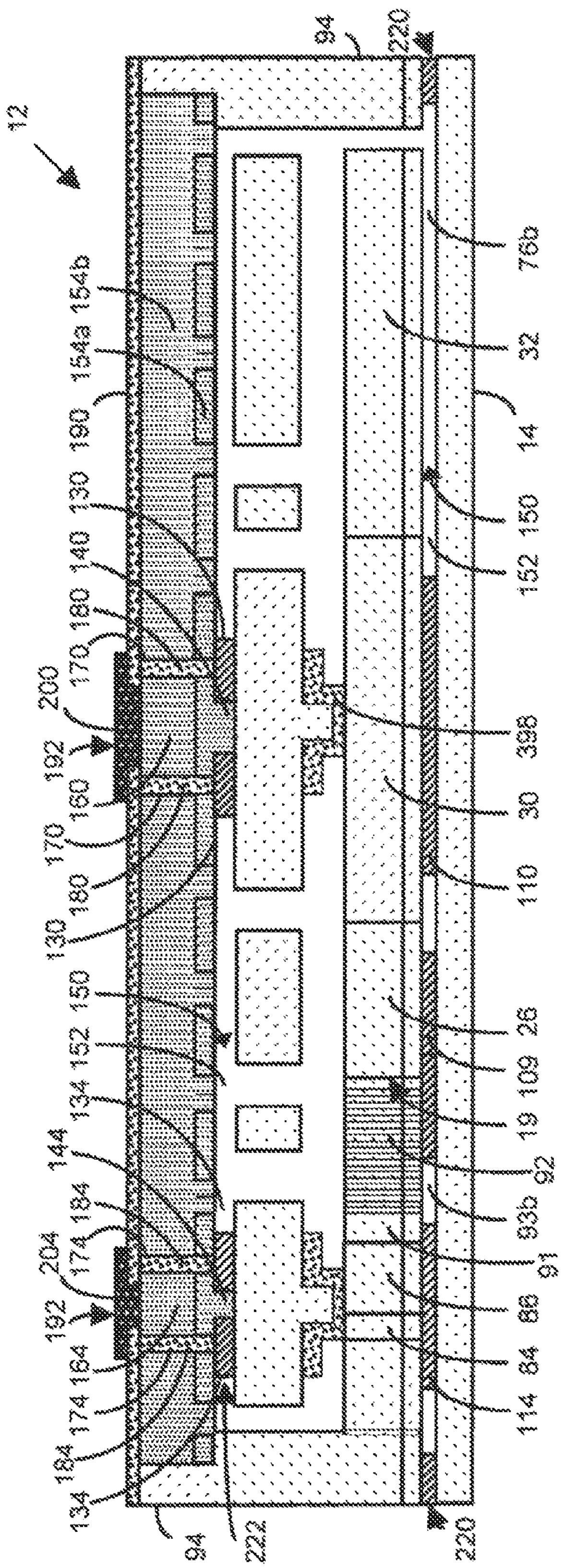

For example, with reference to FIGS. 12A and 12B, integrated circuits 390 may be fabricated using conventional techniques after definition of mechanical structure 12 using, for example, the techniques described and illustrated in Microelectromechanical Systems and Method of Encapsulating Patent Application Publication and/or Microelectromechanical Systems Having Trench Isolated Contacts Patent (see, for example, FIG. 13B). In this regard, after fabrication and encapsulation of mechanical structure 12, integrated circuits 390 may be fabricated using conventional techniques and interconnected, for example, to one or more contact areas, e.g., one or more of contact areas 84*a*, 86*a*, 20*a*, 22*a*, of one or more mechanical structures, e.g., electrodes 84, 86, 20, 22, respectively, of micromachined mechanical structure 12 by way of conductive layer 192. In particular, as is also illustrated and described in Microelectromechanical Systems and Method of Encapsulating Patent Application Publication (for example, FIGS. 12A-12C thereof and/or Microelectromechanical Systems Having Trench Isolated Contacts Patent (for example, FIGS. 14A-14E thereof), a contact area (e.g., one or more of contact areas 84*a*, 86*a*, 20*a*, 22*a*) of a mechanical structure (one or more of electrodes 84, 86, 20, 22, respectively) may be accessed directly by integrated circuitry 390 via a low resistance electrical path (e.g., conductive layer 192) that facilitates a good electrical connection. An insulation layer (e.g., insulation layer 190) may be deposited, formed and/or grown and patterned and, thereafter, a conductive layer (e.g., a conductive layer 192) (for example, a heavily doped polysilicon or metal such as aluminum, chromium, gold, silver, molybdenum, platinum, palladium, tungsten, titanium, and/or copper) may be formed.

As stated above, one or more portions of data processing electronics 386 and/or one or more portions of interface circuitry 388 may receive, directly and/or indirectly, electrical energy generated by the energy harvesting device 325. The electrical energy may be used, directly and/or indirectly, in powering one or more portions of the data processing electronics 386 and interface circuitry 388 and/or for any other purpose(s).

With reference to FIG. 12C, in some embodiments, interface circuitry 388 may be coupled to, and/or a portion of, one or more communication links, e.g., communication link 392, to one or more circuits and/or devices 393, disposed external to MEMS 10. A communication link may be any kind of communication link including, for example, but not limited to, for example, wired (e.g., conductors, fiber optic cables) or wireless (e.g., acoustic links, electromagnetic links or any combination thereof including, for example, but not limited to microwave links, satellite links, infrared links), and combinations thereof, each of which may be public or private, dedicated and/or shared (e.g., a network). A communication link may transmit any type of information in any form, including, for example, but not limited to, analog and/or digital (a sequence of binary values, i.e. a bit string). The information may or may not be divided into blocks. If divided into blocks, the amount of information in a block may be predetermined or determined dynamically, and/or may be fixed (e.g., uniform) or variable. A communication link may employ a protocol or combination of protocols including, for example, but not limited to the Internet Protocol.

Accordingly, interface circuitry 388 may include one or more circuits for use in association with one or more wired communication links, one or more circuits for use in association with one or more wireless communication links and/or any combination thereof. In some embodiments, interface circuitry 388 includes circuitry to facilitate wired, wireless and/or optical communication to and/or from MEMS 10 and/or within MEMS 10. The circuitry to facilitate wired, wireless and/or optical communication may have any form. In some embodiments, one or more portions of the circuitry to facilitate wired, wireless and/or optical communication is disposed in the same integrated circuit as one or more other portions of the interface circuitry 388 and/or data processing electronics 386. In some embodiments, one or more portions of the circuitry to facilitate wired, wireless and/or optical communication may be disposed in or on, and/or integrated in or on, MEMS 10. In some embodiments, one or more portions of the circuitry to facilitate wired, wireless and/or optical communication is in a discrete form, separate from the other portions of the interface circuitry 388 and/or data processing electronics 386.

Figure 12D:
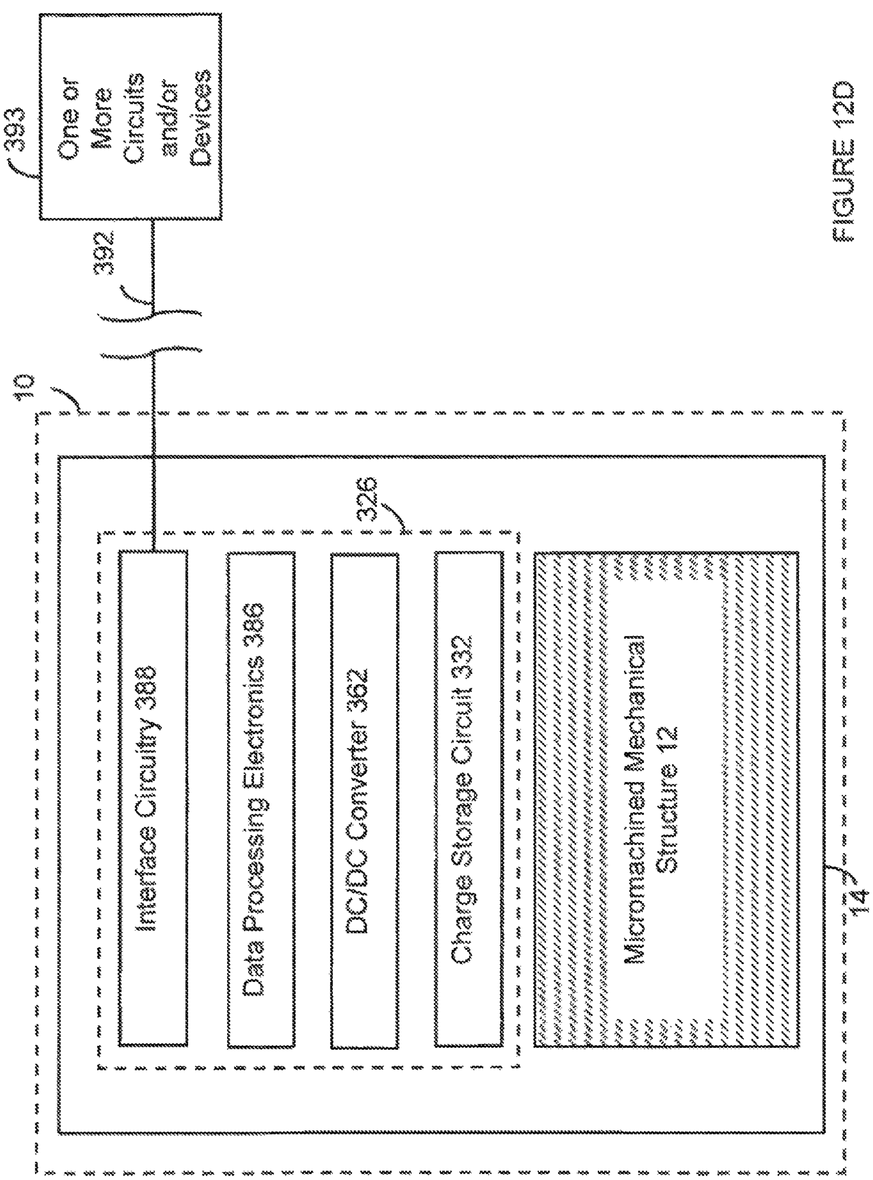
FIG. 12D is a block diagram of a microelectromechanical system (MEMS) disposed on a substrate, in conjunction with one embodiment of the one or more other circuits and/or devices that may be coupled thereto, which includes a charge storage circuit, a DC/DC converter, data processing electronics, interface circuitry, and one or more external circuits and/or devices that may be coupled to the interface circuitry, in accordance with certain aspects of the present invention.

With reference to FIG. 12D, in some embodiments, the one or more circuits and/or devices 326 includes charge storage circuit 332, DC/DC converter circuit 362, data processing electronics 386 and interface circuitry 388 disposed in or on, and/or integrated in or on, MEMS 10. In one exemplary embodiment, MEMS 10 includes the micromachined mechanical structure 12 disposed on substrate 14, for example, an undoped semiconductor-like material, a glass-like material, or an insulator-like material and further includes one or more other circuits and or devices 326, including charge storage circuit 332, DC/DC converter circuit 362, data processing electronics 386 and interface circuitry 388 disposed in or on, and/or integrated in or on, MEMS 10. One or more portions of the electrical energy generated by the energy harvesting device 325 may be supplied, directly and/or indirectly, to one or more portions of the data processing electronics 386 and/or one or more portions of the interface circuitry 388. Such electrical energy may be used in powering one or more portions of the data processing electronics 386, powering one or more portions of the interface circuitry 388 and/or for any other purpose(s).

It should be understood that a circuit and/or device may include, for example, hardware, software, firmware, hardwired circuits and/or any combination thereof. Moreover, a circuit and/or device may be, for example, programmable or non programmable, general purpose or special purpose, dedicated or non dedicated, distributed or non distributed, shared or not shared, and/or any combination thereof. If a circuit and/or device is a distributed circuit and/or device, two or more portions of such circuit and/or device may be coupled to one another in any way, for example, but not limited by via electrical conductors, and/or may communicate with one another via one or more communication links.

In some embodiments, one or more MEMS 10 are employed in one or more devices employed in a distributed system.

Figure 12E:
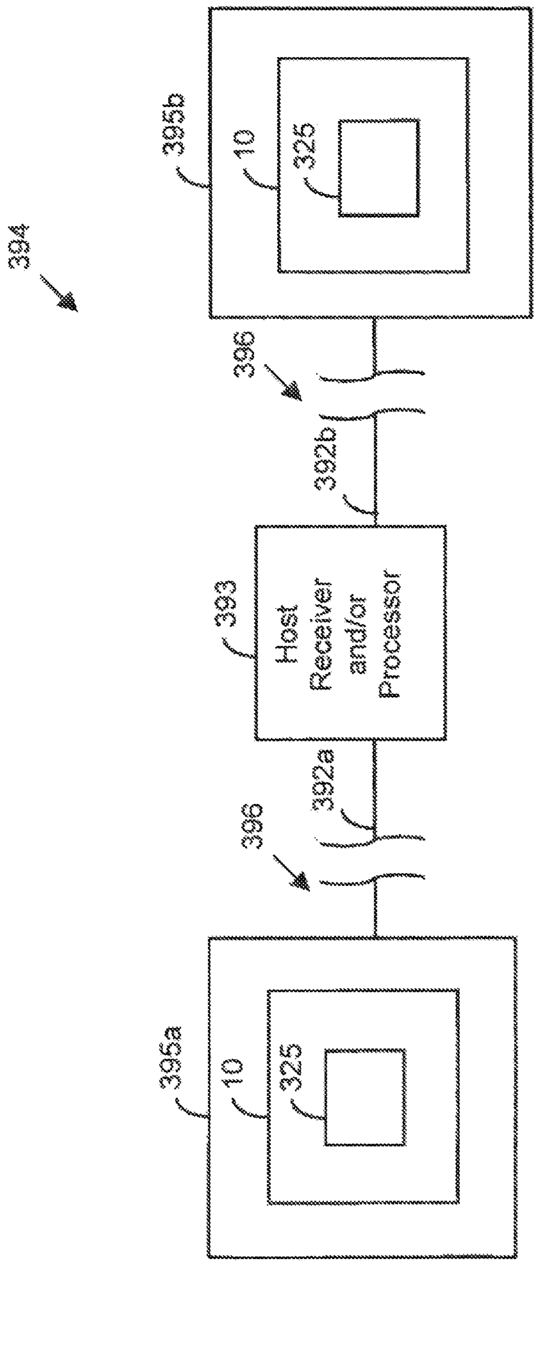
FIG. 12E is a schematic diagram of a distributed system having one or more devices that may employ one or more of the MEMS illustrated in FIG. 1 in conjunction with a communication system and a host receiver and/or processor, in accordance with certain aspects of the present invention.

With reference to FIG. 12E, in one embodiment, a distributed system 394 includes one or more devices, e.g., devices 395*a*, 395*b*, connected via a communication system 396 to one or more circuits and/or devices, e.g., a host receiver 393 and/or processor. The communication system 396 may be any type of communication system and may include one or more communication links, e.g., communication links 392*a*, 392*b*. The communication system may be used, for example, in providing information from one or more of the devices to the host receiver and/or processor 393 and/or in providing information from the host receiver and/or processor 393 to one or more of the devices. The information may have any form, including for example, but not limited to, data type information and/or control type information. The host receiver 393 may include any type of receiver and/or processor. As further discussed below with respect to FIG. 12H, a processor may be any type of processor.

Each of the one or more devices, e.g., devices 395*a*, 395*b*, may be any type of device including, but not limited to, an energy harvesting device, a sensor (e.g., an accelerometer, gyroscope, microphone, pressure sensor, strain sensor, tactile sensor, magnetic sensor and/or temperature sensor), a resonator, a resonant filter, a processor, an input device, and output device and/or any combination thereof.

In some embodiments, one or more of the one or more devices, e.g., devices 395*a*, 395*b*, includes one or more of the MEMS 10 described herein. As stated above, MEMS 10 may be any type of device including, for example, but not limited to, an energy harvesting device, a sensor (e.g., an accelerometer, gyroscope, microphone, pressure sensor, strain sensor, tactile sensor, magnetic sensor and/or temperature sensor), a resonator, a resonant filter, a processor, an input device, and output device and/or any combination thereof.

One or more of the one or more MEMS 10 may include an energy harvesting device 325. As described above, energy (e.g., vibrational energy) may be supplied to the energy harvesting device 325, which may convert at least a portion of such energy to electrical energy.

Figure 12F:
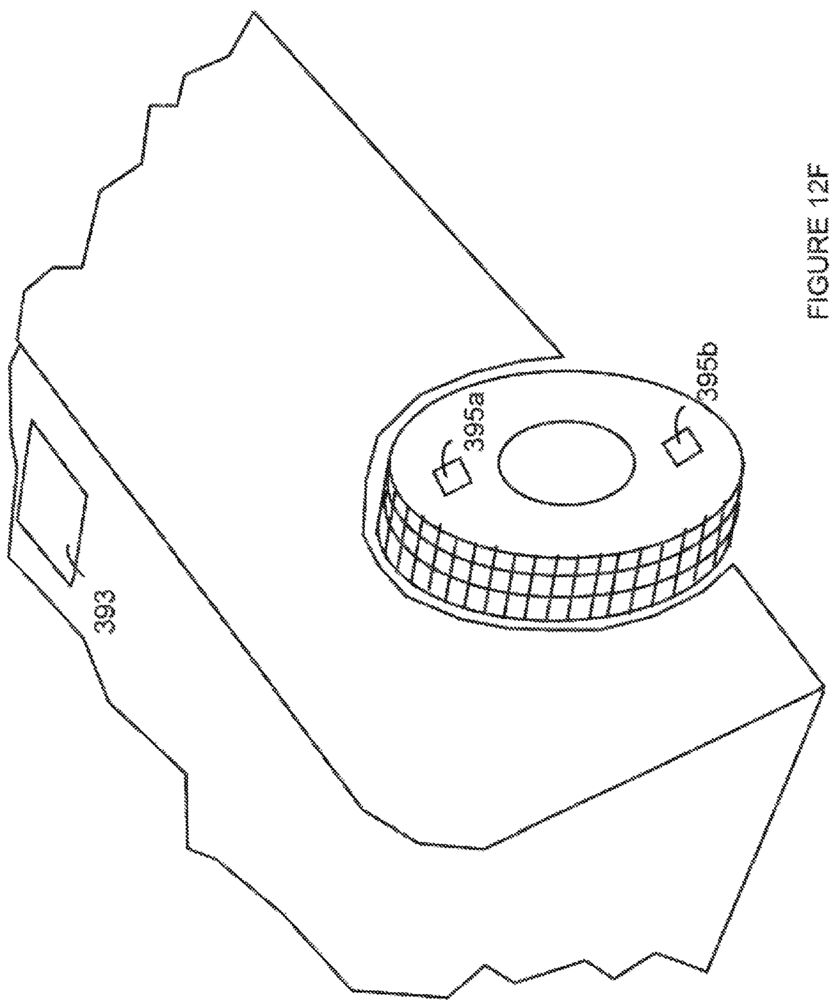
FIG. 12F illustrates a schematic diagram of one embodiment of the distributed system of FIG. 12E to monitor tire conditions, e.g., temperature, pressure and/or vibration, in conjunction with a vehicle having a tire, in accordance with certain aspects of the present invention.
Figure 12G:
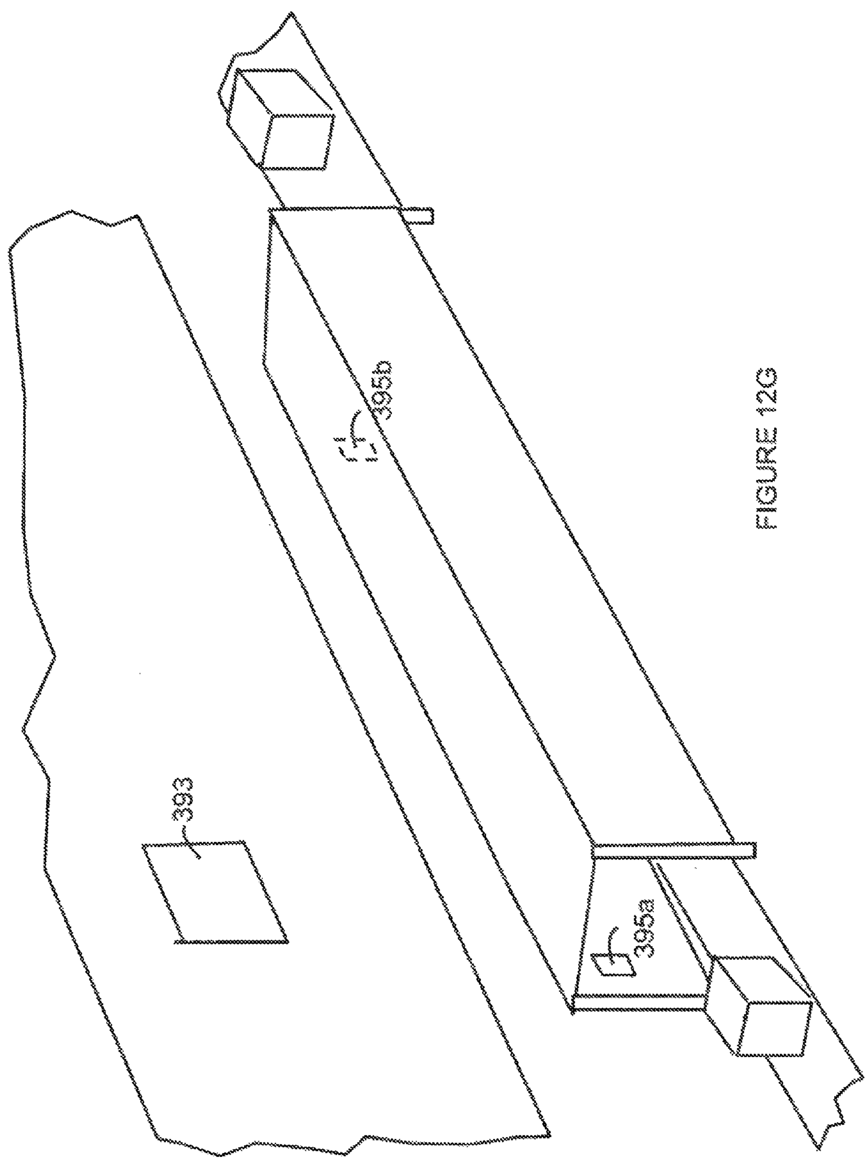
FIG. 12G illustrates a schematic diagram of one embodiment of the distributed system of FIG. 12E to monitor an industrial process, in conjunction with a portion of an industrial facility, in accordance with certain aspects of the present invention.
Figure 12H:
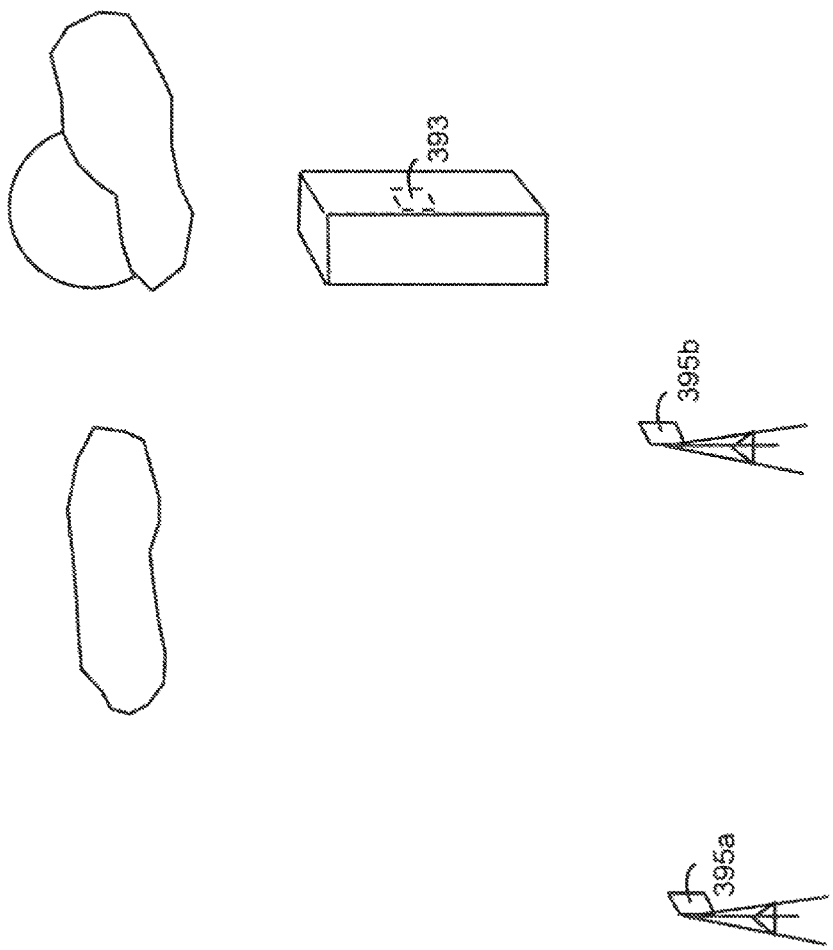
FIG. 12H illustrates a schematic diagram of another embodiment of the distributed system of FIG. 12E to monitor one or more environmental conditions (e.g., temperature, pressure, vibration), in conjunction with distributed structures that support the distributed monitoring devices and a structure at a remote location that supports the host receiver and/or processor, in accordance with certain aspects of the present invention.
Figure 12I:
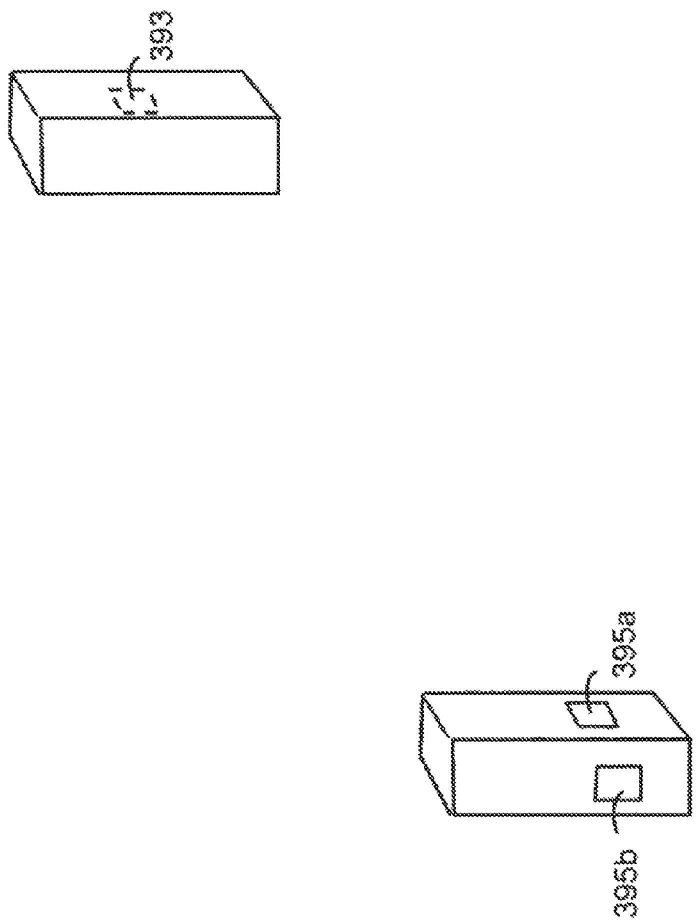
FIG. 12I illustrates a schematic diagram of another embodiment of the distributed system of FIG. 12 to monitor one or more conditions and/or activities relating to security, in conjunction with a structure that support the monitoring devices and a structure at a remote location that supports the host receiver and/or processor, in accordance with certain aspects of the present invention.
Figure 12J:
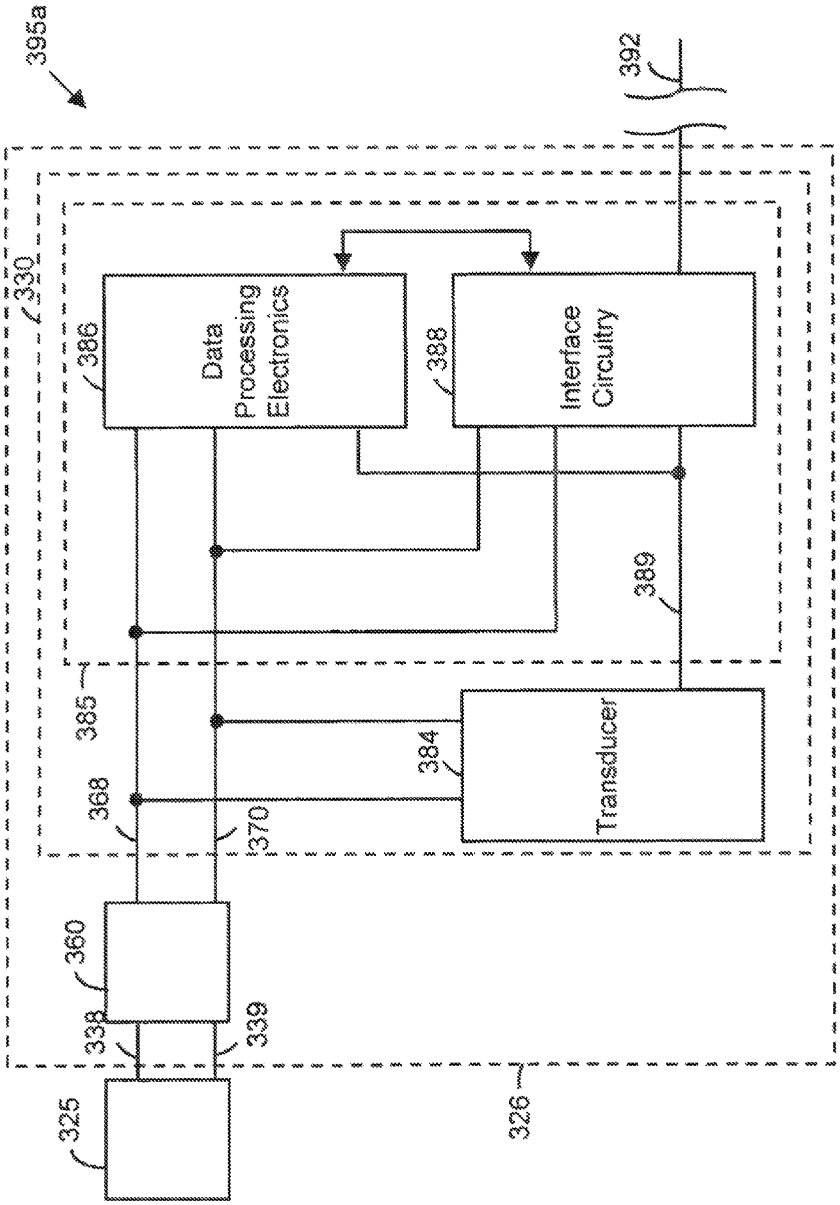
FIG. 12J illustrates a schematic diagram of one embodiment of a device that may be employed in the distributed system of FIG. 12E, in accordance with certain aspects of the present invention.

With reference to FIG. 12J, in some embodiments, one or more of the devices, e.g., devices 395*a*, 395*b*, further includes one or more other circuits and/or devices, e.g., other circuits and/or devices 326. One or more portions of the electrical energy generated by the energy harvesting device 325 may be supplied, directly and/or indirectly, to the one or more other circuits and/or devices 326 and/or may be used, directly and/or indirectly, in powering one or more portions of the one or more other circuits and/or devices 326 and/or for any other purpose(s). Such one or more other circuits and/or devices 326 may be disposed in or on MEMS 10, integrated in or on MEMS 10, and/or disposed in any other location. In some embodiments, one, some or all of the devices, e.g., devices 395*a*, 395*b*, are powered entirely by one or more portions of the electrical energy generated by the energy harvesting device 325 such that one, some or all of such devices e.g., devices 395*a*, 395*b*, are able to operate and/or supply information indefinitely (or at least a desired period of time), without any need for a battery and/or an external power supply.

In some embodiments, the one or more other circuits or devices 326 includes a power conditioning circuit 360, a transducer 384 and one or more other circuits and/or devices 385 coupled thereto. The power conditioning circuit 360 may receive one or more portions of the electrical energy generated by the energy harvesting device 325 and may generate a regulated voltage from such energy. The regulated voltage may be supplied, directly and/or indirectly, to the transducer 384 and/or the one or more circuits and/or devices 385 and may be used, directly and/or indirectly, in powering one or more portions of the transducer 384 and/or one or more portions of the one or more circuits and/or devices 385 or for any other purpose.

As stated above, the transducer 384 may be any type of transducer including, for example, but not limited to a sensor (e.g., an accelerometer, a gyroscope, a microphone, a vibration sensor, a pressure sensor, a strain sensor, a tactile sensor, a magnetic sensor and/or a temperature sensor). In some embodiments, transducer 384 comprises a transducer 16 having electrical charge stored on one or more portions thereof in accordance with one or more aspects of the present invention. For example, electrical charge may be stored on an electrode (see for example, first electrode 19 (FIGS. 2A-2C, 3A-3E 14A-14B, 15A-15B, 20A-20B, 21A-21C, 26A-26B, 27A-27C, 32A-32B, 33A-33B, 38A-38C, 42-45, 46A-46B, 47A-47B, 53-56)). In some such embodiments, the transducer 16 may be able to operate and/or supply one or more of the one or more signals without power from energy harvesting device 325, a battery and/or an external power supply. In some embodiments, the transducer 384 is disposed in or on, and/or integrated in or on, the same MEMS 10 as the micromachined mechanical structure 12 defining transducer 16 of energy harvesting device 325.

In some embodiments, the one or more circuits and/or devices 385 include data processing electronics 386 and/or interface circuitry 388. The regulated voltage from the power conditioning circuit 360 may be supplied, directly and/or indirectly, to the data processing electronics 386 and/or the interface circuitry 388 and may be used, directly and/or indirectly, in powering one or more portions of one or more of such circuits and/or for any other purpose(s). One or more portions of the one or more circuits and/or devices 385 may be disposed in or on MEMS 10, integrated in or on MEMS 10, and/or disposed in any other location.

The transducer 384 may be coupled to the data processing electronics 386 and/or the interface circuitry 388, for example, via one or more signal lines, e.g., signal line 389. In operation, transducer 384 may generate a signal indicative of a physical quantity (e.g., vibration) sensed by the transducer 384, which may be supplied to the data processing electronics 386 and/or the interface circuitry 388, for example, via the one or more signal lines, e.g., signal line 389. In some embodiments, the signal from the transducer 384 may be supplied to data processing electronics 368, which may generate a signal in response at least thereto. The signal from the data processing electronics 368 may be supplied to the interface circuitry 388, which may generate a signal in response thereto. Interface circuitry 388 may interface to, and/or may be a portion of, communication link 392, which may supply the signal from the interface circuitry 388 to the host receiver 393. Some embodiments employ the transducer 384 without the one or more circuits and/or devices 385. Some other embodiments employ the one or more circuits and/or devices 385 without the transducer 384.

In some embodiments, transducer 384 and/or one or more circuits and/or devices 385 are powered entirely by one or more portions of the electrical power generated by the energy harvesting device 325, such that transducer 384, one or more circuits and/or devices 385 and/or a device employing transducer 384 and/or one or more circuits and/or devices 385 are able to operate and/or supply information indefinitely (or at least a desired period of time), without any need for a battery and/or an external power supply.

In some embodiments, one or more of the devices, e.g., devices 395*a*, 395*b*, include a transducer 384 that comprises a transducer for monitoring one or more characteristics of a tire (e.g., an automotive tire sensor), a transducer for use in monitoring one or more industrial processes, a transducer for use in monitoring one or more environmental conditions (e.g., a weather condition), and/or a transducer for use in monitoring one or more activities relating to security (e.g., homeland security).

With reference also to FIG. 12F, in one such embodiment, each of the plurality of devices, e.g., devices 395*a*, 395*b*, comprises one or more MEMS 10 and one or more transducers 384 that include one or more transducers to monitor tire conditions, e.g., temperature, pressure and/or vibration. MEMS 10 may include a energy harvesting device 325. The devices, e.g., devices 395*a*, 395*b*, are spaced apart from one another (e.g., on the tire of the vehicle). The transducer(s) monitor one or more tire conditions (e.g., temperature, pressure and/or vibration) and generate one or more signals indicative of the temperature, pressure and/or vibration thereof. In some embodiments, one or more of the signals are supplied to data processing electronics and/or interface circuitry 388, which supplies information indicative thereof, to the host receiver 393. Host receiver 393 may be disposed on the vehicle or at any other location. If an energy harvesting device 325 (e.g., a vibrational energy to electrical energy converter) is employed, energy harvesting device 325 is exposed to vibrational energy (or another type of energy) and generates electrical energy in response thereto. One or more portion of the electrical energy is used, directly and/or indirectly, to power one or more of the transducer(s) and/or interface circuitry 388. In some embodiments, one or more of the transducer(s) to monitor tire conditions (e.g., temperature, pressure and/or vibration) and interface circuitry 388 are disposed in or on and/or integrated in or on MEMS 10. In some embodiments, one, some or all of the devices, e.g., devices 395*a*, 395*b*, are powered entirely by energy harvesting device 325 such that one, some or all of such devices e.g., devices 395*a*, 395*b*, are able to operate and/or supply information indefinitely (or at least a desired period of time), without any need for a battery and/or an external power supply. With reference also to FIG. 12G, in another embodiment, each of the plurality of devices, e.g., devices 395*a*, 395*b*, comprises one or more MEMS 10 and one or more transducers 384 that include one or more transducers for monitoring an industrial process. MEMS 10 may include a energy harvesting device 325. The devices, e.g., devices 395*a*, 395*b*, are spaced apart from one another (e.g., within the industrial facility). The transducer(s) monitors the industrial process and generate one or more signals indicative of the process conditions being monitored. In some embodiments, one or more of the signals are supplied to data processing electronics and/or interface circuitry 388, which supplies information indicative thereof, to the host receiver 393. Host receiver 393 may be disposed at a remote location within the industrial facility. If an energy harvesting device 325 (e.g., a vibrational energy to electrical energy converter) is employed, energy harvesting device 325 is exposed to vibrational energy (or other type of energy) and generates electrical energy in response thereto. One or more portion of the electrical energy is used, directly and/or indirectly, to power one or more of the transducer(s) and/or interface circuitry 388. In some embodiments, one or more of the transducer(s) and interface circuitry 388 are disposed in or on and/or integrated in or on MEMS 10. In some embodiments, one, some or all of the devices, e.g., devices 395*a*, 395*b*, are powered entirely by energy harvesting device 325 such that one, some or all of such devices e.g., devices 395*a*, 395*b*, are able to operate and/or supply information indefinitely (or at least a desired period of time), without any need for a battery and/or an external power supply.

With reference also to FIG. 12H, in another embodiment, each of the plurality of devices, e.g., devices 395*a*, 395*b*, comprises one or more MEMS 10 and one or more transducers 384 that include one or more transducers for use in monitoring one or more environmental conditions (e.g., temperature, pressure, vibration). MEMS 10 may include a energy harvesting device 325. The devices, e.g., devices 395*a*, 395*b*, are spaced apart from one another (e.g., outdoors). The transducer(s) monitor one or more environmental conditions and generate one or more signals indicative of the environmental condition(s) being monitored (e.g., temperature, pressure, vibration). In some embodiments, one or more of the signals are supplied to data processing electronics and/or interface circuitry 388, which supplies information indicative thereof, to the host receiver 393. Host receiver may be disposed at a remote location (e.g., a weather center). If an energy harvesting device 325 (e.g., a vibrational energy to electrical energy converter) is employed, energy harvesting device 325 is exposed to vibrational energy (or other type of energy) and generates electrical energy in response thereto. One or more portion of the electrical energy is used, directly and/or indirectly, to power one or more of the transducer(s) and/or interface circuitry 388. In some embodiments, one or more of the transducer(s) and interface circuitry 388 are disposed in or on and/or integrated in or on MEMS 10. In some embodiments, one, some or all of the devices, e.g., devices 395*a*, 395*b*, are powered entirely by energy harvesting device 325 such that one, some or all of such devices e.g., devices 395*a*, 395*b*, are able to operate and/or supply information indefinitely (or at least a desired period of time), without any need for a battery and/or an external power supply.

With reference also to FIG. 121, in another embodiment, each of the plurality of devices, e.g., devices 395*a*, 395*b*, comprises one or more MEMS 10 and one or more transducers 384 that include one or more transducers for use in monitoring one or more conditions and/or activities relating to security (e.g., homeland security). MEMS 10 may include a energy harvesting device 325. The devices, e.g., devices 395*a*, 395*b*, are spaced apart from one another (e.g., at a location to be monitored). The transducer(s) monitor one or more conditions and/or activities relating to security and generate one or more signals indicative of the conditions and/or activities being monitored. In some embodiments, one or more of the signals are supplied to data processing electronics and/or interface circuitry 388, which supplies information indicative thereof, to the host receiver 393. Host receiver 393 may be disposed at a remote location (e.g., a local monitoring station). If an energy harvesting device 325 (e.g., a vibrational energy to electrical energy converter) is employed, energy harvesting device 325 is exposed to vibrational energy (or other type of energy) and generates electrical energy in response thereto. One or more portion of the electrical energy is used, directly and/or indirectly, to power one or more of the transducer(s) and/or interface circuitry 388. In some embodiments, one or more of the transducer(s) and interface circuitry 388 are disposed in or on and/or integrated in or on MEMS 10. In some embodiments, one, some or all of the devices, e.g., devices 395*a*, 395*b*, are powered entirely by energy harvesting device 325 such that one, some or all of such devices e.g., devices 395*a*, 395*b*, are able to operate and/or supply information indefinitely (or at least a desired period of time), without any need for a battery and/or an external power supply.

Some embodiments may employ one or more of the methods and/or devices described and/or illustrated in (1) the "Parasitic Power Harvesting in Shoes" paper and/or (2) the "Parasitic Power Harvesting for Automotive Tire Sensors" paper. As stated above, the entire contents of the Parasitic Power Harvesting in Shoes paper and the Parasitic Power Harvesting for Automotive Tire Sensors paper are each incorporated by reference herein, however, unless stated otherwise, the aspects and/or embodiments of the present invention are not limited in any way by the description and/or illustrations set forth in such papers.

The one or more devices, e.g., devices 395*a*, 395*b*, may be located in one geographic location or may be distributed among two or more geographic locations. The host receiver 393 may be located in the same geographic location as one or more of the plurality of devices, e.g., devices 395*a*, 395*b*, or in a geographic location different from that of any of the plurality of devices, e.g., devices 395*a*, 395*b*. As stated above, the host receiver 393 may be any type of receiver and may include a processor.

It should also be understood that a processor may be implemented in any manner. For example, a processor may be programmable or non programmable, general purpose or special purpose, dedicated or non dedicated, distributed or non distributed, shared or not shared, and/or any combination thereof. If the processor has two or more distributed portions, the two or more portions may communicate via one or more communication links.

A processor may include, for example, but is not limited to, hardware, software, firmware, hardwired circuits and/or any combination thereof. In some embodiments, one or more portions of a processor may be implemented in the form of one or more ASICs. A processor may include, for example, but is not limited to, a computer. A processor may or may not execute one or more computer programs that have one or more subroutines, or modules, each of which may include a plurality of instructions, and may or may not perform tasks in addition to those described herein. If a computer program includes more than one module, the modules may be parts of one computer program, or may be parts of separate computer programs. As used herein, the term module is not limited to a subroutine but rather may include, for example, hardware, software, firmware, hardwired circuits and/or any combination thereof.

In some embodiments, a processor comprises at least one processing unit connected to a memory system via an interconnection mechanism (e.g., a data bus). A memory system may include a computer-readable and writeable recording medium. The medium may or may not be non-volatile. Examples of non-volatile medium include, but are not limited to, magnetic disk, magnetic tape, non-volatile optical media and non-volatile integrated circuits (e.g., read only memory and flash memory). A disk may be removable, e.g., known as a floppy disk, or permanent, e.g., known as a hard drive. Examples of volatile memory include but are not limited to random access memory, e.g., dynamic random access memory (DRAM) or static random access memory (SRAM), which may or may not be of a type that uses one or more integrated circuits to store information.

If a processor executes one or more computer programs, the one or more computer programs may be implemented as a computer program product tangibly embodied in a machine-readable storage medium or device for execution by a computer. Further, if a processor is a computer, such computer is not limited to a particular computer platform, particular processor, or programming language. Computer programming languages may include but are not limited to procedural programming languages, object oriented programming languages, and combinations thereof.

A computer may or may not execute a program called an operating system, which may or may not control the execution of other computer programs and provides scheduling, debugging, input/output control, accounting, compilation, storage assignment, data management, communication control, and/or related services. A computer may for example be programmable using a computer language such as C, C++, Java or other language, such as a scripting language or even assembly language. The computer system may also be specially programmed, special purpose hardware, or an application specific integrated circuit (ASIC).

Example output devices include, but are not limited to, displays (e.g., cathode ray tube (CRT) devices, liquid crystal displays (LCD), plasma displays and other video output devices), printers, communication devices for example modems, storage devices such as a disk or tape and audio output, and devices that produce output on light transmitting films or similar substrates. An output device may include one or more interfaces to facilitate communication with the output device. The interface may be any type of interface, e.g., proprietary or not proprietary, standard (for example, universal serial bus (USB) or micro USB) or custom or any combination thereof.

Example input devices include but are not limited to buttons, knobs, switches, keyboards, keypads, track ball, mouse, pen and tablet, light pen, touch screens, and data input devices such as audio and video capture devices. An output device may include one or more interfaces to facilitate communication with the output device. The interface may be any type of interface, for example, but not limited to, proprietary or not proprietary, standard (for example, universal serial bus (USB) or micro USB) or custom or any combination thereof. Input signals to a processor may have any form and may be supplied from any source, for example, but not limited to.

Further, the various structures of the micromachined mechanical structure 12 may have any orientation including longitudinal, lateral, vertical any combination thereof.

For example, any of the embodiments and/or techniques described herein may be implemented in conjunction with micromachined mechanical structures 12 having one or more transducers or sensors which may themselves include multiple layers that are vertically and/or laterally stacked or interconnected as illustrated in Microelectromechanical Systems and Method of Encapsulating Patent Application Publication and/or Microelectromechanical Systems Having Trench Isolated Contacts Patent. Accordingly, any and all of the inventions and/or embodiments illustrated and described herein may be implemented in, and/or employed in conjunction with, any of the embodiments of Microelectromechanical Systems and Method of Encapsulating Patent Application Publication and/or Microelectromechanical Systems Having Trench Isolated Contacts Patent that include multiple layers of mechanical structures, contacts areas and buried contacts that are vertically and/or laterally stacked or interconnected (see, for example, micromachined mechanical structure 12 of FIGS. 11B, 11C and 11D of Microelectromechanical Systems and Method of Encapsulating Patent Application Publication and/or micromachined mechanical structure 12 of FIGS. 13B, 13C and 13D of Microelectromechanical Systems Having Trench Isolated Contacts Patent). Under such circumstance, the MEMS 10 may be fabricated using the techniques described in this application wherein the mechanical structures include one or more processing steps to provide the vertically and/or laterally stacked and/or interconnected multiple layers (see, for example, FIGS. 13A and 13B).

Thus, any of the techniques, materials and/or embodiments of fabricating and/or encapsulating micromachined mechanical structure 12 that are described in the Microelectromechanical Systems and Method of Encapsulating Patent Application Publication and/or in the Microelectromechanical Systems Having Trench Isolated Contacts Patent may be employed with the embodiments and/or the inventions described herein.

Moreover, the present inventions may implement the anchors and techniques of anchoring mechanical structures 16 to substrate 14 (as well as other elements of MEMS 10) described and illustrated in the Anchors for Microelectromechanical Systems Patent).

In this regard, with reference to FIGS. 13A and 13B, in one embodiment, anchors 397 and/or 398 may be comprised of a material that is relatively unaffected by the release processes of the mechanical structures. In this regard, the etch release process are selective or preferential to the material(s) securing mechanical structures 16 in relation to the material comprising anchors 397. Moreover, anchors 397 and/or 398 may be secured to substrate 14 in such a manner that removal of insulation layer 190 has little to no affect on the anchoring of mechanical structures 16 to substrate 14.

It should be noted that the embodiments described herein may be incorporated into MEMS 10 described and illustrated in Anchors for Microelectromechanical Systems Patent. For the sake of brevity, the inventions and/or embodiments described and illustrated in the Anchors for Microelectromechanical Systems Patent will not be repeated. It is expressly noted, however, that the entire contents of the Anchors for Microelectromechanical Systems Patent, including, for example, the features, attributes, alternatives, materials, techniques and advantages of all of the embodiments and/or inventions, are incorporated by reference herein, although, unless stated otherwise, the aspects and/or embodiments of the present invention are not limited to such features, attributes alternatives, materials, techniques and advantages.

The fabrication and/or formation of the structures of micromachined mechanical structure 12 may be accomplished using the techniques described and illustrated herein or any conventional technique. Indeed, all techniques and materials used to fabricate and/or form mechanical structure 12, whether now known or later developed, are intended to be within the scope of the present invention.

FIGS. 14A-14B and FIGS. 15A-15B illustrate plan views and cross sectional views, respectively, of a portion of another micromachined mechanical structure 12 that may be employed in the MEMS of FIG. 1, in accordance with certain aspects of the present invention. As with the micromachined mechanical structure of FIGS. 2A-2D and FIGS. 3A-3E, micromachined mechanical structure 12 illustrated in FIGS. 14A-14B and FIGS. 15A-15B includes a transducer 16, which may have electrical charge supplied thereto, stored thereon and/or trapped thereon. The transducer 16 may be any type of transducer, for example, an energy harvesting device, a sensor (e.g., an accelerometer, a gyroscope, a microphone, a vibration sensor, a pressure sensor, a strain sensor, a tactile sensor, a magnetic sensor and/or a temperature sensor), a resonator, a resonant filter, and/or a combination thereof. In this embodiment, transducer 16 comprises a capacitive transducer, however, the transducer 12 is not limited to such.

In the micromachined mechanical structure 12 illustrated in FIGS. 14A-14B and FIGS. 15A-15B, transducer 16 includes a plurality of mechanical structures disposed on, above and/or in substrate 14, including, for example first, second and third electrodes 19, 20, 22. The first, second and third electrodes 19, 20, 22 and/or other mechanical structures may each have any configuration. In the illustrated embodiment, for example, the first electrode 19 includes a fixed mechanical structure 26 and a movable mechanical structure 28 supported thereby. The movable mechanical structure 28 is similar to the movable mechanical structure 28 of the first electrode 19 of the transducer 16 illustrated in FIGS. 2A-2D and FIGS. 3A-3E. The second and third electrodes 20, 22 comprise fixed mechanical structures with generally rectangular shapes similar to that of the second and third electrodes 20, 22 of the transducer 16 illustrated in FIGS. 2A-2D and FIGS. 3A-3E.

The micromachined mechanical structure 12 further includes one or more mechanical structures 82 disposed on, above and/or in substrate 14, for use in supplying, storing and/or trapping electrical charge on the first electrode 19 (and/or any other portion(s) of the micromachined mechanical structure 12 on which charge is to be stored). In this embodiment, the one or more mechanical structures 82 include a first electrode 84, a second electrode 86 and a thermionic electron source 400. The one or more mechanical structures 82 may have any configuration (e.g., size, shape, orientation). In the illustrated embodiment, for example, the first and second electrodes 84, 86 comprise fixed mechanical structures having generally rectangular shapes spaced apart from one another by a gap 402. The thermionic electron source 400 includes a filament 403 connected between the first and second electrodes 84, 86 and spaced apart from the first electrode 19 of the transducer (and/or any other portion (s) of the micromachined mechanical structure 12 on which charge is to be stored) by one or more gaps, e.g., a gap 404.

The one or more mechanical structures 82 may be comprised of any suitable material, for example, a semiconductor material, for example, silicon, (whether doped or undoped), germanium, silicon/germanium, silicon carbide, gallium arsenide and combinations thereof, materials in column IV of the periodic table for example silicon, germanium, carbon; and combinations thereof, for example, silicon germanium, or silicon carbide; also of III-V compounds for example, gallium phosphide, aluminum gallium phosphide, or other III-V combinations; also combinations of III, IV, V, or VI materials, for example, silicon nitride, silicon oxide, aluminum carbide, or aluminum oxide; also metallic silicides, germanides, and carbides, for example, nickel silicide, cobalt silicide, tungsten carbide, or platinum germanium silicide; also doped variations including phosphorus, arsenic, antimony, boron, or aluminum doped silicon or germanium, carbon, or combinations like silicon germanium; also these materials with various crystal structures, including single crystalline, polycrystalline, nanocrystalline, or amorphous; also with combinations of crystal structures, for instance with regions of single crystalline and polycrystalline structure (whether doped or undoped).

Figure 14A:
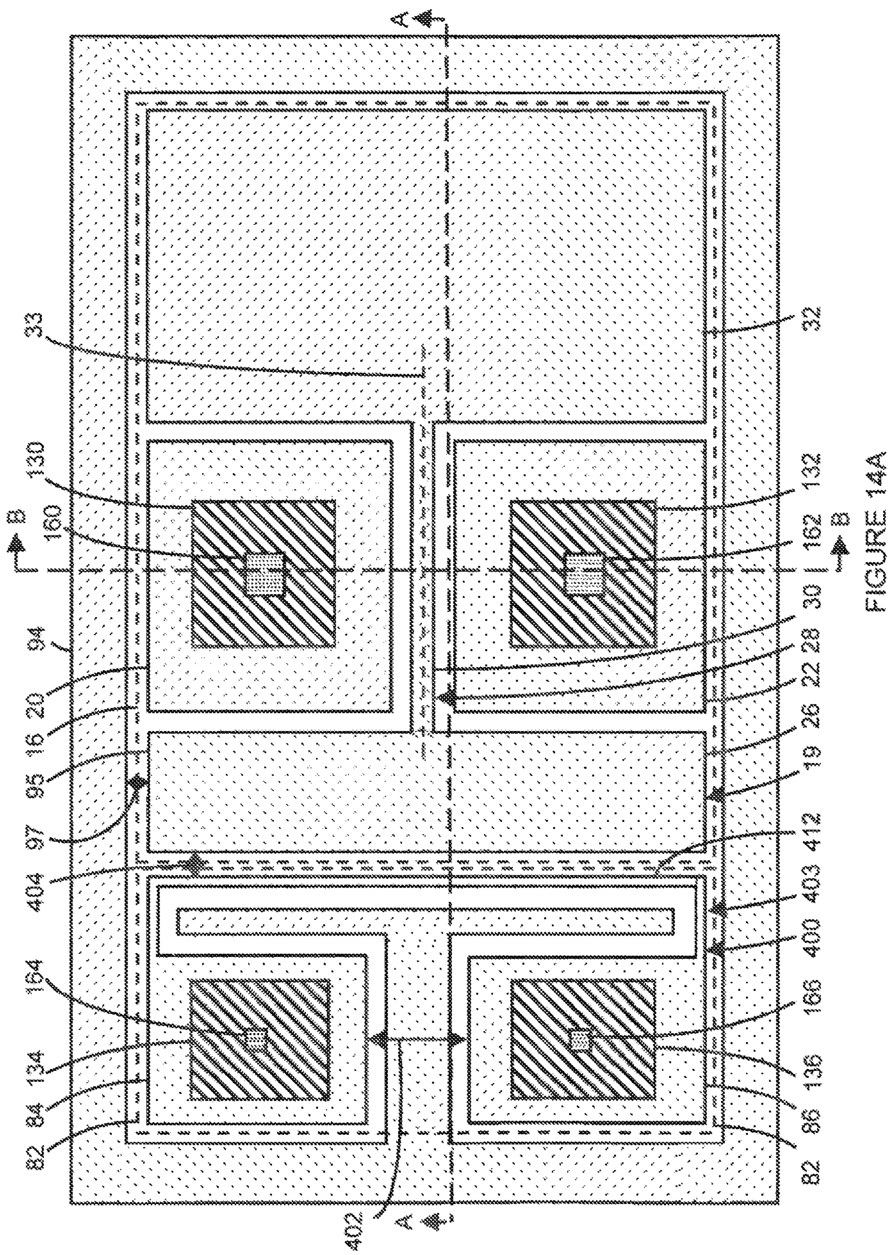
FIG. 14A illustrates a plan view of a portion of another micromachined mechanical structure that may be employed in the MEMS of FIG. 1, in accordance with certain aspects of the present invention.
Figure 14B:
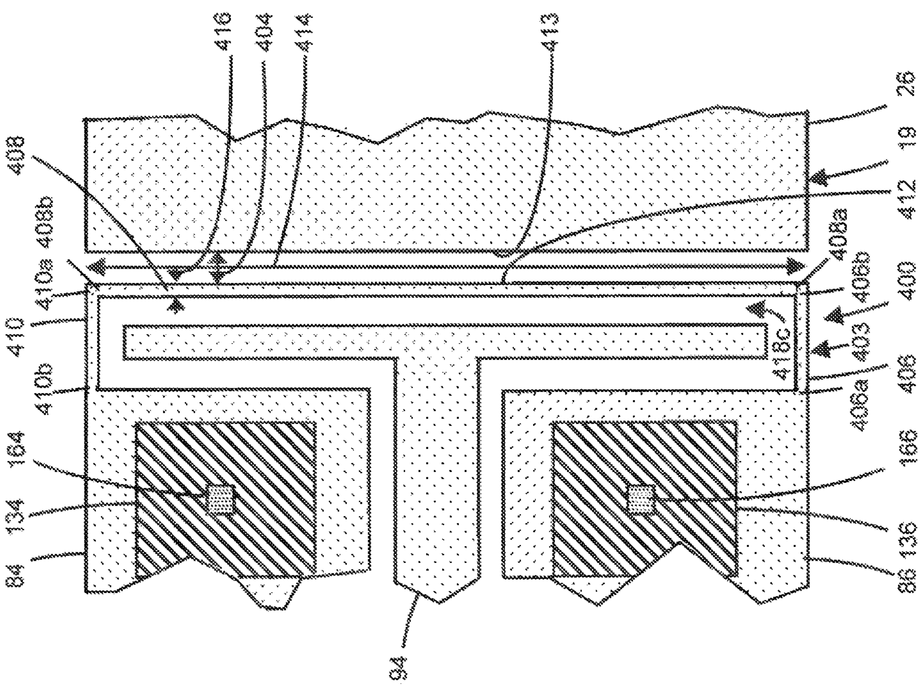
FIG. 14B illustrates an enlarged plan view of a portion of the micromachined mechanical structure of FIG. 14A, in accordance with certain aspects of the present invention.
Figure 15A:
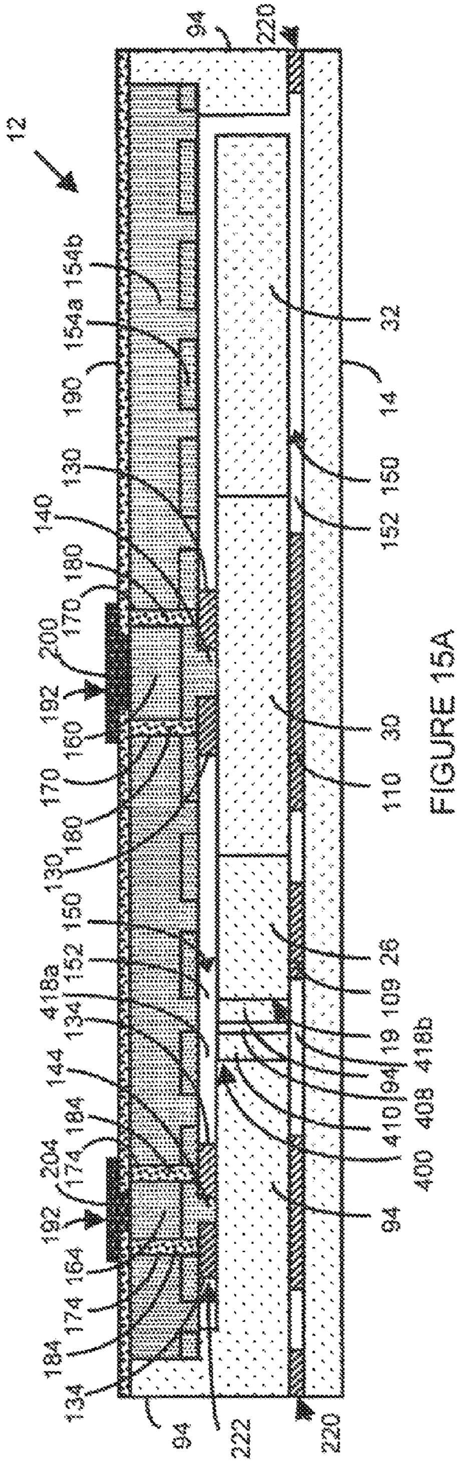
FIG. 15A illustrates a cross-sectional view (taken in the direction A-A of FIG. 14A) of the portion of the micromachined mechanical structure of FIG. 14A and one embodiment of an encapsulation structure that may be employed therewith, in accordance with certain aspects of the present invention.
Figure 15B:
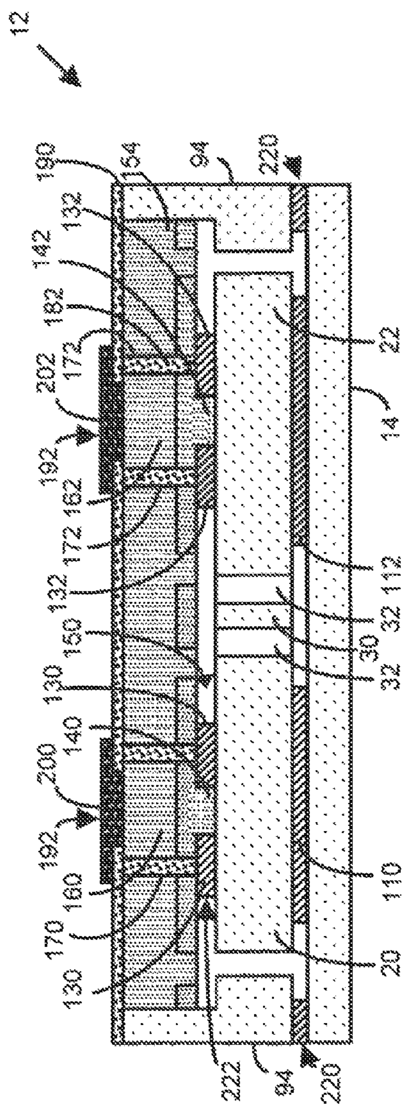
FIG. 15B illustrates a cross-sectional view (taken in the direction B-B of FIG. 14A) of the portion of the micromachined mechanical structure of FIG. 14A and one embodiment of an encapsulation structure that may be employed therewith, in accordance with certain aspects of the present invention.

With reference to FIG. 14B, the filament 403 may include first, second and third portions 406, 408, 410 arranged, for example, in a "U" shape. The first portion 408 may have a first end 406*a* that connects to the first electrode 84 and a second end 406*b* that connects to a first end 408*a* of the second portion 408. The second portion 408 may have a second end 408*b* that connects to a first end 410*a* of a third portion 410, a second end 410*b* of which connects to the second electrode 86.

The thermionic electron source 400 may include one or more surfaces, e.g., surface 412 of filament 403, that face in a direction toward, and/or are disposed in register with, one or more surfaces, e.g., surface 413, of the first electrode 19 of the transducer 16 (and/or any other portion(s) of the micromachined mechanical structure 12 on which charge is to be stored). In some embodiments, one or more of such surfaces, e.g., one or more of surfaces 412 413, has a length 414 of at least about 200 microns and a width 416 of about 1 micron.

One or more clearances, e.g., clearances 418*a*-418*c* (FIGS. 14B, 15A), may be provided between one or more portions of the thermionic electron source 400 and one or more other portions of the micromachined mechanical structure 12. Such clearances, e.g., clearances 418*a*-418*c*, may help reduce the thermal conductivity between the thermionic electron source 400 and the rest of the micromachined mechanical structure 12, thereby reducing the amount of energy needed to heat the thermionic electron source to a temperature at which electrons are emitted therefrom, as further discussed below. In some embodiments, the one or more clearances, e.g., clearances 418*a*-418*c*, provide clearance around each surface of the thermionic electron source 400 except at one or more ends, e.g., ends 406*a*, 410*b*, where the thermionic electron source 400 connects to one or more structures, e.g., the first and second electrodes 84, 86, respectively, such that the thermionic electron source is suspended from such structures.

Figure 16:
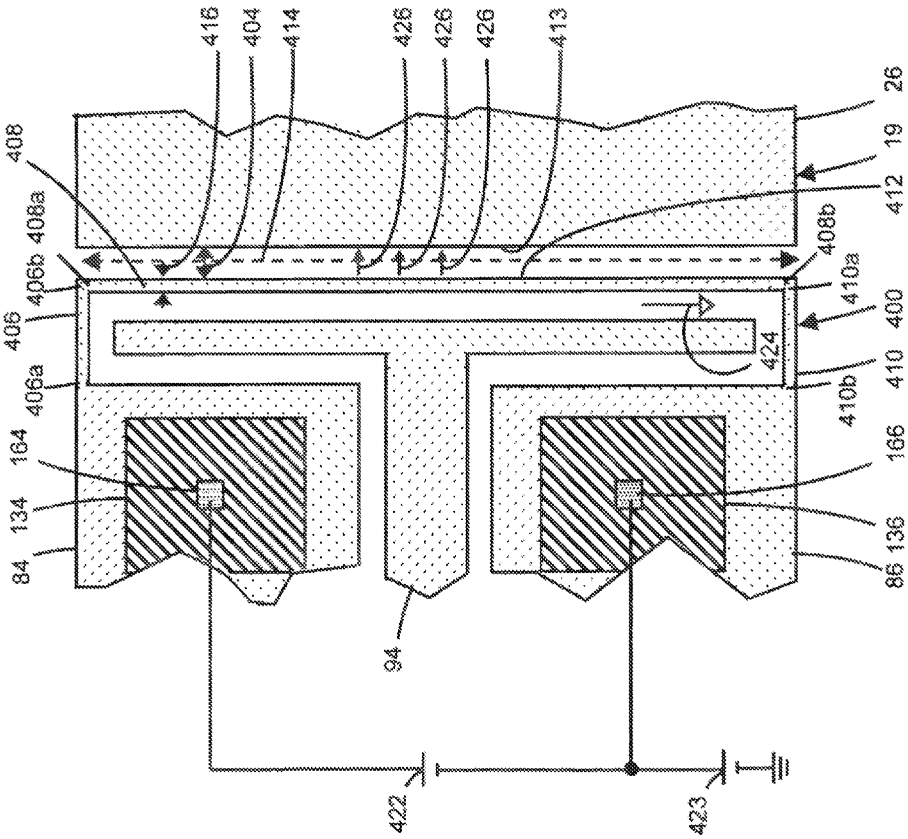
FIG. 16 illustrates a plan view of the portion of micromachined mechanical structure illustrated in FIGS. 14A-14B and FIGS. 15A-15B, in conjunction with power sources that may be employed therewith, showing one embodiment for employing the thermionic electron source of FIGS. 14A-14B and FIGS. 15A-15B to facilitate supplying, storing and/or trapping of electrical charge, in accordance with certain aspects of the present invention.

FIG. 16 illustrates one embodiment for employing the thermionic electron source 400 to facilitate supplying, storing and/or trapping of electrical charge on the first electrode 19 of the transducer 16 illustrated in FIGS. 14A-14B and FIGS. 15A-15B (and/or any other portion(s) of the micromachined mechanical structure 12 on which charge is to be stored), in accordance with certain aspects of the present invention.

Referring to FIG. 16, in this embodiment, first and second electrodes 84, 86 are electrically connected to a first power source, e.g., a voltage source 422, that provides a first voltage potential across the first and second electrodes 84, 86. One of the electrodes 84, 86 (e.g., the electrode connected to the terminal of the first power source, e.g., voltage source 422, having the lower potential) is also connected to a second power source, e.g., a voltage source 423, that provides a second voltage potential to bias the first and second electrodes 84, 86 from ground.

The first power source, e.g., voltage source 422, thereafter supplies a current 424 that flows through the first electrode 84, the thermionic electron source 400 and the second electrode 86. The electric current 424 causes power dissipation and heating in one or more portions of the thermionic electron source 400, e.g., the second portion 408, such that one or more of such portions, e.g., the second portion 408, becomes superheated and reaches or exceeds a high temperature (e.g., a temperature of about 800 degrees Centigrade) at which electrons are emitted from the surface of such portion(s).

Some of the electrons 426 emitted by the thermionic source 400 travel across the gap 404 and reach the electrode 19 (or other mechanical structure(s) on which charge is to be stored) and become trapped thereon. The charge stored and/or trapped on the electrode 19 (or other mechanical structure(s)) may cause an increase in the voltage thereof.

The charge supplying process may continue until a desired amount of charge has been supplied, e.g., until the electrode 19 (or other mechanical structure(s) on which charge is to be stored) has a desired voltage. In some embodiments, the second power source, e.g., voltage source 423, supplies a voltage equal to the desired voltage of the electrode 19 (or other mechanical structure(s) on which charge is to be stored) and the charge supplying process proceeds until the voltage of the electrode 19 (or other mechanical structure(s) on which charge is to be stored) is equal to the voltage supplied by the second power source, e.g., voltage source 423, and then stops. As stated above, in some embodiments, the desired voltage is within a range of from about 100 volts to about 1000 volts.

In some embodiments, MEMS 10 has one or more characteristics (e.g. a voltage, a resonant frequency) indicative of the amount of charge that has been supplied to the electrode 19 (and/or other mechanical structure(s) on which charge is to be stored). In such embodiments, one or more of such characteristics may be measured and compared to one or more reference magnitudes to determine whether the desired amount of charge has been supplied. For example, movable mechanical structure 28 of first electrode 19 (and/or other mechanical structure(s) on which charge is to be stored) may have a resonant frequency indicative of the amount of charge supplied to the first electrode 19 (and/or other mechanical structure(s) on which charge is to be stored). The resonant frequency of the movable mechanical structure 28 may thus be measured and compared to a reference magnitude indicative of a resonant frequency that would be exhibited by the movable mechanical structure 28 if the first electrode 19 (and/or other mechanical structure(s) on which charge is to be stored) has the desired amount of charge stored thereon), so as to determine whether the desired amount of charge has been supplied thereto. The charge supplying process may be stopped if it is determined that the desired amount of charge has been supplied (e.g., reached or exceeded).

The charge supplying process may be continuous or discontinuous (periodic or non-periodic), fixed in rate or time varying in rate, and/or combinations thereof. In that regard, the electric current 424 supplied to the thermionic electron source 400 may be continuous or discontinuous (e.g., periodic or non-periodic), fixed in magnitude or time varying, direct current or alternating current, and/or any combination of the above.

After a desired amount of charge has been supplied, it may be desirable to stop the flow of current to the thermionic electron source 400, so as to stop the heating of the thermionic electron source 400 and the emission of electrons therefrom. This may be accomplished, for example, by disconnecting the first and second electrodes 84, 86 from the first power source, e.g., voltage source 422. The second power source, e.g., voltage source 423, may also be disconnected from the micromachined mechanical structure 12.

Notably, at the end of the charge supplying process employed in the embodiment of FIG. 16, the first electrode 19 (and/or any other portions of the structure on which charge is to be stored) is electrically isolated from all other electrically conductive structures inside the chamber and outside the chamber.

In some embodiments, an electrical isolation of at least ten teraohms or another high DC resistance is provided between the first electrode 19 and other electrically conductive structures within the chamber including, or example, each of the other electrodes 20, 22 and the electrodes 84, 86 temporarily connected to the power source during the charge supplying process. Such a configuration helps reduce the possibility of excessive surface leakage that could otherwise lead to excessive drain of the electrical charge on the one or more portions of the micromachined mechanical structure on which electrical charge is desired to be stored.

In addition, as stated above, at the end of the charge supplying process employed in the embodiment of FIG. 16, the first electrode 19 (and/or any other portion(s) of the structure on which charge is to be stored) is also electrically isolated from electrically conductive structures outside the chamber. As stated above, structures outside the chamber may have more contamination and/or greater potential for leakage current and/or drain than structures inside the chamber. Thus, providing electrical isolation from conductive structures outside of the chamber may significantly reduce leakage current and/or drain.

In some embodiments, an electrical isolation of at least ten teraohms or another high DC resistance is provided, thereby reducing the possibility of excessive leakage through the one or more mechanical structures 82 to points outside the chamber that could otherwise lead to excessive drain of the electrical charge on the first electrode 19 (and/or any other portion (s) of the structure on which charge is to be stored).

The efficiency of the charge supplying process may depend, at least in part, on the surface area of the one or more portions of the thermionic electron source 400 that face toward the charge supplying portion and emit electrons, and the magnitude of the gap between the thermionic electron source 400 and the first electrode 19 of the transducer 16 (or other mechanical structure(s)) on which charge is to be stored and/or trapped).

One or more portions of thermionic electron source 400 may have a configuration adapted to increase the thermal resistance thereof, thereby making it easier to heat the thermionic electron source to a temperature at which the electrons are emitted therefrom. In that regard, thermionic electron source may span a major portion of the width of the chamber 150. In some embodiments, the thermionic electron source 400 has a total length of at least 200 microns.

In some embodiments, a vacuum or near vacuum is provided within the chamber 150. The vacuum or near vacuum may help reduce or minimize heat transfer within the chamber 150 and thereby help to reduce or minimize the amount of energy needed to heat the thermionic electron source 400. In some embodiments, for example, the amount of power needed to heat the thermionic electron source 400 is several orders of magnitude less than the amount of power that would be required to heat the thermionic electron source 400 if a vacuum or near vacuum was not provided within the chamber 150.

The micromachined mechanical structure 12 may be fabricated using one or more of the methods disclosed herein and/or any other suitable technique.

FIGS. 17A-17J illustrate cross-sectional views an exemplary embodiment of the fabrication of the portion of MEMS of FIGS. 14A-14B and FIGS. 15A-15B, including encapsulation that may be employed therewith, at various stages of the process, according to certain aspects of the present invention.

Figure 17A:
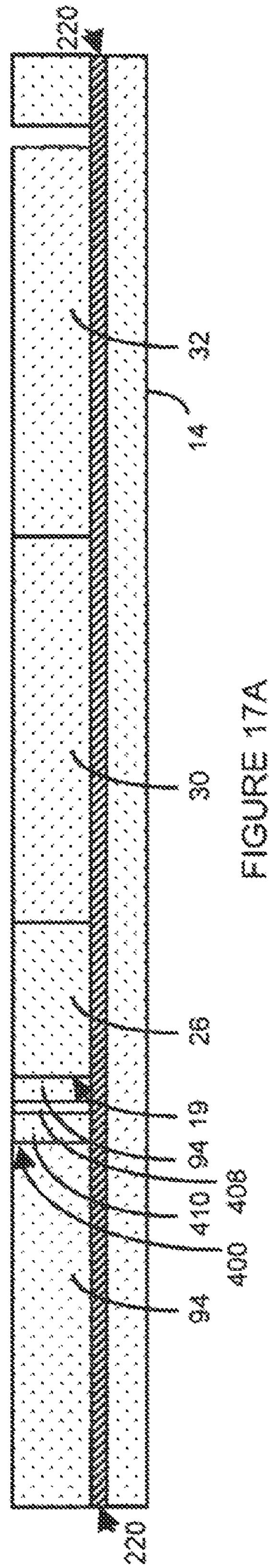
FIGS. 17A-17J illustrate cross-sectional views (taken in the direction A-A of FIG. 14A) of one embodiment of the fabrication of the portion of the micromachined mechanical structure of FIGS. 14A-14B and FIGS. 15A-15B including one embodiment of an encapsulation that may be employed therewith, at various stages of the process, according to certain aspects of the present invention.
Figure 17B:
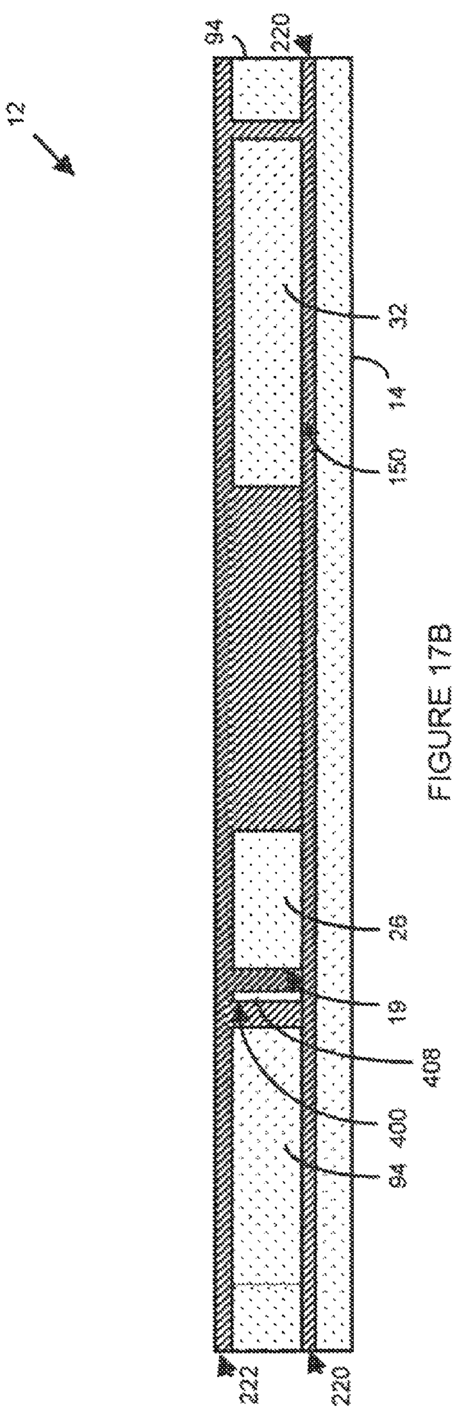
Figure 17C:
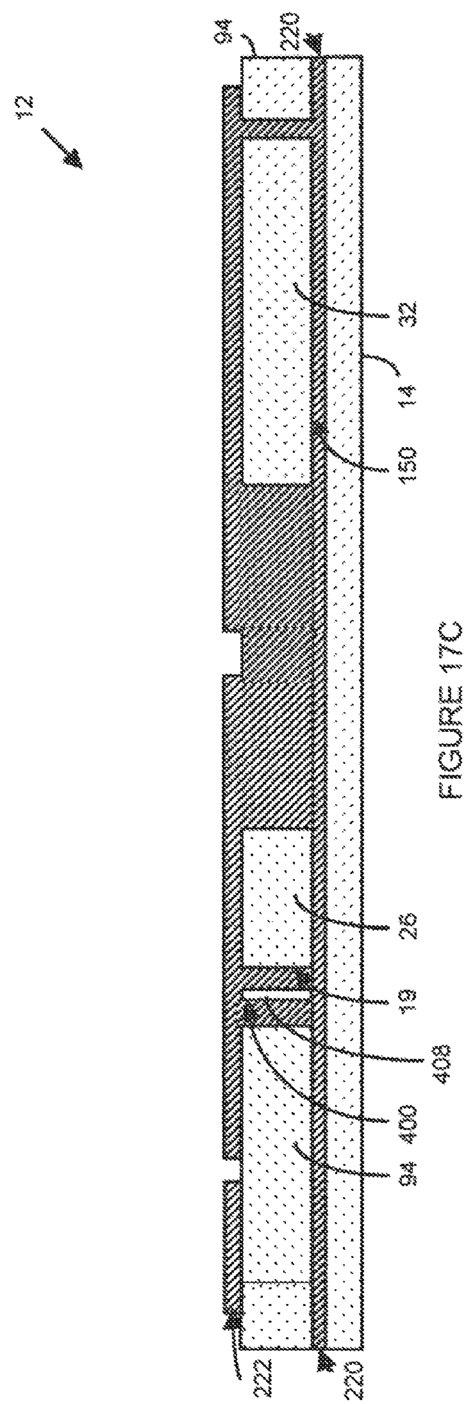
Figure 17D:
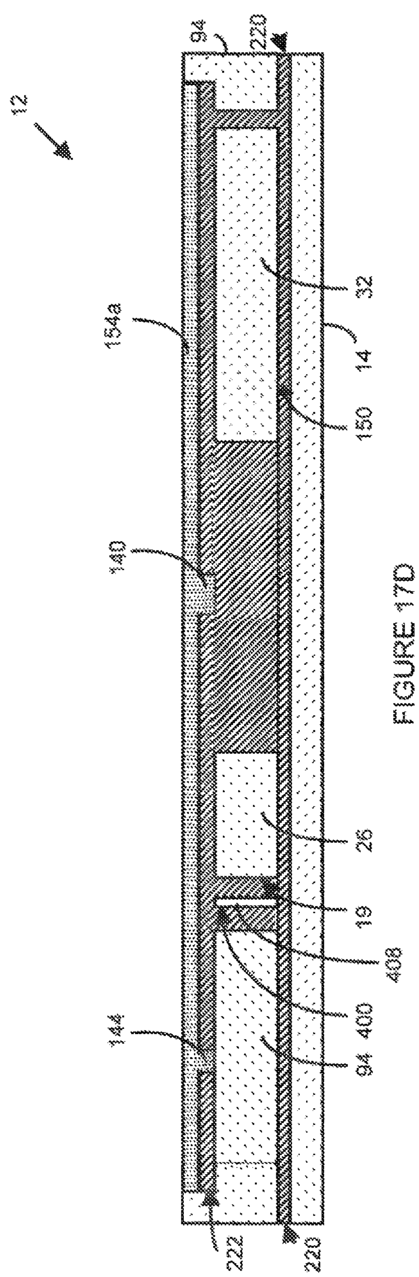
Figure 17E:
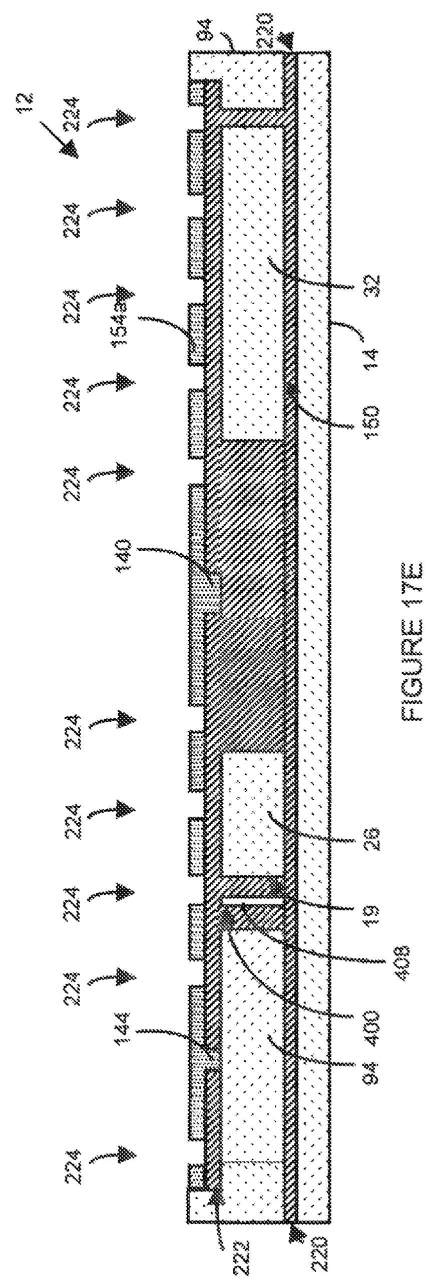
Figure 17F:
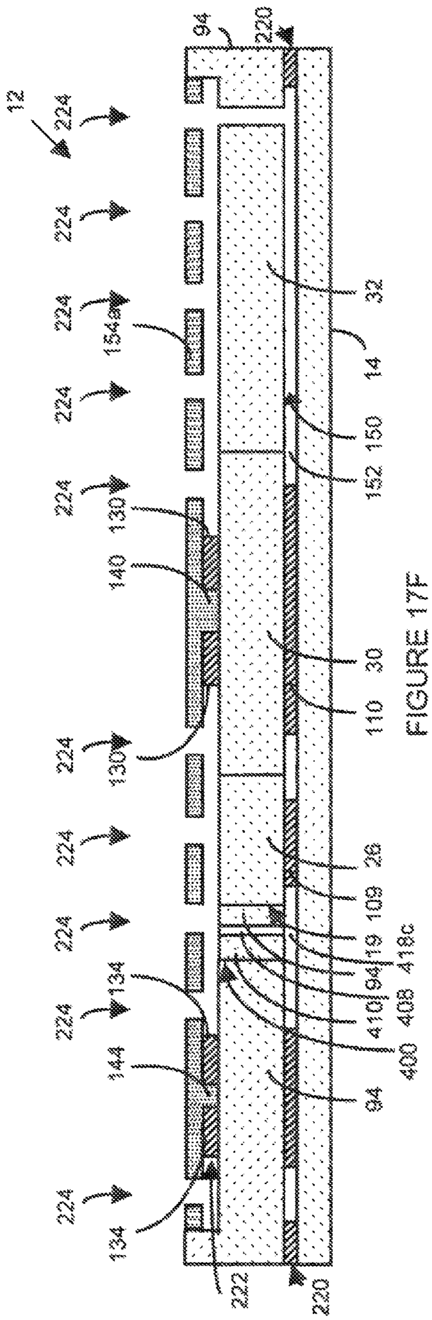
Figure 17G:
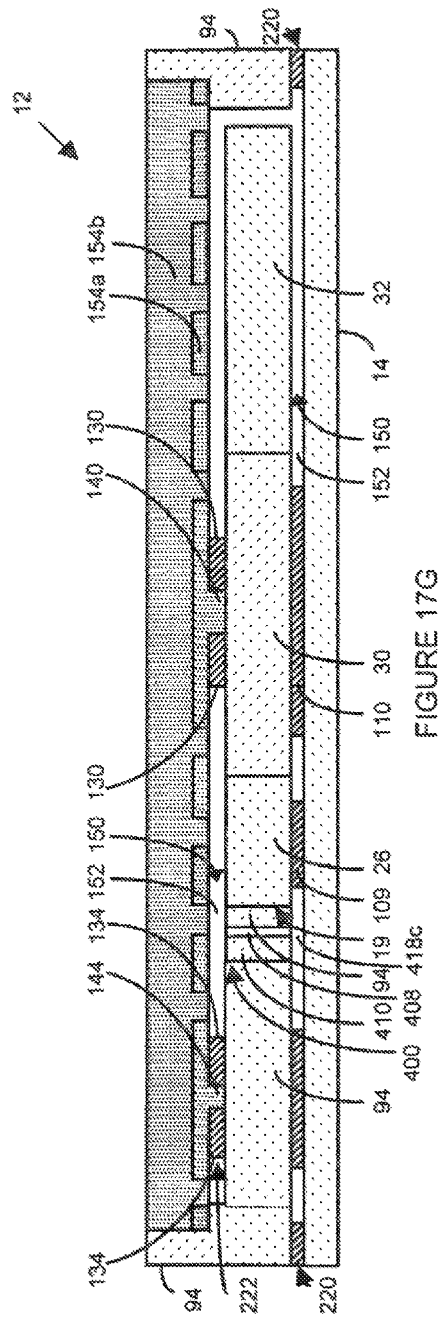
Figure 17H:
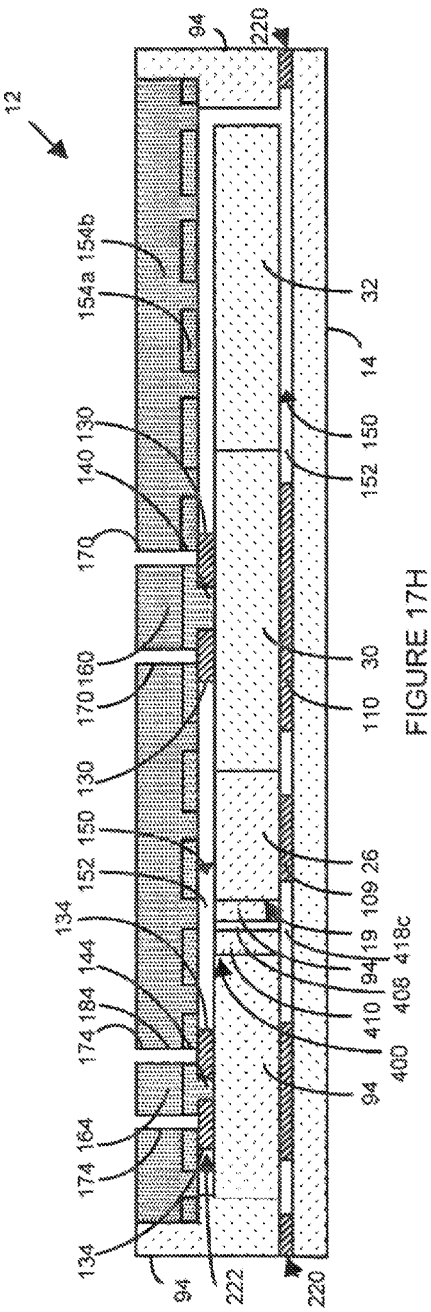
Figure 17I:
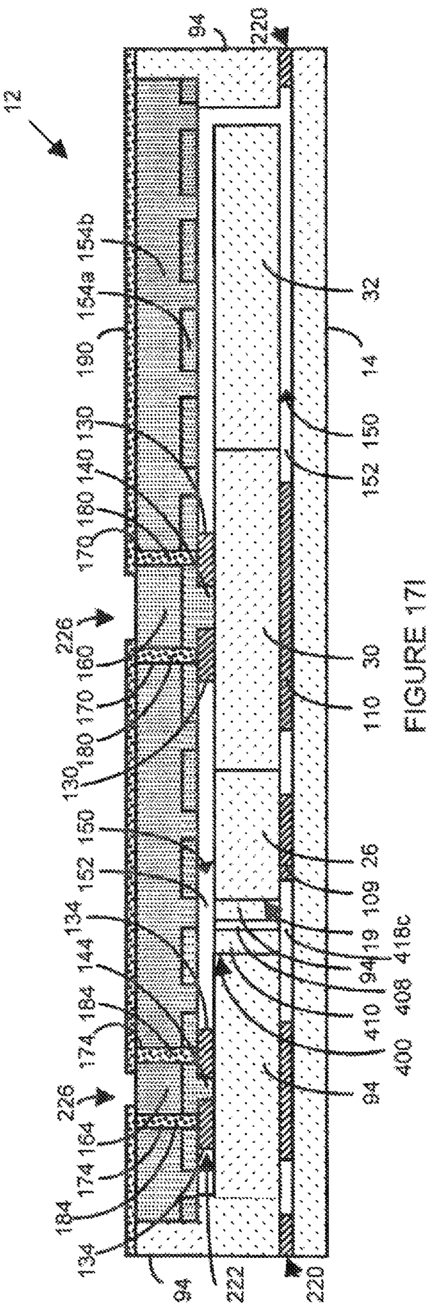
Figure 17J:
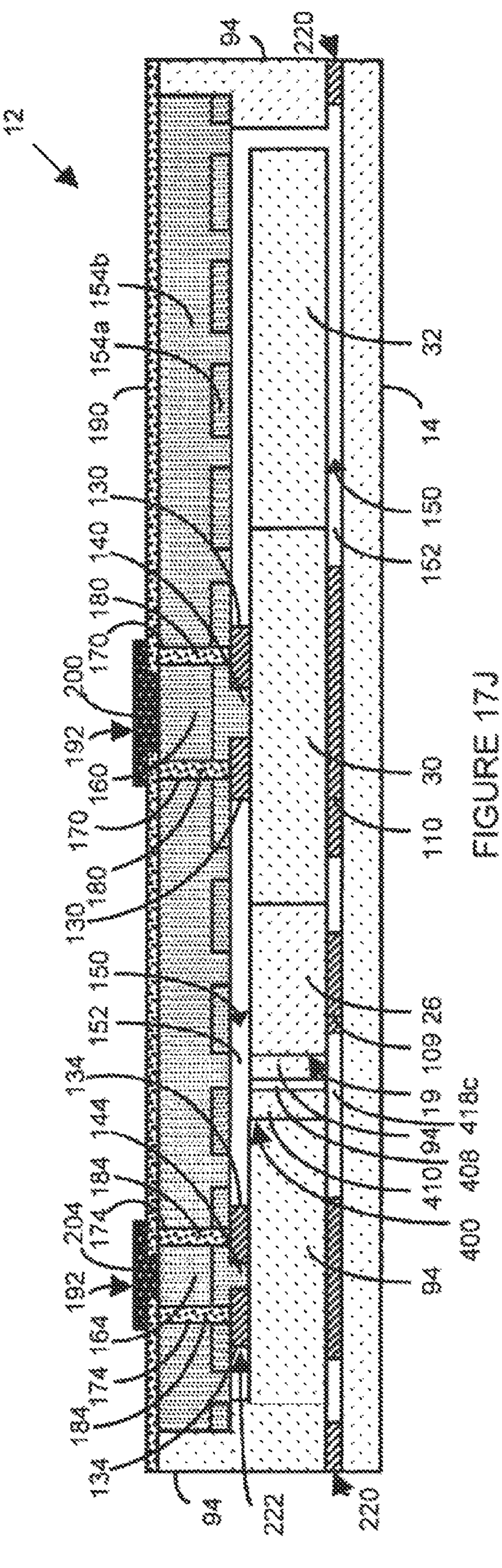

With reference to FIG. 17A, in the exemplary embodiment, fabrication of MEMS 10 having micromachined mechanical structure 12 including a thermionic electron source may begin with an SOI substrate partially formed device including mechanical structures, e.g., electrodes 84, 86, thermionic electron source 400 and electrodes 19, 20, 22, disposed on a first sacrificial layer 220, for example, silicon dioxide or silicon nitride. The mechanical structures, e.g., electrodes 84, 86, thermionic electron source 400 and electrodes 19, 20, 22, may be formed using well-known deposition, lithographic, etching and/or doping techniques as well as from well-known materials (for example, semiconductors such as silicon, germanium, silicon-germanium or gallium-arsenide).

Thereafter, the processing of MEMS 10 having the thermionic electron source may proceed in the same manner as described above with respect to FIGS. 4B-4J. In this regard, an exemplary fabrication process of MEM 10 including thermionic electron source is illustrated in FIGS. 17B-17J. Because the processes are substantially similar to the discussion above with respect to FIGS. 4B-4J, for the sake of brevity, that discussion will not be repeated.

As stated above, some embodiments of the present invention may be implemented in conjunction with one or more of the thin film encapsulation techniques described and illustrated in the Microelectromechanical Systems and Method of Encapsulating Patent Application Publication incorporated by reference herein. In this regard, any and all of the embodiments described herein may employ one or more of the structures and/or techniques disclosed in the Microelectromechanical Systems and Method of Encapsulating Patent Application Publication. The present invention may also be employed in conjunction with wafer-bonding encapsulation techniques.

Figure 18A:
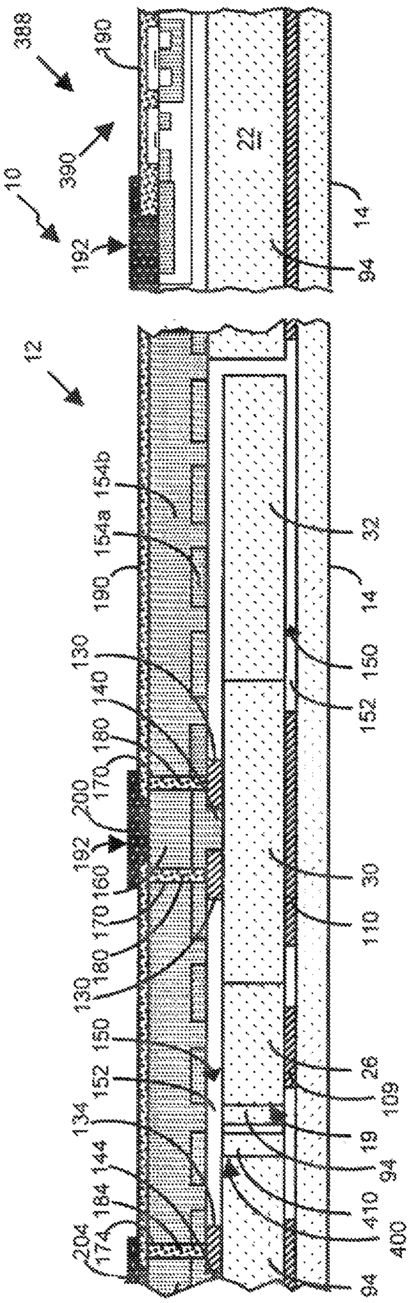
FIG. 18A illustrates a cross-sectional view of a MEMS according to certain aspects of the present inventions, including the portion of the micromachined mechanical illustrated in FIG. 14A (cross sectional view thereof taken in the direction A-A of FIG. 14A) and an integrated circuit portion, both portions of which are disposed or integrated on or in a common substrate.
Figure 18B:
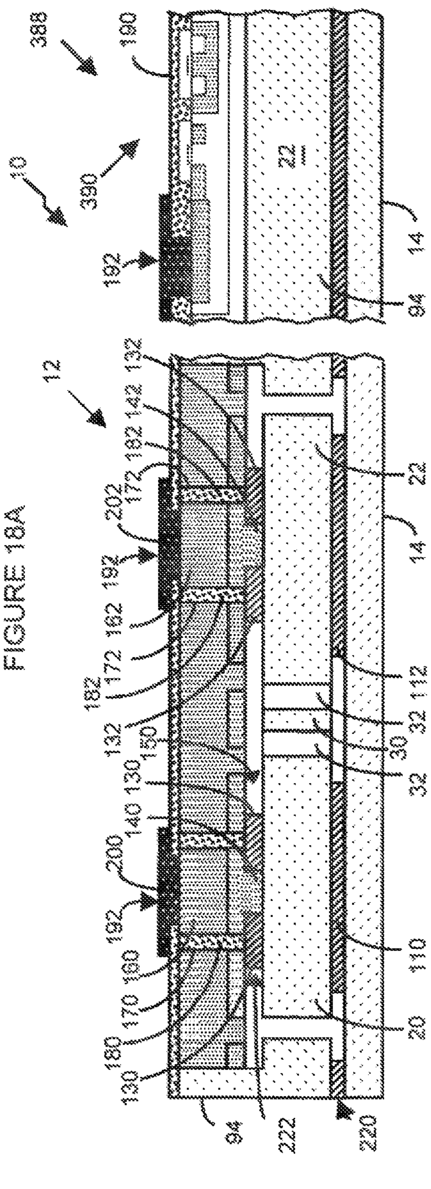
FIG. 18B illustrates a cross-sectional view of a MEMS according to certain aspects of the present inventions, including the portion of the micromachined mechanical illustrated in FIG. 14A (cross sectional view thereof taken in the direction B-B of FIG. 14A) and an integrated circuit portion, both portions of which are disposed or integrated on or in a common substrate.

As also stated above, MEMS 10 may include one or more other circuits and/or devices, e.g., other circuits and/or devices 226, 330 (FIGS. 10A-10L), charge storing circuit 332 (FIGS. 10B-10E, 10K-10L), DC/DC converter circuit 362 (FIGS. 10E-10G, 10L), data processing electronics 386 (FIG. 11 and FIGS. 12A-12D) and/or interface circuitry 388 (FIG. 11A and FIGS. 12A-12D). For example, with reference to FIGS. 18A and 18B, integrated circuits 390 may be fabricated using conventional techniques after definition of mechanical structure 12 using, for example, the techniques described and illustrated in Microelectromechanical Systems and Method of Encapsulating Patent Application Publication and/or Microelectromechanical Systems Having Trench Isolated Contacts Patent.

Figure 19A:
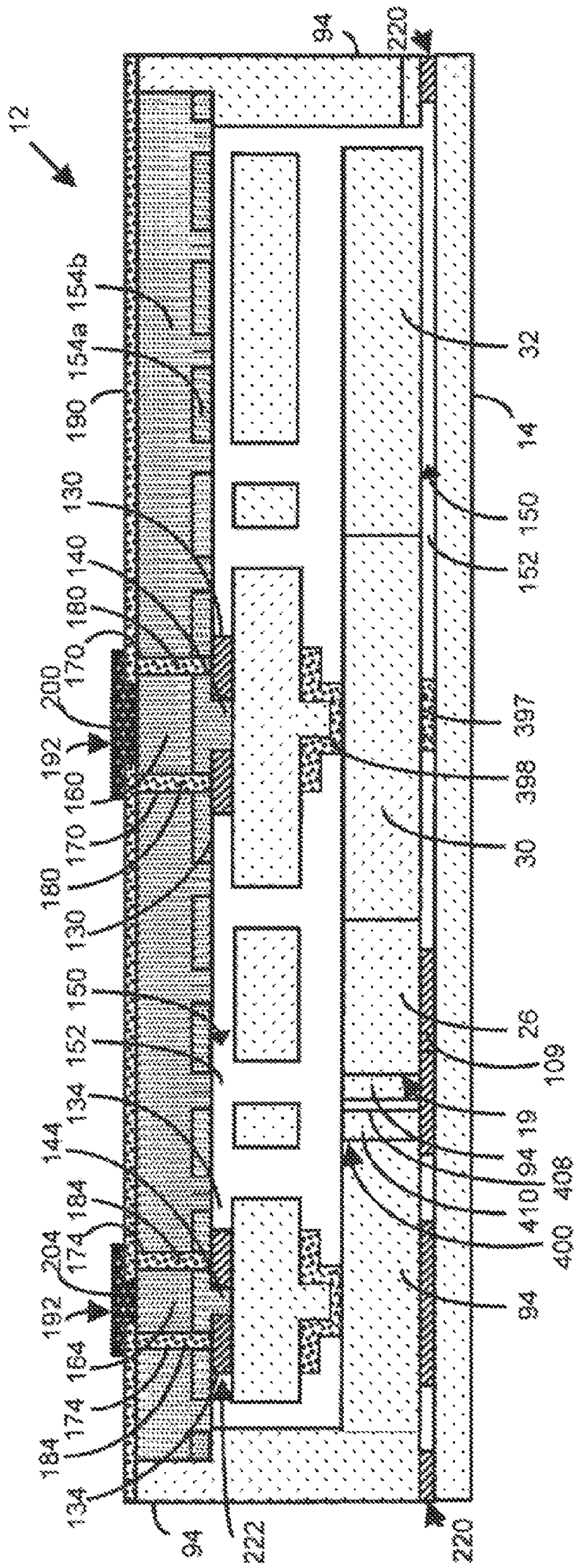
FIGS. 19A-19B illustrate cross-sectional views of micromechanical structures, which may be monolithically integrated on or within the substrate of a MEMS, in accordance with certain aspects of the present invention.
Figure 19B:
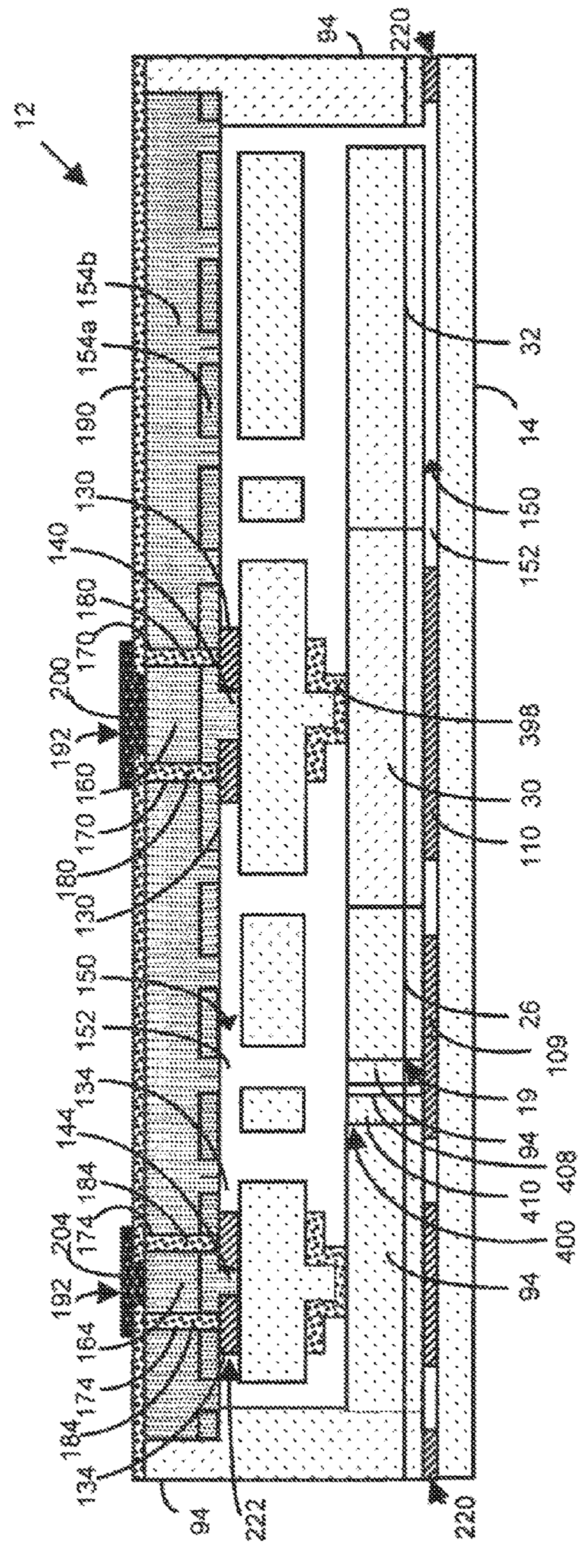

Further, the various structures of the micromachined mechanical structure 12 may have any orientation including longitudinal, lateral, vertical any combination thereof. As stated above, any of the embodiments and/or techniques described herein may be implemented in conjunction with micromachined mechanical structures 12 having one or more transducers or sensors which may themselves include multiple layers that are vertically and/or laterally stacked or interconnected as illustrated in Microelectromechanical Systems and Method of Encapsulating Patent Application Publication and/or Microelectromechanical Systems Having Trench Isolated Contacts Patent, each of which is incorporated by reference herein. Accordingly, any and all of the inventions and/or embodiments illustrated and described herein may be implemented in, and/or employed in conjunction with, any of the embodiments of Microelectromechanical Systems and Method of Encapsulating Patent Application Publication and/or Microelectromechanical Systems Having Trench Isolated Contacts Patent that include multiple layers of mechanical structures, contacts areas and buried contacts that are vertically and/or laterally stacked or interconnected (see, for example, FIGS. 19A and 19B).

Moreover, the present inventions may implement the anchors and techniques of anchoring mechanical structures 16 to substrate 14 (as well as other elements of MEMS 10) described and illustrated in the Anchors for Microelectromechanical Systems Patent, which is incorporated by reference herein. Accordingly, any and all of the inventions and/or embodiments illustrated and described herein may be implemented in, and/or employed in conjunction with, any of the embodiments described and illustrated in the Anchors for Microelectromechanical Systems Patent, implemented in conjunction with the inventions described and illustrated herein (see, for example, FIGS. 19A and 19B).

FIGS. 20A-20B and FIGS. 21A-21C illustrate plan views and cross sectional views, respectively, of a portion of another micromachined mechanical structure 12 that may be employed in the MEMS of FIG. 1, in accordance with certain aspects of the present invention. As with the micromachined mechanical structure of FIGS. 2A-2D and FIGS. 3A-3E, micromachined mechanical structure 12 illustrated in FIGS. 20A-20B and FIGS. 21A-21C includes a transducer 16, which may have electrical charge supplied thereto, stored thereon and/or trapped thereon. The transducer 16 may be any type of transducer, for example, an energy harvesting device, a sensor (e.g., an accelerometer, a gyroscope, a microphone, a vibration sensor, a pressure sensor, a strain sensor, a tactile sensor, a magnetic sensor and/or a temperature sensor), a resonator, a resonant filter, and/or a combination thereof. In this embodiment, transducer 16 comprises a capacitive transducer, however the transducer 12 is not limited to such.

In the micromachined mechanical structure 12 illustrated in FIGS. 20A-20B and FIGS. 21A-21C, transducer 16 includes a plurality of mechanical structures disposed on, above and/or in substrate 14, including, for example first, second and third electrodes 19, 20, 22. The first, second and third electrodes 19, 20, 22 and/or other mechanical structures may each have any configuration. In the illustrated embodiment, for example, the first, second and third electrodes have configurations that are similar to that of the first, second and third electrodes 19, 20, 22, respectively, of the transducer 16 illustrated in FIGS. 2A-2D and FIGS. 3A-3E.

The micromachined mechanical structure 12 further includes one or more mechanical structures 82 disposed on, above and/or in substrate 14, for use in supplying, storing and/or trapping electrical charge on the first electrode 19 (and/or any other portion(s) of the micromachined mechanical structure 12 on which charge is to be stored). In this embodiment, the one or more mechanical structures 82 include a first electrode 84, a second electrode 86 and an electron gun 430. The one or more mechanical structures 82 may have any configuration (e.g., size, shape, orientation). In the illustrated embodiment, for example, the first and second electrodes 84, 86 comprise fixed mechanical structures having generally rectangular shapes spaced apart from one another by a gap 402. The electron gun 430 includes a thermionic electron source 400 and a beam shaper 440. The thermionic electron source 400 may include a filament 403 connected between first and second electrodes 84, 86 and spaced apart from the first electrode 19 of the transducer (and/or any other portion(s) of the micromachined mechanical structure 12 on which charge is to be stored) by one or more gaps, e.g., a gap 404.

The one or more mechanical structures 82 may be comprised of any suitable material, for example, a semiconductor material, for example, silicon, (whether doped or undoped), germanium, silicon/germanium, silicon carbide, gallium arsenide and combinations thereof, materials in column IV of the periodic table for example silicon, germanium, carbon; and combinations thereof, for example, silicon germanium, or silicon carbide; also of III-V compounds for example, gallium phosphide, aluminum gallium phosphide, or other III-V combinations; also combinations of III, IV, V, or VI materials, for example, silicon nitride, silicon oxide, aluminum carbide, or aluminum oxide; also metallic silicides, germanides, and carbides, for example, nickel silicide, cobalt silicide, tungsten carbide, or platinum germanium silicide; also doped variations including phosphorus, arsenic, antimony, boron, or aluminum doped silicon or germanium, carbon, or combinations like silicon germanium; also these materials with various crystal structures, including single crystalline, polycrystalline, nanocrystalline, or amorphous; also with combinations of crystal structures, for instance with regions of single crystalline and polycrystalline structure (whether doped or undoped).

Figure 20A:
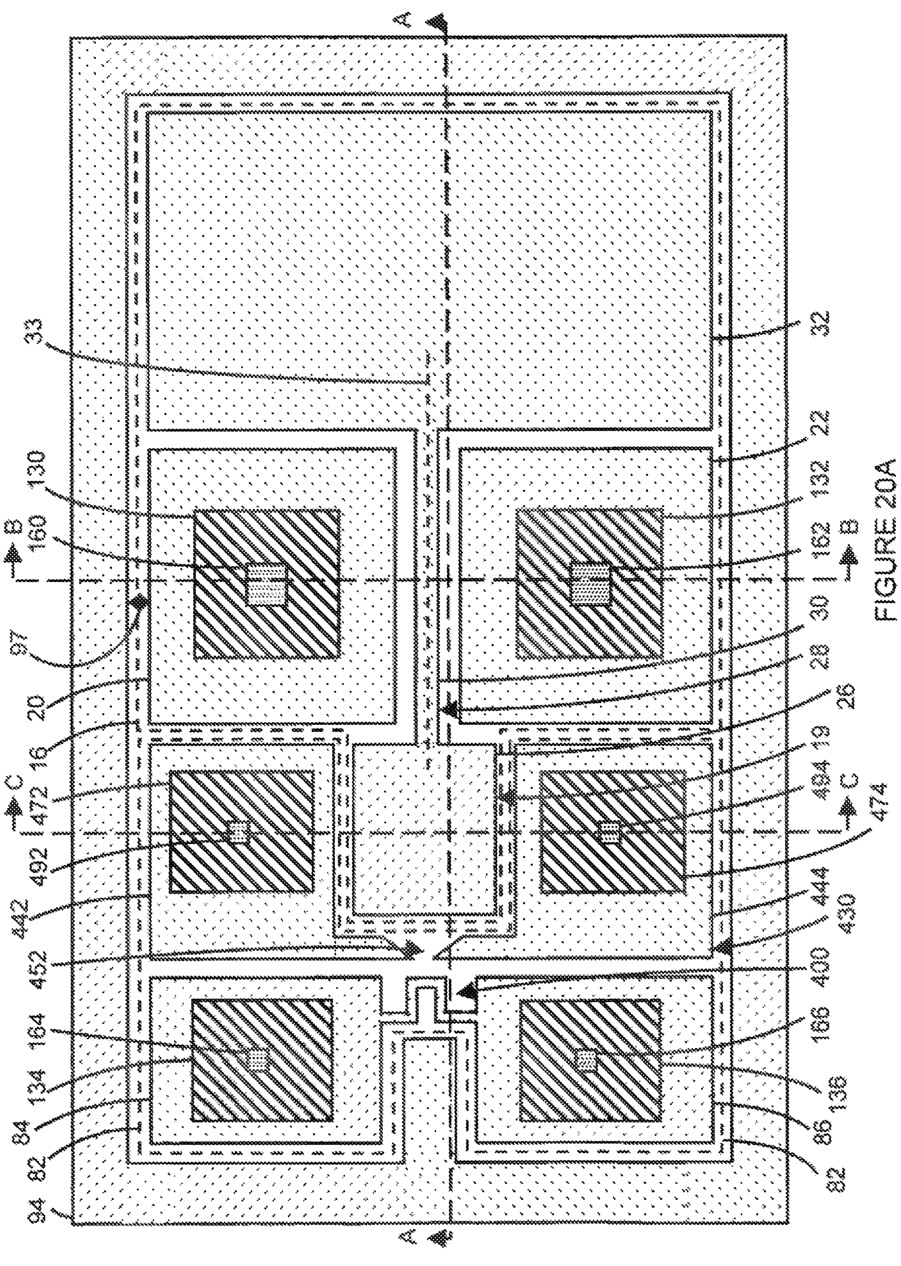
FIG. 20A illustrates a plan view of a portion of another micromachined mechanical structure that may be employed in the MEMS of FIG. 1, in accordance with certain aspects of the present invention.
Figure 20B:
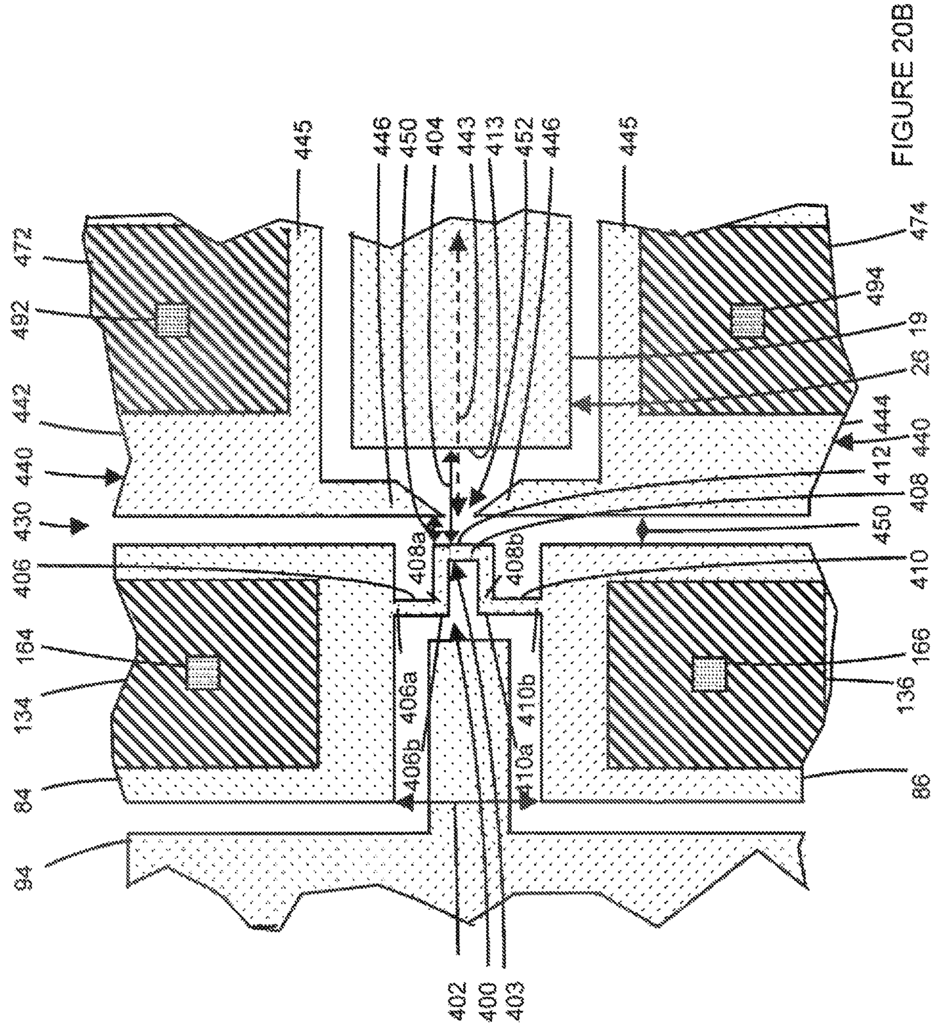
FIG. 20B illustrates an enlarged plan view of a portion of the micromachined mechanical structure of FIG. 20A, in accordance with certain aspects of the present invention.

With reference to FIG. 20B, the filament 403 may include first, second and third portions 406, 408, 410 arranged, for example, in a "U" shape. The first portion 408 may have a first end 406*a* that connects to the first electrode 84 and a second end 406*b* that connects to a first end 408*a* of the second portion 408. The second portion 408 may have a second end 408*b* that connects to a first end 410*a* of a third portion 410, a second end 410*b* of which connects to the second electrode 86.

The thermionic electron source 400 may include one or more surfaces, e.g., surface 412 of filament 403, that face in a direction toward, and/or are disposed in register with, one or more surfaces, e.g., surface 413, of the first electrode 19 of the transducer 16 (and/or any other portion(s) of the micromachined mechanical structure 12 on which charge is to be stored).

The beam shaper 440 may include first and second electrodes 442, 444. In the illustrated embodiment, first and second electrodes 442, 444 are fixed mechanical structures with generally "L" shapes disposed on opposite sides of, and equally spaced from, a reference plane 443. Each of the electrodes 442, 444 has a first portion 445 and a second portion 446. The second portion 446 of each electrode 442, 444 extends in a direction toward the reference plane 443 and in register with the second portion 446 of the opposite electrode 444, 442, respectively. The second portions 446 are spaced apart from the thermionic electron source 400 by a gap 450 and define an aperture 452 that defines a path for electrons emitted by the thermionic electron source 400 to exit the electron gun 430.

The first and second electrodes 442, 444, may comprise any suitable material, for example, a semiconductor material (doped or undoped), for example, silicon, germanium, silicon/germanium, silicon carbide, gallium arsenide, and combinations thereof.

Figure 22:
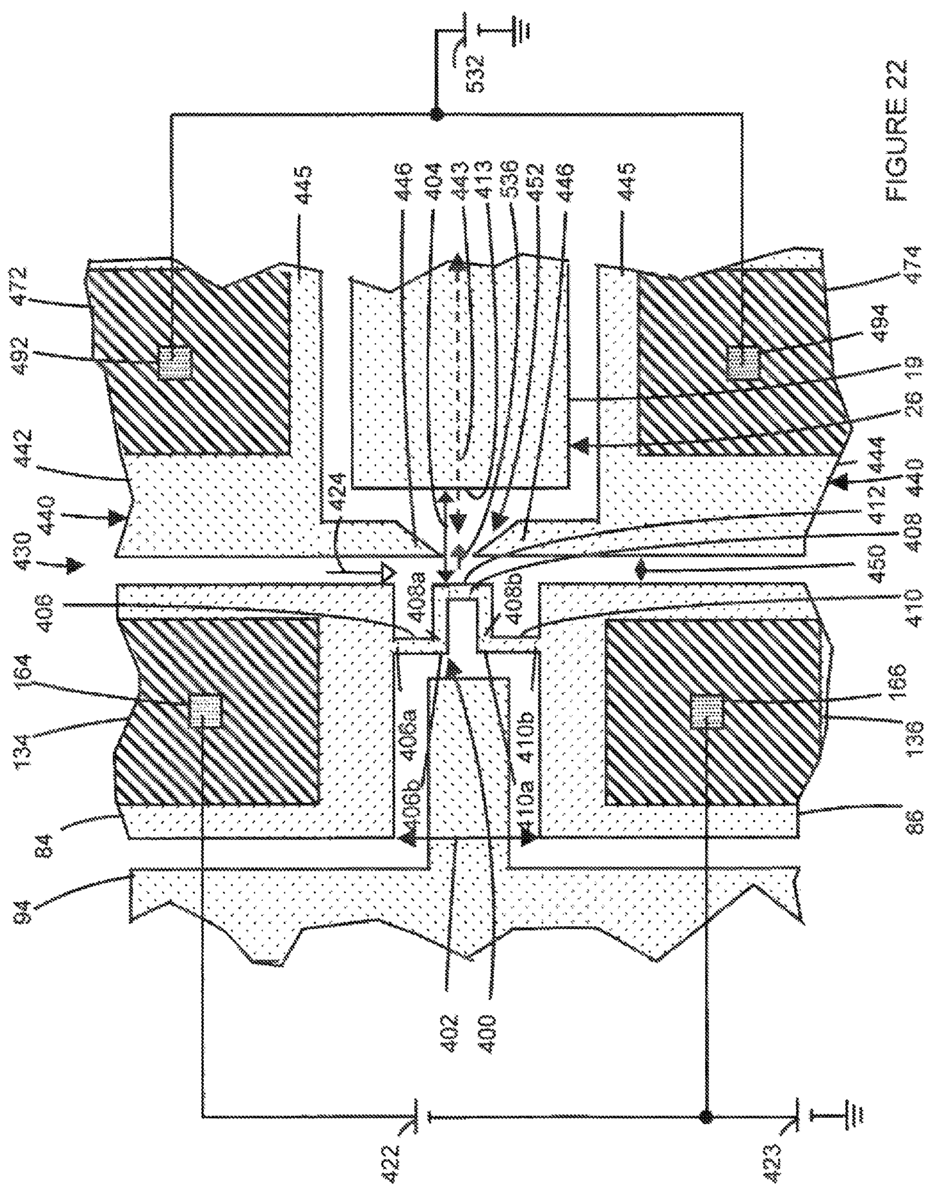
FIG. 22 illustrates a plan view of the portion of micromachined mechanical structure illustrated in FIGS. 20A-20B and FIGS. 21A-21C, in conjunction with a power source that may be employed therewith, showing one embodiment for employing the electron gun of FIGS. 20A-20B and FIGS. 21A-21C to facilitate supplying, storing and/or trapping of electrical charge, in accordance with certain aspects of the present invention.

The first and second electrodes 442, 444, may define one or more contact areas, e.g., contact areas 442*a*, 444*a*, respectively, which may provide one or more electrical paths between the micromachined mechanical structure 12 and one or more other circuits and/or devices, e.g., voltage source 532 (FIG. 22).

Figure 21A:
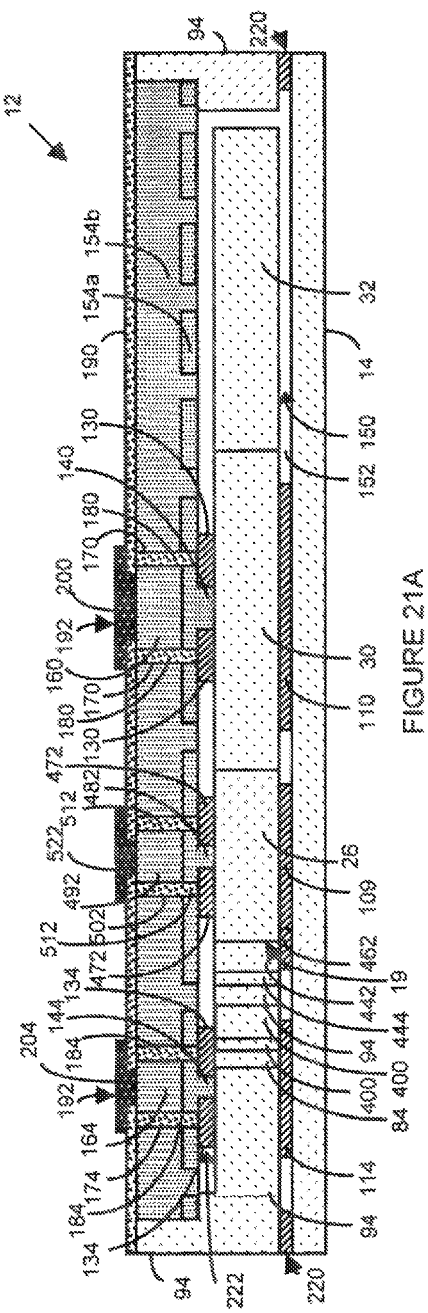
FIG. 21A illustrates a cross-sectional view (taken in the direction A-A of FIG. 20A) of the portion of the micromachined mechanical structure of FIG. 20A and one embodiment of an encapsulation structure that may be employed therewith, in accordance with certain aspects of the present invention.
Figure 21B:
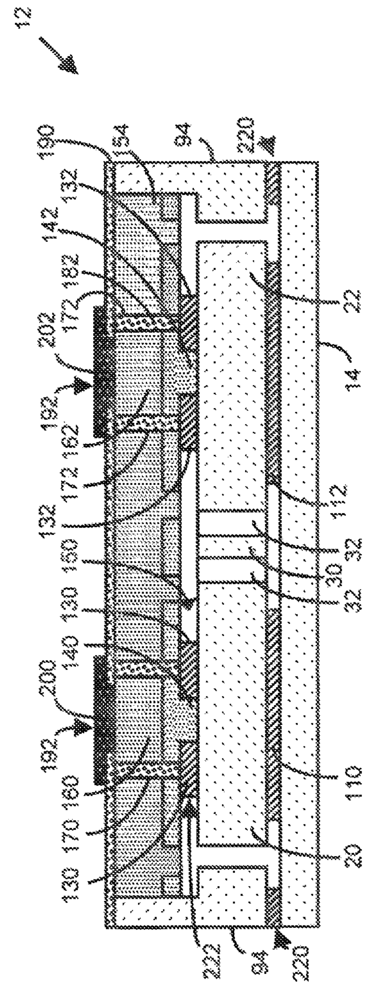
FIG. 21B illustrates a cross-sectional view (taken in the direction B-B of FIG. 20A) of the portion of the micromachined mechanical structure of FIG. 20A and one embodiment of an encapsulation structure that may be employed therewith, in accordance with certain aspects of the present invention.
Figure 21C:
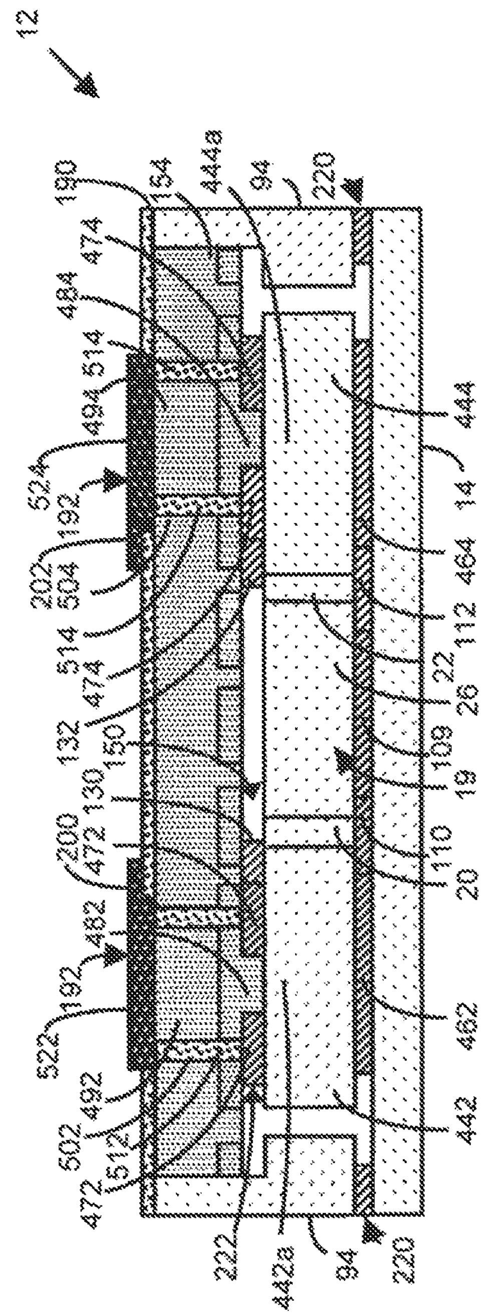
FIG. 21C illustrates a cross-sectional view (taken in the direction C-C of FIG. 20A) of the portion of the micromachined mechanical structure of FIG. 20A and one embodiment of an encapsulation structure that may be employed therewith, in accordance with certain aspects of the present invention.

Referring to FIGS. 21A-21C, the micromachined mechanical structure 12 may further define one or more insulation areas, e.g., insulation areas 462, 464, disposed between the substrate and the electrodes 442, 444, respectively, to provide electrical isolation between the substrate 14 and such electrodes. The one or more insulation areas, e.g., insulation areas 462, 464, may comprise, for example, silicon dioxide or silicon nitride.

The micromachined mechanical structure 12 may further define one or more insulation areas, e.g., insulation areas 472, 474, disposed superjacent electrodes 442, 444, respectively, to partially, substantially or entirely surround contact areas 442,*a*, 444*a* of electrodes 442, 444, respectively, as may be desired. The one or more insulation areas, e.g., insulation areas 472, 474, may comprise, for example, silicon dioxide or silicon nitride. One or more of the insulation areas, e.g., insulation areas 472, 474, may define one or more openings, e.g., openings 482, 484, respectively, to facilitate electrical contact to the electrodes 442, 444, respectively.

As stated above, the micromachined mechanical structure 12 further defines a chamber 150 having an atmosphere 152 "contained" therein. The chamber 150 may be formed, at least in part, by one or more encapsulation layer(s) 154. In some embodiments, one or more of the one or more encapsulation layer(s) 154 are formed using one or more of the encapsulation techniques described and illustrated in the Microelectromechanical Systems Having Trench Isolated Contacts Patent, the entire contents which, including, for example, the features, attributes, alternatives, materials, techniques and advantages of all of the inventions, are incorporated by reference herein, although, unless stated otherwise, the aspects and/or embodiments of the present invention are not limited to such features, attributes alternatives, materials, techniques and advantages.

The one or more encapsulation layers 154 may define one or more conductive regions, e.g., conductive regions 492, 494, disposed superjacent electrodes 442, 444, respectively, to facilitate electrical contact therewith. The one or more encapsulation layers 154 may further define one or more trenches, e.g., trenches 502, 504, disposed about one or more of the conductive regions, e.g., conductive regions 492, 494, respectively, to electrically isolate one or more of such regions from one or more other portions of the micromachined mechanical structure 12. Insulating material may be deposited in one or more of the trenches, e.g., trenches 502, 504, to form one or more isolation regions, e.g., isolation regions 512, 514, respectively.

As stated above, the micromachined mechanical structure may further define an insulation layer 190 and a conductive layer 192 disposed superjacent encapsulation layer(s) 154. The insulation layer 190 may provide electrical isolation between conductive layer 192 and one or more other portions of the micromachined mechanical structure 12, as may be desired. The conductive layer 192 may define one or more conductive regions, e.g., conductive regions 522, 524 that form part of the electrical connection to one or more of the beam shaper electrodes, e.g., electrodes 442, 444, respectively.

FIG. 22 illustrates one embodiment for employing the electron gun to facilitate storing of electrical charge on the first electrode 19 of the transducer 16 illustrated in FIGS. 20A-20B and FIGS. 21A-21C (and/or any other portion(s) of the micromachined mechanical structure 12 on which charge is to be stored), in accordance with certain aspects of the present invention.

Referring to FIG. 22, in this embodiment, first and second electrodes 84, 86 are electrically connected to a first power source, e.g., a voltage source 422, that provides a first voltage potential across the first and second electrodes 84, 86. One of the electrodes 84, 86 (e.g., the electrode connected to the terminal of the first power source, e.g., voltage source 422, having the lower potential) is also connected to a second power source, e.g., a voltage source 423, that provides a second voltage potential to bias the first and second electrodes 84, 86 from ground The first and second electrodes 442, 444 of the beam shaper 440 are connected to a third power source, e.g., a voltage source 532, that provides a voltage potential on the first and second electrodes 442, 444 of the beam shaper 440. In some embodiments, the voltage potential provided on the first and second electrodes 442, 444 of the beam shaper 430 is greater than the voltage potential biasing the first and second electrodes 84, 86.

The first power source, e.g., voltage source 422, supplies a current 424 that flows through the first electrode 84, the thermionic electron source 400 and the second electrode 86. The electric current 424 causes one or more portions of the thermionic electron source, e.g., second portion 408, to dissipate power and produce heat that causes one or more of such portions, e.g., second portion 408, to reach or exceed a temperature at which electrons 426 are emitted from the surface thereof. The temperature may be a relatively high temperature and may or may not be below the melting temperature of such portion(s) of the thermionic electron source 400. In some embodiments, one or more portions of thermionic electron source 400, e.g., the second portion 408 of filament 403, becomes superheated and/or reaches or exceeds a temperature of about 800 degrees C. at which temperature electrons 426 are emitted from the surface thereof. The magnitude of the power dissipation and heating may depend at least in part on the magnitude of the current and/or the voltage across the thermionic electron source 400. In some embodiments, the power dissipated by the thermionic electron source 150 is greater than or equal to one milliwatt (mw).

The beam shaper 440 causes at least some of the electrons emitted from the thermionic electron source 400 to form into a beam 536 as they travel toward the first electrode 19 of the transducer 16 (or other mechanical structure(s) on which charge is to be stored). The configuration (e.g., shape, charge density distribution) of the electron beam may depend, at least in part, on the gap 450 between the thermionic electron source 400 and the beam shaper 440, and on the difference between the voltage potential of the thermionic electron source 400 and the voltage potential of the beam shaper 440.

At least some of the electrons 536 in the beam travel across the gap 404 between the thermionic electron source 400 and the first electrode 19 of the transducer (or other mechanical structure(s) on which charge is to be stored) and become trapped thereon. The charge trapped on the electrode 19 (or other mechanical structure(s)) may cause an increase in the voltage thereof.

The charge supplying process may continue until a desired amount of charge has been supplied, e.g., until the electrode 19 (or other mechanical structure(s) on which charge is to be stored) has a desired voltage. In some embodiments, the second power source, e.g., voltage source 423, supplies a voltage equal to the desired voltage of the electrode 19 (or other mechanical structure(s) on which charge is to be stored) and the charge supplying process proceeds until the voltage of the electrode 19 (or other mechanical structure(s) on which charge is to be stored) is equal to the voltage supplied by the second power source, e.g., voltage source 423, and then stops. In some embodiments, the desired voltage is within a range of from about 100 volts to about 1000 volts.

In some embodiments, MEMS 10 has one or more characteristics (e.g. a voltage, a resonant frequency) indicative of the amount of charge that has been supplied to the electrode 19 (and/or other mechanical structure(s) on which charge is to be stored). In such embodiments, one or more of such characteristics may be measured and compared to one or more reference magnitudes to determine whether the desired amount of charge has been supplied. For example, movable mechanical structure 28 of first electrode 19 (and/or other mechanical structure(s) on which charge is to be stored) may have a resonant frequency indicative of the amount of charge supplied to the first electrode 19 (and/or other mechanical structure(s) on which charge is to be stored). The resonant frequency of the movable mechanical structure 28 may thus be measured and compared to a reference magnitude indicative of a resonant frequency that would be exhibited by the movable mechanical structure 28 if the first electrode 19 (and/or other mechanical structure(s) on which charge is to be stored) has the desired amount of charge stored thereon), so as to determine whether the desired amount of charge has been supplied thereto. The charge supplying process may be stopped if it is determined that the desired amount of charge has been supplied (e.g., reached or exceeded).

The charge supplying process may be continuous or discontinuous (periodic or non-periodic), fixed in rate or time varying in rate, and/or combinations thereof. In that regard, the electric current 424 supplied to the thermionic electron source 400 may be continuous or discontinuous (e.g., periodic or non-periodic), fixed in magnitude or time varying, direct current or alternating current, and/or any combination of the above.

After a desired amount of charge has been supplied, it may be desirable to stop the flow of current to the thermionic electron source, so as to stop the heating of the thermionic electron source 400 and the emission of electrons therefrom. This may be accomplished, for example, by disconnecting the first and second electrodes 84, 86 from the first power source, e.g., voltage source 422. The second power source, e.g., voltage source 423, and the third power source, e.g., voltage source 532, may also be disconnected from the micromachined mechanical structure 12.

Notably, at the end of the charge supplying process employed in the embodiment of FIG. 22, the first electrode 19 (and/or any other portions of the structure on which charge is to be stored) is electrically isolated from all other electrically conductive structures within the chamber and outside of the chamber.

In some embodiments, an electrical isolation of at least ten teraohms or another high resistance is provided between the first electrode 19 and other electrically conductive structures within the chamber including, for example, each of the other electrodes 20, 22 and the electrodes 84, 86 temporarily connected to the power source during the charge supplying process. Such a configuration helps reduce the possibility of excessive surface leakage that could otherwise lead to excessive drain of the electrical charge on the one or more portions of the micromachined mechanical structure on which electrical charge is desired to be stored.

As stated above, at the end of the charge supplying process employed in the embodiment of FIG. 22, the first electrode 19 (and/or any other portion(s) of the structure on which charge is to be stored) is also electrically isolated from electrically conductive structures outside the chamber. As stated above, structures outside the chamber may have more contamination and/or greater potential for leakage current and/or drain than structures inside the chamber. Thus, providing electrical isolation from conductive structures outside of the chamber may significantly reduce leakage current and/or drain.

In some embodiments, an electrical isolation of at least ten teraohms or another high DC resistance is provided between the first electrode 19 and structures outside the chamber, thereby reducing the possibility of excessive leakage through the one or more mechanical structures 82 to points outside the chamber that could otherwise lead to excessive drain of the electrical charge on the first electrode 19 (and/or any other portion(s) of the structure on which charge is to be stored).

As stated above, it may be desirable to reduce heat transfer from the thermionic electron source 400 in order to increase the heating thereof and reduce the amount of energy needed to heat the thermionic electron source 400 to a temperature at which electrons are emitted therefrom.

In some embodiments, a vacuum or near vacuum is provided within the chamber 150. The vacuum or near vacuum may help reduce (or further reduce) heat transfer within the chamber 150 and thereby help to reduce or minimize the amount of energy needed to heat the thermionic electron source.

It may also be desirable to increase the thermal resistance of the thermionic electron source. Increasing the thermal resistance of the thermionic electron source 400 may increase the magnitude of the power dissipation and/or heating, and thereby help the thermionic electron source reach or exceed a temperature at which electrons are emitted therefrom.

As stated above, the efficiency of the charge supplying process may depend, at least in part, on the surface area of the one or more portions of the thermionic electron source that face toward the electrode 19 (or other mechanical structure(s) on which charge is to be stored), the surface area of the one or more portions of the electrode 19 (or other mechanical structure(s) on which charge is to be stored) and the distance between the thermionic electron source and the electrode 19 (or other mechanical structure(s) on which charge is to be stored).

The micromachined mechanical structure 12 may be fabricated using one or more of the methods disclosed herein and/or any other suitable technique.

FIGS. 23A-23J illustrate cross-sectional views an exemplary embodiment of the fabrication of the portion of MEMS of FIGS. 20A-20B and FIGS. 21A-21C, including encapsulation that may be employed therewith, at various stages of the process, according to certain aspects of the present invention.

Figure 23A:
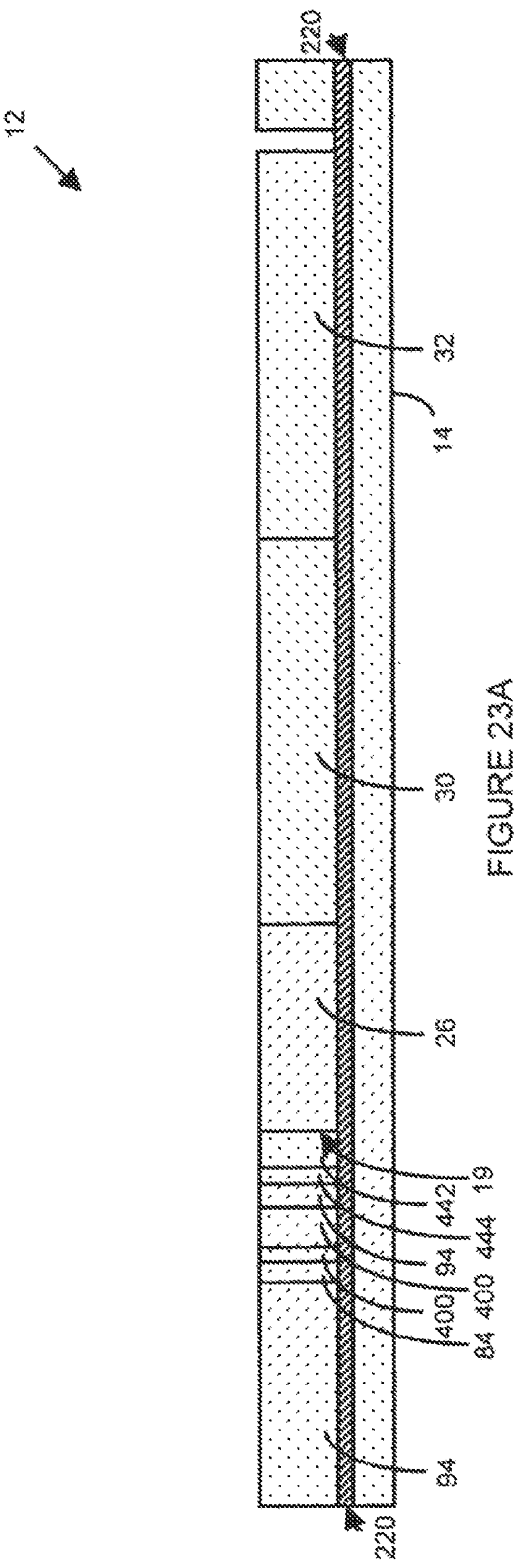
FIGS. 23A-23J illustrate cross-sectional views (taken in the direction A-A of FIG. 20A) of one embodiment of the fabrication of the portion of the micromachined mechanical structure of FIGS. 20A-20B and FIGS. 21A-21C including one embodiment of an encapsulation that may be employed therewith, at various stages of the process, according to certain aspects of the present invention.
Figure 23B:
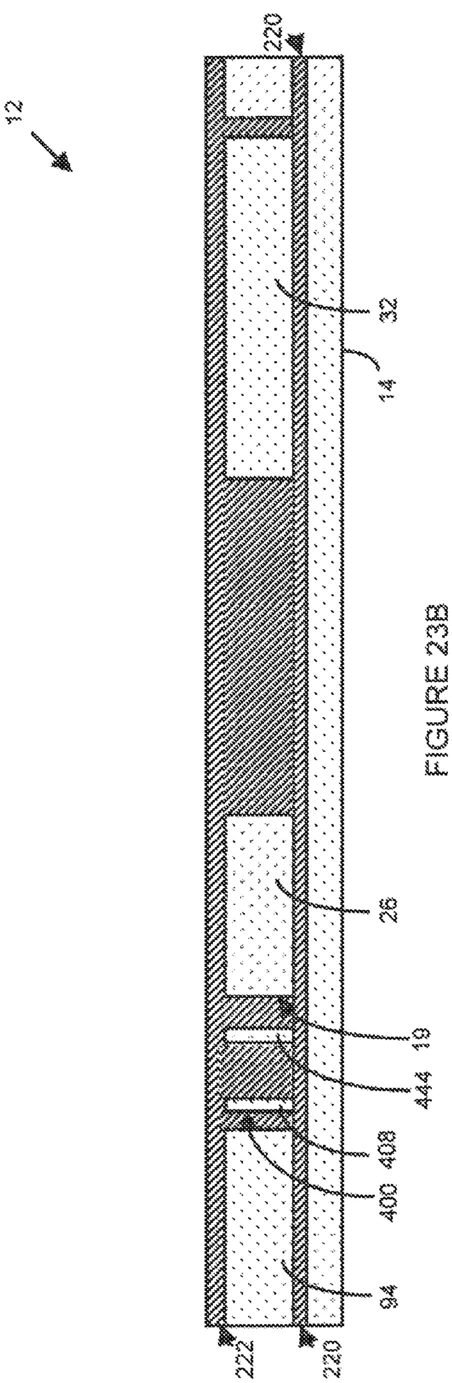
Figure 23C:
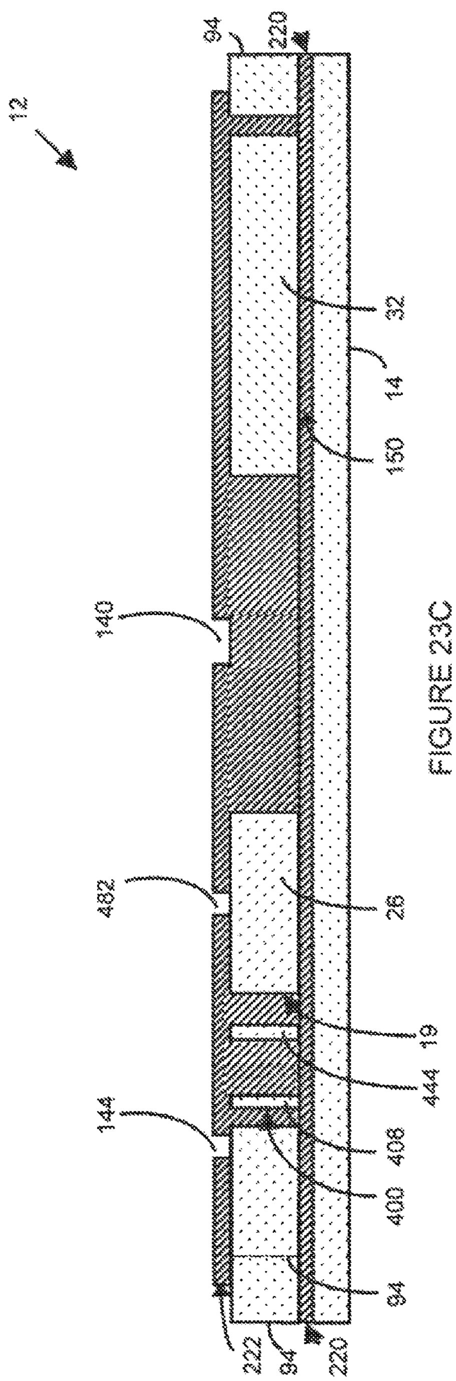
Figure 23D:
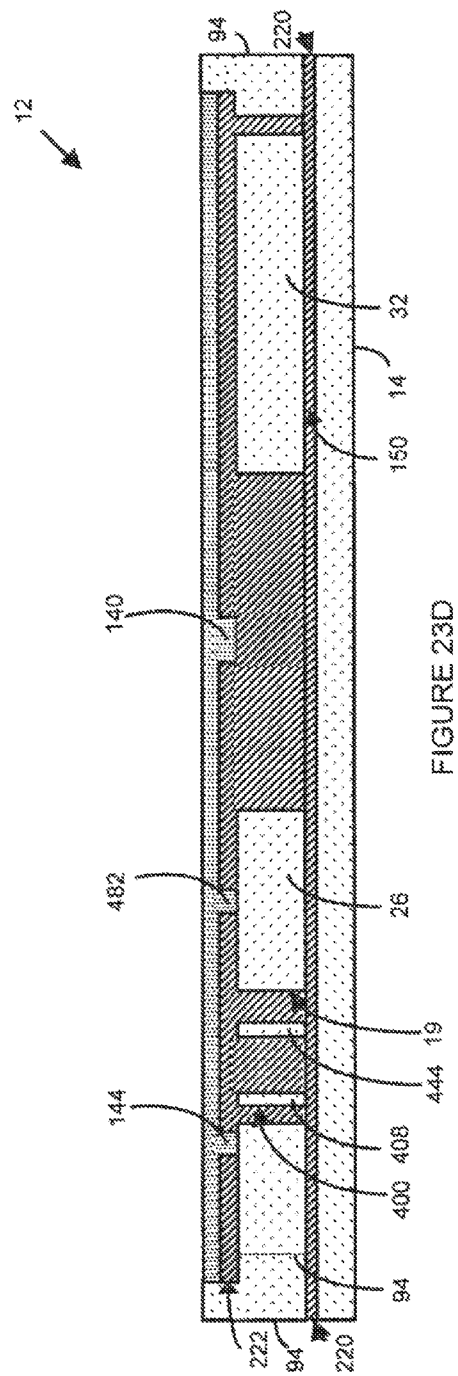
Figure 23E:
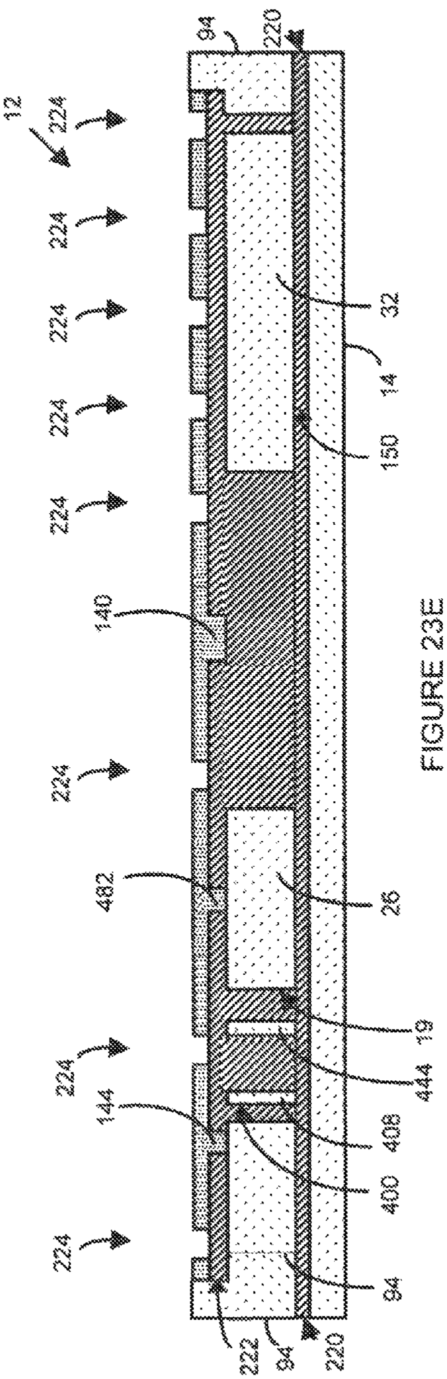
Figure 23F:
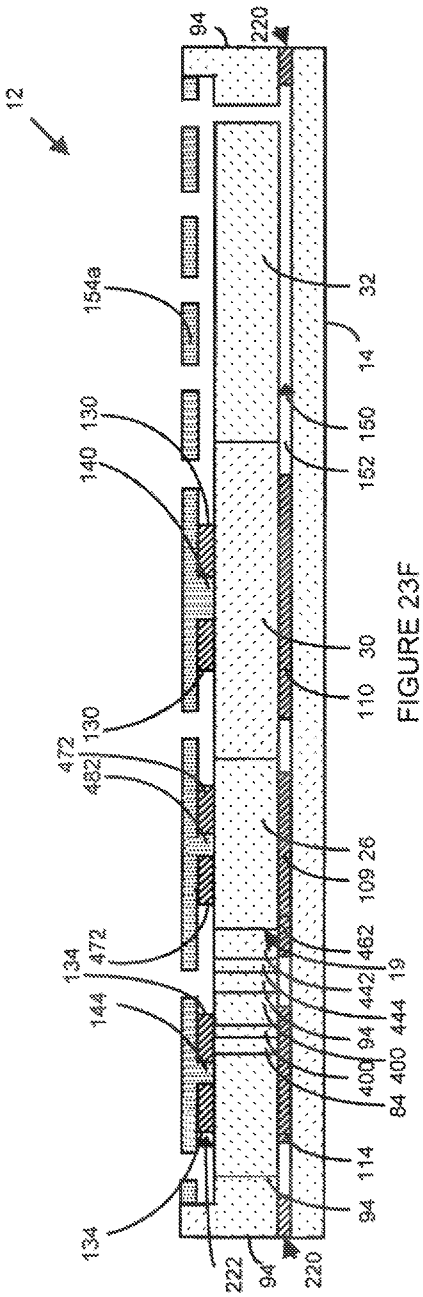
Figure 23G:
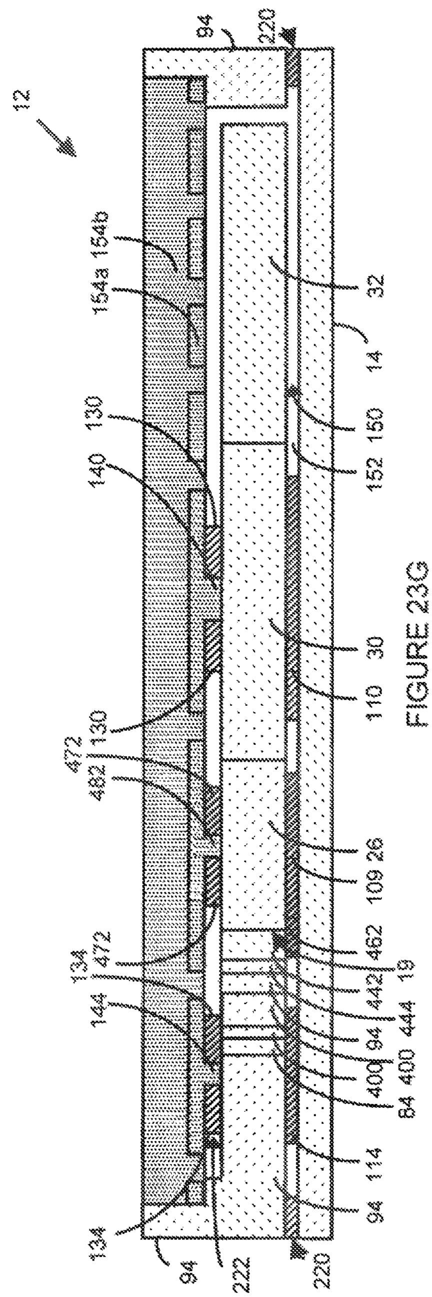
Figure 23H:
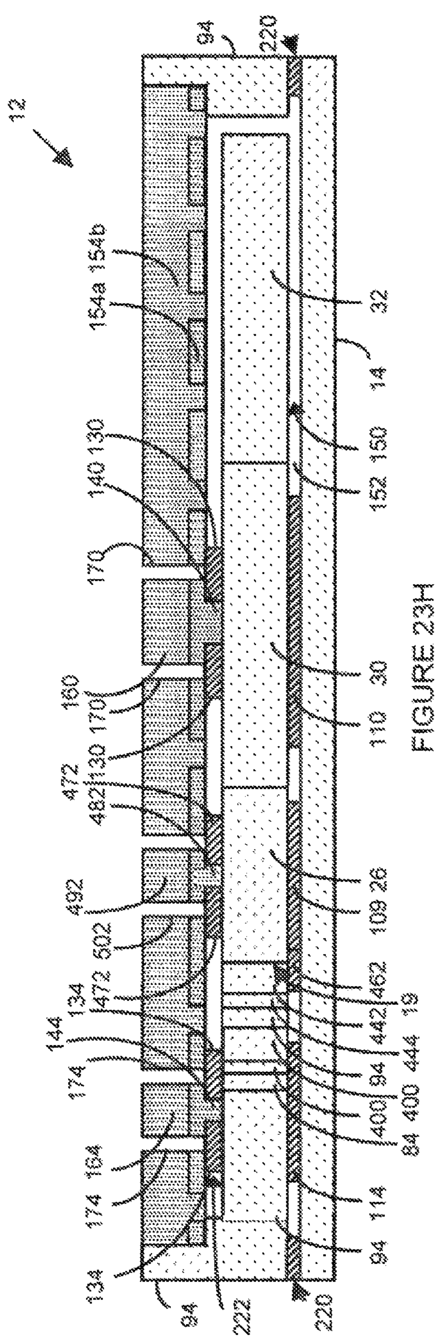
Figure 23I:
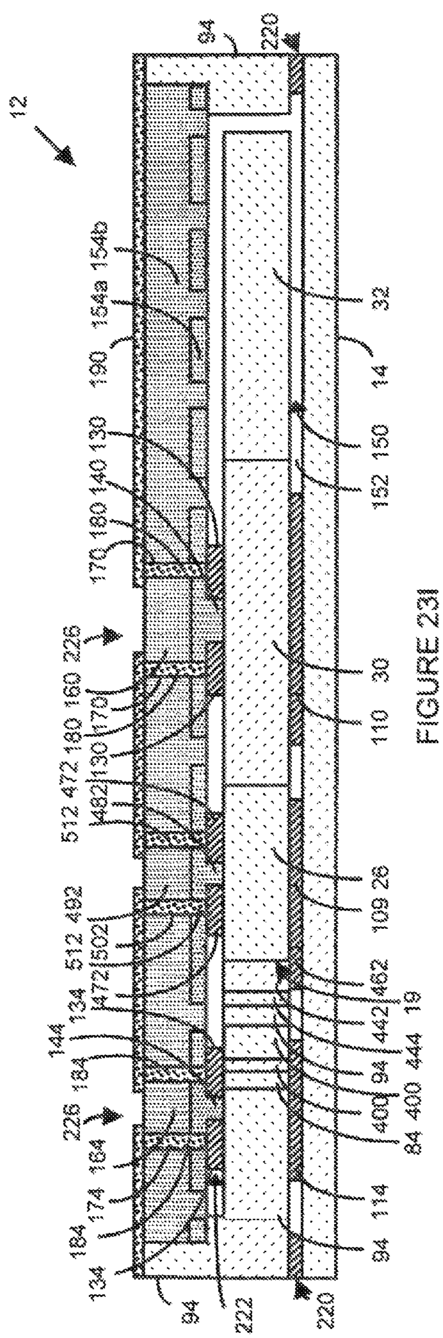
Figure 23J:
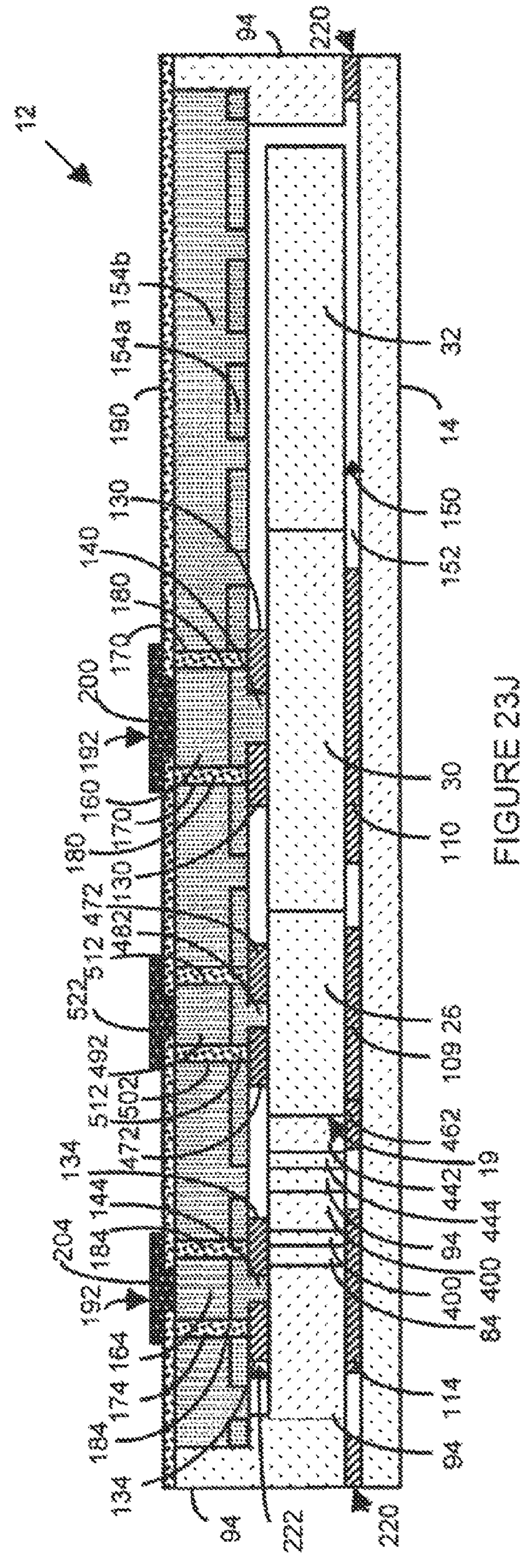

With reference to FIG. 23A, in the exemplary embodiment, fabrication of MEMS 10 having micromachined mechanical structure 12 including an electron gun may begin with an SOI substrate partially formed device including mechanical structures, e.g., electrodes 84, 86, electron gun (including thermionic electrode 220 and beam shaper 440) and electrodes 19, 20, 22, disposed on a first sacrificial layer 220, for example, silicon dioxide or silicon nitride. The mechanical structures, e.g., electrodes 84, 86, electron gun (including thermionic electrode 220 and beam shaper 440) and electrodes 19, 20, 22, may be formed using well-known deposition, lithographic, etching and/or doping techniques as well as from well-known materials (for example, semiconductors such as silicon, germanium, silicon-germanium or gallium-arsenide).

Thereafter, the processing of MEMS 10 having the electron gun may proceed in the same manner as described above with respect to FIGS. 4B-4J. In this regard, an exemplary fabrication process of MEM 10 including electron gun is illustrated in FIGS. 23B-23J. Because the processes are substantially similar to the discussion above with respect to FIGS. 4B-4J, for the sake of brevity, that discussion will not be repeated.

As stated above, some embodiments of the present invention may be implemented in conjunction with one or more of the thin film encapsulation techniques described and illustrated in the Microelectromechanical Systems and Method of Encapsulating Patent Application Publication incorporated by reference herein. In this regard, any and all of the embodiments described herein may employ one or more of the structures and/or techniques disclosed in the Microelectromechanical Systems and Method of Encapsulating Patent Application Publication. The present invention may also be employed in conjunction with wafer-bonding encapsulation techniques.

Figure 24A:
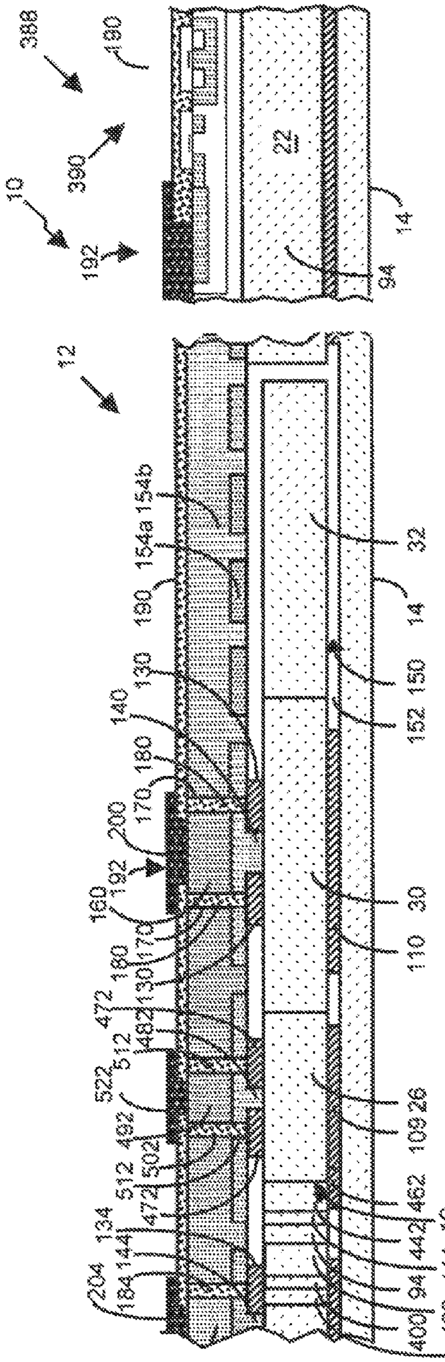
FIG. 24A illustrates a cross-sectional view of a MEMS according to certain aspects of the present inventions, including the portion of the micromachined mechanical illustrated in FIG. 20A (cross sectional view thereof taken in the direction A-A of FIG. 20A) and an integrated circuit portion, both portions of which are disposed or integrated on or in a common substrate.
Figure 24B:
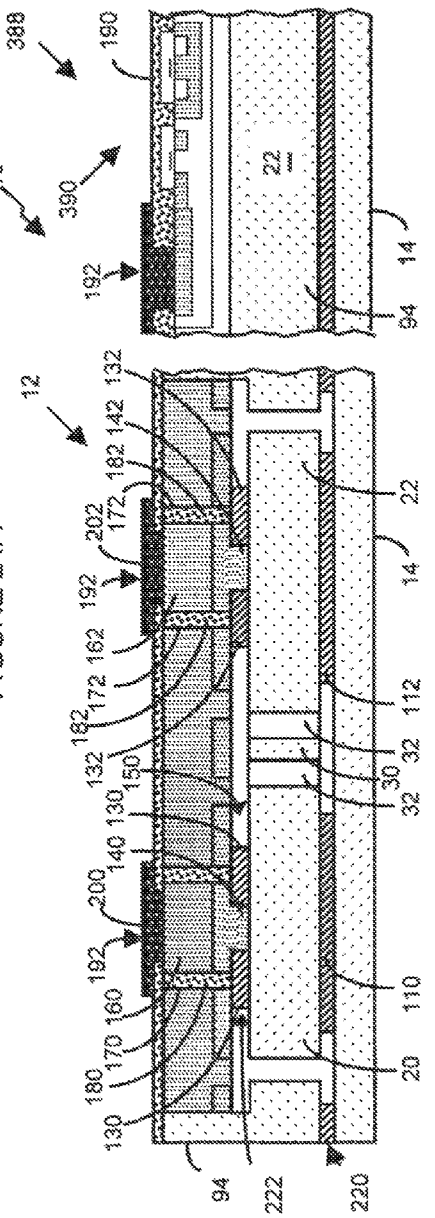
FIG. 24B illustrates a cross-sectional view of a MEMS according to certain aspects of the present inventions, including the portion of the micromachined mechanical illustrated in FIG. 20A (cross sectional view thereof taken in the direction B-B of FIG. 20A) and an integrated circuit portion, both portions of which are disposed or integrated on or in a common substrate.

As also stated above, MEMS 10 may include one or more other circuits and/or devices, e.g., other circuits and/or devices 226, 330 (FIGS. 10A-10L), charge storing circuit 332 (FIGS. 10B-10E, 10K-10L), DC/DC converter circuit 362 (FIGS. 10E, 10G, 10L), data processing electronics 386 (FIG. 11 and FIGS. 12A-12D) and/or interface circuitry 388 (FIG. 11 and FIGS. 12A-12D). For example, with reference to FIGS. 24A and 24B, integrated circuits 390 may be fabricated using conventional techniques after definition of mechanical structure 12 using, for example, the techniques described and illustrated in Microelectromechanical Systems and Method of Encapsulating Patent Application Publication and/or Microelectromechanical Systems Having Trench Isolated Contacts Patent.

Figure 25A:
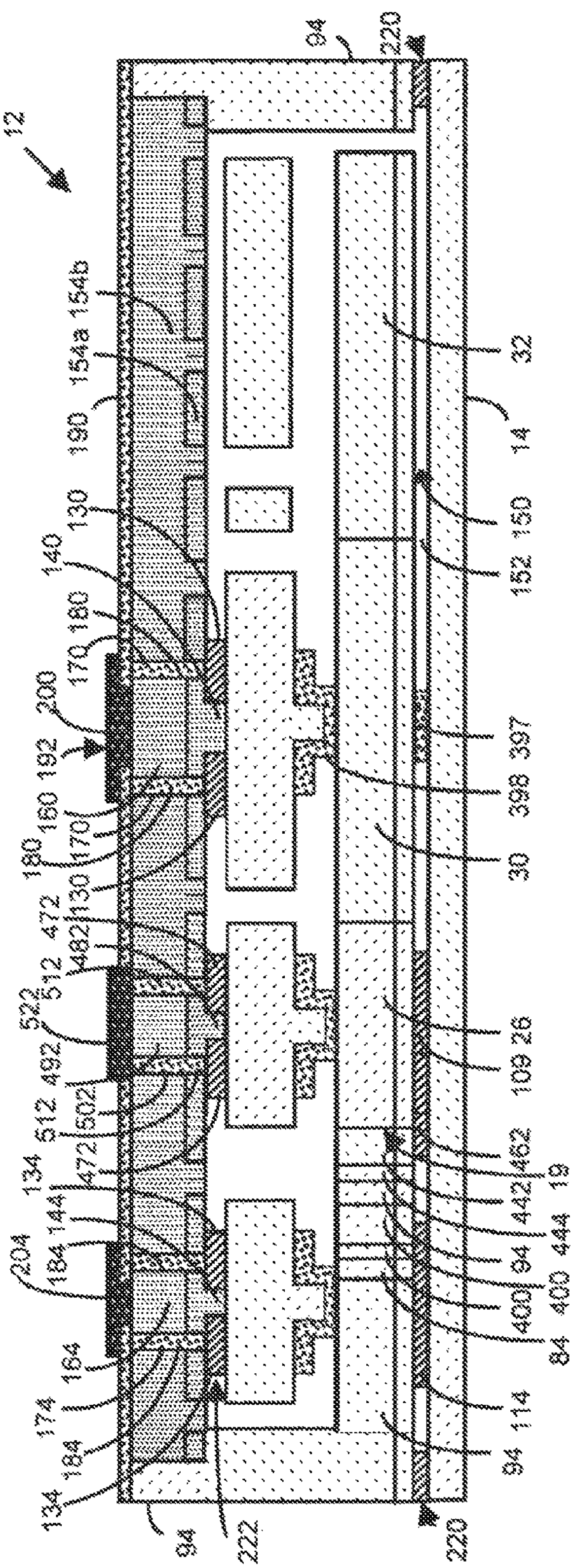
FIGS. 25A-25B illustrate cross-sectional views of micromechanical structures, which may be monolithically integrated on or within the substrate of a MEMS, in accordance with certain aspects of the present invention.
Figure 25B:
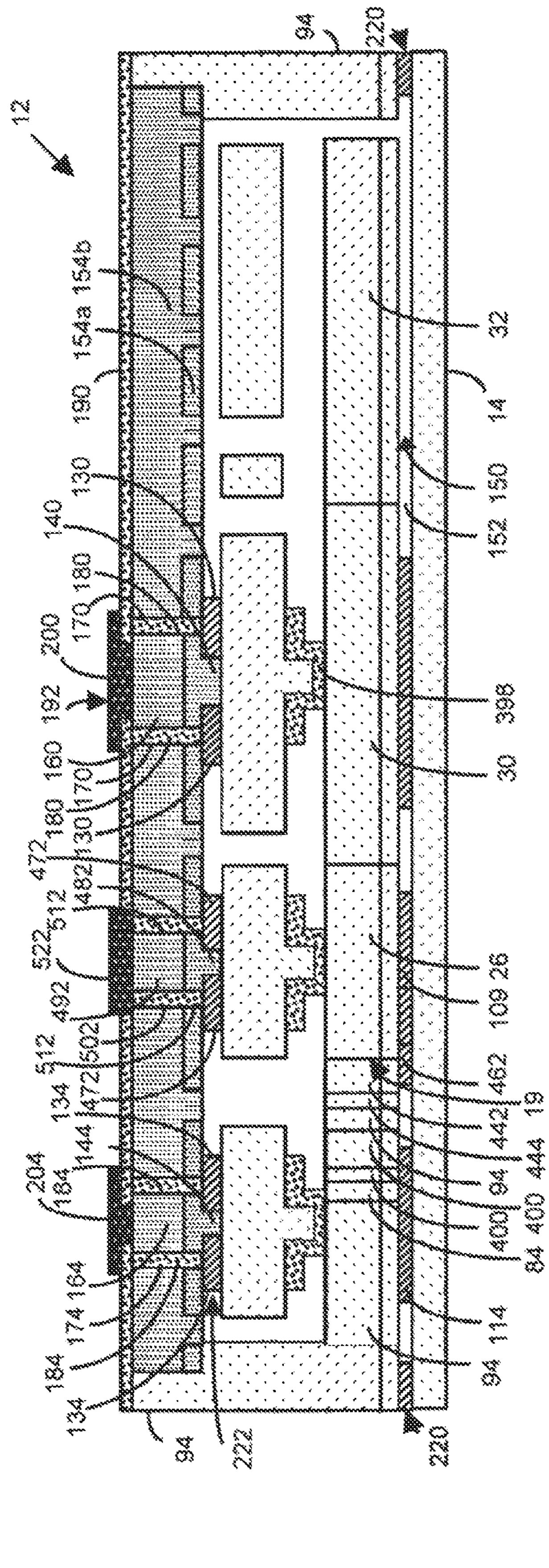
Figure 26A:
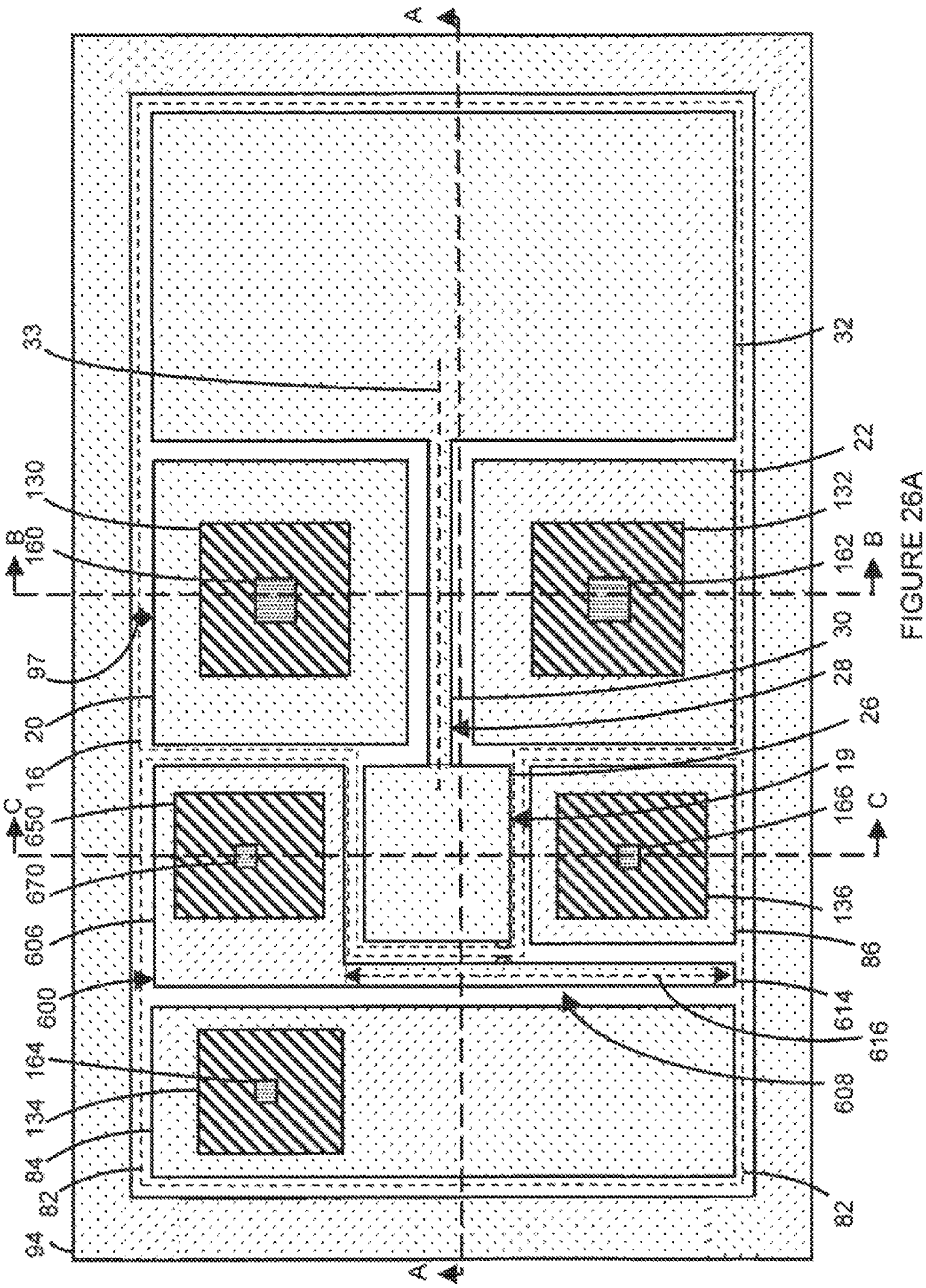
FIG. 26A illustrates a plan view of a portion of another micromachined mechanical structure that may be employed in the MEMS of FIG. 1, in accordance with certain aspects of the present invention.
Figure 26B:
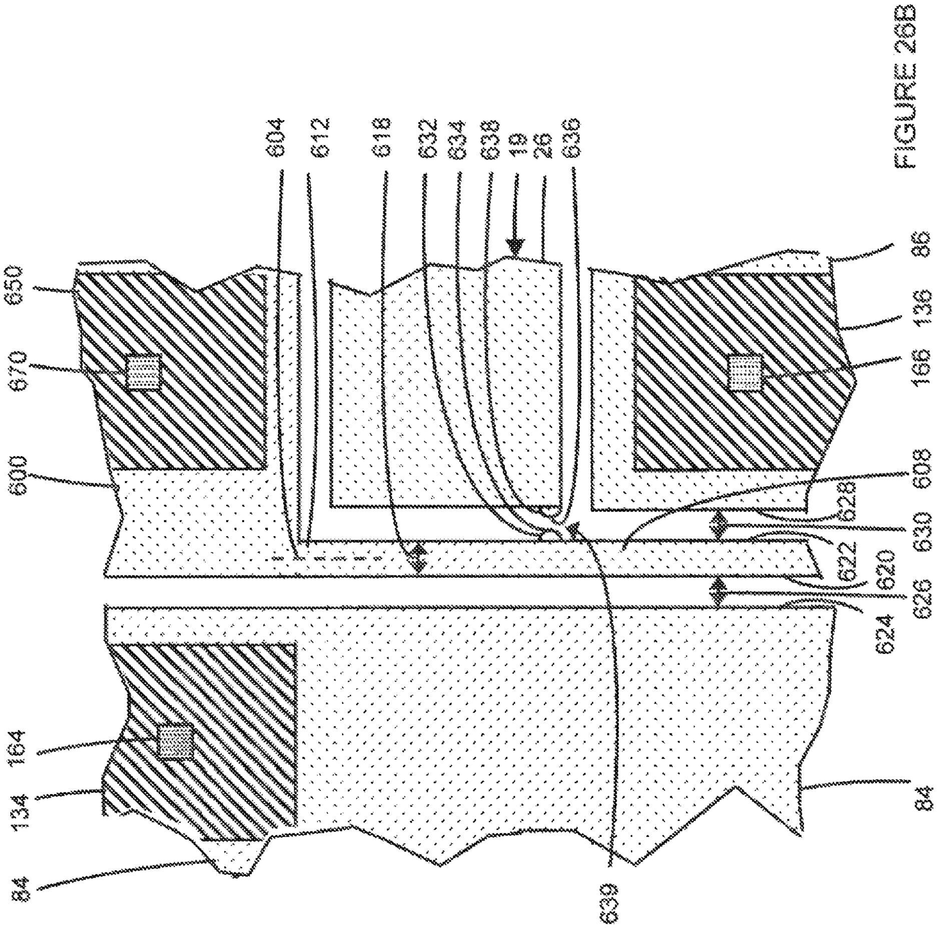
FIG. 26B illustrates an enlarged plan view of a portion of the micromachined mechanical structure of FIG. 26A, in accordance with certain aspects of the present invention.

Further, the various structures of the micromachined mechanical structure 12 may have any orientation including longitudinal, lateral, vertical any combination thereof. As stated above, any of the embodiments and/or techniques described herein may be implemented in conjunction with micromachined mechanical structures 12 having one or more transducers or sensors which may themselves include multiple layers that are vertically and/or laterally stacked or interconnected as illustrated in Microelectromechanical Systems and Method of Encapsulating Patent Application Publication and/or Microelectromechanical Systems Having Trench Isolated Contacts Patent, each of which is incorporated by reference herein. Accordingly, any and all of the inventions and/or embodiments illustrated and described herein may be implemented in, and/or employed in conjunction with, any of the embodiments of Microelectromechanical Systems and Method of Encapsulating Patent Application Publication and/or Microelectromechanical Systems Having Trench Isolated Contacts Patent that include multiple layers of mechanical structures, contacts areas and buried contacts that are vertically and/or laterally stacked or interconnected (see, for example, FIGS. 25A and 25B).

Moreover, the present inventions may implement the anchors and techniques of anchoring mechanical structures 16 to substrate 14 (as well as other elements of MEMS 10) described and illustrated in the Anchors for Microelectromechanical Systems Patent, which is incorporated by reference herein. Accordingly, any and all of the inventions and/or embodiments illustrated and described herein may be implemented in, and/or employed in conjunction with, any of the embodiments described and illustrated in the Anchors for Microelectromechanical Systems Patent, implemented in conjunction with the inventions described and illustrated herein (see, for example, FIGS. 25A and 25B).

FIGS. 26A-26B and FIGS. 27A-27C illustrate plan views and cross sectional views, respectively, of a portion of another micromachined mechanical structure 12 that may be employed in the MEMS of FIG. 1, in accordance with certain aspects of the present invention. As with the micromachined mechanical structure of FIGS. 2A-2D and FIGS. 3A-3E, micromachined mechanical structure 12 illustrated in FIGS. 26A-26B and FIGS. 27A-27C includes a transducer 16, which may have electrical charge supplied thereto, stored thereon and/or trapped thereon. The transducer 16 may be any type of transducer, for example, an energy harvesting device), a sensor (e.g., an accelerometer, a gyroscope, a microphone, a vibration sensor, a pressure sensor, a strain sensor, a tactile sensor, a magnetic sensor and/or a temperature sensor), a resonator, a resonant filter, and/or a combination thereof. In this embodiment, transducer 16 comprises a capacitive transducer, however, the transducer 12 is not limited to such.

In the micromachined mechanical structure 12 illustrated in FIGS. 26A-26B and FIGS. 27A-27C, transducer 16 includes a plurality of mechanical structures disposed on, above and/or in substrate 14, including, for example first, second and third electrodes 19, 20, 22. The first, second and third electrodes 19, 20, 22 and/or other mechanical structures may each have any configuration. In the illustrated embodiment, for example, the first electrode 19 includes a fixed mechanical structure 26 and a movable mechanical structure 28 supported thereby. The movable mechanical structure 28 is similar to the movable mechanical structure 28 of the first electrode 19 of the transducer 16 illustrated in FIGS. 2A-2D and FIGS. 3A-3E. The second and third electrodes 20, 22 comprise fixed mechanical structures with generally rectangular shapes similar to that of the second and third electrodes 20, 22 of the transducer 16 illustrated in FIGS. 2A-2D and FIGS. 3A-3E.

The micromachined mechanical structure 12 further includes one or more mechanical structures 82 disposed on, above and/or in substrate 14, for use in supplying, storing and/or trapping electrical charge on the first electrode 19 (and/or any other portion(s) of the micromachined mechanical structure 12 on which charge is to be stored). In this embodiment, the one or more mechanical structures 82 include a first electrode 84, a second electrode 86 and a third electrode 600. The one or more mechanical structures 82 may have any configuration (e.g., size, shape, orientation). In the illustrated embodiment, for example, the first and second electrodes 84, 86 include fixed mechanical structures having generally rectangular shapes spaced apart from one another by a gap. The first and second electrodes 84, 86 may be disposed on opposite sides of, and equally spaced from, a reference plane 604. The third electrode 600 may include a fixed mechanical structure 606 and a movable mechanical structure 608 that extends therefrom and includes first and second ends 612, 614. The first end 612 may connect to the fixed structure 606. The second end 614 may be free. In one embodiment, movable structure 608 has a length 616 in a range of about 100 microns to about 300 microns and a width 618 in a range of about 5 microns to about 10 microns.

A portion of the movable structure 608 may be disposed between the first and second electrodes 84, 86. In that regard, the movable structure 608 may define first and second surfaces 620, 622. The first surface 620 may face in a direction toward a first surface 624 of the first electrode 84 and may be spaced therefrom by a first gap 626. The second surface 622 may face in a direction toward a first surface 628 of the second electrode 86 and may be spaced therefrom by a second gap 630.

The movable structure 608 may further include a contact 632 defining a contact surface 634 that faces in a direction toward a contact surface 636 of a contact portion 638 of electrode 19 of the transducer 16 (and/or other mechanical structure(s) on which charge is to be stored). The contact surface 634 of the movable structure and the contact surface 636 of the electrode 19 (and/or other mechanical structure(s) on which charge is to be stored) may be spaced apart from one another by a third gap 639. The contact 632, contact portion 638, and contact surfaces 634, 636 may have any configuration (shape, size) and/or location. Thus, contact 632, contact portion 638, and contact surfaces 634, 636 are not limited to raised contacts and/or raised contact surfaces.

The one or more mechanical structures 82 may be comprised of any suitable material, for example, a semiconductor material, for example, silicon, (whether doped or undoped), germanium, silicon/germanium, silicon carbide, gallium arsenide and combinations thereof, materials in column IV of the periodic table for example silicon, germanium, carbon; and combinations thereof, for example, silicon germanium, or silicon carbide; also of III-V compounds for example, gallium phosphide, aluminum gallium phosphide, or other III-V combinations; also combinations of III, IV, V, or VI materials, for example, silicon nitride, silicon oxide, aluminum carbide, or aluminum oxide; also metallic silicides, germanides, and carbides, for example, nickel silicide, cobalt silicide, tungsten carbide, or platinum germanium silicide; also doped variations including phosphorus, arsenic, antimony, boron, or aluminum doped silicon or germanium, carbon, or combinations like silicon germanium; also these materials with various crystal structures, including single crystalline, polycrystalline, nanocrystalline, or amorphous; also with combinations of crystal structures, for instance with regions of single crystalline and polycrystalline structure (whether doped or undoped).

One or more clearances e.g., clearances 636*a*, 636*b* (FIG. 27A), may be provided between one or more portions of the movable structure 608 and one or more other portions of the micromachined mechanical structure 12. Such clearances, e.g., clearances 636*a*, 636*b*, may reduce the possibility of friction and/or interference between the movable structure and the one or more other portions of the micromachined mechanical structure 12. In some embodiments, the one or more clearances, e.g., clearances 636*a*, 636*b*, provide clearance around each surface of the movable structure 608 except at end 612 where the movable structure 608 connects to the fixed structure 606 such that the movable structure 608 is suspended from the fixed structure 606.

The third electrode 600 may define a contact area, e.g., contact area 600*a*, which may provide an electrical path between the electrode 600 and one or more other circuits and/or devices, e.g., voltage source 300 (FIG. 28)).

Figure 27A:
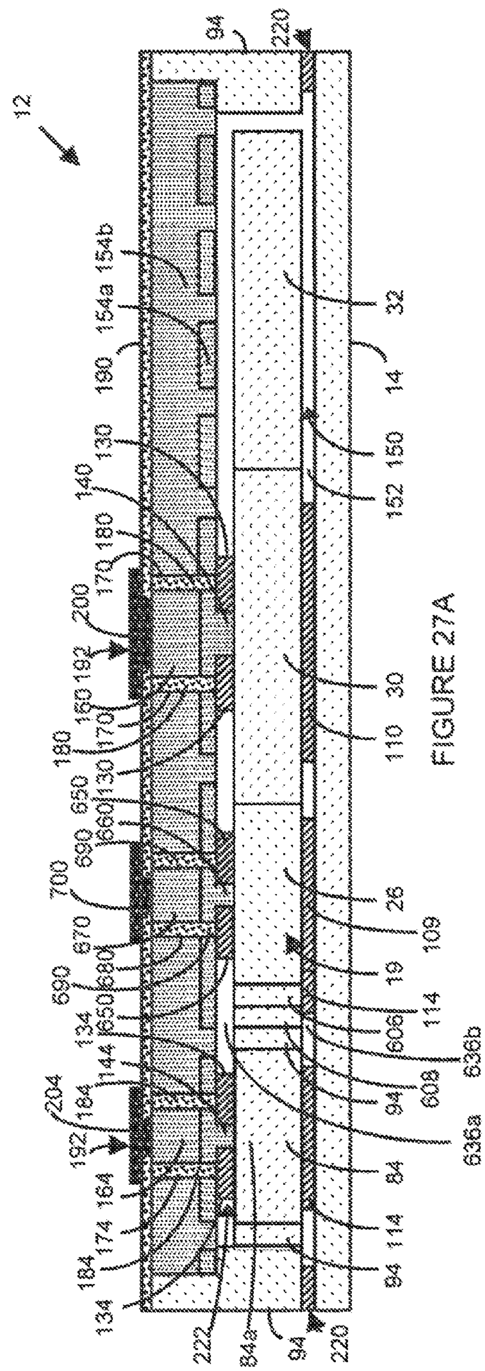
FIG. 27A illustrates a cross-sectional view (taken in the direction A-A of FIG. 26A) of the portion of the micromachined mechanical structure of FIG. 26A and one embodiment of an encapsulation structure that may be employed therewith, in accordance with certain aspects of the present invention.
Figure 27B:
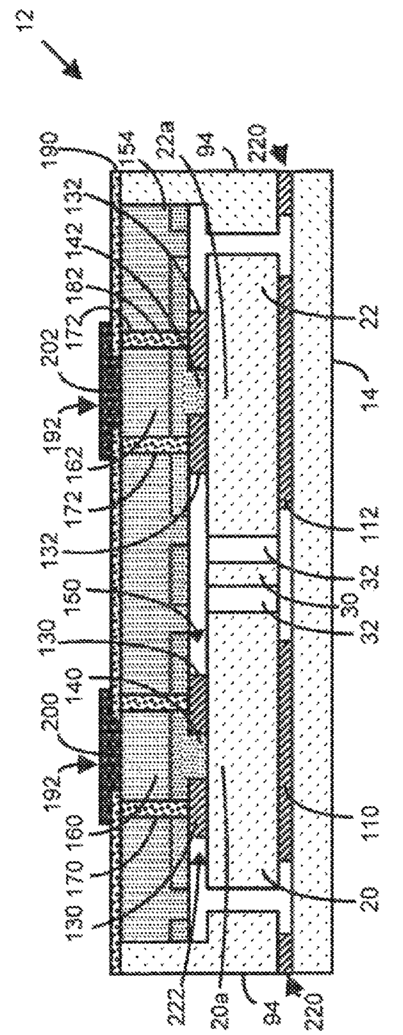
FIG. 27B illustrates a cross-sectional view (taken in the direction B-B of FIG. 26A) of the portion of the micromachined mechanical structure of FIG. 26A and one embodiment of an encapsulation structure that may be employed therewith, in accordance with certain aspects of the present invention.
Figure 27C:
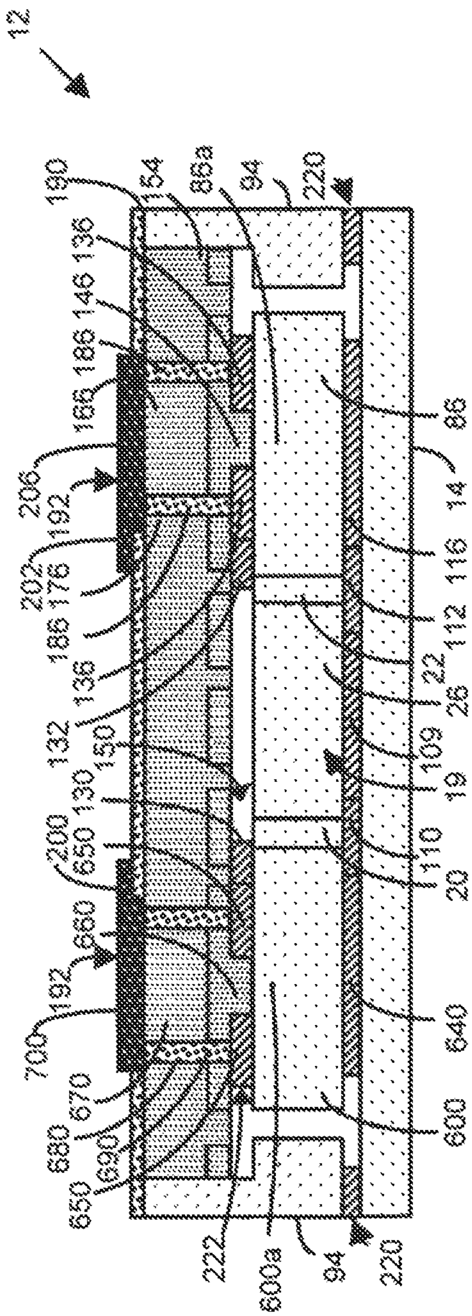
FIG. 27C illustrates a cross-sectional view (taken in the direction C-C of FIG. 26A) of the portion of the micromachined mechanical structure of FIG. 26A and one embodiment of an encapsulation structure that may be employed therewith, in accordance with certain aspects of the present invention.

Referring to FIGS. 27A-27C, the micromachined mechanical structure 12 may further define one or more insulation area, e.g., isolation area 640, disposed between the substrate 14 and third electrode 600, to provide electrical isolation between the substrate and such electrode. The one or more insulation areas, e.g., insulation areas 640, may comprise, for example, silicon dioxide or silicon nitride.

The micromachined mechanical structure 12 may further define one or more insulation areas, e.g., insulation area 650, disposed superjacent electrode 600 to partially, substantially or entirely surround contact area 600*a* of electrode 600, as may be desired. The one or more insulation areas, e.g., insulation area 650, may comprise, for example, silicon dioxide or silicon nitride. One or more of such insulation areas, e.g., insulation area 650, may define one or more openings, e.g., openings 660, to facilitate electrical contact to the electrode 600.

As stated above, the micromachined mechanical structure 12 further defines a chamber 150 having an atmosphere 152 "contained" therein. The chamber 150 may be formed, at least in part, by one or more encapsulation layer(s) 154. In some embodiments, one or more of the one or more encapsulation layer(s) 154 are formed using one or more of the encapsulation techniques described and illustrated in the Microelectromechanical Systems Having Trench Isolated Contacts Patent, the entire contents of which, including, for example, the features, attributes, alternatives, materials, techniques and advantages of all of the inventions, are incorporated by reference herein, although, unless stated otherwise, the aspects and/or embodiments of the present invention are not limited to such features, attributes alternatives, materials, techniques and advantages.

The one or more encapsulation layers 154 may define one or more conductive regions, e.g., conductive region 670, disposed superjacent electrode 600 to facilitate electrical contact therewith. The one or more encapsulation layers 154 may further define one or more trenches, e.g., trench 680, disposed about one or more of the conductive regions, e.g., conductive region 670, to electrically isolate one or more of such regions from one or more other portions of the micromachined mechanical structure 12. Insulating material may be deposited in one or more of the trenches, e.g., trench 680, to form one or more isolation regions, e.g., isolation region 690.

As stated above, the micromachined mechanical structure may further define an insulation layer 190 and a conductive layer 192 disposed superjacent encapsulation layer(s) 154. The insulation layer 190 may provide electrical isolation between conductive layer 192 and one or more other portions of the micromachined mechanical structure 12, as may be desired. The conductive layer 192 may define one or more conductive regions, e.g., conductive region 700, that form part of the electrical connection to one or more electrodes, e.g., electrode 600.

As further described hereinafter, providing an excitation, e.g., an excitation signal on one or more of first and second electrodes 84, 86, causes the movable structure 608 of the third electrode 600 to move in a lateral direction.

In the absence of an excitation and/or stored charge, the movable structure 608 may be stationary and disposed at a position that is centered about the reference plane 604 (i.e., equidistant or at least approximately equidistant between the first and second electrodes 84, 86). With such positioning, the width of the gap 626 (i.e., the gap separating the movable structure 608 and the first electrode 84) may be approximately equal to the width of the gap 630 (i.e., the gap separating the movable structure 608 and the second electrode 86). In some embodiments, one or more portions of third electrode 600 are resilient so that the movable structure 608 bends in the presence of an excitation and returns to its original position after the excitation is removed.

FIGS. 28A-28E illustrate one embodiment for employing the one or more mechanical structures 82 to facilitate storing of electrical charge on the first electrode 19 of the transducer 16 illustrated in FIGS. 26A-26B and FIGS. 27A-27C (and/or any other portion(s) of the micromachined mechanical structure 12 on which charge is to be stored), in accordance with certain aspects of the present invention.

Figure 28A:
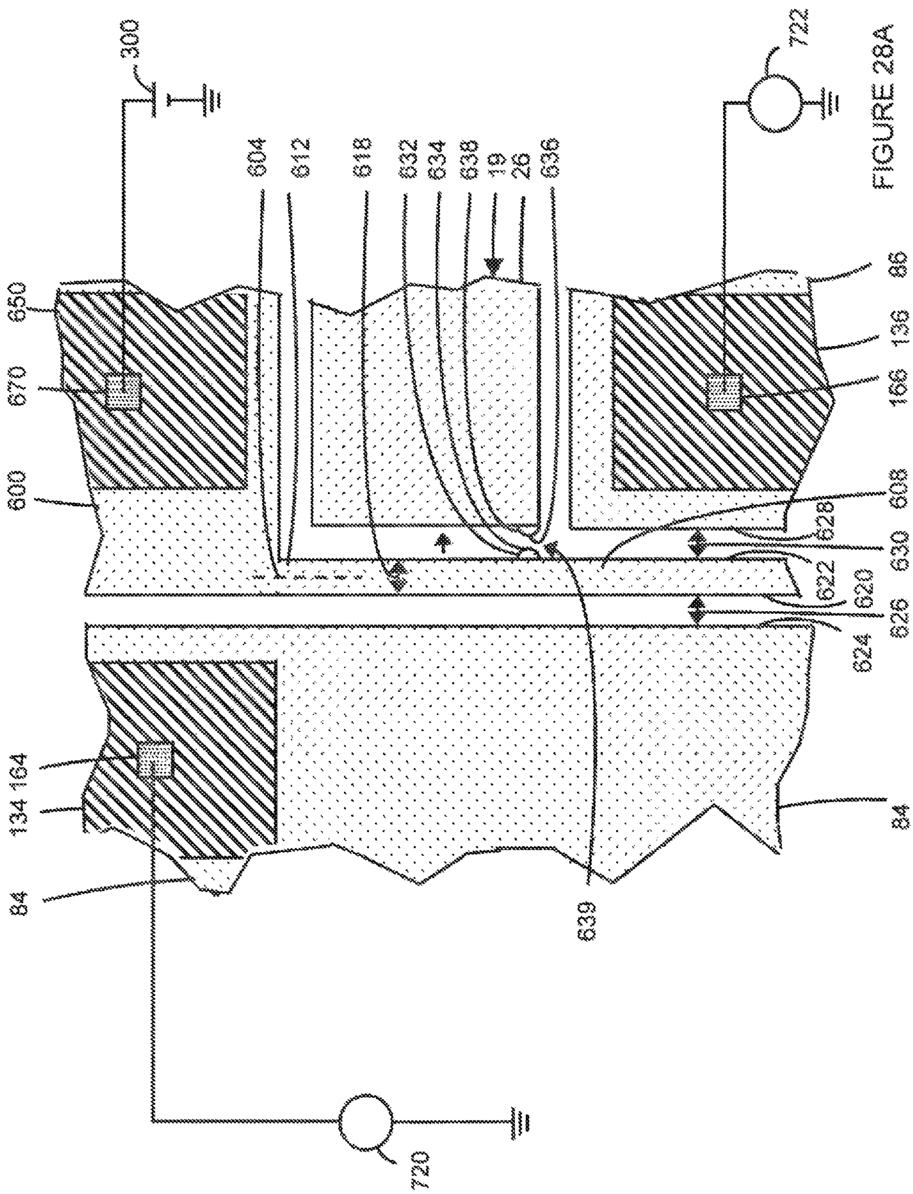
FIGS. 28A-28E illustrate a plan view of the portion of micromachined mechanical structure illustrated in FIGS. 26A-26B and FIGS. 27A-27C, in conjunction with a power source that may be employed therewith, showing one embodiment for employing the mechanical structures of FIGS. 26A-26B and FIGS. 27A-27C to facilitate supplying, storing and/or trapping of electrical charge, in accordance with certain aspects of the present invention.

Referring to FIG. 28A, in this embodiment, one or more of the first and second electrodes 84, 86 are connected to one or more power sources that provide an excitation, e.g., excitation signals 720, 722, to control the movable structure 608 of the third electrode 600. The third electrode 600 is electrically connected to a first power source, e.g., a voltage source 300. The excitation, e.g., excitation signals 720, 722, result in an electrostatic force that cause the movable structure 608 of the third electrode 600 to move toward the contact portion 638 of the first electrode 19 (and/or other mechanical structure(s) on which charge is to be stored).

Figure 28B:
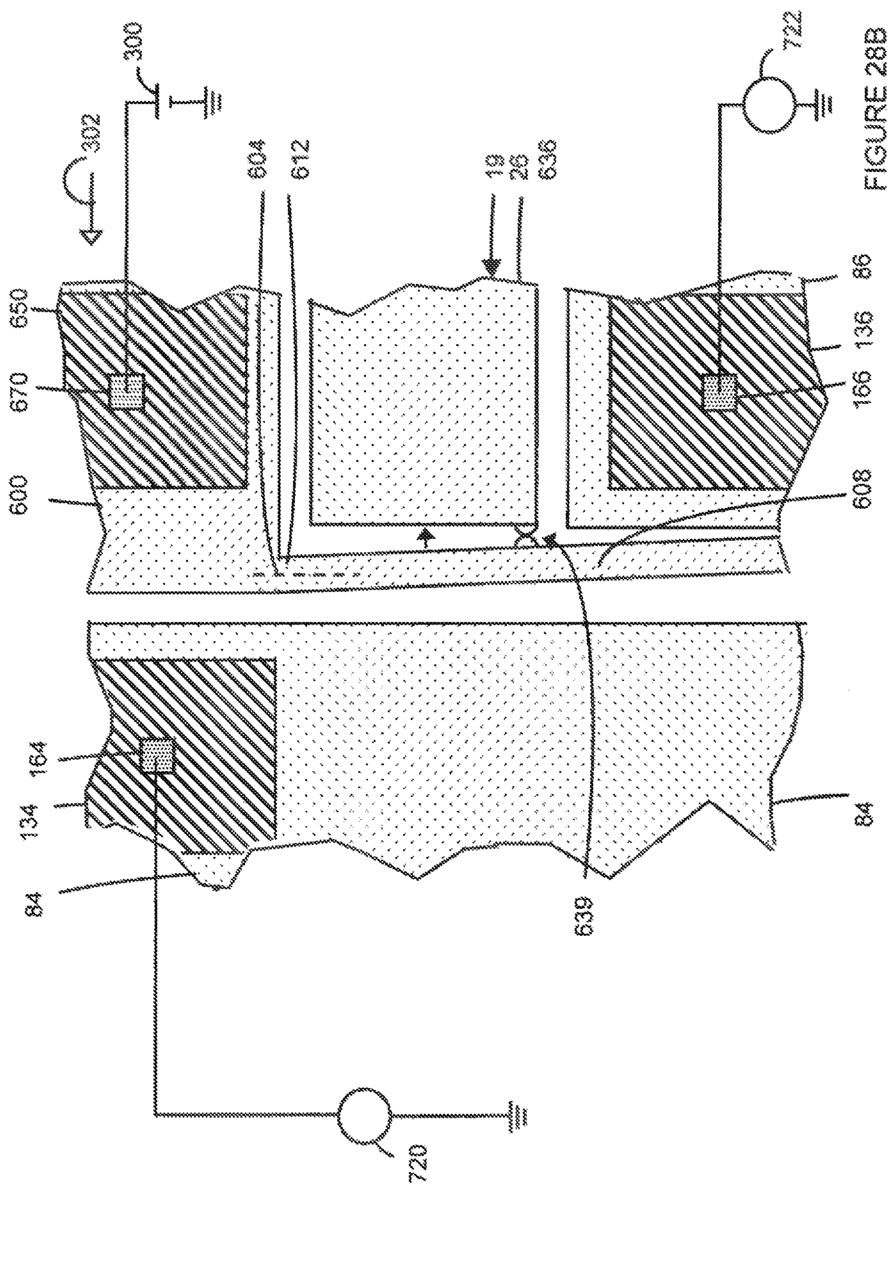

Referring to FIG. 28B, as the contact portion 632 of the movable body 608 moves toward the contact portion 638 of the first electrode 19 (and/or other mechanical structure(s) on which charge is to be stored), the gap 639 between the contact portions 632, 638 decreases and the contact surface 634 of the movable structure 608 eventually makes contact with the contact surface 636 of the first electrode 19 (and/or other mechanical structure(s) on which charge is to be stored).

During such contact, the first power source, e.g., voltage source 300, supplies an electric current 302 that flows through the third electrode 600 to supply charge to the first electrode 19 of the transducer (and/or other mechanical structure(s) on which charge is to be stored). The charge supplied to the first electrode 19 of the transducer 16 (or other mechanical structure(s) on which charge is to be stored) may cause an increase in the voltage thereof.

The charge supplying process may proceed until a desired amount of charge has been supplied, e.g., until the electrode 19 (or other mechanical structure(s) on which charge is to be stored) has a desired voltage. In some embodiments, the first power source, e.g., voltage source 300, supplies a voltage equal to the desired voltage of the electrode 19 (or other mechanical structure(s) on which charge is to be stored) and the above described charge supplying process proceeds until the voltage of the electrode 19 (or other mechanical structure (s) on which charge is to be stored) is equal to the voltage supplied by the first power source, e.g., voltage source 300, and then stops. As stated above, in some embodiments, the desired voltage is within a range of from about 100 volts to about 1000 volts, e.g., 1000 volts.

In some embodiments, MEMS 10 has one or more characteristics (e.g. a voltage, a resonant frequency) indicative of the amount of charge that has been supplied to the electrode 19 (and/or other mechanical structure(s) on which charge is to be stored). In such embodiments, one or more of such characteristics may be measured and compared to one or more reference magnitudes to determine whether the desired amount of charge has been supplied. For example, movable mechanical structure 28 of first electrode 19 (and/or other mechanical structure(s) on which charge is to be stored) may have a resonant frequency indicative of the amount of charge supplied to the first electrode 19 (and/or other mechanical structure(s) on which charge is to be stored). The resonant frequency of the movable mechanical structure 28 may thus be measured and compared to a reference magnitude indicative of a resonant frequency that would be exhibited by the movable mechanical structure 28 if the first electrode 19 (and/or other mechanical structure(s) on which charge is to be stored) has the desired amount of charge stored thereon), so as to determine whether the desired amount of charge has already been supplied thereto.

Figure 28C:
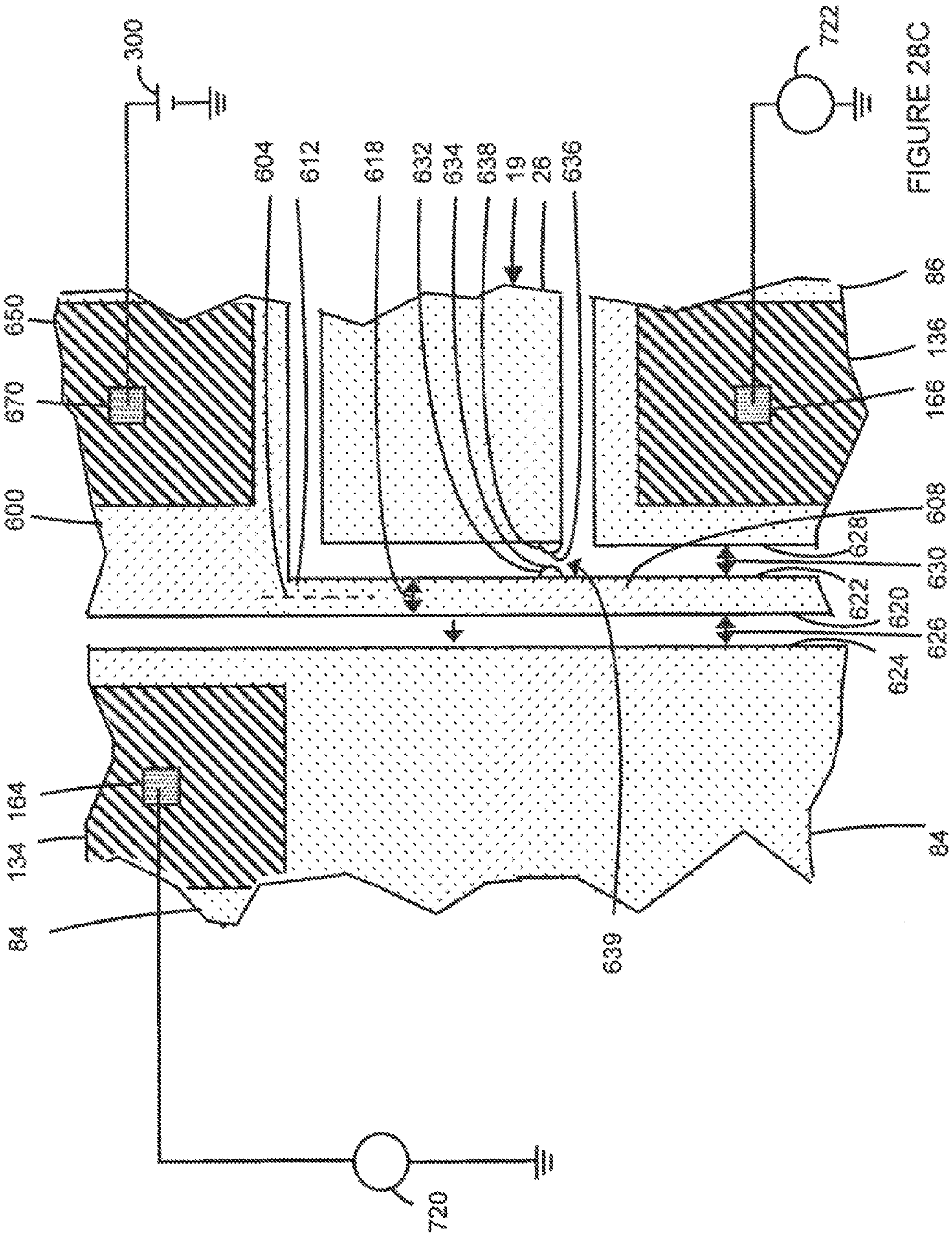
Figure 28D:
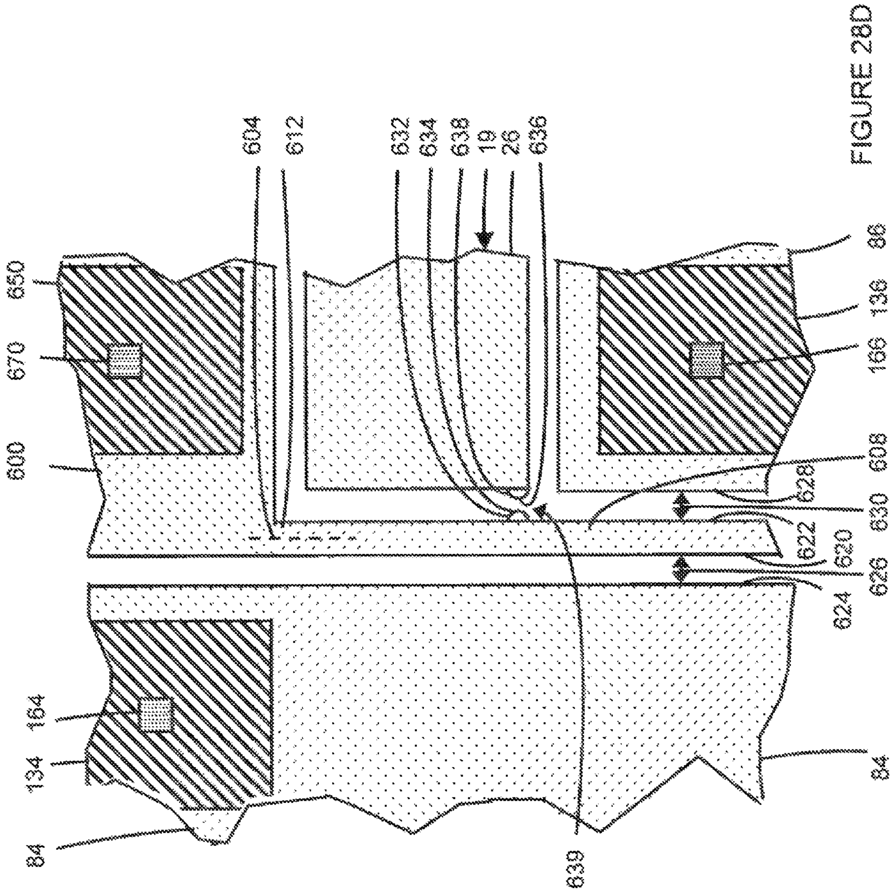

Referring to FIG. 28C, after a desired amount of charge has been supplied, it may be desirable to break the mechanical and electrical contact between the contact portion 632 of the movable structure 608 and the contact portion 638 of the first electrode 19 (and/or other mechanical structure(s) on which charge is to be stored). In some embodiments, this may be accomplished, by removing and/or reducing the excitation, e.g., excitation signals 720, 722. If one or more portions of first electrode 19 are resilient, the movable structure may move away from the first electrode 19 (and/or other mechanical structure(s) on which charge is to be stored) and the contact portion 632 of the movable structure 608 may eventually break contact with the contact portion 638 of the first electrode 19 (and/or other mechanical structure(s) on which charge is to be stored) after the excitation is removed. In some embodiments, it may be advantageous to connect one or more of the first and second electrodes 84, 86 to one or more power sources that provide an excitation, e.g., excitation signals 720, 722, that cause the movable structure 608 of the third electrode 600 to move away from the contact portion 638 of the first electrode 19 (and/or other mechanical structure(s) on which charge is to be stored) such that the contact portion 632 of the movable structure 608 eventually breaks contact with the contact portion 638 of the first electrode 19 (and/or other mechanical structure(s) on which charge is to be stored). Referring to FIG. 28D, thereafter, the third electrode 600 may be disconnected from the first power source, e.g., the first voltage source 300.

Figure 28E:
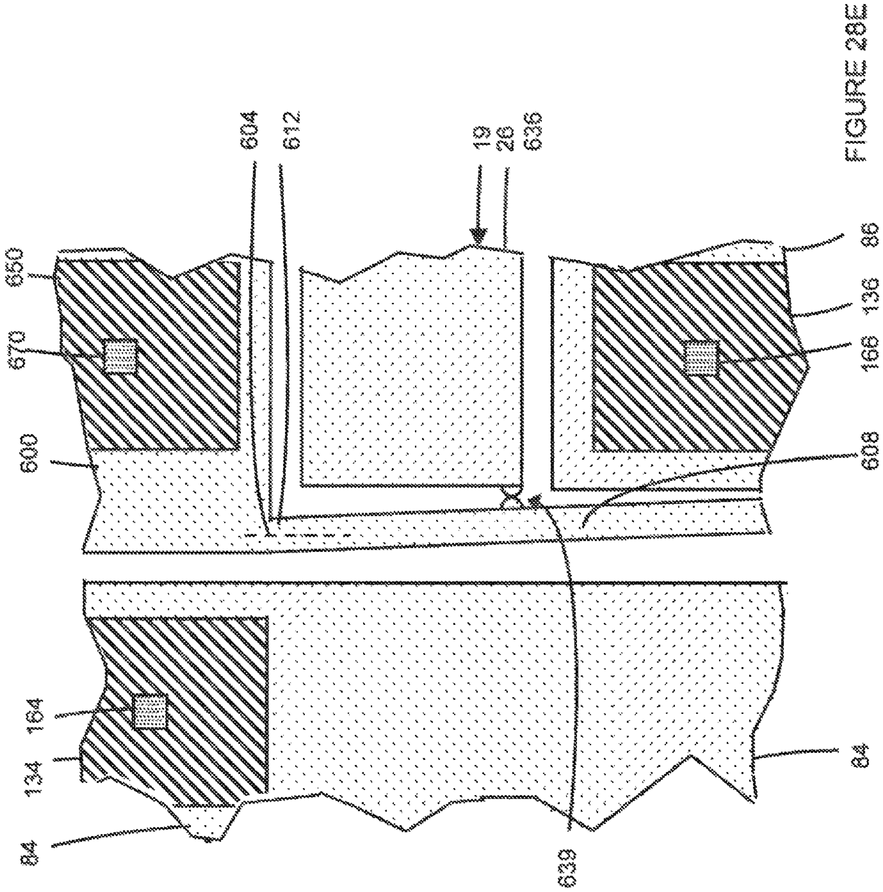

Referring to FIG. 28E, in some embodiments, however, the contact portion 632 of the movable structure 608 and the contact portion 638 of the first electrode 19 become welded and permanently short circuited to one another during the charge storing process. For example, in some embodiments, some or all surfaces of the micromachined mechanical structure 12 (including contact surface 634 of contact portion 632 and/or contact surface 636 of contact portion 638) are so clean and/or smooth that the surface forces applied to contact surface 634 of contact portion 632 and/or contact surface 636 of contact portion 638 during the charge storing process are of a sufficient magnitude to cause a weld and a permanent short circuit between such surfaces 634, 636. As a result, the electrode, e.g., electrode 600, connected to the first power source becomes permanently short circuited to the first electrode 19 of the transducer (and/or other structure(s) on which electrical charge is to be stored). Such a configuration increases the possibility of excessive surface leakage to points within the chamber and introduces the possibility of leakage through the one or more mechanical structures 82 to points outside the chamber, which in some embodiments, could result in excessive leakage and/or drain of the electrical charge on the one or more portions of the micromachined mechanical structure on which electrical charge is desired to be stored.

Thus, in some embodiments (e.g., embodiments for which the leakage and/or drain in the configuration above could be excessive), it may be advantageous to employ the one or more structures 82 of micromachined mechanical structure 12 illustrated in FIGS. 2A-2D, 3A-3F, the one or more structures 82 of micromachined mechanical structure 12 illustrated in FIGS. 14A-14B, 15A-15B and/or the one or more structures 82 of micromachined mechanical structure 12 illustrated in FIGS. 20A-20B, 21A-21C. Such structures 82 help prevent the electrode, e.g., electrode 600, connected to the power source from becoming permanently short circuited to the first electrode 19 of the transducer (and/or other structure(s) on which electrical charge is to be stored).

As stated above, the charge supplying process may be continuous or discontinuous (periodic or non-periodic), fixed in rate or time varying in rate, and/or combinations thereof. In that regard, the electric current may be continuous or discontinuous (e.g., periodic or non-periodic), fixed in magnitude or time varying in magnitude, direct current or alternating current, and/or any combination of the above.

The excitation, e.g., excitation signals 720, 722, supplied to the one or more electrodes, e.g., electrodes 84, 86, may be single ended or differential, continuous or discontinuous, periodic or non-periodic, sinusoidal or non-sinusoidal, fixed in rate or time varying in rate, fixed in magnitude or time varying in magnitude, direct current or alternating current, and/or any combination of the above.

FIGS. 28F-28I illustrate another embodiment for employing the one or more mechanical structures 82 to facilitate storing of electrical charge on the first electrode 19 of the transducer 16 illustrated in FIGS. 26A-26B and FIGS. 27A-27C (and/or one or more portion(s) of the micromachined mechanical structure 12 on which charge is to be stored), in accordance with certain aspects of the present invention.

Figure 28F:
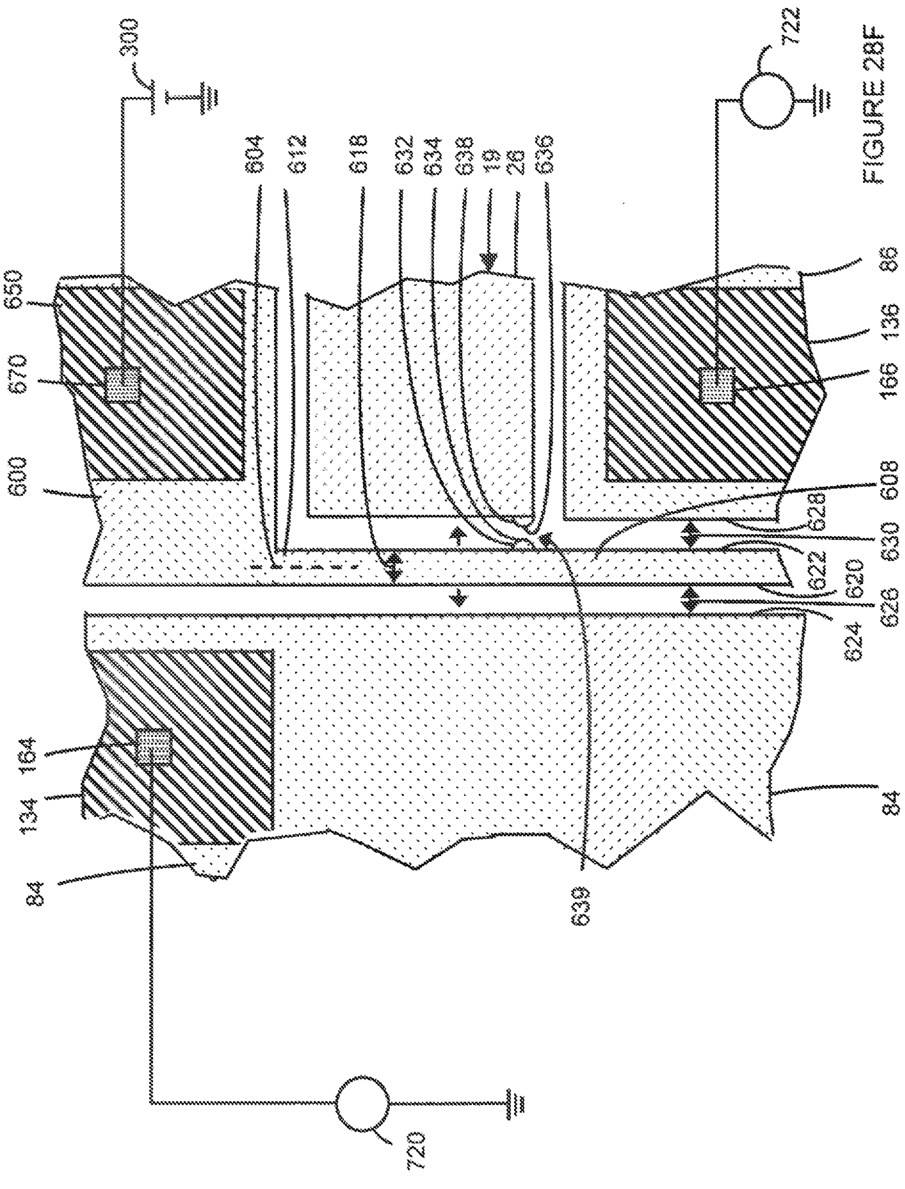
FIGS. 28F-28I illustrate a plan view of the portion of micromachined mechanical structure illustrated in FIGS. 26A-26B and FIGS. 27A-27C, in conjunction with a power source that may be employed therewith, showing another embodiment for employing the mechanical structures of FIGS. 26A-26B and FIGS. 27A-27C to facilitate supplying, storing and/or trapping of electrical charge, in accordance with certain aspects of the present invention.

Referring to FIG. 28F, in this embodiment, one or more of the first and second electrodes 84, 86 are connected to one or more power sources that an excitation, e.g., excitation signals 720, 722, to control the movable structure 608 of the third electrode 600. The third electrode 600 is electrically connected to a first power source, e.g., a voltage source 300. The excitation, e.g., excitation signals 720, 722, result in an electrostatic force that causes the movable structure 608 of the third electrode 600 to move back and forth, such that the contact portion 632 of the movable structure 608 moves toward and away from the contact portion 638 of the first electrode 19 (and/or other mechanical structure(s) on which charge is to be stored).

Figure 28G:
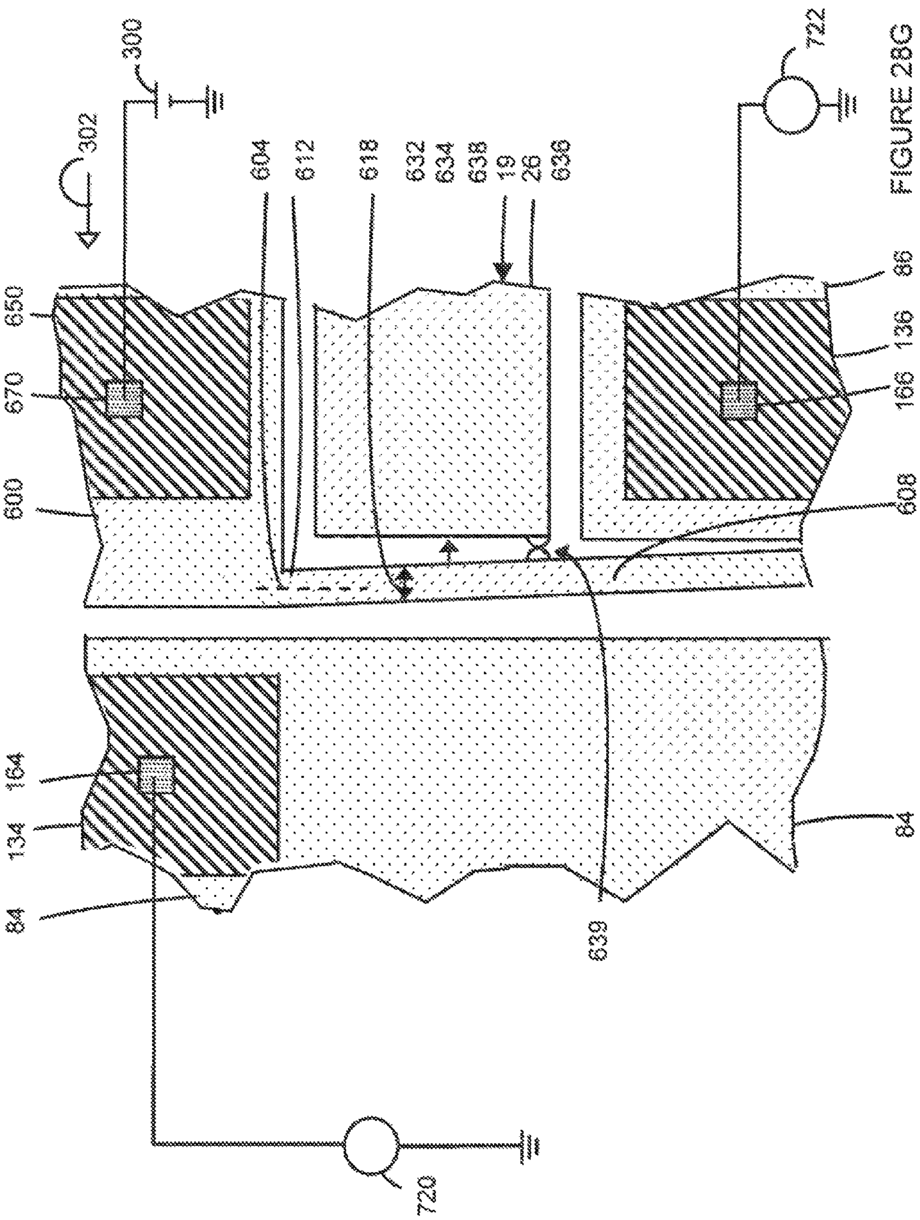

Referring to FIG. 28G, as the contact portion 632 of the movable body 608 moves toward the contact portion 638 of the first electrode 19 (and/or other mechanical structure(s) on which charge is to be stored), the gap 639 between the contact portions 632, 638 decreases and the contact surface 634 of the contact portion 632 of the movable structure 608 eventually makes contact with the contact surface 636 of the contact portion 638 of the first electrode 19 (and/or other mechanical structure(s) on which charge is to be stored).

During such contact, the first power source, e.g., voltage source 300, supplies an electric current 302 that flows through the third electrode 600 to supply charge to the first electrode 19 of the transducer (and/or other mechanical structure(s) on which charge is to be stored). The charge supplied to the first electrode 19 of the transducer 16 (and/or other mechanical structure(s) on which charge is to be stored) may cause an increase in the voltage thereof.

Figure 28H:
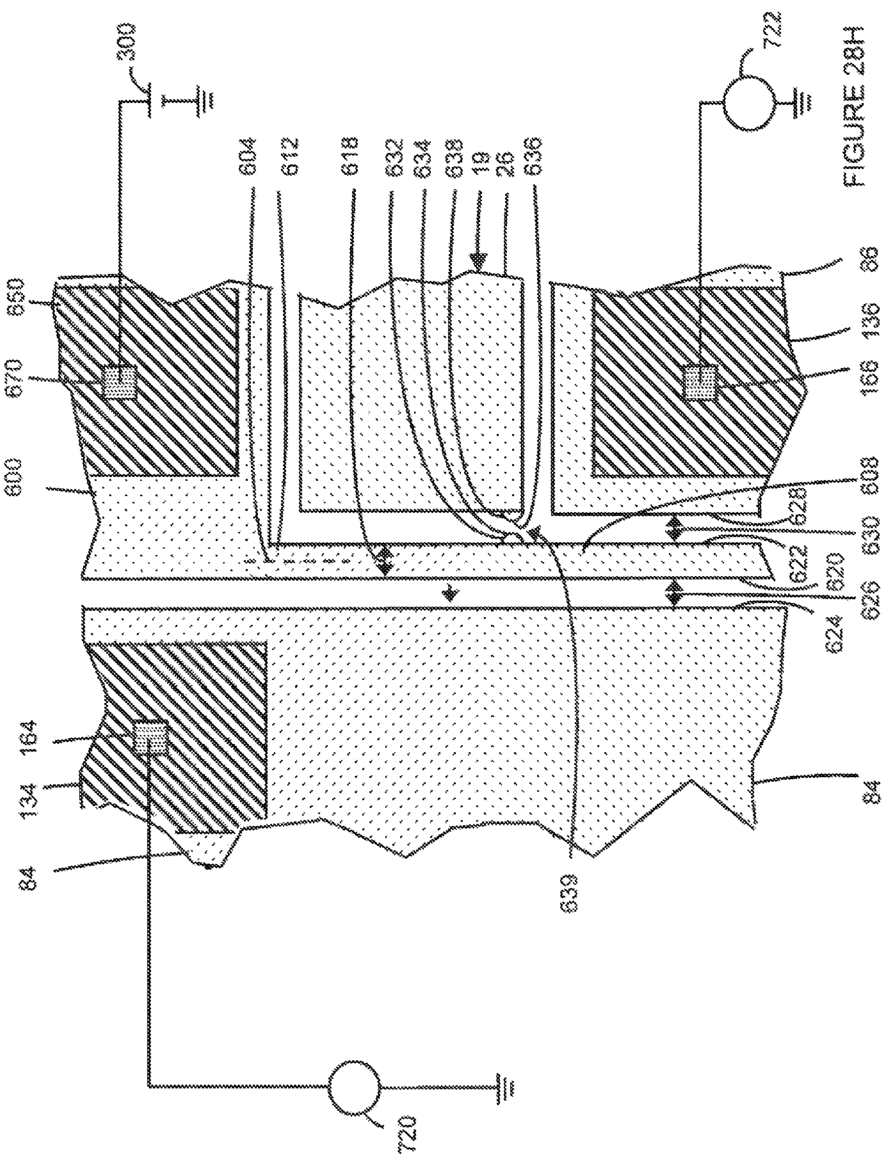

Referring to FIG. 28H, as the contact portion of the movable body 608 moves away from the contact portion 638 of the first electrode 19 (and/or other mechanical structure(s) on which charge is to be stored), the contact surface 634 of the contact portion 632 of the movable structure 608 eventually breaks contact with the contact surface 636 of the contact portion 638 of the first electrode 19 (and/or other mechanical structure(s) on which charge is to be stored), and the electrical current to the first electrode 19 (and/or other mechanical structure(s) on which charge is to be stored) stops.

The make-break cycle and the charge supplying process (wherein charge is supplied while the contact surface 634 of the contact portion 632 is in contact with the contact surface 636 of the contact portion 638) may proceed until a desired amount of charge has been supplied, e.g., until the electrode 19 (or other mechanical structure(s) on which charge is to be stored) has a desired voltage. In some embodiments, the first power source, e.g., voltage source 300, supplies a voltage equal to the desired voltage of the electrode 19 (or other mechanical structure(s) on which charge is to be stored) and the above described charge supplying process proceeds until the voltage of the electrode 19 (or other mechanical structure (s) on which charge is to be stored) is equal to the voltage supplied by the first power source, e.g., voltage source 300, and then stops. As stated above, in some embodiments, the desired voltage is within a range of from about 100 volts to about 1000 volts, e.g., 1000 volts.

In some embodiments, MEMS 10 has one or more characteristics (e.g. a voltage, a resonant frequency) indicative of the amount of charge that has been supplied to the electrode 19 (and/or other mechanical structure(s) on which charge is to be stored). In such embodiments, one or more of such characteristics may be measured and compared to one or more reference magnitudes to determine whether the desired amount of charge has been supplied. For example, movable mechanical structure 28 of first electrode 19 (and/or other mechanical structure(s) on which charge is to be stored) may have a resonant frequency indicative of the amount of charge supplied to the first electrode 19 (and/or other mechanical structure(s) on which charge is to be stored). The resonant frequency of the movable mechanical structure 28 may thus be measured and compared to a reference magnitude indicative of a resonant frequency that would be exhibited by the movable mechanical structure 28 if the first electrode 19 (and/or other mechanical structure(s) on which charge is to be stored) has the desired amount of charge stored thereon), so as to determine whether the desired amount of charge has been supplied thereto. The charge supplying process may be stopped if it is determined that the desired amount of charge has been supplied (e.g., reached or exceeded).

The make-break cycle may be stopped, for example, by removing and/or reducing the excitation, e.g., excitation signals 720, 722, such that the movable structure 608 of the third electrode 600 eventually comes to rest and/or no longer moves enough to make contact with the electrode 19 (and/or other mechanical structure(s) on which charge is to be stored).

Figure 28I:
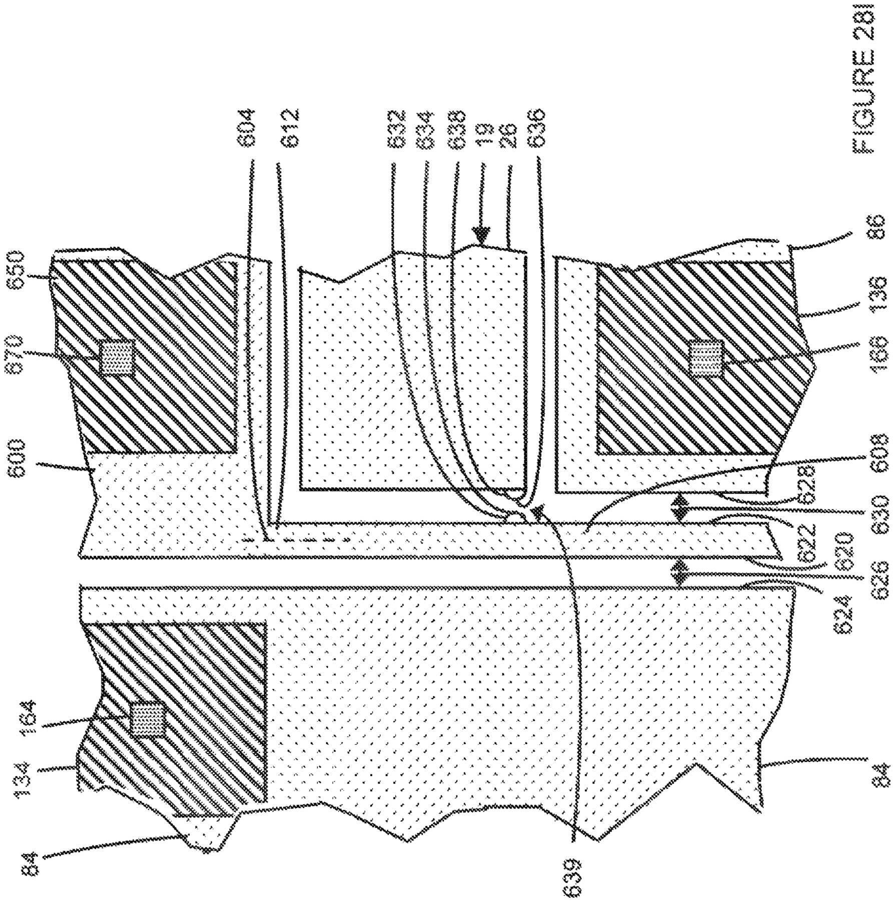

With the make-break cycle stopped, the movable body and the electrode 19 (and/or other mechanical structure(s) on which charge is to be stored) may be separated by the gap 639 thereby trapping the charge stored on the electrode 19 (and/or other mechanical structure(s) on which charge is to be stored). Referring to FIG. 28I, thereafter, the third electrode 600 may be disconnected from the first power source, e.g., the first voltage source 300.

As stated above, the charge supplying process may be continuous or discontinuous (periodic or non-periodic), fixed in rate or time varying in rate, and/or combinations thereof. In that regard, the electric current may be continuous or discontinuous (e.g., periodic or non-periodic), fixed in magnitude or time varying in magnitude, direct current or alternating current, and/or any combination of the above.

The excitation, e.g., excitation signals 720, 722, supplied to the one or more electrodes, e.g., electrodes 84, 86, may be single ended or differential, continuous or discontinuous, periodic or non-periodic, sinusoidal or non-sinusoidal, fixed in rate or time varying in rate, fixed in magnitude or time varying in magnitude, direct current or alternating current, and/or any combination of the above.

The "make" portion of the make-break cycle may deliver any amount of force to the electrode 19 (and/or other mechanical structure(s) on which charge is to be stored) during the break portion of the make-break process (or cycle). Further, the make portion of the make-break cycle may comprise any type of contact between the contact portions for example but not limited to, perpendicular (e.g., head-on), tangential (e.g., brushing), and/or any combination thereof.

The movement of the movable structure 608 may include any type or types of movement. In some embodiments, the electrostatic force resulting from the excitation, e.g., the one or more excitation signals, e.g., 720, 722, drives the movable structure 608 into a state of mechanical resonance such that the movable structure 608 defines a tapping mode cantilever. With the movable structure in a state of mechanical resonance, the movable structure 608 makes a brushing contact with the first electrode 19 (and/or other mechanical structure (s) on which charge is to be stored). During such brushing contact with the first electrode 19, electric current 302 flows into the first electrode 19 (and/or other mechanical structure (s) on which charge is to be stored) to supply electrical charge thereto. By driving the movable mechanical structure 608 into a state of mechanical resonance, a large mechanical restoring force is assured, which helps to ensure that the contact portion of the movable structure breaks contact with the contact portion of the electrode 19 (and/or other mechanical structure(s) on which charge is to be stored) during the break portion of the make-break process (or cycle) and thereby helping to prevent the movable mechanical structure 608 from becoming welded and permanently short circuited to the first electrode 19 (and/or other mechanical structure(s) on which charge is to be stored). Repeated contact between the movable structure 608 and the first electrode 19 (and/or other mechanical structure(s) on which charge is to be stored), causes an increase in the amount of charge stored thereon and/or an increase in the voltage thereof.

The movable body may comprise any suitable material, for example, a semiconductor material (whether doped or undoped), for example, silicon, germanium, silicon/germanium, silicon carbide, gallium arsenide and combinations and/or permutations thereof.

The micromachined mechanical structure 12 may be fabricated using one or more of the methods disclosed herein and/or any other suitable technique.

FIGS. 29A-29J illustrate cross-sectional views an exemplary embodiment of the fabrication of the portion of MEMS of FIGS. 26A-26B and FIGS. 27A-27C, including encapsulation that may be employed therewith, at various stages of the process, according to certain aspects of the present invention.

Figure 29A:
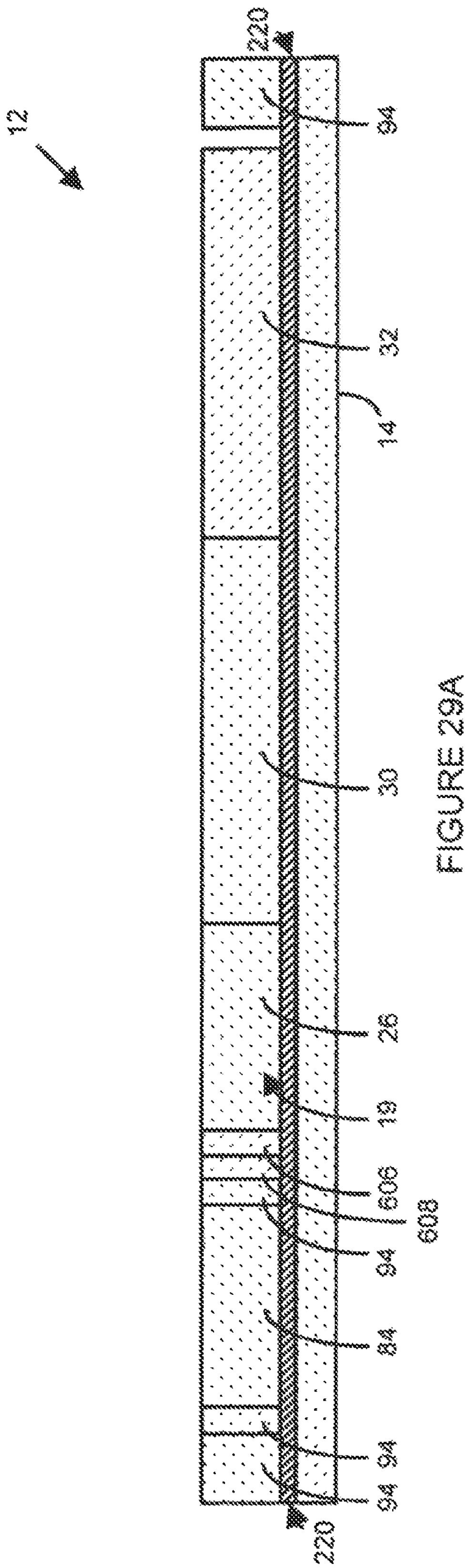
FIGS. 29A-29J illustrate cross-sectional views (taken in the direction A-A of FIG. 26A) of one embodiment of the fabrication of the portion of the micromachined mechanical structure of FIGS. 26A-26B and FIGS. 27A-27C, including one embodiment of an encapsulation that may be employed therewith, at various stages of the process, according to certain aspects of the present invention.
Figure 29B:
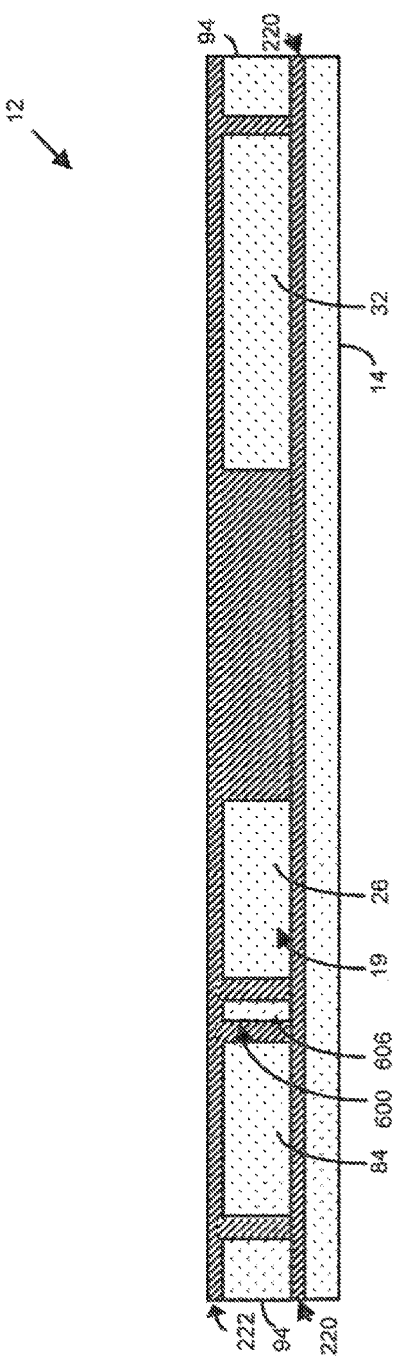
Figure 29C:
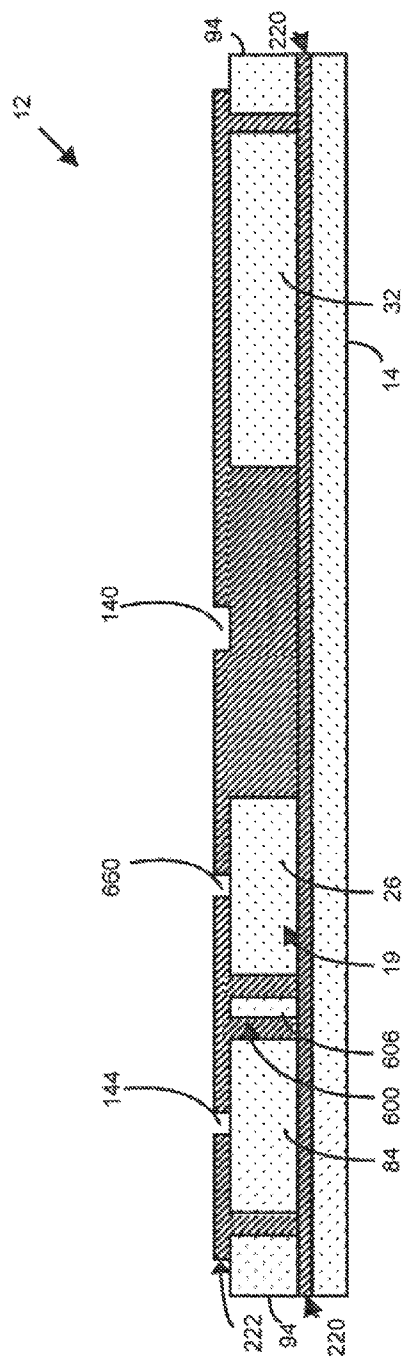
Figure 29D:
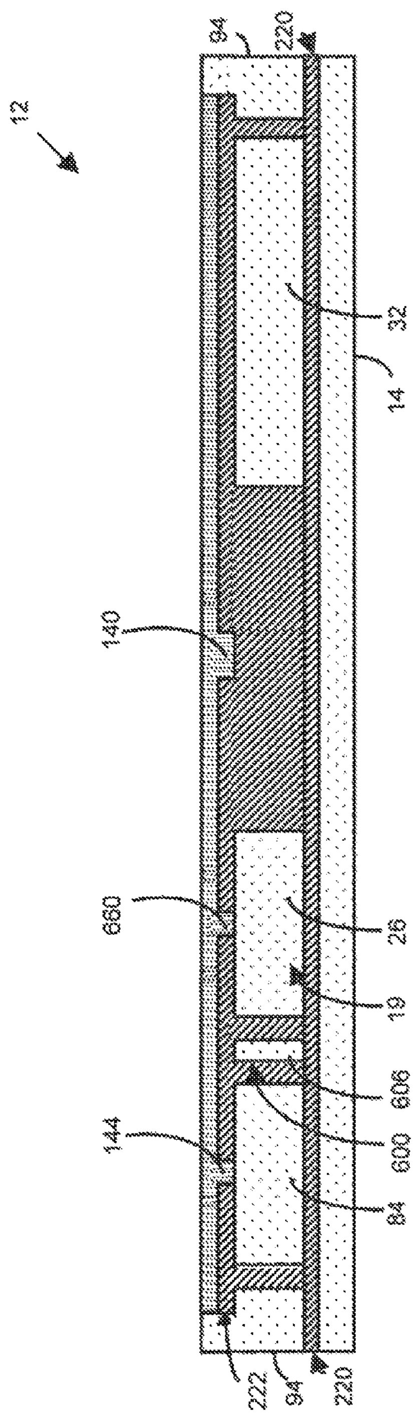
Figure 29E:
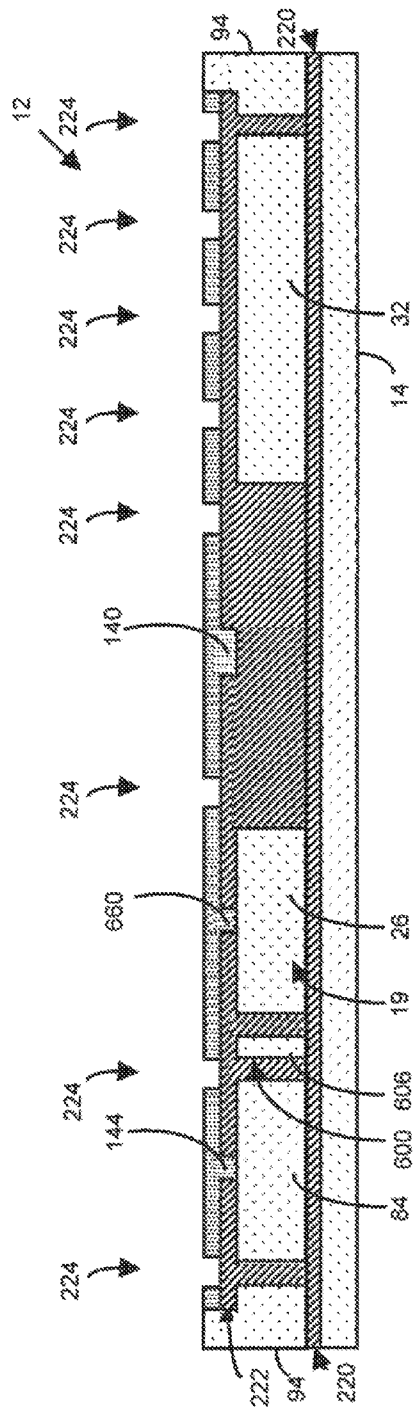
Figure 29F:
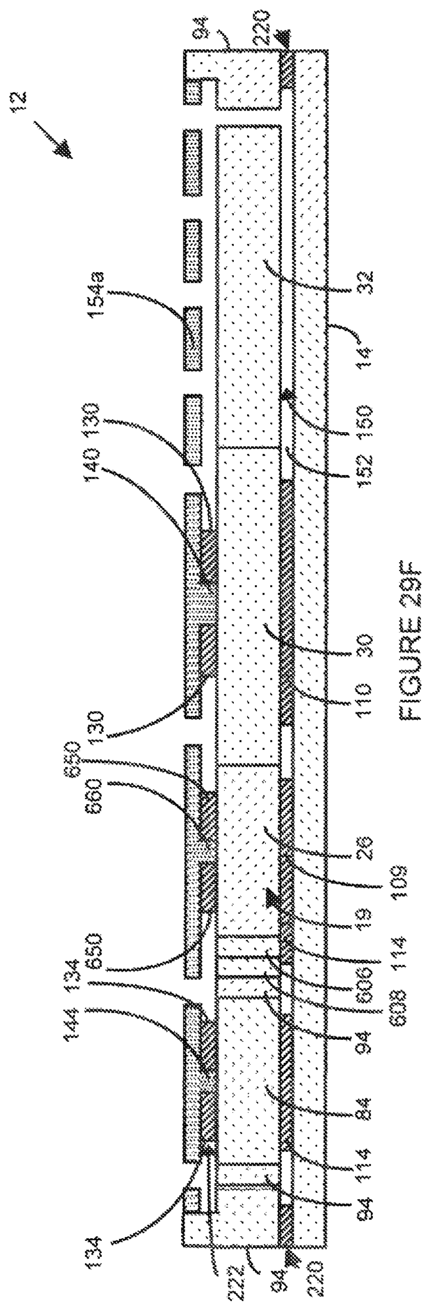
Figure 29G:
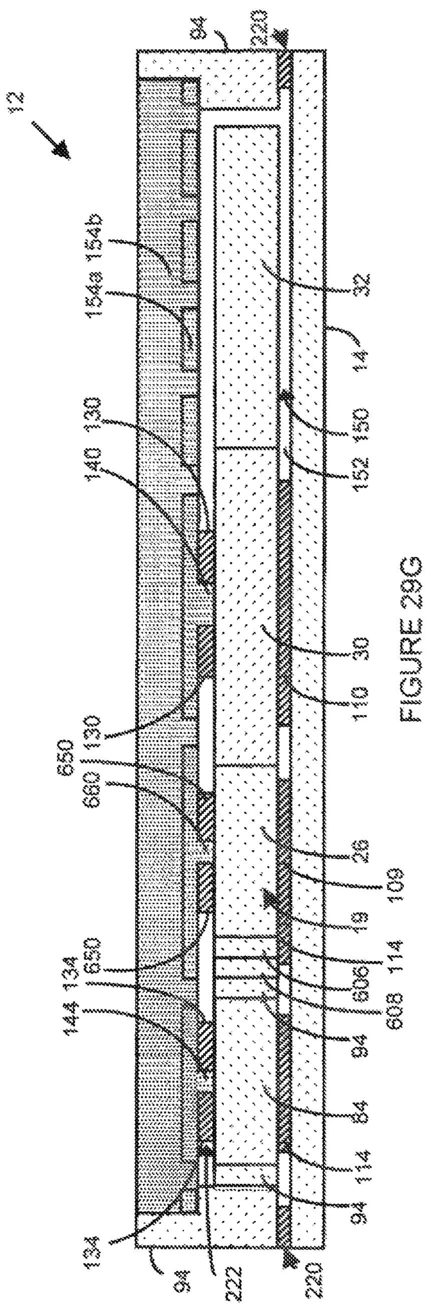
Figure 29H:
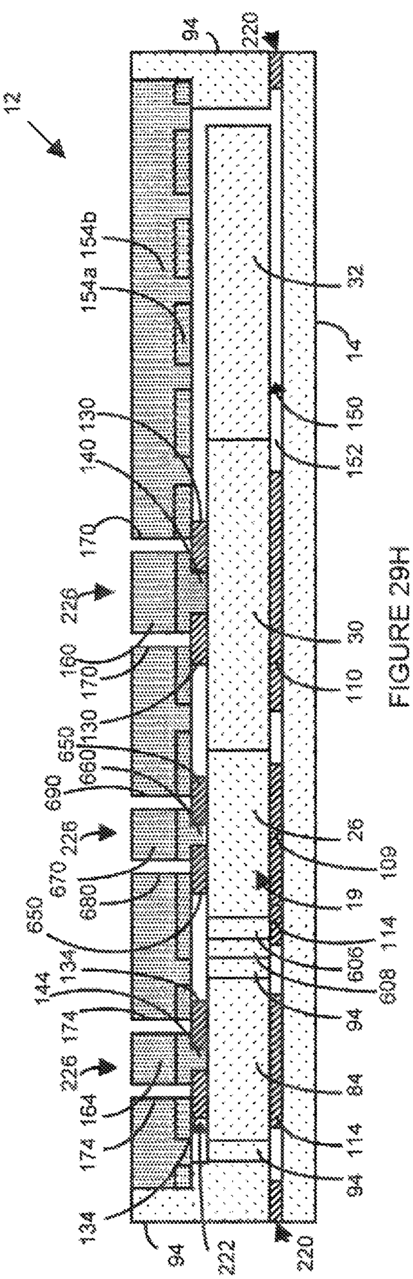
Figure 29I:
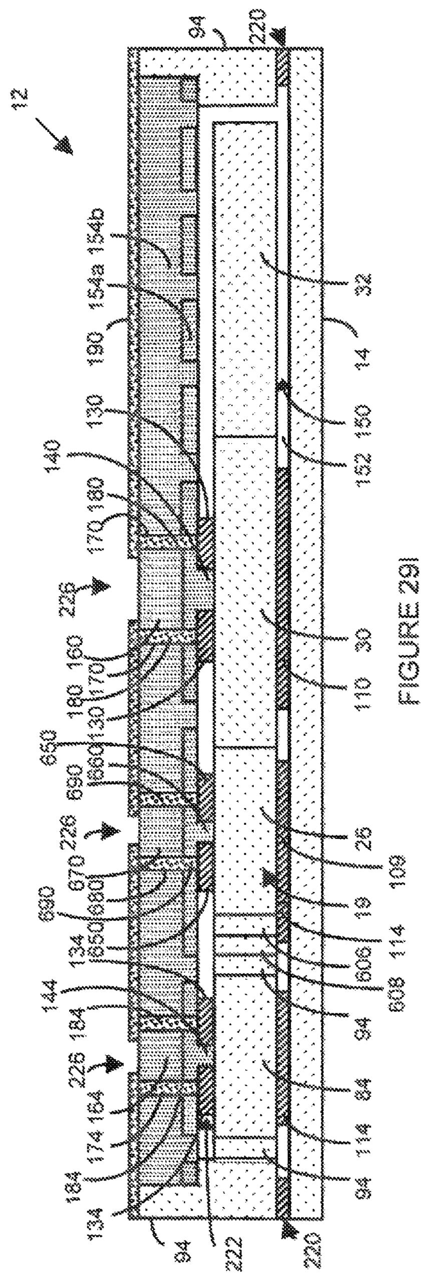
Figure 29J:
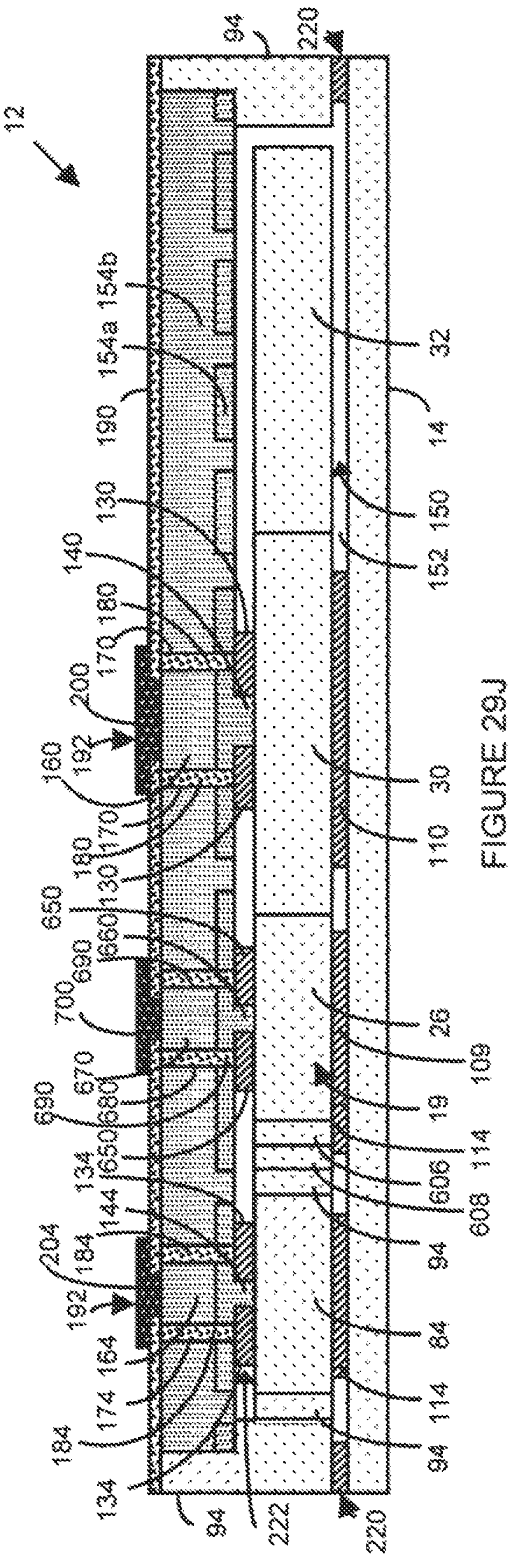

With reference to FIG. 29A, in the exemplary embodiment, fabrication of MEMS 10 having the micromachined mechanical structure 12 illustrated in FIGS. 26A-26B and FIGS. 27A-27C may begin with an SOI substrate partially formed device including mechanical structures, e.g., electrodes 84, 86, 600 and electrodes 19, 20, 22, disposed on a first sacrificial layer 220, for example, silicon dioxide or silicon nitride. The mechanical structures, e.g., electrodes 84, 86, 600 and electrodes 19, 20, 22, may be formed using well-known deposition, lithographic, etching and/or doping techniques as well as from well-known materials (for example, semiconductors such as silicon, germanium, silicon-germanium or gallium-arsenide).

Thereafter, the processing of MEMS 10 may proceed in the same manner as described above with respect to FIGS. 4B-4J. In this regard, an exemplary fabrication process of MEM 10 is illustrated in FIGS. 29B-29J. Because the processes are substantially similar to the discussion above with respect to FIGS. 4B-4J, for the sake of brevity, that discussion will not be repeated.

As stated above, some embodiments of the present invention may be implemented in conjunction with one or more of the thin film encapsulation techniques described and illustrated in the Microelectromechanical Systems and Method of Encapsulating Patent Application Publication incorporated by reference herein. In this regard, any and all of the embodiments described herein may employ one or more of the structures and/or techniques disclosed in the Microelectromechanical Systems and Method of Encapsulating Patent Application Publication. The present invention may also be employed in conjunction with wafer-bonding encapsulation techniques.

Figure 30A:
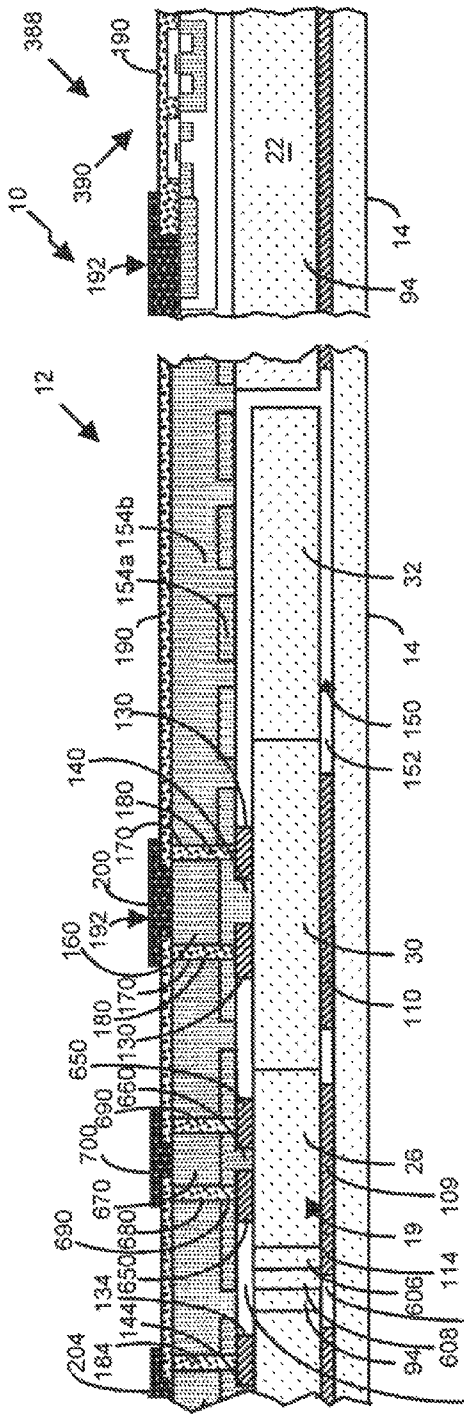
FIG. 30A illustrates a cross-sectional view of a MEMS according to certain aspects of the present inventions, including the portion of the micromachined mechanical illustrated in FIG. 26A (cross sectional view thereof taken in the direction A-A of FIG. 26A) and an integrated circuit portion, both portions of which are disposed or integrated on or in a common substrate.
Figure 30B:
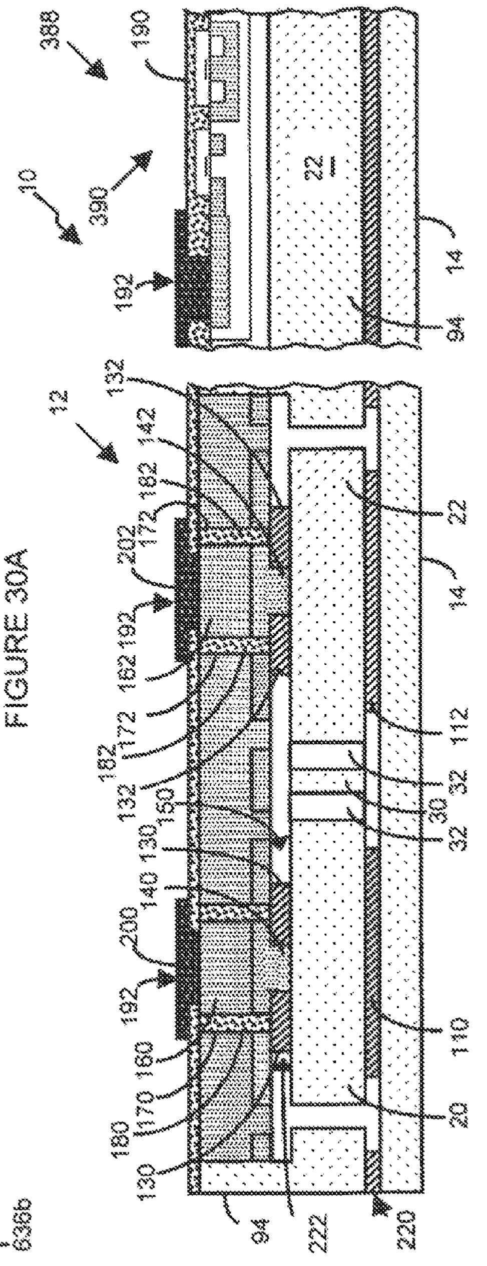
FIG. 30B illustrates a cross-sectional view of a MEMS according to certain aspects of the present inventions, including the portion of the micromachined mechanical illustrated in FIG. 26A (cross sectional view thereof taken in the direction B-B of FIG. 26A) and an integrated circuit portion, both portions of which are disposed or integrated on or in a common substrate.

As also stated above, MEMS 10 may include one or more other circuits and/or devices, e.g., other circuits and/or devices 226, 330 (FIGS. 10A-10L), charge storing circuit 332 (FIGS. 10B-10E, 10K-10L), DC/DC converter circuit 362 (FIGS. 10E, 10G, 10L), data processing electronics 386 (FIG. 11 and FIGS. 12A-12D) and/or interface circuitry 388 (FIG. 11 and FIGS. 12A-12D). For example, with reference to FIGS. 30A and 30B, integrated circuits 390 may be fabricated using conventional techniques after definition of mechanical structure 12 using, for example, the techniques described and illustrated in Microelectromechanical Systems and Method of Encapsulating Patent Application Publication and/or Microelectromechanical Systems Having Trench Isolated Contacts Patent.

Figure 31A:
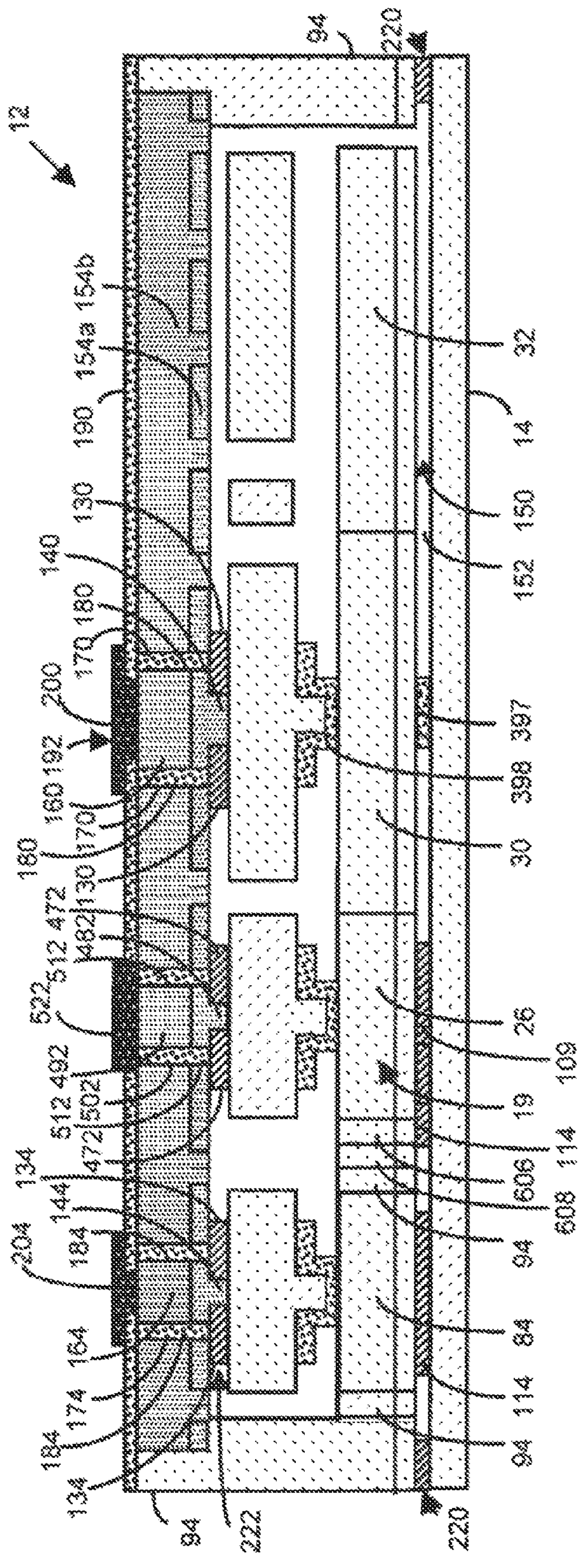
FIGS. 31A-31B illustrate cross-sectional views of micromechanical structures, which may be monolithically integrated on or within the substrate of a MEMS, in accordance with certain aspects of the present invention.
Figure 31B:
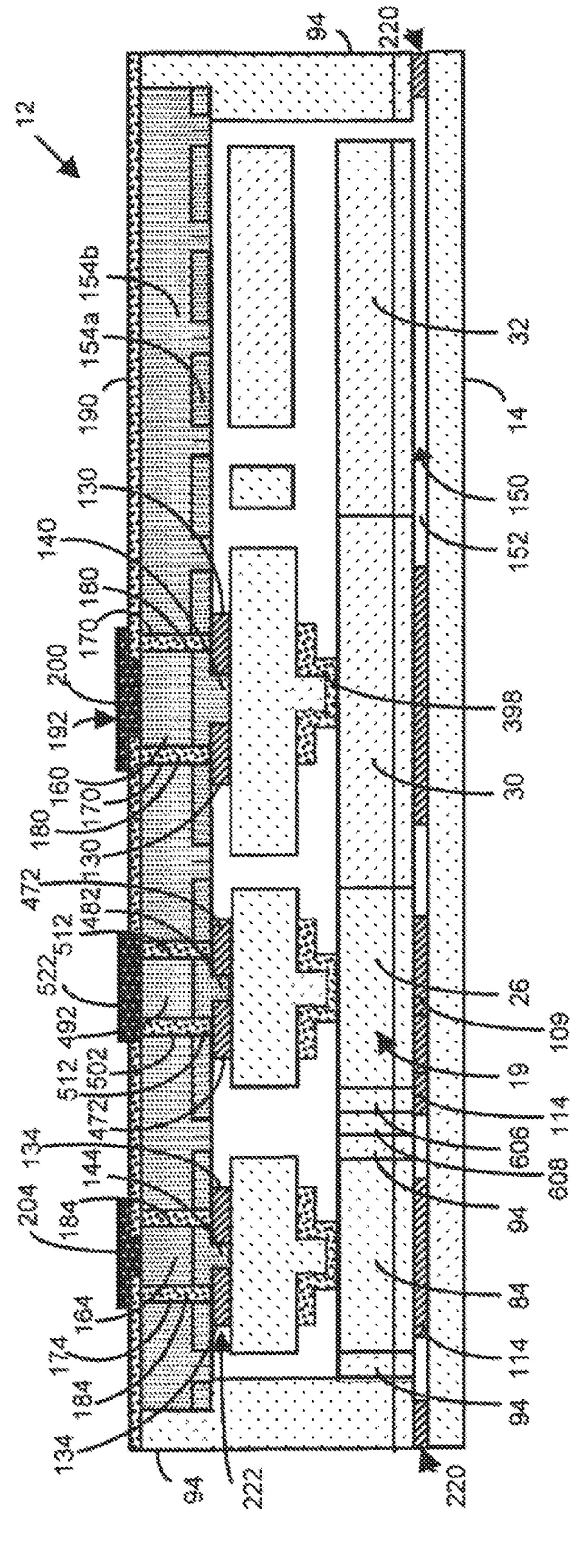
Figure 32A:
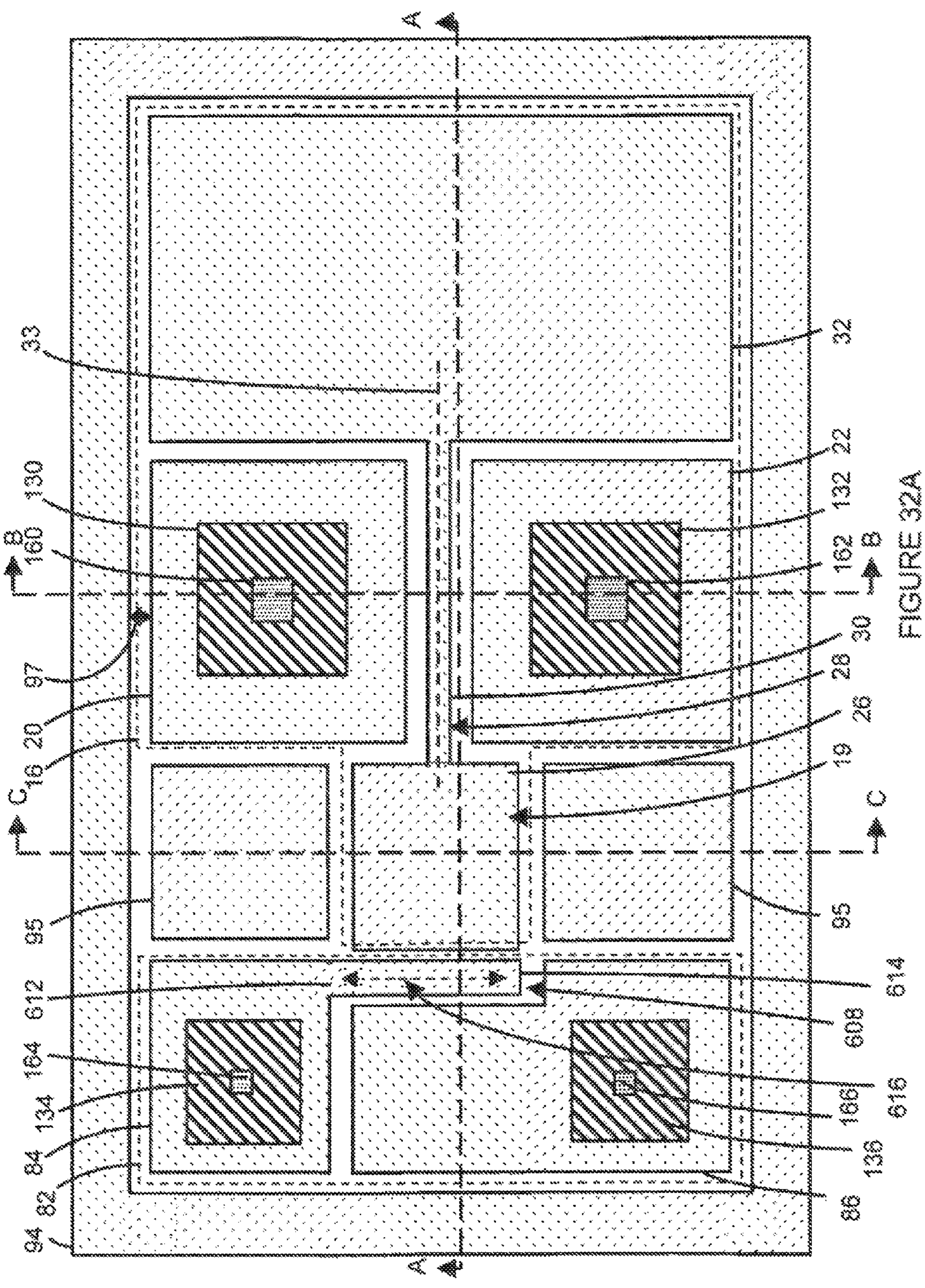
FIG. 32A illustrates a plan view of a portion of another micromachined mechanical structure that may be employed in the MEMS of FIG. 1, in accordance with certain aspects of the present invention.
Figure 32B:
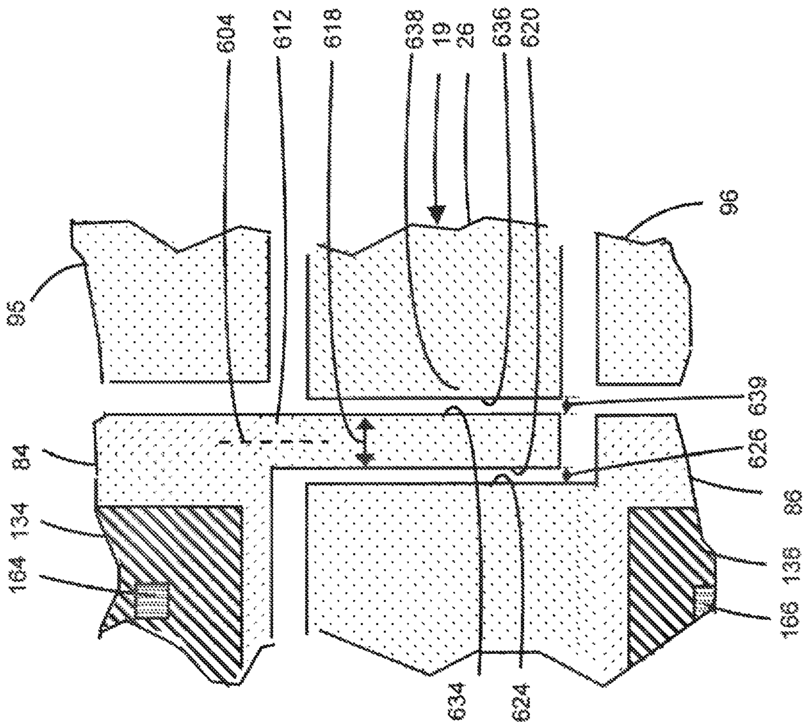
FIG. 32B illustrates an enlarged plan view of a portion of the micromachined mechanical structure of FIG. 32A, in accordance with certain aspects of the present invention.
Figure 33A:
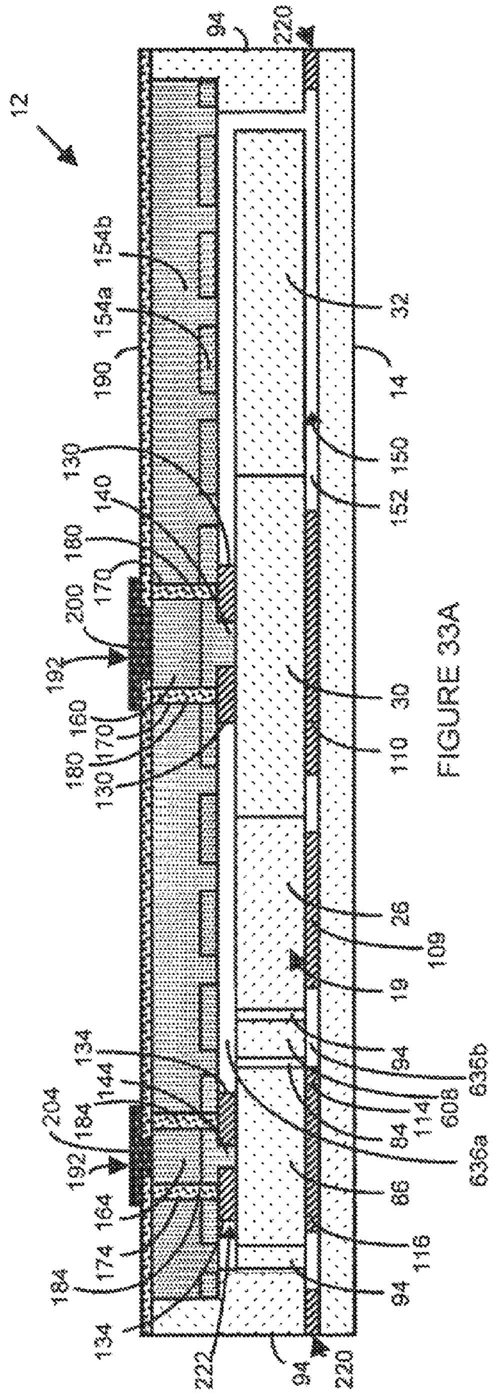
FIG. 33A illustrates a cross-sectional view (taken in the direction A-A of FIG. 32A) of the portion of the micromachined mechanical structure of FIG. 32A and one embodiment of an encapsulation structure that may be employed therewith, in accordance with certain aspects of the present invention.
Figure 33B:
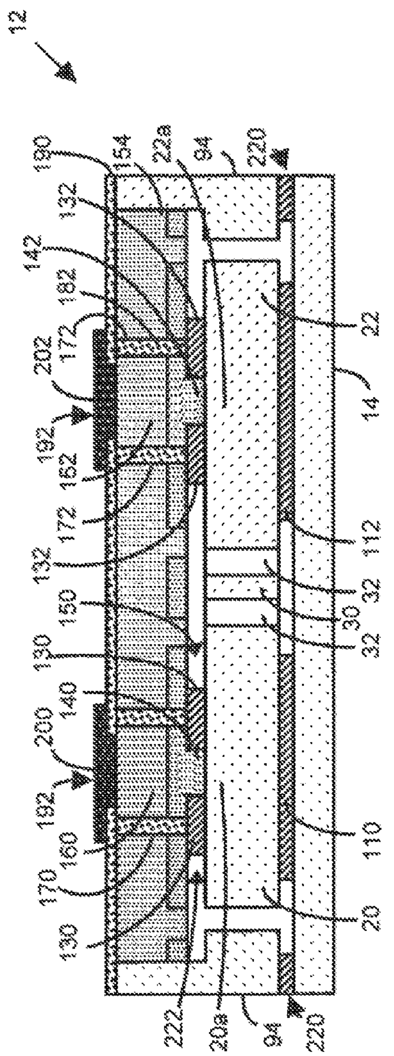
FIG. 33B illustrates a cross-sectional view (taken in the direction B-B of FIG. 32A) of the portion of the micromachined mechanical structure of FIG. 32A and one embodiment of an encapsulation structure that may be employed therewith, in accordance with certain aspects of the present invention.

Further, the various structures of the micromachined mechanical structure 12 may have any orientation including longitudinal, lateral, vertical any combination thereof. As stated above, any of the embodiments and/or techniques described herein may be implemented in conjunction with micromachined mechanical structures 12 having one or more transducers or sensors which may themselves include multiple layers that are vertically and/or laterally stacked or interconnected as illustrated in Microelectromechanical Systems and Method of Encapsulating Patent Application Publication and/or Microelectromechanical Systems Having Trench Isolated Contacts Patent, each of which is incorporated by reference herein. Accordingly, any and all of the inventions and/or embodiments illustrated and described herein may be implemented in, and/or employed in conjunction with, any of the embodiments of Microelectromechanical Systems and Method of Encapsulating Patent Application Publication and/or Microelectromechanical Systems Having Trench Isolated Contacts Patent that include multiple layers of mechanical structures, contacts areas and buried contacts that are vertically and/or laterally stacked or interconnected (see, for example, FIGS. 31A and 31B).

Moreover, the present inventions may implement the anchors and techniques of anchoring mechanical structures 16 to substrate 14 (as well as other elements of MEMS 10) described and illustrated in the Anchors for Microelectromechanical Systems Patent, which is incorporated by reference herein. Accordingly, any and all of the inventions and/or embodiments illustrated and described herein may be implemented in, and/or employed in conjunction with, any of the embodiments described and illustrated in the Anchors for Microelectromechanical Systems Patent, implemented in conjunction with the inventions described and illustrated herein (see, for example, FIGS. 31A and 31B).

FIGS. 32A-32B and FIGS. 33A-33B illustrate plan views and cross sectional views, respectively, of a portion of another micromachined mechanical structure 12 that may be employed in the MEMS of FIG. 1, in accordance with certain aspects of the present invention. As with the micromachined mechanical structure of FIGS. 2A-2D and FIGS. 3A-3E, micromachined mechanical structure 12 illustrated in 32A-32B and FIGS. 33A-33B includes a transducer 16, which may have electrical charge supplied thereto, stored thereon and/or trapped thereon. The transducer 16 may be any type of transducer, for example, an energy harvesting device, a sensor (e.g., an accelerometer, a gyroscope, a microphone, a vibration sensor, a pressure sensor, a strain sensor, a tactile sensor, a magnetic sensor and/or a temperature sensor), a resonator, a resonant filter, and/or a combination thereof. In this embodiment, transducer 16 comprises a capacitive transducer, however, the transducer 12 is not limited to such.

In the micromachined mechanical structure 12 illustrated in FIGS. 32A-32B and FIGS. 33A-33B, transducer 16 includes a plurality of mechanical structures disposed on, above and/or in substrate 14, including, for example first, second and third electrodes 19, 20, 22. The first, second and third electrodes 19, 20, 22 and/or other mechanical structures may each have any configuration. In the illustrated embodiment, for example, the first electrode 19 includes a fixed mechanical structure 26 and a movable mechanical structure 28 supported thereby. The movable mechanical structure 28 is similar to the movable mechanical structure 28 of the first electrode 19 of the transducer 16 illustrated in FIGS. 2A-2D and FIGS. 3A-3E. The second and third electrodes 20, 22 comprise fixed mechanical structures with generally rectangular shapes similar to that of the second and third electrodes 20, 22 of the transducer 16 illustrated in FIGS. 2A-2D and FIGS. 3A-3E.

The micromachined mechanical structure 12 further includes one or more mechanical structures 82 disposed on, above and/or in substrate 14, for use in supplying, storing and/or trapping electrical charge on the first electrode 19 (and/or any other portion(s) of the micromachined mechanical structure 12 on which charge is to be stored). In this embodiment, the one or more mechanical structures 82 include a first electrode 84 and a second electrode 86. The one or more mechanical structures 82 may have any configuration (e.g., size, shape, orientation). In the illustrated embodiment, for example, the first electrode includes a fixed mechanical structure 606 and a movable mechanical structure 608 that extends therefrom and includes first and second ends 612, 614. The first end 612 connects to the fixed structure 606. The second end 614 is free.

The second mechanical structure includes a fixed mechanical structure.

A portion of the movable structure 608 may be disposed between the second electrode 86 and the first electrode 19 (and/or other mechanical structure(s) on which charge is to be stored). In that regard, the movable structure 608 may define a first surface 620 that faces in a direction toward a first surface 624 of the second electrode 86 and may be spaced therefrom by a first gap 626. The movable structure 608 may further define a contact surface 634 that faces in a direction toward a contact surface 636 of a contact portion 638 of electrode 19 (and/or other mechanical structure(s) on which charge is to be stored) and may be spaced therefrom by a gap 639.

The one or more mechanical structures 82 may be comprised of any suitable material, for example, a semiconductor material, for example, silicon, (whether doped or undoped), germanium, silicon/germanium, silicon carbide, gallium arsenide and combinations thereof, materials in column IV of the periodic table for example silicon, germanium, carbon; and combinations thereof, for example, silicon germanium, or silicon carbide; also of III-V compounds for example, gallium phosphide, aluminum gallium phosphide, or other III-V combinations; also combinations of III, IV, V, or VI materials, for example, silicon nitride, silicon oxide, aluminum carbide, or aluminum oxide; also metallic silicides, germanides, and carbides, for example, nickel silicide, cobalt silicide, tungsten carbide, or platinum germanium silicide; also doped variations including phosphorus, arsenic, antimony, boron, or aluminum doped silicon or germanium, carbon, or combinations like silicon germanium; also these materials with various crystal structures, including single crystalline, polycrystalline, nanocrystalline, or amorphous; also with combinations of crystal structures, for instance with regions of single crystalline and polycrystalline structure (whether doped or undoped).

One or more clearances e.g., clearances 636*a*, 636*b* (FIG. 33A), may be provided between one or more portions of the movable structure 608 and one or more other portions of the micromachined mechanical structure 12. Such clearances, e.g., clearances 636*a*, 636*b*, may reduce the possibility of friction and/or interference between the movable structure and the one or more other portions of the micromachined mechanical structure 12. In some embodiments, the one or more clearances, e.g., clearances 636*a*, 636*b*, provide clearance around each surface of the movable structure 608 except at end 612 where the movable structure 608 connects to the fixed structure 606 such that the movable structure 608 is suspended from the fixed structure 606.

As stated above, the micromachined mechanical structure 12 further defines a chamber 150 having an atmosphere 152 "contained" therein. The chamber 150 may be formed, at least in part, by one or more encapsulation layer(s) 154. In some embodiments, one or more of the one or more encapsulation layer(s) 154 are formed using one or more of the encapsulation techniques described and illustrated in the Microelectromechanical Systems Having Trench Isolated Contacts Patent, the entire contents of which, including, for example, the features, attributes, alternatives, materials, techniques and advantages of all of the inventions, are incorporated by reference herein, although, unless stated otherwise, the aspects and/or embodiments of the present invention are not limited to such features, attributes alternatives, materials, techniques and advantages.

As further described hereinafter, providing an excitation, e.g., an excitation signal, on the second electrode 86 causes the movable structure 608 of the first electrode 84 to move in a lateral direction.

In the absence of an excitation and/or stored charge, the movable structure 608 may be stationary and disposed at a position that is centered about the reference plane 604 (i.e., equidistant or at least approximately equidistant between the second electrode 86 and the first electrode 19 (and/or any other portion(s) of the micromachined mechanical structure 12 on which charge is to be stored). With such positioning, the width of the gap 626 (i.e., the gap separating the movable structure 608 and the second electrode 84) may be approximately equal to the width of the gap 639 (i.e., the gap separating the movable structure 608 and the first electrode 19 (and/or any other portion(s) of the micromachined mechanical structure 12 on which charge is to be stored)). In some embodiments, one or more portions of first electrode 84 is resilient so that the movable structure 608 bends in response to the excitation, e.g., in the presence of the excitation, and returns to its original position after the excitation, is removed.

FIGS. 34A-34D illustrate one embodiment for employing the one or more mechanical structures 82 to facilitate storing of electrical charge on the first electrode 19 of the transducer 16 illustrated in FIGS. 32A-32B and FIGS. 33A-33B (and/or any other portion(s) of the micromachined mechanical structure 12 on which charge is to be stored), in accordance with certain aspects of the present invention.

Figure 34A:
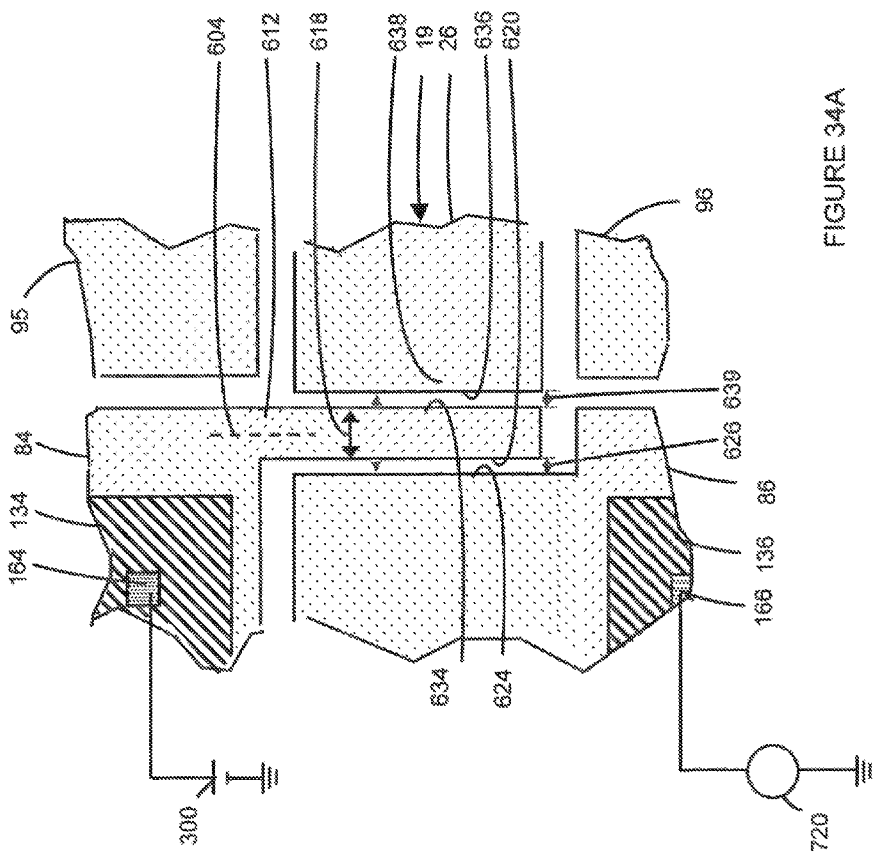
FIGS. 34A-34D illustrate a plan view of the portion of micromachined mechanical structure illustrated in FIGS. 32A-32B and FIGS. 33A-33C, in conjunction with a power source that may be employed therewith, showing one embodiment for employing the mechanical structures of FIGS. 32A-32B and FIGS. 33A-33B to facilitate supplying, storing and/or trapping of electrical charge, in accordance with certain aspects of the present invention.

Referring to FIG. 34A, in this embodiment, the first electrode 84 is electrically connected to a first power source, e.g., a voltage source 300. The second electrode 86 is connected to one or more power sources that an excitation, e.g., excitation signal 720. The excitation, e.g., excitation signal 720, results in an electrostatic force that causes the movable structure 608 of the first electrode 84 to move back and forth, such that the contact surface 634 of the movable structure 608 moves toward and away from the contact surface 636 of the first electrode 19 (and/or other mechanical structure(s) on which charge is to be stored).

Figure 34B:
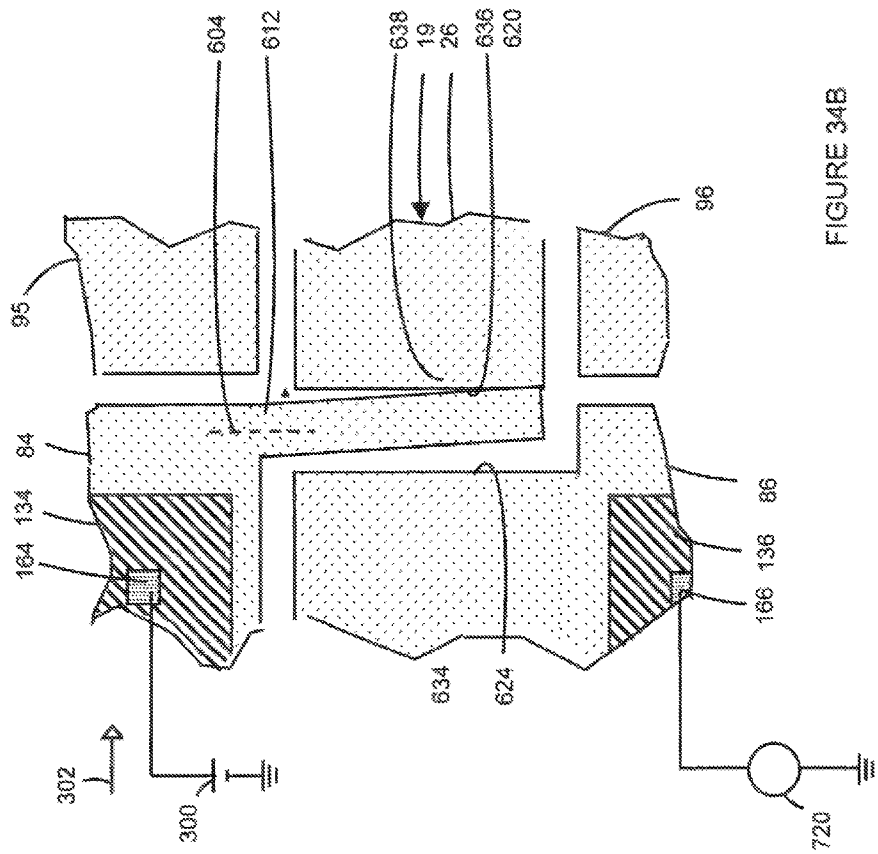

Referring to FIG. 34B, as the contact surface 634 of the movable body 608 moves toward the contact surface 636 of the first electrode 19 (and/or other mechanical structure(s) on which charge is to be stored), the gap 639 between the contact surfaces 634, 636 decreases and the contact surface 634 of the movable structure 608 eventually makes contact with the contact surface 636 of the first electrode 19 (and/or other mechanical structure(s) on which charge is to be stored).

During such contact, the first power source, e.g., voltage source 300, supplies an electric current 302 that flows through the first electrode 84 to supply charge to the first electrode 19 of the transducer (and/or other mechanical structure(s) on which charge is to be stored). The charge supplied to the first electrode 19 of the transducer 16 (or other mechanical structure(s) on which charge is to be stored) may cause an increase in the voltage thereof.

Figure 34C:
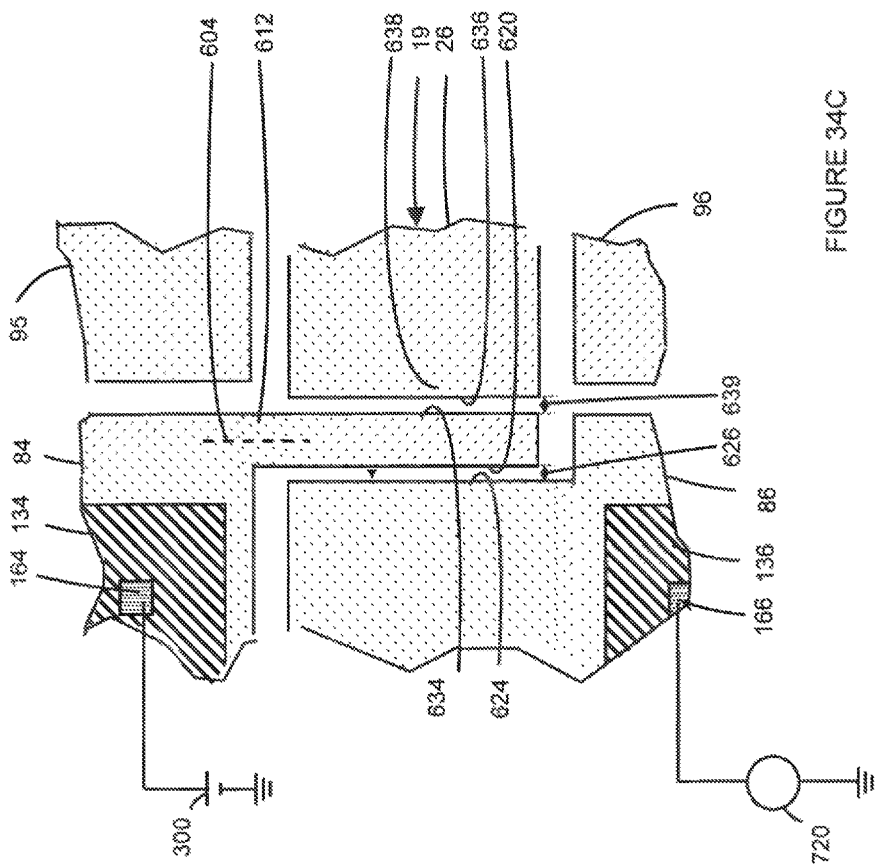

Referring to FIG. 34C, as the contact surface 634 of the movable body 608 moves away from the contact surface 636 of the first electrode 19 (and/or other mechanical structure(s) on which charge is to be stored), the contact surface 634 of the movable structure 608 eventually breaks contact with the contact surface 636 of the first electrode 19 (and/or other mechanical structure(s) on which charge is to be stored), and the electrical current to the first electrode 19 (and/or other mechanical structure(s) on which charge is to be stored) stops.

The make-break cycle and the charge supplying process (wherein charge is supplied while the contact surface 634 of the movable structure 608 is in contact with the contact surface 636 of the first electrode 19 (or other mechanical structure(s) on which charge is to be stored)) may proceed until a desired amount of charge has been supplied, e.g., until the electrode 19 (or other mechanical structure(s) on which charge is to be stored) has a desired voltage. In some embodiments, the first power source, e.g., voltage source 300, supplies a voltage equal to the desired voltage of the electrode 19 (or other mechanical structure(s) on which charge is to be stored) and the above described charge supplying process proceeds until the voltage of the electrode 19 (or other mechanical structure(s) on which charge is to be stored) is equal to the voltage supplied by the first power source, e.g., voltage source 300, and then stops. As stated above, in some embodiments, the desired voltage is within a range of from about 100 volts to about 1000 volts, e.g., 1000 volts.

In some embodiments, MEMS 10 has one or more characteristics (e.g. a voltage, a resonant frequency) indicative of the amount of charge that has been supplied to the electrode 19 (and/or other mechanical structure(s) on which charge is to be stored). In such embodiments, one or more of such characteristics may be measured and compared to one or more reference magnitudes to determine whether the desired amount of charge has been supplied. For example, movable mechanical structure 28 of first electrode 19 (and/or other mechanical structure(s) on which charge is to be stored) may have a resonant frequency indicative of the amount of charge supplied to the first electrode 19 (and/or other mechanical structure(s) on which charge is to be stored). The resonant frequency of the movable mechanical structure 28 may thus be measured and compared to a reference magnitude indicative of a resonant frequency that would be exhibited by the movable mechanical structure 28 if the first electrode 19 (and/or other mechanical structure(s) on which charge is to be stored) has the desired amount of charge stored thereon), so as to determine whether the desired amount of charge has been supplied thereto. The charge supplying process may be stopped if it is determined that the desired amount of charge has been supplied (e.g., reached or exceeded). The make-break cycle may be stopped, for example, by removing and/or by reducing the excitation, e.g., excitation signal 720, such that the movable structure 608 of the first electrode 84 eventually comes to rest and/or no longer moves enough to make contact with the electrode 19 (and/or other mechanical structure(s) on which charge is to be stored).

With the make-break cycle stopped, the movable body and electrode 19 (and/or other mechanical structure(s) on which charge is to be stored) may be separated by gap 639 thereby trapping the charge stored on electrode 19 (and/or other mechanical structure(s) on which charge is to be stored).

Figure 34D:
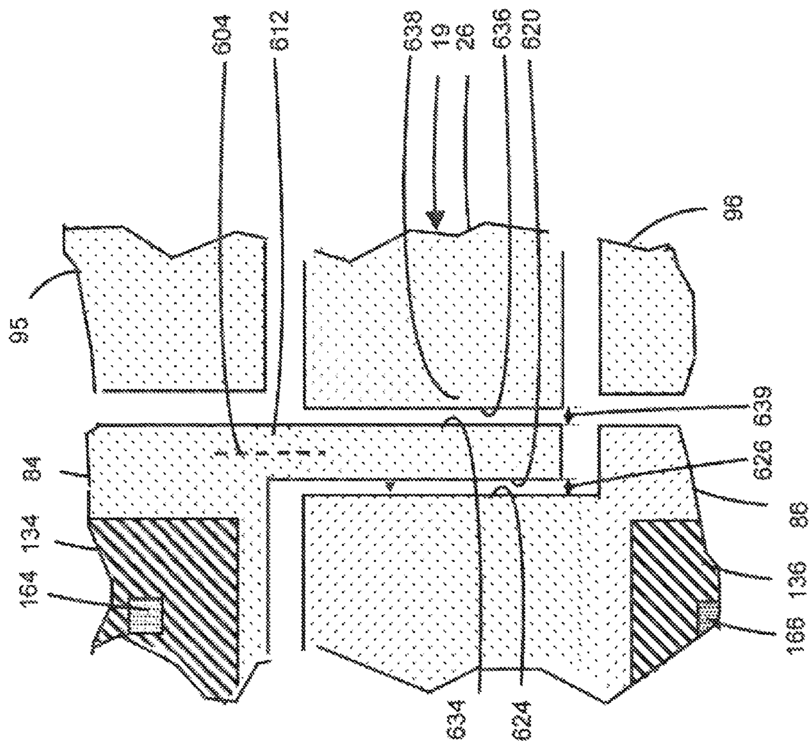

Referring to FIG. 34D, thereafter, first electrode 84 may be disconnected from the first power source, e.g., first voltage source 300.

As stated above, the charge supplying process may be continuous or discontinuous (periodic or non-periodic), fixed in rate or time varying in rate, and/or combinations thereof. In that regard, the electric current may be continuous or discontinuous (e.g., periodic or non-periodic), fixed in magnitude or time varying in magnitude, direct current or alternating current, and/or any combination of the above.

Notably, at the end of the charge supplying process employed in the embodiment of FIGS. 34A-34D, the first electrode 19 (and/or any other portion of the structure on which charge is to be stored) is electrically isolated from all other electrically conductive structures within the chamber. In some embodiments, an electrical isolation of at least ten teraohms or another high DC resistance is provided between the first electrode 19 and other electrically conductive structures within the chamber including, for example, each of the other electrodes 20, 22 and the electrodes 84, 86 temporarily connected to the power source during the charge supplying process. Such a configuration helps reduce the possibility of excessive surface leakage that could otherwise lead to excessive drain of the electrical charge on the one or more portions of the micromachined mechanical structure on which electrical charge is desired to be stored. In addition, at the end of the charge supplying process employed in the embodiment of FIGS. 34A-34D, the first electrode 19 (and/or any other portion(s) of the structure on which charge is to be stored) is also electrically isolated from electrically conductive structures outside the chamber. In some embodiments, an electrical isolation of at least ten teraohms or another high DC resistance is provided, thereby reducing the possibility of excessive leakage through the one or more mechanical structures 82 to points outside the chamber that could otherwise lead to excessive drain of the electrical charge on the first electrode 19 (and/or any other portion(s) of the structure on which charge is to be stored).

The excitation, e.g., excitation signal 720, may be continuous or discontinuous, periodic or non-periodic, sinusoidal or non-sinusoidal, fixed in rate or time varying in rate, fixed in magnitude or time varying in magnitude, direct current or alternating current, and/or any combination of the above.

The "make" portion of the make-break cycle may deliver any amount of force to the electrode 19 (and/or other mechanical structure(s) on which charge is to be stored) during the break portion of the make-break process (or cycle). Further, the make portion of the make-break cycle may comprise any type of contact between the contact portions for example but not limited to, perpendicular (e.g., head-on), tangential (e.g., brushing), and/or any combination thereof.

The movement of the movable structure 608 may include any type or types of movement. In some embodiments, the electrostatic force resulting from the excitation, e.g., the one or more excitation signals, e.g., 720, 722, drives the movable structure 608 into a state of mechanical resonance such that the movable structure 608 defines a tapping mode cantilever. With the movable structure in a state of mechanical resonance, the movable structure 608 makes a brushing contact with the first electrode 19 (and/or other mechanical structure (s) on which charge is to be stored). During such brushing contact with the first electrode 19, electric current 302 flows into the first electrode 19 (and/or other mechanical structure (s) on which charge is to be stored) to supply electrical charge thereto. By driving the movable mechanical structure 608 into a state of mechanical resonance, a large mechanical restoring force is assured, which helps to ensure that the contact portion of the movable structure breaks contact with the contact portion of the electrode 19 (and/or other mechanical structure(s) on which charge is to be stored) during the break portion of the make-break process (or cycle) and thereby helping to prevent the movable mechanical structure 608 from becoming welded and permanently short circuited to the first electrode 19 (and/or other mechanical structure(s) on which charge is to be stored). Repeated contact between the movable structure 608 and the first electrode 19 (and/or other mechanical structure(s) on which charge is to be stored), causes an increase in the amount of charge stored thereon and/or an increase in the voltage thereof.

The movable body may comprise any suitable material, for example, a semiconductor material (whether doped or undoped), for example, silicon, germanium, silicon/germanium, silicon carbide, gallium arsenide and combinations and/or permutations thereof.

The micromachined mechanical structure 12 may be fabricated using one or more of the methods disclosed herein and/or any other suitable technique.

FIGS. 35A-35J illustrate cross-sectional views an exemplary embodiment of the fabrication of the portion of MEMS of FIGS. 32A-32B and FIGS. 33A-33B, including encapsulation that may be employed therewith, at various stages of the process, according to certain aspects of the present invention.

Figure 35A:
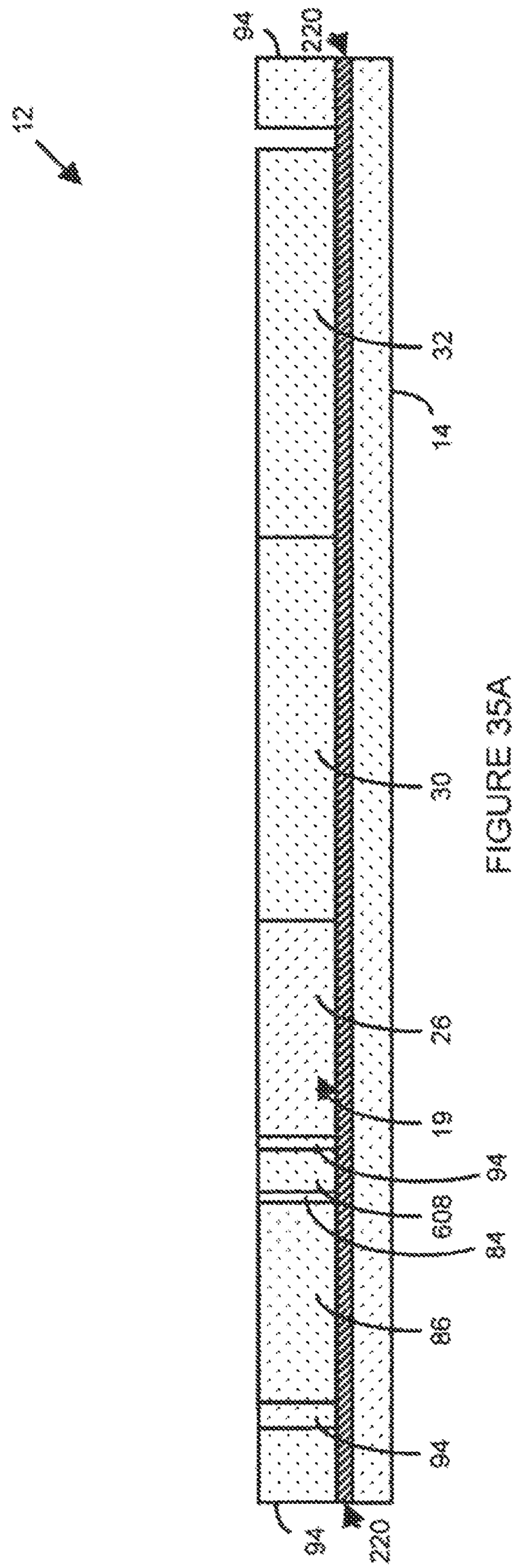
FIGS. 35A-35J illustrate cross-sectional views (taken in the direction A-A of FIG. 32A) of one embodiment of the fabrication of the portion of the micromachined mechanical structure of FIGS. 32A-32B and FIGS. 33A-33B, including one embodiment of an encapsulation that may be employed therewith, at various stages of the process, according to certain aspects of the present invention.
Figure 35B:
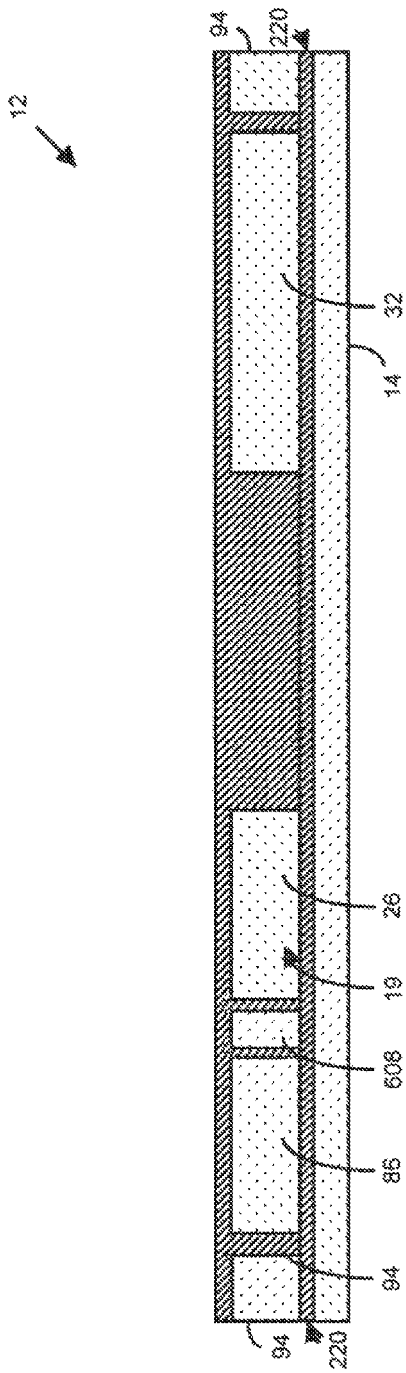
Figure 35C:
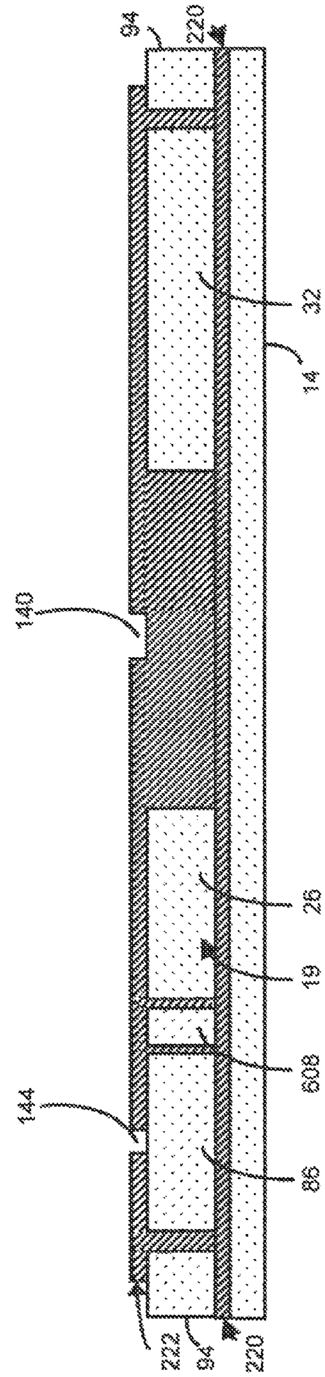
Figure 35D:
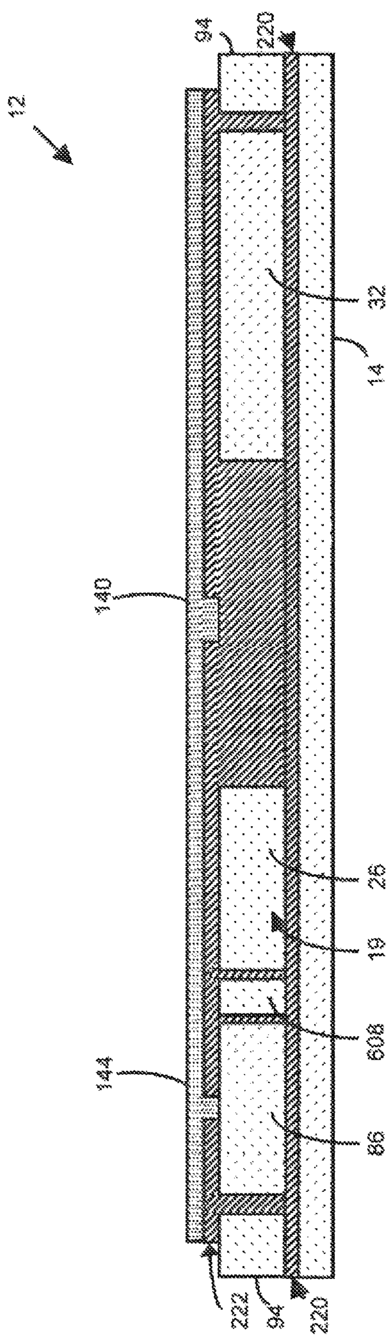
Figure 35E:
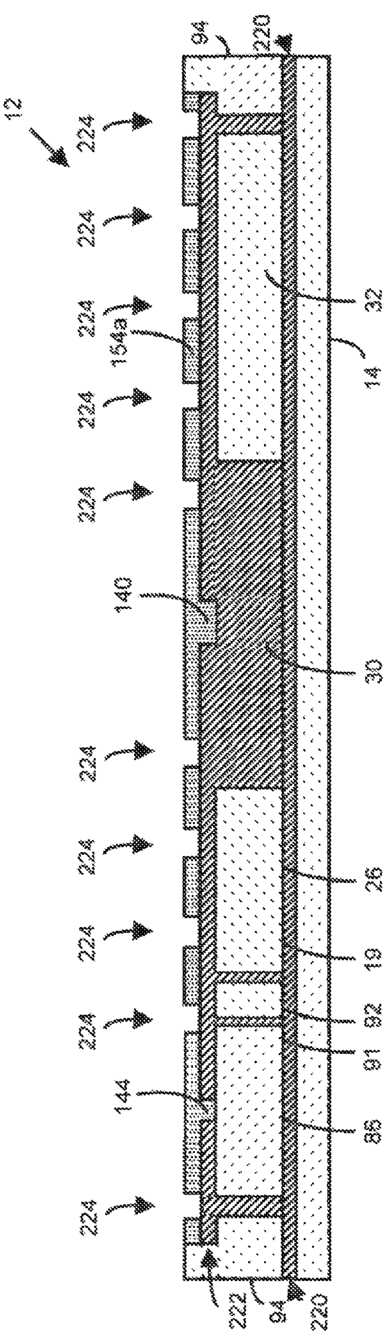
Figure 35F:
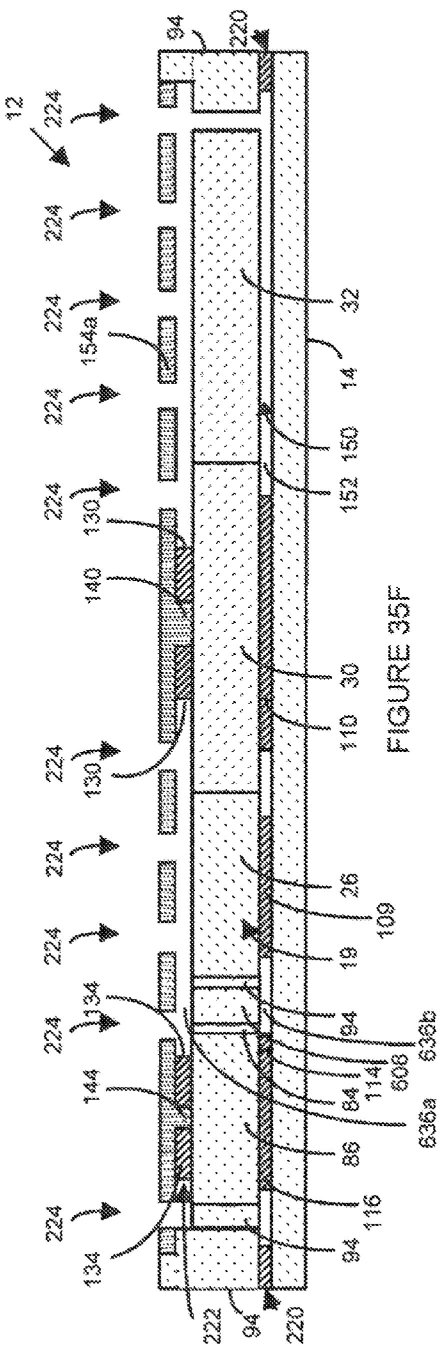
Figure 35G:
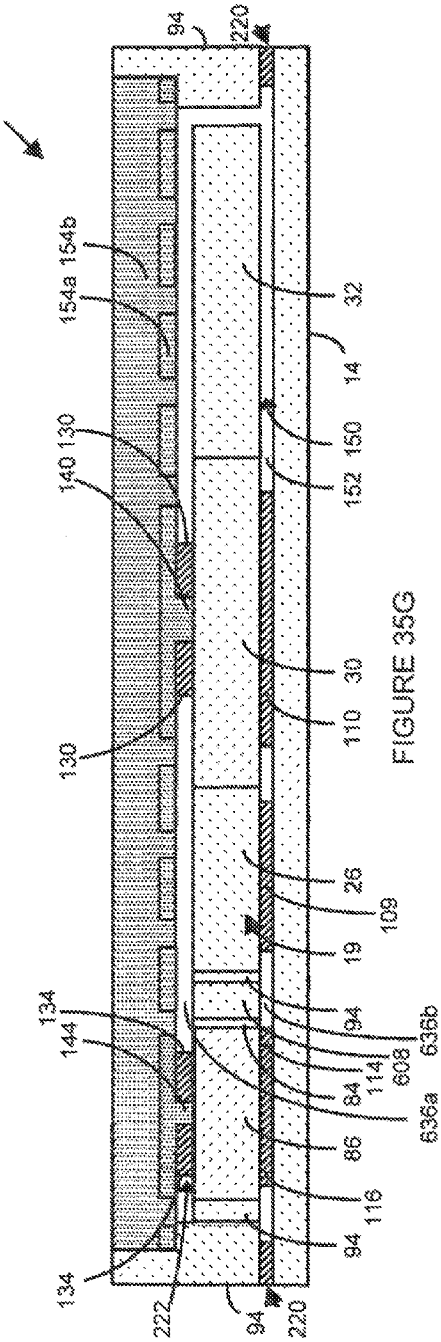
Figure 35H:
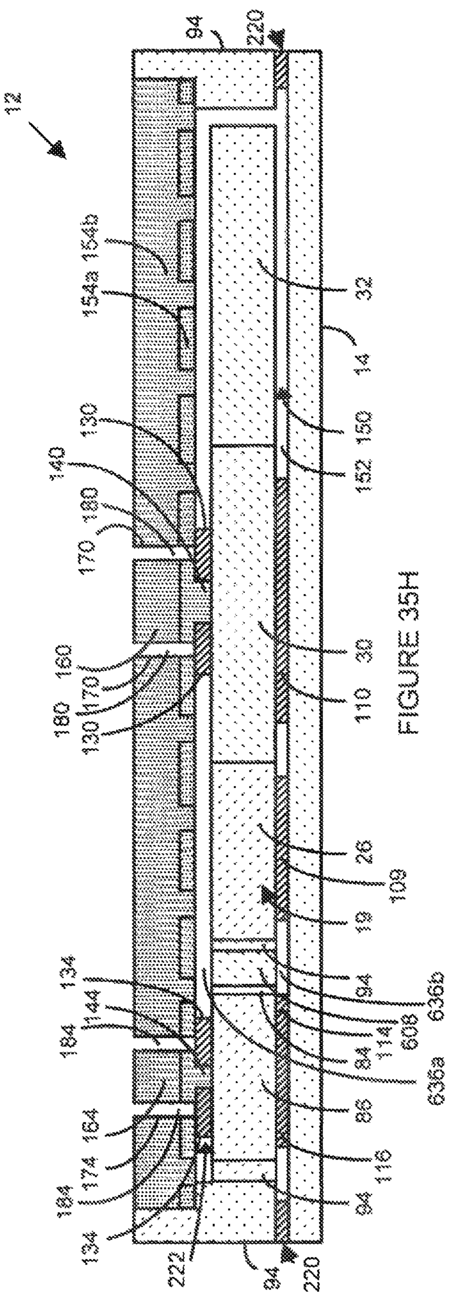
Figure 35I:
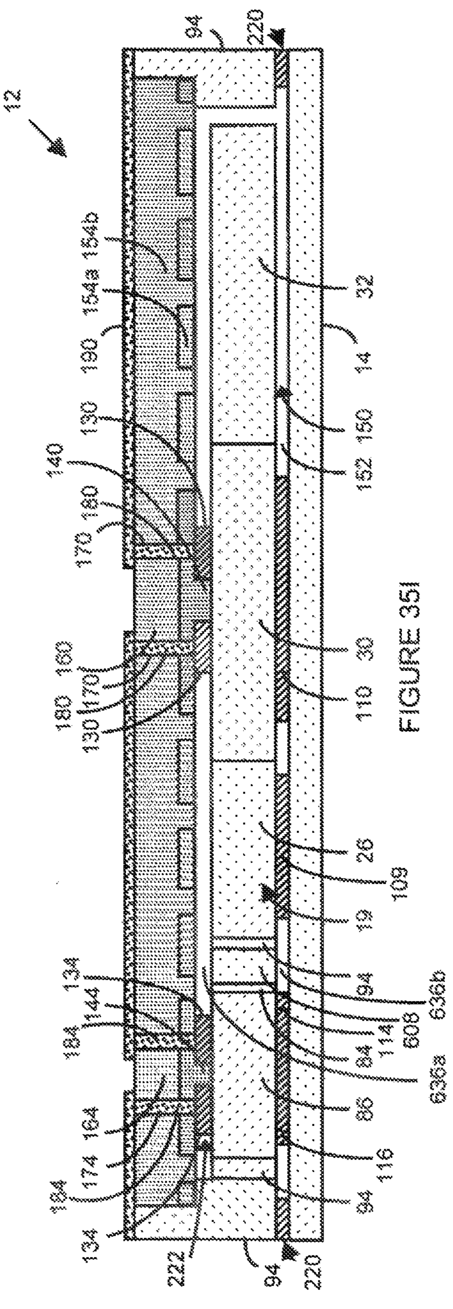
Figure 35J:
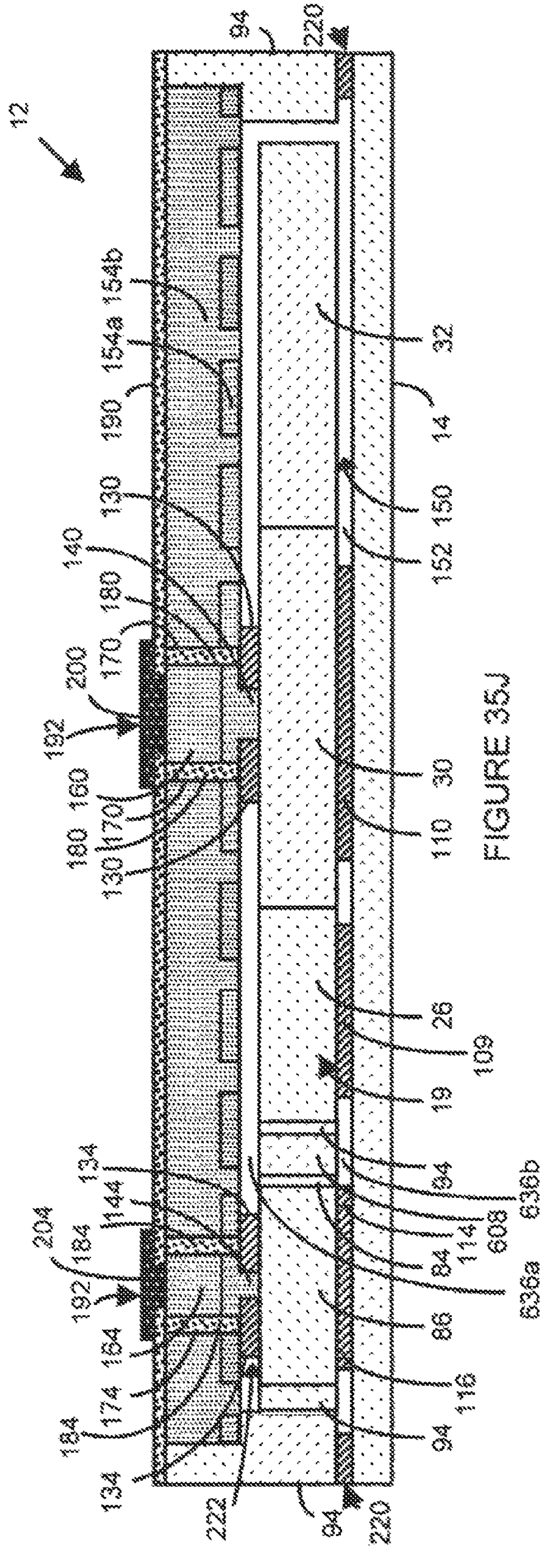

With reference to FIG. 35A, in the exemplary embodiment, fabrication of MEMS 10 having the micromachined mechanical structure 12 illustrated in FIGS. 32A-32B and FIGS. 33A-33B may begin with an SOI substrate partially formed device including mechanical structures, e.g., electrodes 84, 86, 600 and electrodes 19, 20, 22, disposed on a first sacrificial layer 220, for example, silicon dioxide or silicon nitride. The mechanical structures, e.g., electrodes 84, 86, 600 and electrodes 19, 20, 22, may be formed using well-known deposition, lithographic, etching and/or doping techniques as well as from well-known materials (for example, semiconductors such as silicon, germanium, silicon-germanium or gallium-arsenide).

Thereafter, the processing of MEMS 10 may proceed in the same manner as described above with respect to FIGS. 4B-4J. In this regard, an exemplary fabrication process of MEM 10 is illustrated in FIGS. 35B-35J. Because the processes are substantially similar to the discussion above with respect to FIGS. 4B-4J, for the sake of brevity, that discussion will not be repeated.

As stated above, some embodiments of the present invention may be implemented in conjunction with one or more of the thin film encapsulation techniques described and illustrated in the Microelectromechanical Systems and Method of Encapsulating Patent Application Publication incorporated by reference herein. In this regard, any and all of the embodiments described herein may employ one or more of the structures and/or techniques disclosed in the Microelectromechanical Systems and Method of Encapsulating Patent Application Publication. The present invention may also be employed in conjunction with wafer-bonding encapsulation techniques.

Figure 36A:
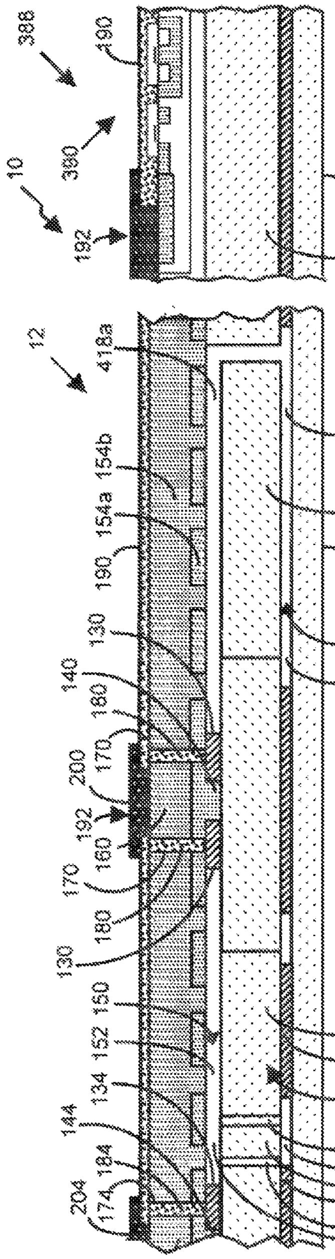
FIG. 36A illustrates a cross-sectional view of a MEMS according to certain aspects of the present inventions, including the portion of the micromachined mechanical illustrated in FIG. 32A (cross sectional view thereof taken in the direction A-A of FIG. 32A) and an integrated circuit portion, both portions of which are disposed or integrated on or in a common substrate.
Figure 36B:
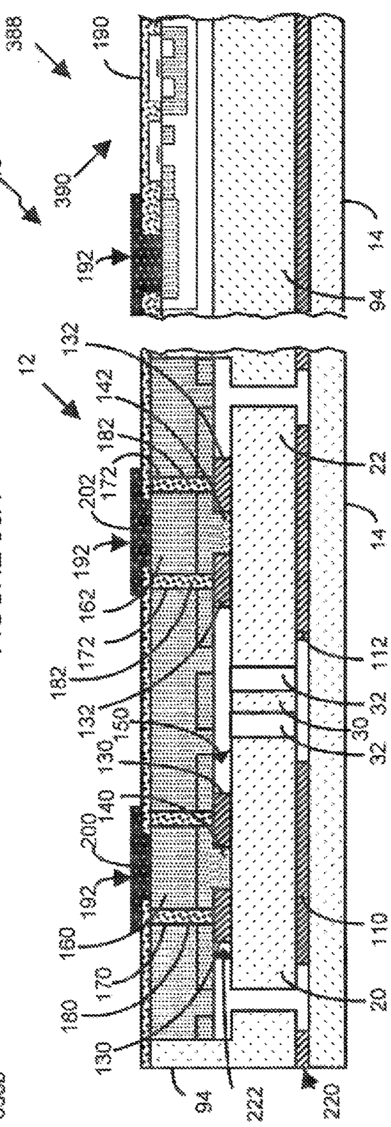
FIG. 36B illustrates a cross-sectional view of a MEMS according to certain aspects of the present inventions, including the portion of the micromachined mechanical illustrated in FIG. 36A (cross sectional view thereof taken in the direction B-B of FIG. 32A) and an integrated circuit portion, both portions of which are disposed or integrated on or in a common substrate.

As also stated above, MEMS 10 may include one or more other circuits and/or devices, e.g., other circuits and/or devices 226, 330 (FIGS. 10A-10L), charge storing circuit 332 (FIGS. 10B-10E, 10K-10L), DC/DC converter circuit 362 (FIGS. 10E, 10G, 10L), data processing electronics 386 (FIG. 11 and FIGS. 12A-12D) and/or interface circuitry 388 (FIG. 11 and FIGS. 12A-12D). For example, with reference to FIGS. 36A and 36B, integrated circuits 390 may be fabricated using conventional techniques after definition of mechanical structure 12 using, for example, the techniques described and illustrated in Microelectromechanical Systems and Method of Encapsulating Patent Application Publication and/or Microelectromechanical Systems Having Trench Isolated Contacts Patent.

Figure 37A:
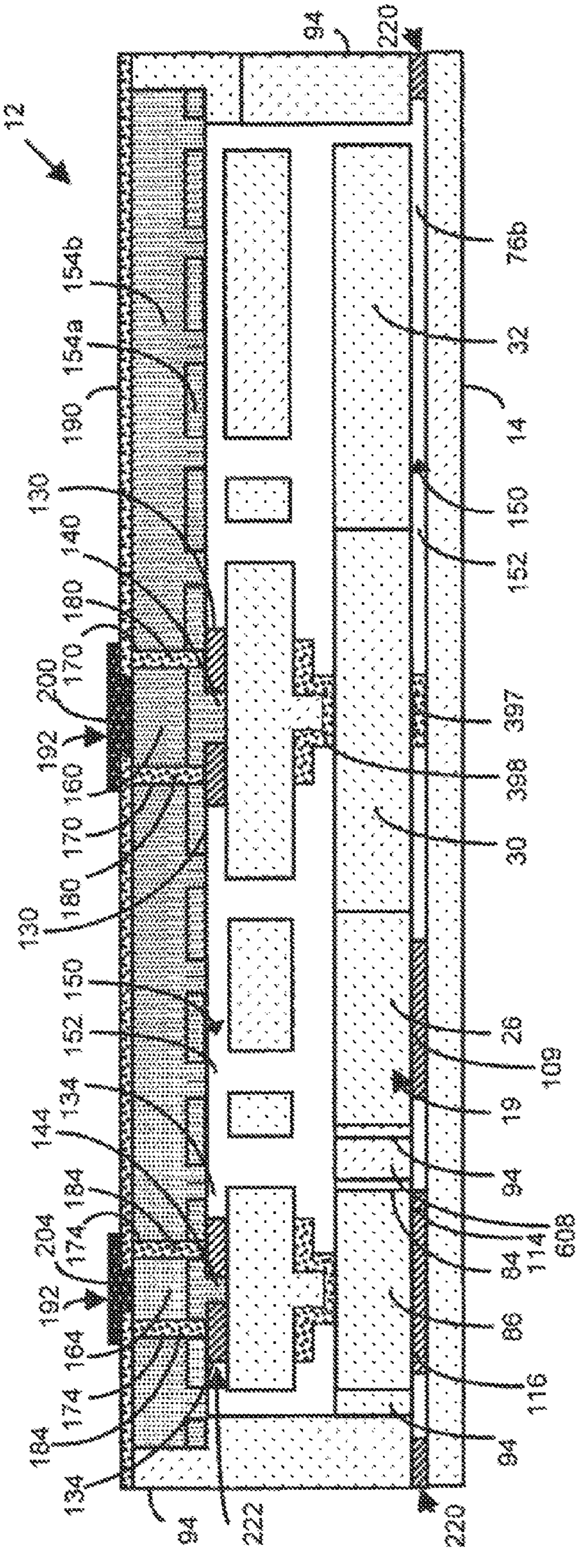
FIGS. 37A-37B illustrate cross-sectional views of micromechanical structures, which may be monolithically integrated on or within the substrate of a MEMS, in accordance with certain aspects of the present invention.
Figure 37B:
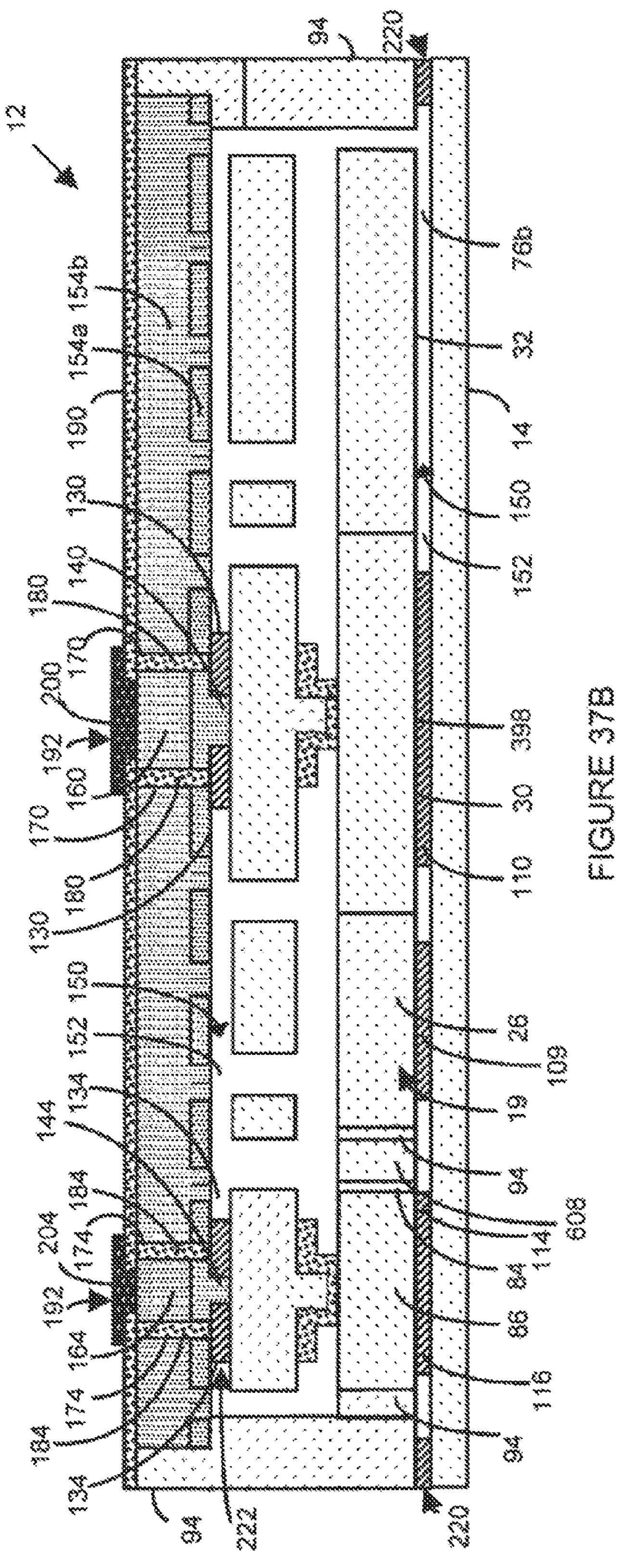

Further, the various structures of the micromachined mechanical structure 12 may have any orientation including longitudinal, lateral, vertical any combination thereof. As stated above, any of the embodiments and/or techniques described herein may be implemented in conjunction with micromachined mechanical structures 12 having one or more transducers or sensors which may themselves include multiple layers that are vertically and/or laterally stacked or interconnected as illustrated in Microelectromechanical Systems and Method of Encapsulating Patent Application Publication and/or Microelectromechanical Systems Having Trench Isolated Contacts Patent, each of which is incorporated by reference herein. Accordingly, any and all of the inventions and/or embodiments illustrated and described herein may be implemented in, and/or employed in conjunction with, any of the embodiments of Microelectromechanical Systems and Method of Encapsulating Patent Application Publication and/or Microelectromechanical Systems Having Trench Isolated Contacts Patent that include multiple layers of mechanical structures, contacts areas and buried contacts that are vertically and/or laterally stacked or interconnected (see, for example, FIGS. 37A and 37B).

Moreover, the present inventions may implement the anchors and techniques of anchoring mechanical structures 16 to substrate 14 (as well as other elements of MEMS 10) described and illustrated in the Anchors for Microelectromechanical Systems Patent, which is incorporated by reference herein. Accordingly, any and all of the inventions and/or embodiments illustrated and described herein may be implemented in, and/or employed in conjunction with, any of the embodiments described and illustrated in the Anchors for Microelectromechanical Systems Patent, implemented in conjunction with the inventions described and illustrated herein (see, for example, FIGS. 37A and 37B).

The transducer 16 is not limited to the configurations of the transducer 16 illustrated in FIGS. 2A-2D, FIGS. 3A-3E, FIGS. 14A-14B, FIGS. 15A-15B, FIGS. 20A-20B, FIGS. 21A-21C, FIGS. 26A-26B and/or FIGS. 27A-27C.

Figure 38A:
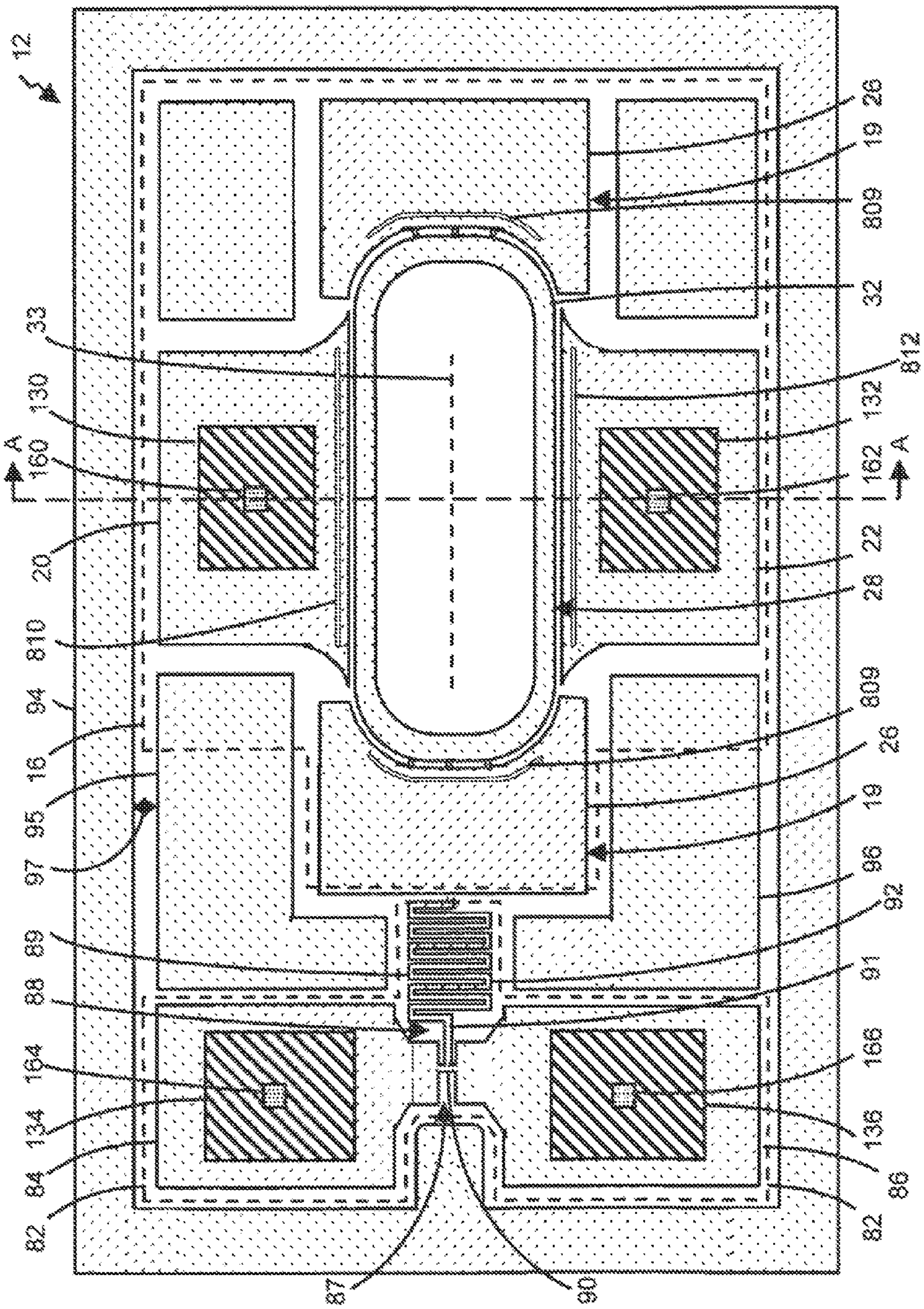
FIG. 38A illustrates a plan view of a portion of another micromachined mechanical structure that may be employed in the MEMS of FIG. 1, in accordance with certain aspects of the present invention.
Figure 38B:
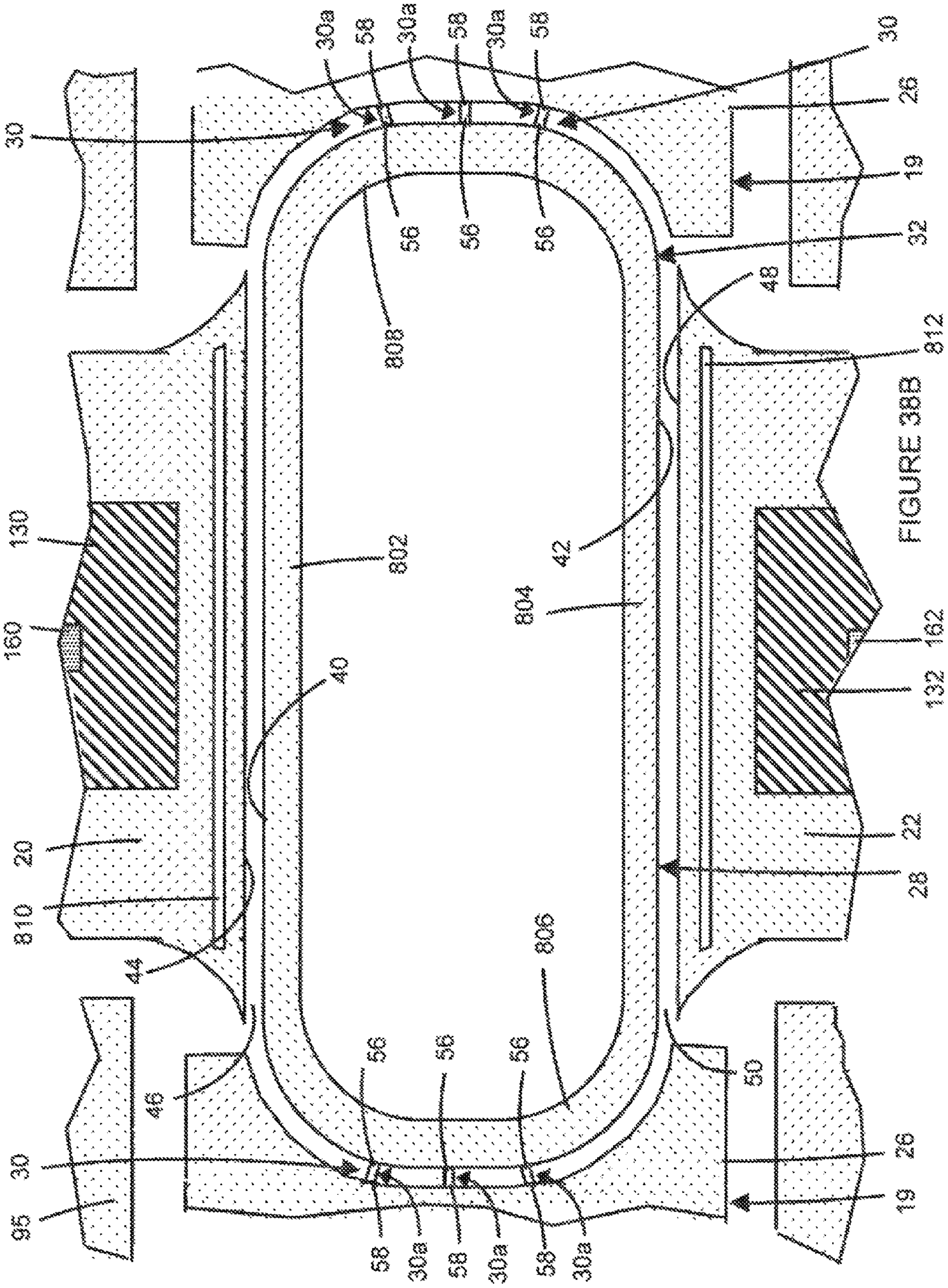
FIG. 38B illustrates an enlarged plan view of a portion of the micromachined mechanical structure of FIG. 38A, in accordance with certain aspects of the present invention.
Figure 38C:
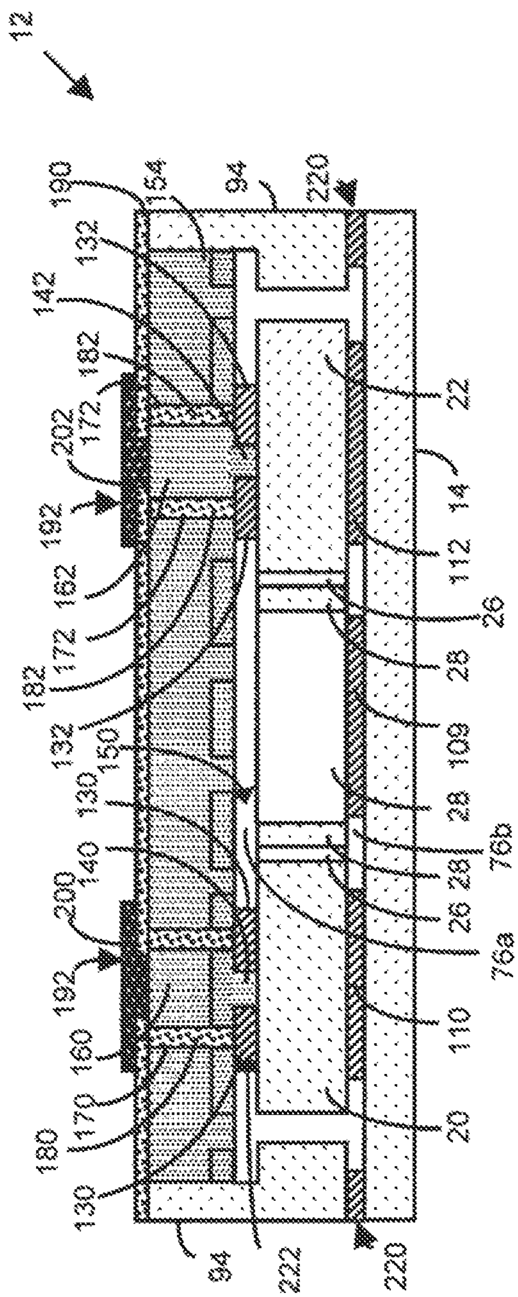
FIG. 38C illustrates a cross-sectional view (taken in the direction A-A of FIG. 38A) of the portion of the micromachined mechanical structure of FIG. 38A and one embodiment of an encapsulation structure that may be employed therewith, in accordance with certain aspects of the present invention.

For example, FIGS. 38A-38C illustrate plan views and a cross sectional view of a portion of another micromachined mechanical structure 12 that may be employed in the MEMS 10 of FIG. 1, in accordance with certain aspects of the present invention. As with the micromachined mechanical structure of FIGS. 2A-2D and FIGS. 3A-3E, micromachined mechanical structure 12 illustrated in FIGS. 38A-38C includes a transducer 16, which may have electrical charge supplied thereto, stored thereon and/or trapped thereon. The transducer 16 may be any type of transducer, for example, an energy harvesting device, a sensor (e.g., an accelerometer, a gyroscope, a microphone, a vibration sensor, a pressure sensor, a strain sensor, a tactile sensor, a magnetic sensor and/or a temperature sensor), a resonator, a resonant filter, and/or a combination thereof. In this embodiment, transducer 16 comprises a capacitive transducer but is not limited to such.

In the micromachined mechanical structure 12 illustrated in FIGS. 38A-38C, transducer 16 includes a plurality of mechanical structures disposed on, above and/or in substrate 14, including, for example first, second and third electrodes 19, 20, 22.

The first, second and third electrodes 19, 20, 22 and/or other mechanical structures may each have any configuration. In the illustrated embodiment, the first electrode 19 includes a fixed mechanical structure 26 and a movable mechanical structure 28 supported thereby. The movable mechanical structure 28 may include a spring portion 30 (FIG. 38B) and a mass portion 32 and may be centered about a reference plane 33. The spring portion 30 may include a plurality of separate spring elements 30*a* (FIG. 38B). The mass portion 32 may be disposed between the second and third electrodes 20, 22. The second and third electrodes 20, 22 may each define a fixed mechanical structure having a generally rectangular shape. The second and third electrodes 20, 22 may be disposed on opposite sides of the movable mechanical structure 28 and/or reference plane 33.

The first, second and third electrodes 19, 20, 22 and/or other mechanical structures may be comprised of any suitable material, for example, a semiconductor material, for example, silicon, (whether doped or undoped), germanium, silicon/germanium, silicon carbide, gallium arsenide and combinations thereof, materials in column IV of the periodic table for example silicon, germanium, carbon; and combinations thereof, for example, silicon germanium, or silicon carbide; also of III-V compounds for example, gallium phosphide, aluminum gallium phosphide, or other III-V combinations; also combinations of III, IV, V, or VI materials, for example, silicon nitride, silicon oxide, aluminum carbide, or aluminum oxide; also metallic silicides, germanides, and carbides, for example, nickel silicide, cobalt silicide, tungsten carbide, or platinum germanium silicide; also doped variations including phosphorus, arsenic, antimony, boron, or aluminum doped silicon or germanium, carbon, or combinations like silicon germanium; also these materials with various crystal structures, including single crystalline, polycrystalline, nanocrystalline, or amorphous; also with combinations of crystal structures, for instance with regions of single crystalline and polycrystalline structure (whether doped or undoped).

The first and second electrodes 19, 20 collectively define a first capacitance. The first and third electrodes 19, 22 collectively define a second capacitance. The magnitude of the first capacitance depends on the relative positioning of the first and second electrodes 19, 20. The magnitude of the second capacitance depends on the relative positioning of the first and third electrodes 19, 22.

As further described hereinafter, exposing the micromachined mechanical structure 12 to an excitation (e.g., a vibrational excitation having a lateral component) causes the movable mechanical structure 28 of the first electrode 19 to move in a direction (e.g., in a lateral direction) that causes a change in the magnitude of the first capacitance and the magnitude of the second capacitance. In the absence of an excitation the movable mechanical structure 28 may be centered between the second electrode 20 and the third electrode 22 at which position the first capacitance and the second capacitance may be approximately equal to one another.

One or more clearances e.g., clearances 76*a*, 76*b* (FIG. 38C), may be provided between one or more portions of the movable mechanical structure 28 and one or more other portions of the micromachined mechanical structure 12. Such clearances, e.g., clearances 76*a*, 76*b*, may reduce the possibility of friction and/or interference between the movable structure and the one or more other portions of the micromachined mechanical structure 12. In some embodiments, the one or more clearances, e.g., clearances 76*a*, 76*b*, provide clearance around each surface of the movable mechanical structure 28 except at end 58 where the movable mechanical structure 28 connects to the fixed mechanical structure 26, such that the movable structure is suspended from the fixed mechanical structure 26.

With reference to FIG. 38B, in this embodiment, each spring element 30*a* of spring portion 30 includes first and second ends 56, 58. The first end 56 may connect to the mass portion 32. The second end 58 may connect to the fixed mechanical structure 26. The length and width of the spring elements 30*a* may be about 10 microns and about 2 microns, respectively. The length of the mass portion 32 may be about 300 microns.

The mass portion 32 of the movable mechanical structure 28 may include a plurality of elongated sections, e.g., elongated beam sections 802, 804, connected via a plurality of end sections, e.g., end sections 806, 808. The width of the sections 802, 804, 806, 808 may be about 30 microns. In some embodiments, each of the plurality of elongated sections, e.g., elongated beam sections 802, 804, comprises a straight elongated beam section and each of the plurality of end sections, e.g., end sections 806, 808, comprises a curved end section so that the mass portion 32 forms a rounded rectangle shape, as shown, a rounded triangle shape, a rounded hexagon shape or a rounded octagon shape or any other geometric shape now know or later developed that includes two or more straight elongated beam sections interconnected by two or more curved or rounded sections.

The movable mechanical structure 28 may define first and second surfaces 40, 42. The first surface 40 may face in a direction toward a first surface 44 of the second electrode 20 and may be spaced therefrom by a first gap 46. The second surface 42 may face in a direction toward a first surface 48 of the third electrode 22 and may be spaced therefrom by a second gap 50.

In some embodiments first, second and third electrodes 19, 20, 22 further define slots 809, 810, 812 to facilitate etching and/or removal of sacrificial material from beneath portions first, second and third electrodes 19, 20, 22 during fabrication of the micromachined mechanical structure 12 so that portions of electrodes 19, 20, 22 are free. The micromachined mechanical structure 12 further includes one or more mechanical structures 82 disposed on, above and/or in substrate 14, for use in supplying, storing and/or trapping electrical charge on the first electrode 19 (and/or any other portion (s) of the micromachined mechanical structure 12 on which charge is to be stored). The one or more mechanical structures 82 may have any configuration. In this embodiment, the one or more mechanical structures include a first electrode 84, a second electrode 86 and a breakable link 88. The one or more mechanical structures 82 may each have any configuration. In the illustrated embodiment, for example, the first and second electrodes 84, 86 and breakable link 88 have configurations that are similar to that of the first and second electrodes 84, 86 and breakable link 88, respectively, of the one or more mechanical structures 82 illustrated in FIGS. 2A-2D and FIGS. 3A-3E.

With reference to FIG. 38C, as stated above, the micromachined mechanical structure 12 further defines a chamber 150 having an atmosphere 152 "contained" therein. The chamber 150 may be formed, at least in part, by one or more encapsulation layer(s) 154. In some embodiments, one or more of the one or more encapsulation layer(s) 154 are formed using one or more of the encapsulation techniques described and illustrated in the Microelectromechanical Systems Having Trench Isolated Contacts Patent, the entire contents of which, including, for example, the features, attributes, alternatives, materials, techniques and advantages of all of the inventions, are incorporated by reference herein, although, unless stated otherwise, the aspects and/or embodiments of the present invention are not limited to such features, attributes alternatives, materials, techniques and advantages.

Figure 39A:
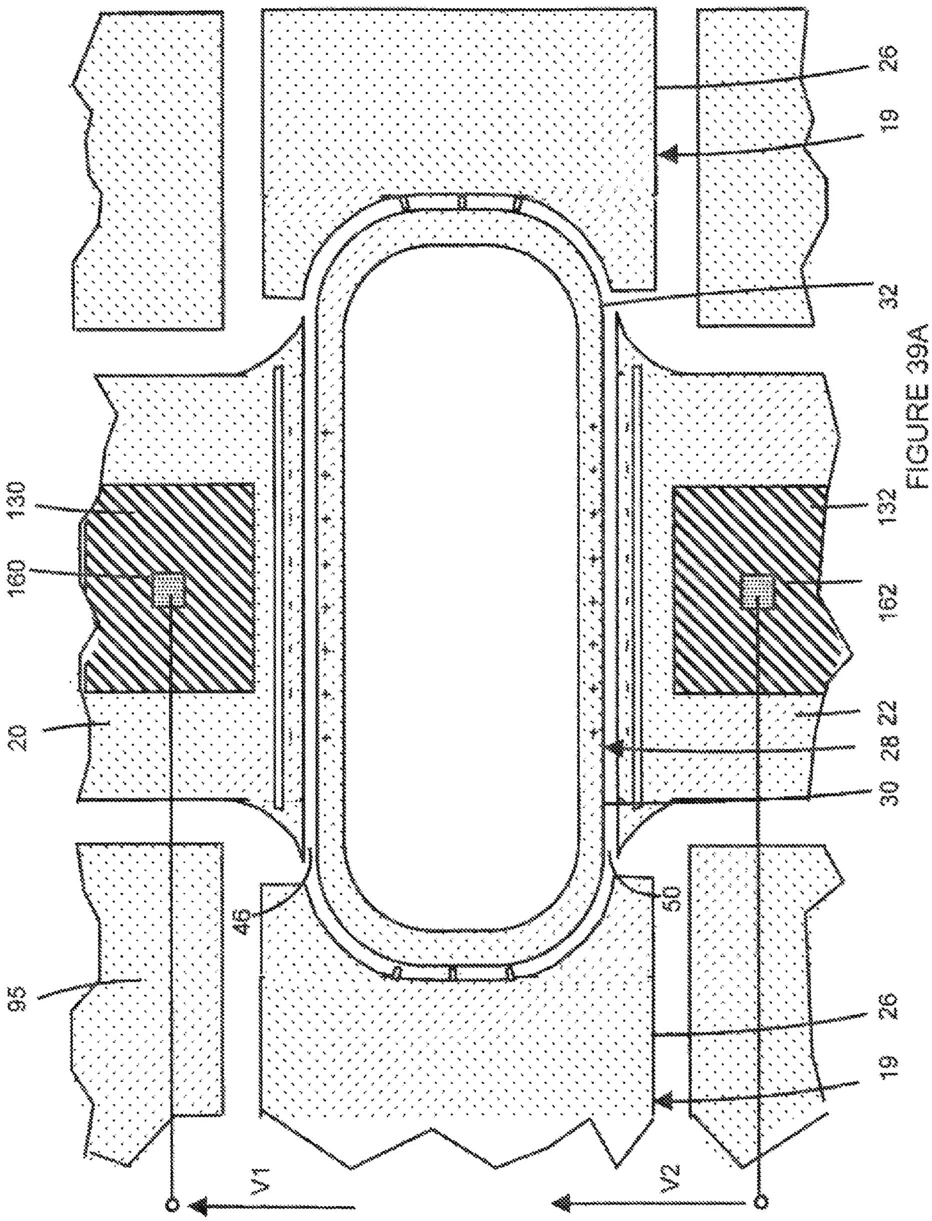
FIGS. 39A-39C illustrate plan views of the portion of micromachined mechanical structure of FIG. 38A, showing stages that may be employed in the operation of the transducer of the micromachined mechanical structure of FIGS. 38A-38C, according to certain aspects of the present invention.
Figure 39B:
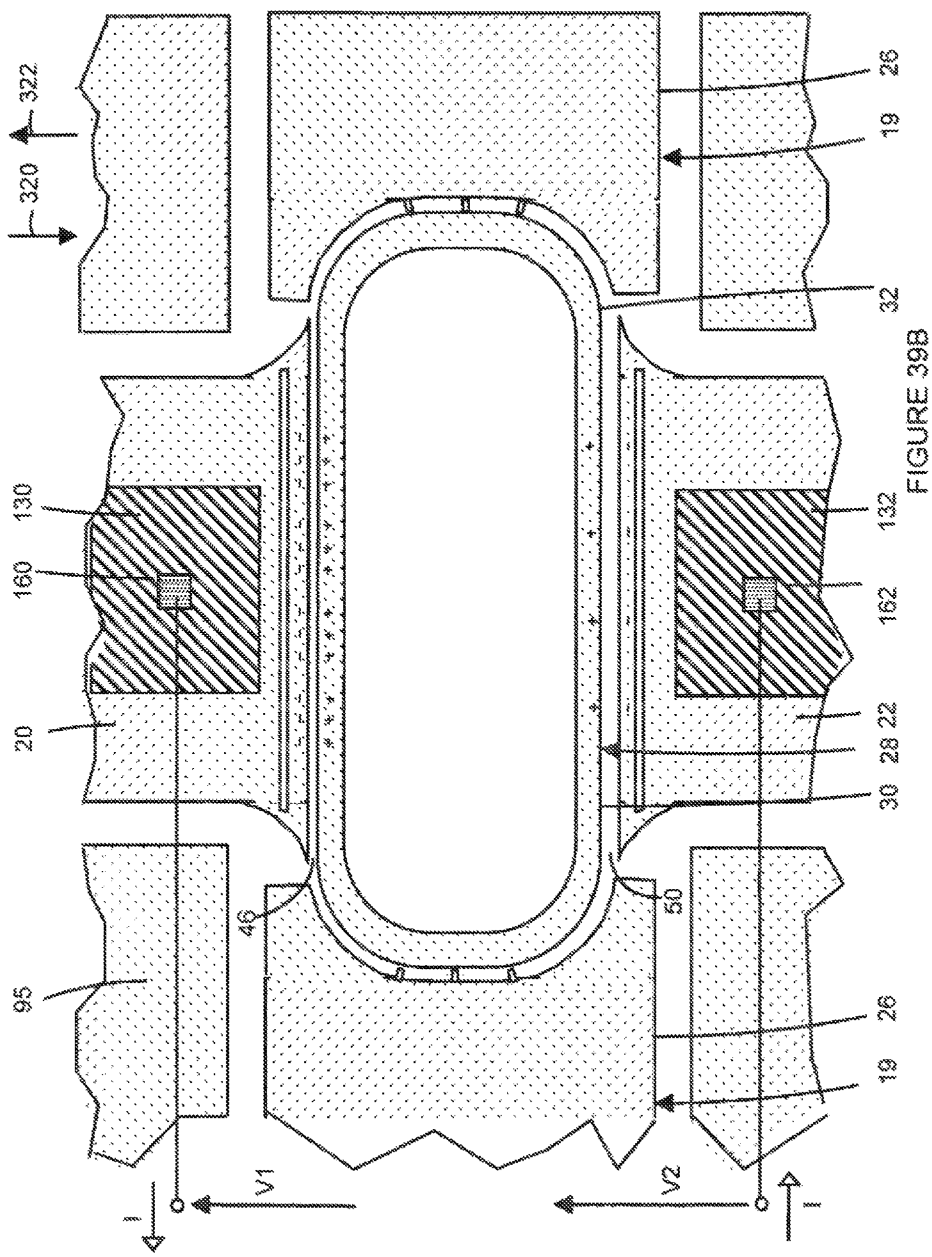
Figure 39C:
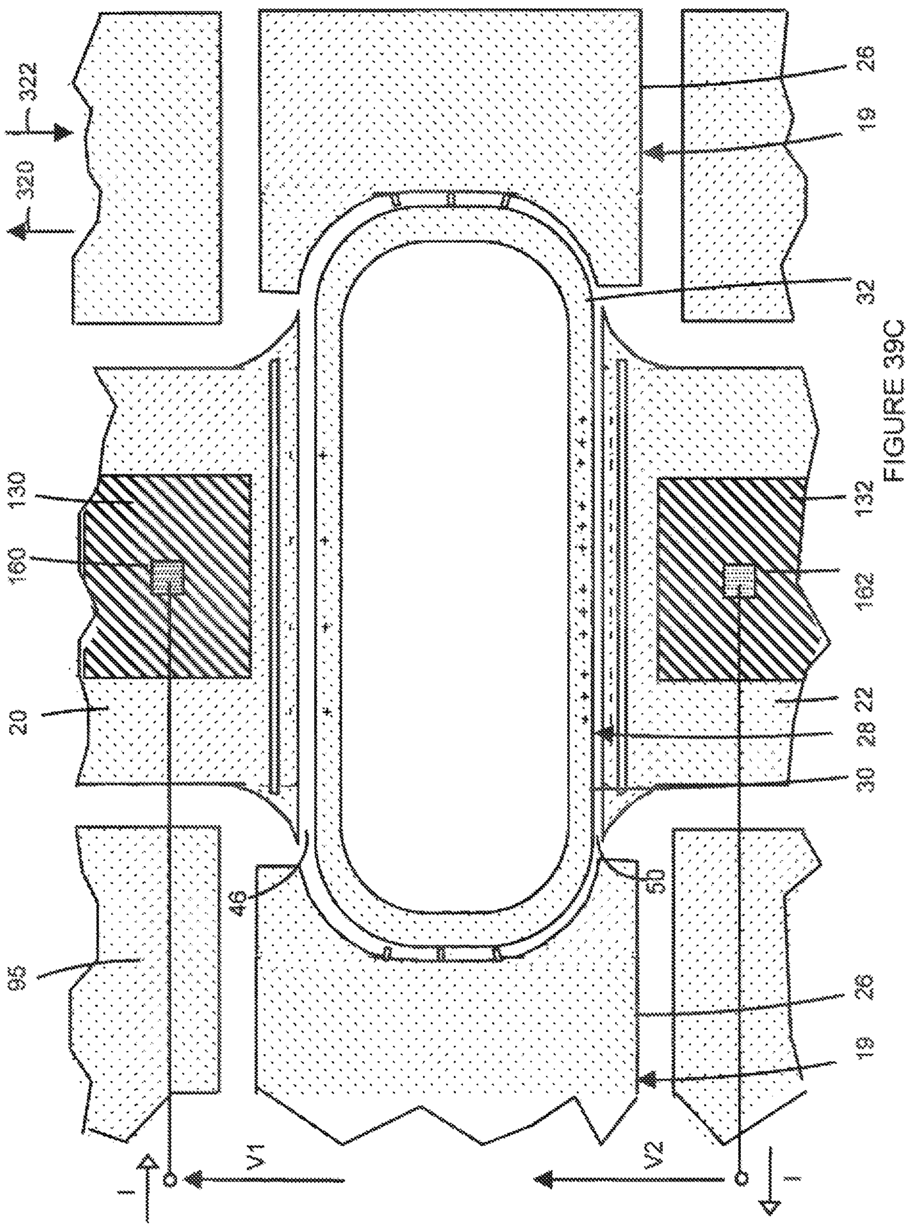

FIGS. 39A-39C illustrate stages that may be employed in the operation of the transducer 16, in accordance with certain aspects of the present invention.

Referring to FIG. 39A, as stated above, in the absence of an excitation (e.g., vibration) the movable mechanical structure 28 of the first electrode 19 may be stationary and disposed at a position approximately centered between the second electrode 20 and the third electrode 22. With the movable mechanical structure 28 at such position, the width of the first gap 46 may be approximately equal to the width of the second gap 50. The charge stored on the first electrode 19 results in a first voltage V1 across the first capacitance (e.g., defined by the second electrode 20 and the first electrode 19) and a second voltage V2 across the second capacitance (e.g., defined by the third electrode 22 and the first electrode 19).

With the movable mechanical structure 28 stationary and centered between the second electrode 20 and the third electrode 22, the first voltage V1 and the second voltage V2 may be equal to and opposite one another (or approximately equal to and opposite one another).

The first and second voltages V1 and V2 result in laterally directed, electrostatic forces on the movable mechanical structure 28. With the movable mechanical structure 28 stationary and centered, as shown, the laterally directed electrostatic force due to the voltage V1 across the first capacitance may be equal to and opposite (or approximately equal to and opposite) the laterally directed, electrostatic force due to the voltage V2 across the second capacitance, so that the net electrostatic force on the movable mechanical structure 28 in the lateral direction may be equal to zero.

With reference to FIG. 39B, providing an excitation (e.g., vibration) having a lateral component, e.g., lateral component 320, causes the movable mechanical structure 28 of electrode 19 to begin to move in a lateral direction, e.g., lateral direction 322. For example, if the lateral component 320 is directed toward the third electrode 22, the movable mechanical structure 28 begins to move in a direction 322 toward the second electrode 20, as shown, such that the size of the first gap 46 decreases and the size of the second gap 50 increases. The decrease in the size of the first gap 46 causes an increase in the magnitude of the first capacitance (e.g., defined by the second electrode 20 and first electrode 19) and an electrical current out of the second electrode 20, thereby decreasing the voltage of the first electrode and increasing the charge differential and the voltage differential across the first capacitance. The voltage The increase in the size of the second gap 50 causes a decrease in the magnitude of the second capacitance (e.g., defined by the third electrode 22 and first electrode 19) and an electrical current into the third electrode 22, thereby increasing the voltage of the second electrode and decreasing the charge differential and the voltage differential across the second capacitance.

With reference to FIG. 39C, if the lateral component 320 is directed toward the second electrode 20, the movable mechanical structure 28 begins to move in a direction 324 toward the third electrode 22, such that the size of the first gap 46 increases and the size of the second gap 50 decreases. The increase in the size of the first gap 46 causes a decrease in the magnitude of the first capacitance (e.g., defined by the second electrode 20 and first electrode 19) and an electrical current into the second electrode 20, which in turn decreases the charge across the first capacitance. The decrease in the size of the second gap 50 causes an increase in the magnitude of the second capacitance (e.g., defined by the third electrode 22 and the first electrode 19) and an electrical current out of the third electrode 22, which in turn increases the charge across the second capacitance.

As stated above, the amount of the movement observed in the movable structure of the first electrode 19 may depend at least in part on the magnitude of the excitation (e.g., vibrational energy) applied to the micromachined mechanical structure 12, the spring constant of the spring portion 30 and the mass of the mass portion 32. In some embodiments, the mass of the mass portion 32 is in a range of from about one microgram (ug) to about one milligram (mg). In some embodiments, it may be advantageous to employ a spring portion 30 and a mass portion 32 that cause the movable mechanical structure 28 to have a resonant frequency equal to, or approximately equal to, a frequency of the excitation (e.g., vibrational energy to be converted to electrical energy) to be converted to electrical energy, in order to improve and/or maximize the efficiency of the transducer. The resonant frequency of a harmonic oscillator employing a spring and a mass may be expressed by the equation: resonant frequency=(k/m), where k is equal to the spring constant and m is equal to the mass. Thus, the resonant frequency of the movable mechanical structure 28 may be adjusted by increasing/decreasing the spring constant of the spring portion 30 and/or by increasing/decreasing the mass of the mass portion 32. The spring constant may be decreased by increasing the length 62 of the spring portion 30 and/or by decreasing the width 64 of the spring portion 30 (or portions thereof. The spring constant may be increased by decreasing the length 62 of the spring portion 30 and/or by increasing the width 64 of the spring portion 30 (or portions thereof). The mass of the mass portion 32 may be adjusted by changing the dimensions and/or density of one or more portions of the mass portion 32.

However, there is no requirement to employ a movable mechanical structure 28 having a resonant frequency equal to the frequency of the excitation (e.g., vibrational energy to be converted to electrical energy). For example, some embodiments may have one or more constraints that preclude a resonant frequency equal to the frequency of the excitation. For example, it may not be possible to increase the length of the spring portion 30 and/or the dimensions or density of the mass portion 32 without an unacceptable increase in the size of the MEMS 10 and/or the cost associated therewith.

Thus, some embodiments employ a movable mechanical structure 28 having a resonant frequency greater than the frequency of the excitation (e.g., vibrational energy to be converted to electrical energy). In some embodiments, the frequency of the excitation is less than or equal to 100 Hertz (Hz) and the resonant frequency of the movable mechanical structure 28 is greater than 100 Hz, for example, in a range from greater than 100 HZ but less than or equal to 1000 Hz. Some other embodiments employ a movable structure having a resonant frequency that is less than the frequency of the excitation.

Some embodiments may employ a movable mechanical structure 28 having more than one resonant frequency. For example, some embodiments may employ more than one spring portion and/or more than one mass portion arranged in and/or a geometric shape now know or later developed that includes provides the movable mechanical structure 28 with more than one spring constant and/or more than one mass.

Some embodiments may be exposed to more than one excitation frequency. In such embodiments, the movable mechanical structure 28 may have one or more resonant frequencies equal to one or more of the excitation frequencies, one or more resonant frequencies greater than one or more of excitation frequencies and/or one or more resonant frequencies less than one or more of excitation frequencies.

The micromachined mechanical structure 12 may be fabricated using one or more of the methods disclosed herein and/or any other suitable technique.

FIGS. 40A-40J illustrate cross-sectional views of an exemplary embodiment of the fabrication of the portion of MEMS of FIGS. 38A-38C, including encapsulation that may be employed therewith, at various stages of the process, according to certain aspects of the present invention.

Figure 40A:
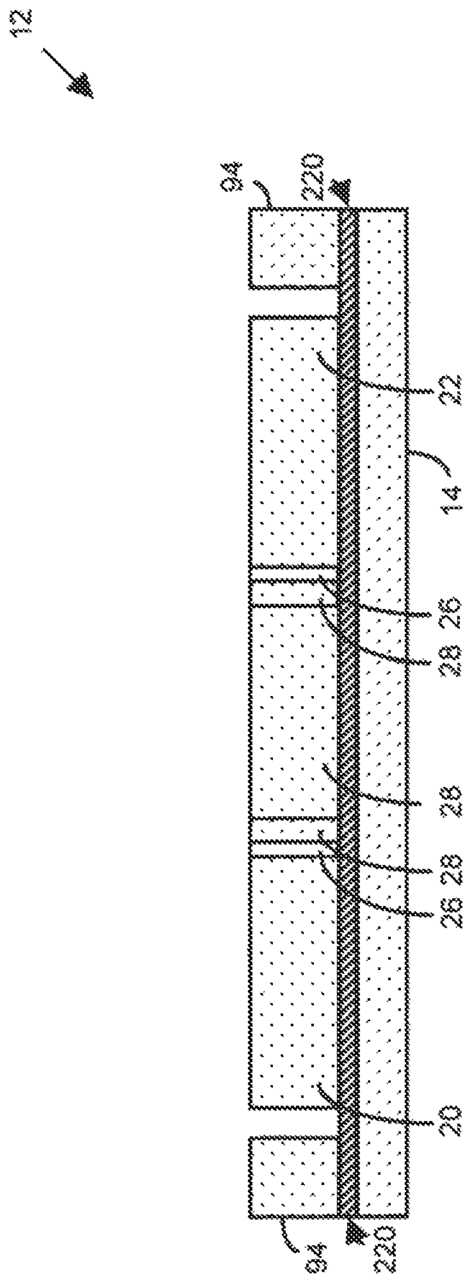
FIGS. 40A-40J illustrate cross-sectional views (taken in the direction A-A of FIG. 38A) of one embodiment of the fabrication of the portion of the micromachined mechanical structure of FIGS. 38A-38C, including one embodiment of an encapsulation that may be employed therewith, at various stages of the process, according to certain aspects of the present invention.
Figure 40B:
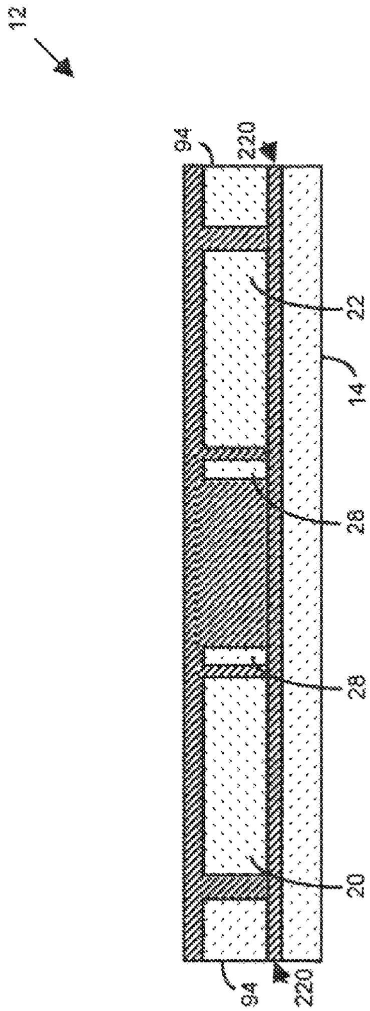
Figure 40C:
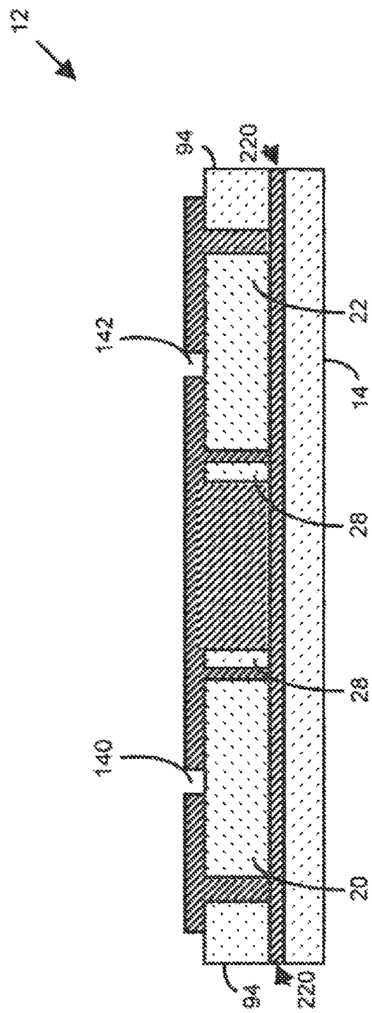
Figure 40D:
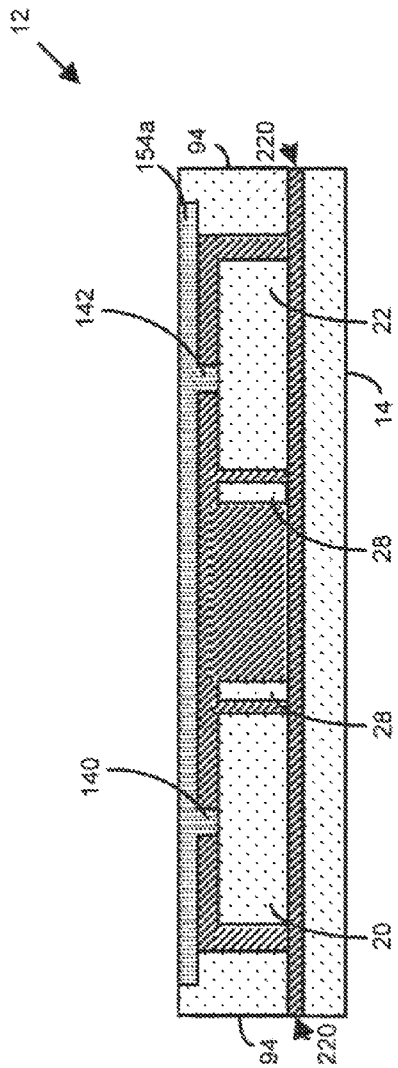
Figure 40E:
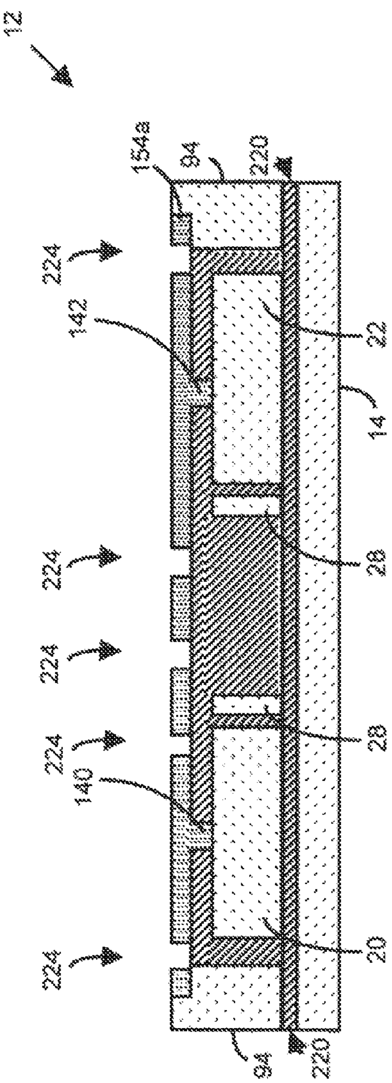
Figure 40F:
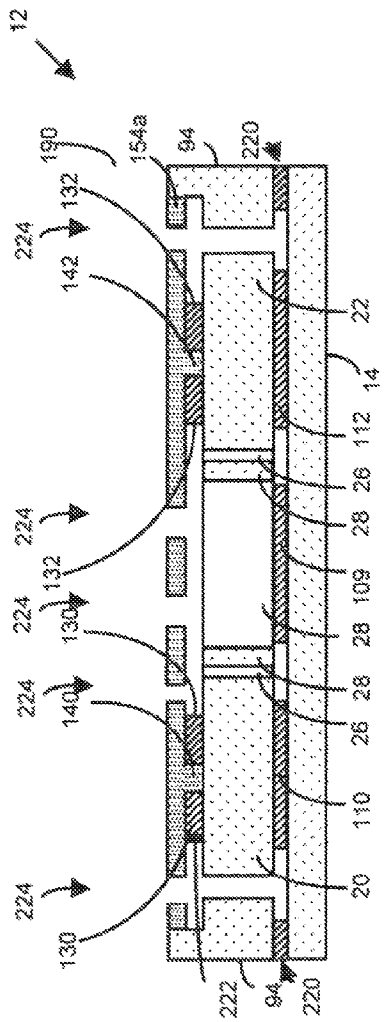
Figure 40G:
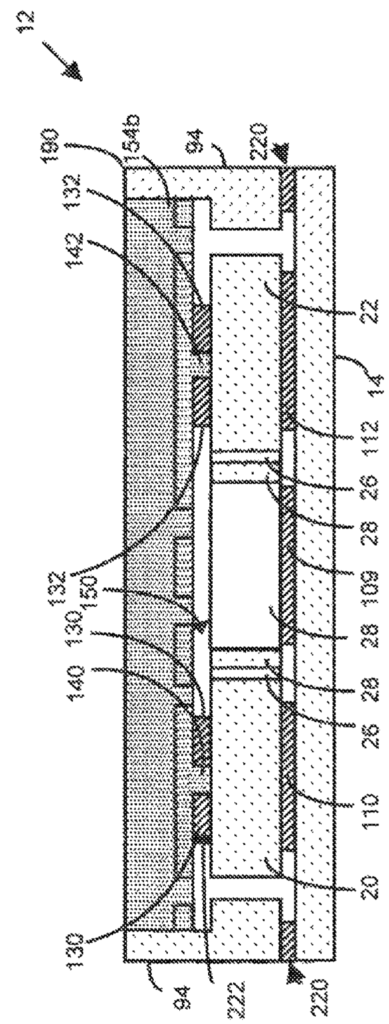
Figure 40H:
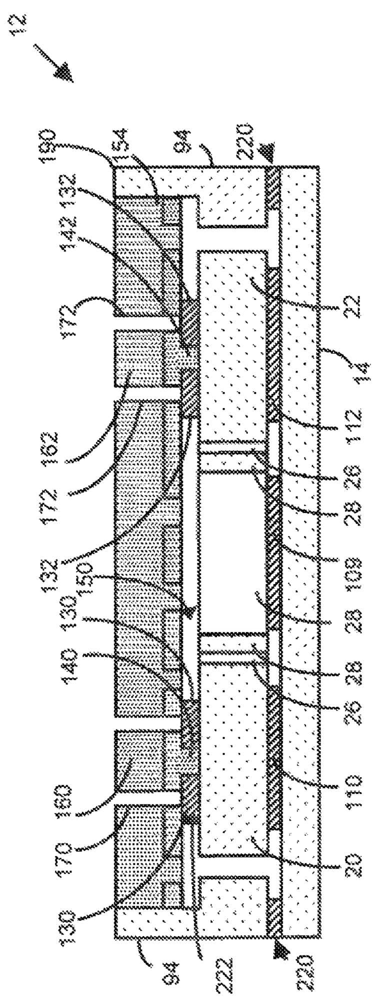
Figure 40I:
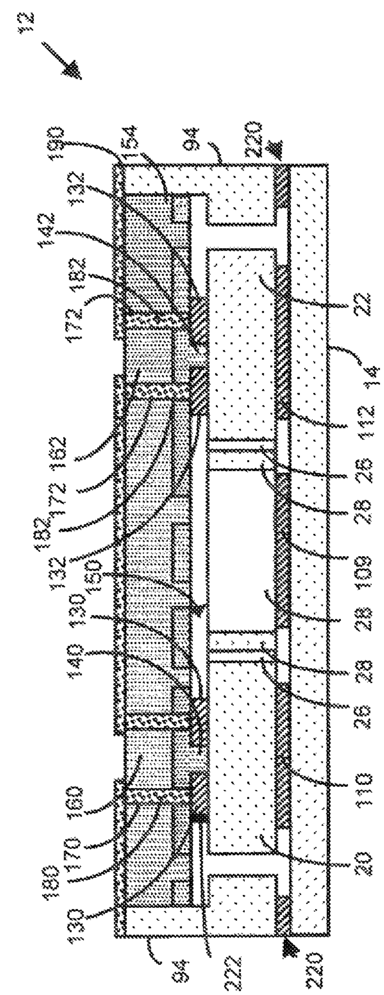
Figure 40J:
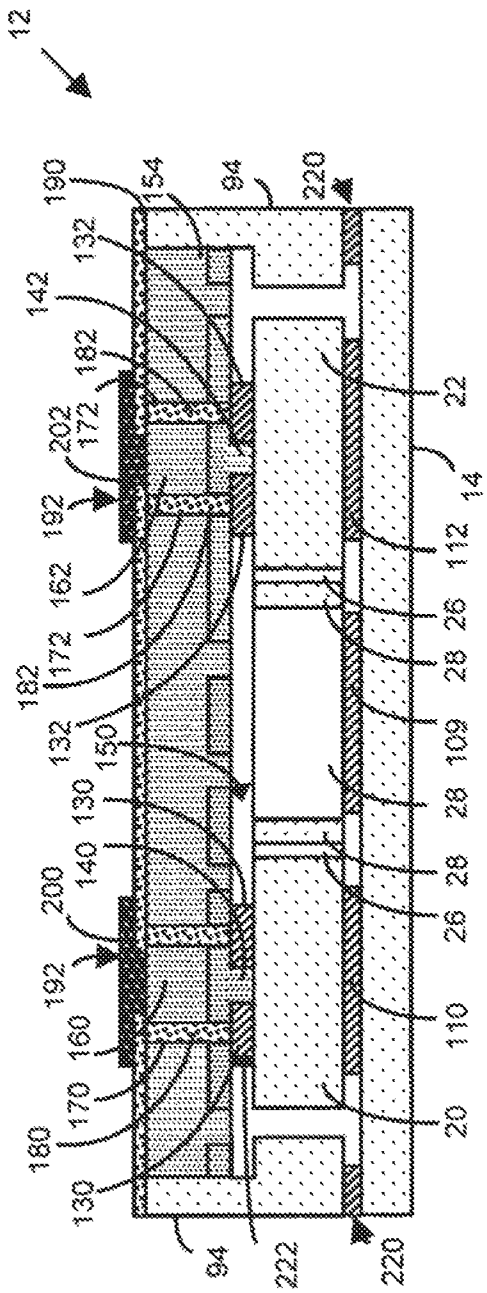

With reference to FIG. 40A, in the exemplary embodiment, fabrication of MEMS 10 having micromachined mechanical structure 12 may begin with an SOI substrate partially formed device including mechanical structures, e.g., electrodes 84, 86, and electrodes 19, 20, 22, disposed on a first sacrificial layer 220, for example, silicon dioxide or silicon nitride. The mechanical structures, e.g., electrodes 84, 86, and electrodes 19, 20, 22, may be formed using well-known deposition, lithographic, etching and/or doping techniques as well as from well-known materials (for example, semiconductors such as silicon, germanium, silicon-germanium or gallium-arsenide).

Thereafter, the processing of MEMS 10 having the thermionic electron source may proceed in the same manner as described above with respect to FIGS. 4B-4J. In this regard, an exemplary fabrication process of MEM 10 is illustrated in FIGS. 40B-40J. Because the processes are substantially similar to the discussion above with respect to FIGS. 4B-4J, for the sake of brevity, that discussion will not be repeated.

As stated above, some embodiments of the present invention may be implemented in conjunction with one or more of the thin film encapsulation techniques described and illustrated in the Microelectromechanical Systems and Method of Encapsulating Patent Application Publication incorporated by reference herein. In this regard, any and all of the embodiments described herein may employ one or more of the structures and/or techniques disclosed in the Microelectromechanical Systems and Method of Encapsulating Patent Application Publication. The present invention may also be employed in conjunction with wafer-bonding encapsulation techniques.

Figure 41:
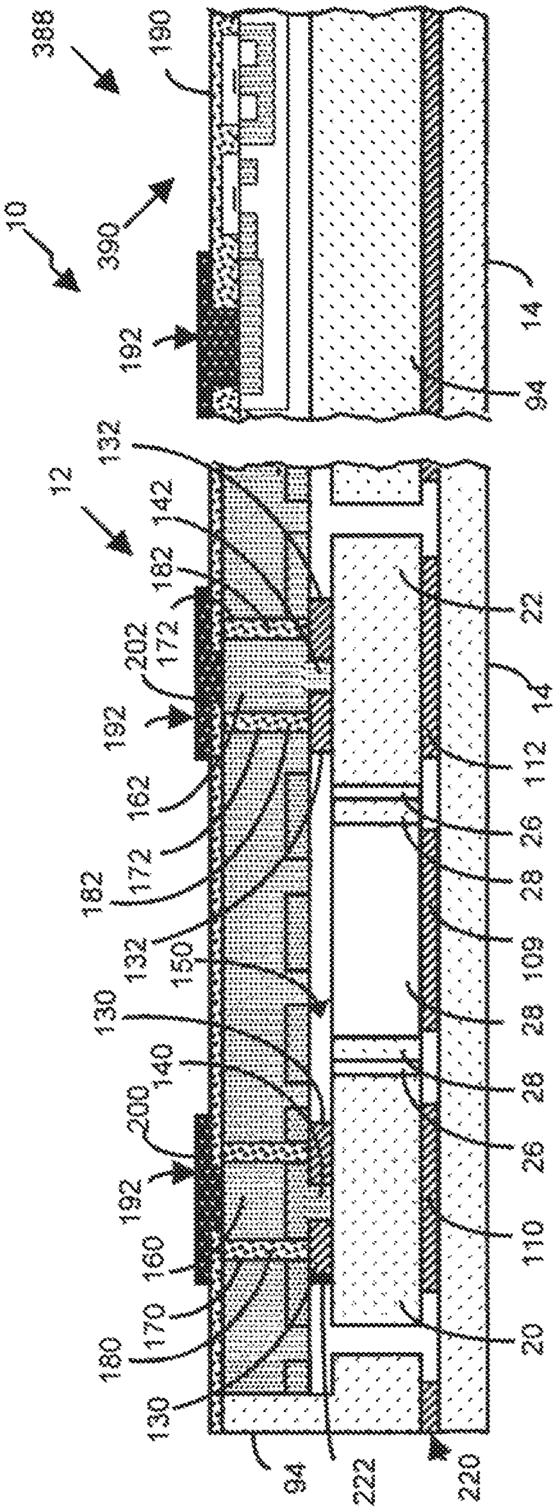
FIG. 41 illustrates a cross-sectional view of a MEMS according to certain aspects of the present inventions, including the portion of the micromachined mechanical illustrated in FIG. 38A (cross sectional view thereof taken in the direction A-A of FIG. 38A) and an integrated circuit portion, both portions of which are disposed or integrated on or in a common substrate.
Figure 42:
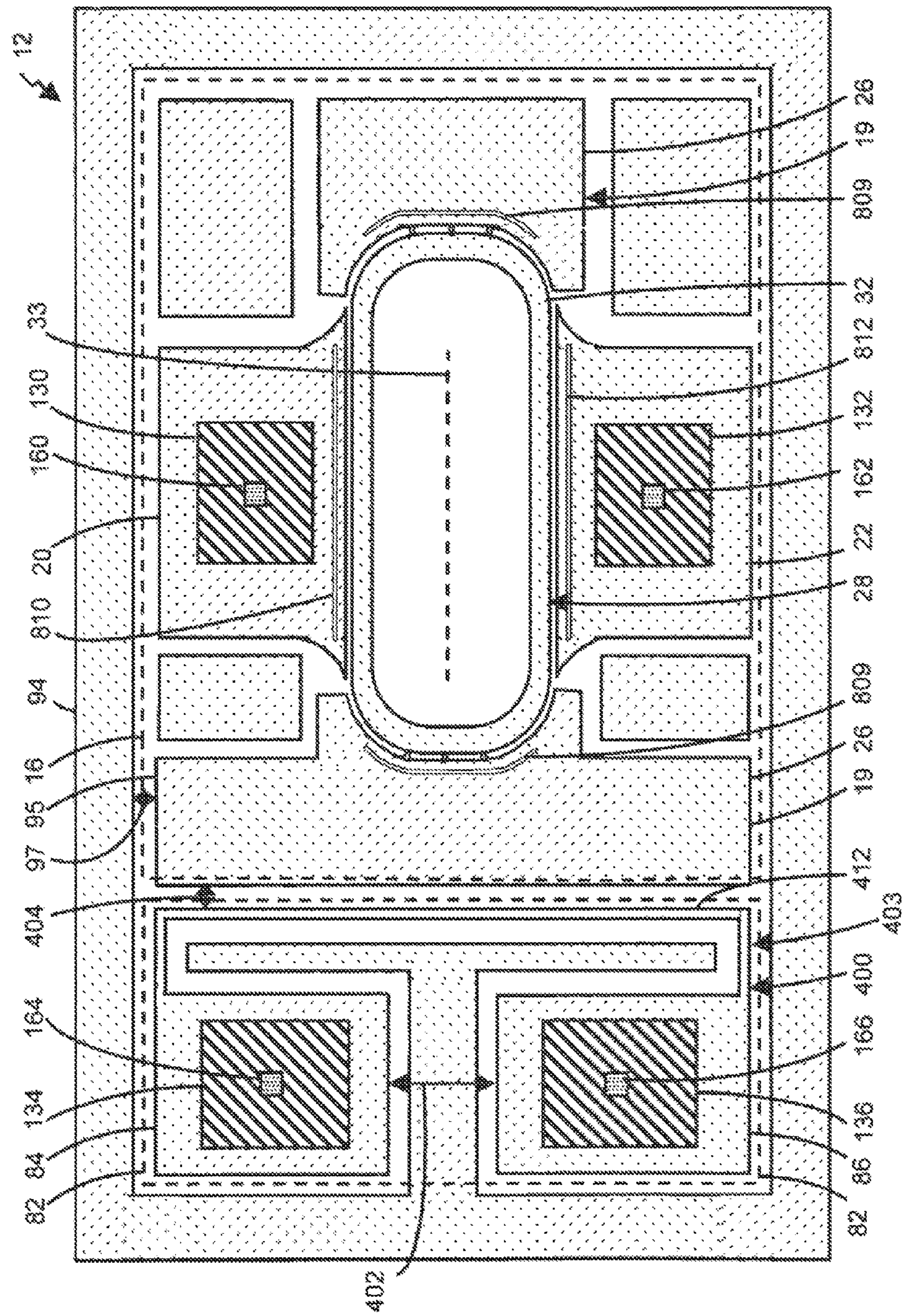
FIG. 42 illustrates a plan view of a portion of another micromachined mechanical structure that may be employed in the MEMS of FIG. 1, in accordance with certain aspects of the present invention.
Figure 43:
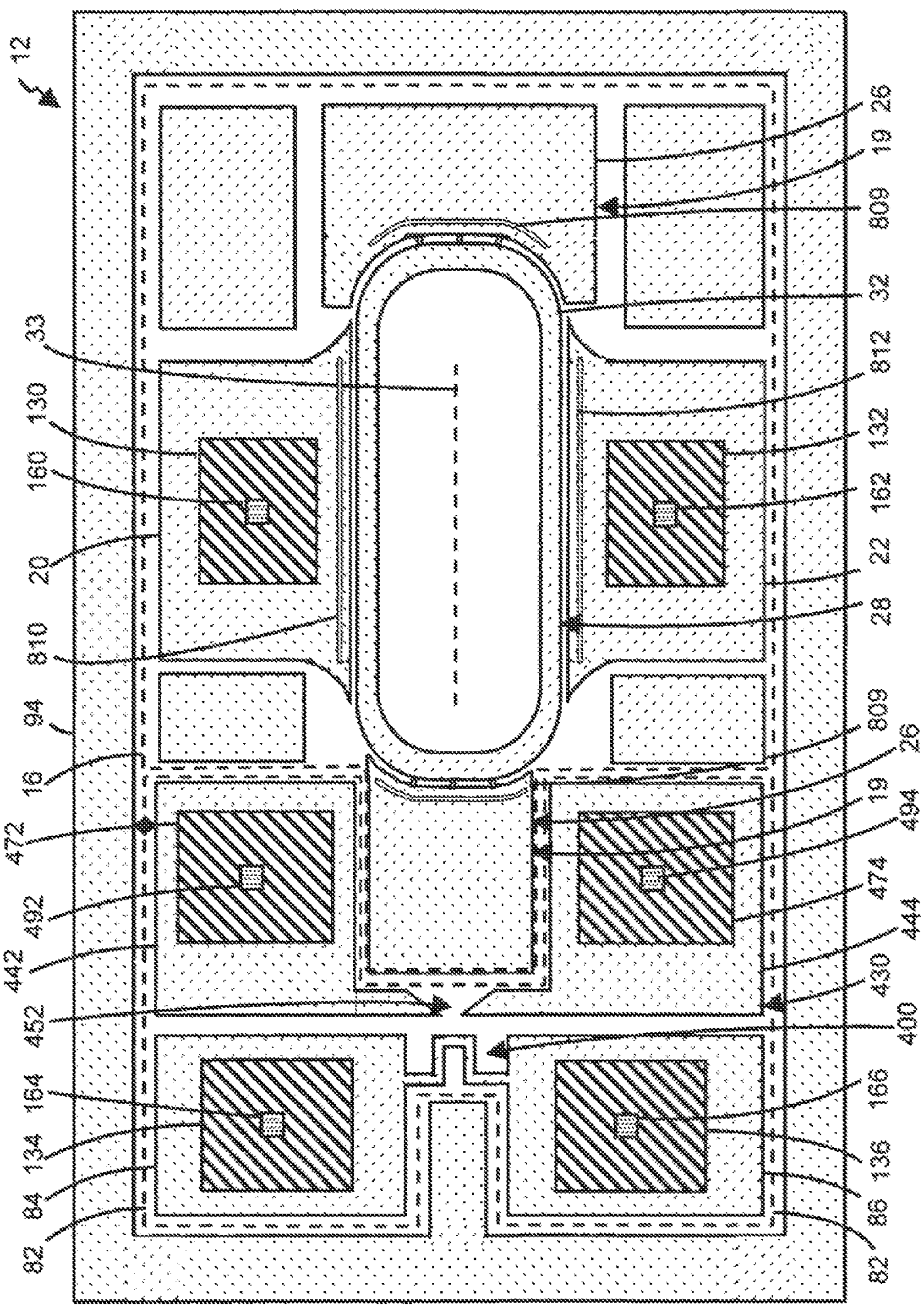
FIG. 43 illustrates a plan view of a portion of another micromachined mechanical structure that may be employed in the MEMS of FIG. 1, in accordance with certain aspects of the present invention.
Figure 44:
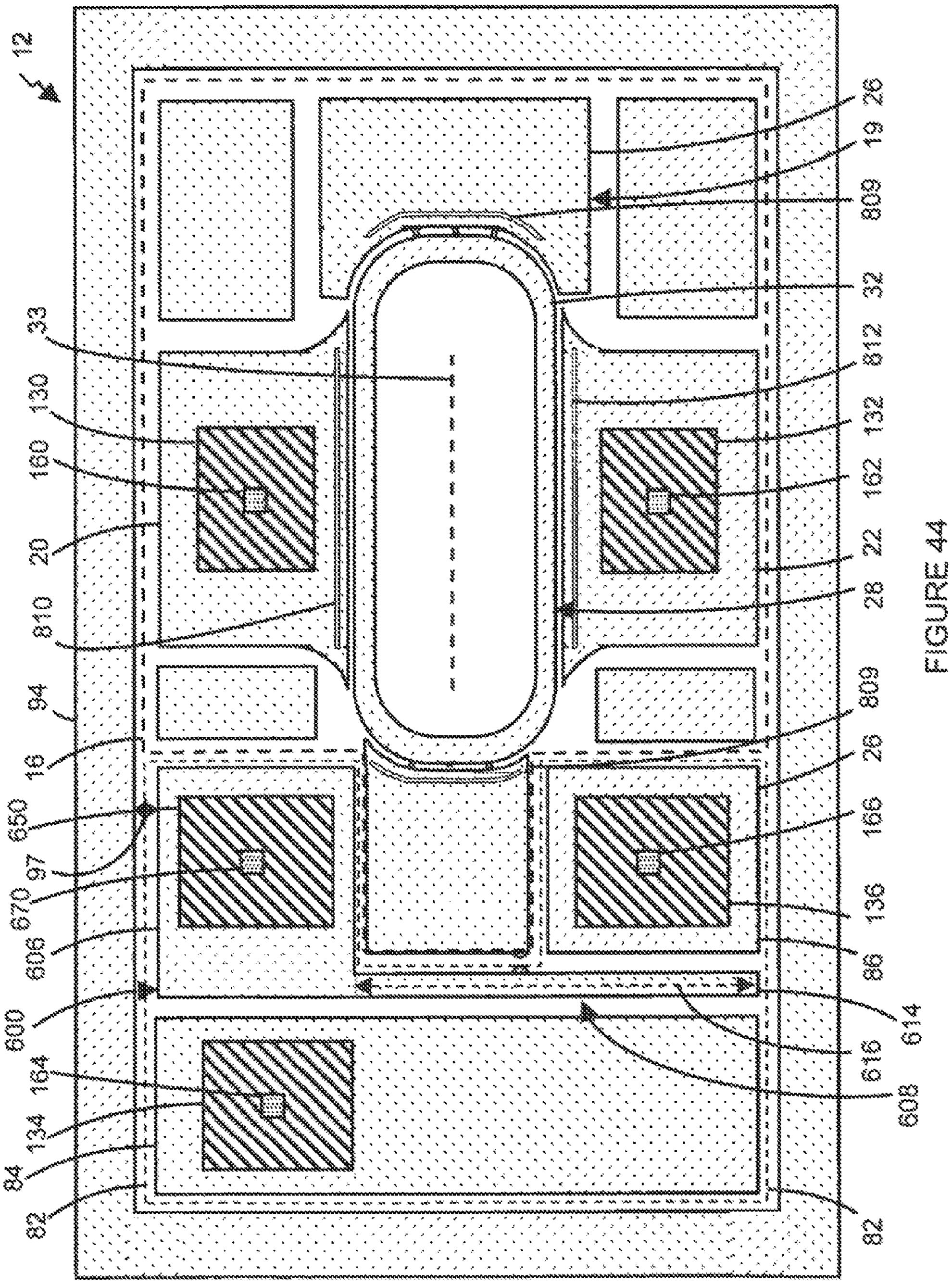
FIG. 44 illustrates a plan view of a portion of another micromachined mechanical structure that may be employed in the MEMS of FIG. 1, in accordance with certain aspects of the present invention.

As also stated above, MEMS 10 may include one or more other circuits and/or devices, e.g., other circuits and/or devices 226, 330 (FIGS. 10A-10L), charge storing circuit 332 (FIGS. 10B-10E, 10K-10L), DC/DC converter circuit 362 (FIGS. 10E, 10G, 10L), data processing electronics 386 (FIG. 11 and FIGS. 12A-12D) and/or interface circuitry 388 (FIG. 11 and FIGS. 12A-12D). For example, with reference to FIG. 41, integrated circuits 390 may be fabricated using conventional techniques after definition of mechanical structure 12 using, for example, the techniques described and illustrated in Microelectromechanical Systems and Method of Encapsulating Patent Application Publication and/or Microelectromechanical Systems Having Trench Isolated Contacts Patent.

Further, the various structures of the micromachined mechanical structure 12 may have any orientation including longitudinal, lateral, vertical any combination thereof. As stated above, any of the embodiments and/or techniques described herein may be implemented in conjunction with micromachined mechanical structures 12 having one or more transducers or sensors which may themselves include multiple layers that are vertically and/or laterally stacked or interconnected as illustrated in Microelectromechanical Systems and Method of Encapsulating Patent Application Publication and/or Microelectromechanical Systems Having Trench Isolated Contacts Patent, each of which is incorporated by reference herein. Accordingly, any and all of the inventions and/or embodiments illustrated and described herein may be implemented in, and/or employed in conjunction with, any of the embodiments of Microelectromechanical Systems and Method of Encapsulating Patent Application Publication and/or Microelectromechanical Systems Having Trench Isolated Contacts Patent that include multiple layers of mechanical structures, contacts areas and buried contacts that are vertically and/or laterally stacked or interconnected.

Moreover, the present inventions may implement the anchors and techniques of anchoring mechanical structures 16 to substrate 14 (as well as other elements of MEMS 10) described and illustrated in the Anchors for Microelectromechanical Systems Patent, which is incorporated by reference herein. Accordingly, any and all of the inventions and/or embodiments illustrated and described herein may be implemented in, and/or employed in conjunction with, any of the embodiments described and illustrated in the Anchors for Microelectromechanical Systems Patent, implemented in conjunction with the inventions described and illustrated herein.

Each of the aspects and/or embodiments disclosed herein, may be employed alone or in combination with one or more of the other aspects and/or embodiments disclosed herein, or portions thereof.

Figure 45:
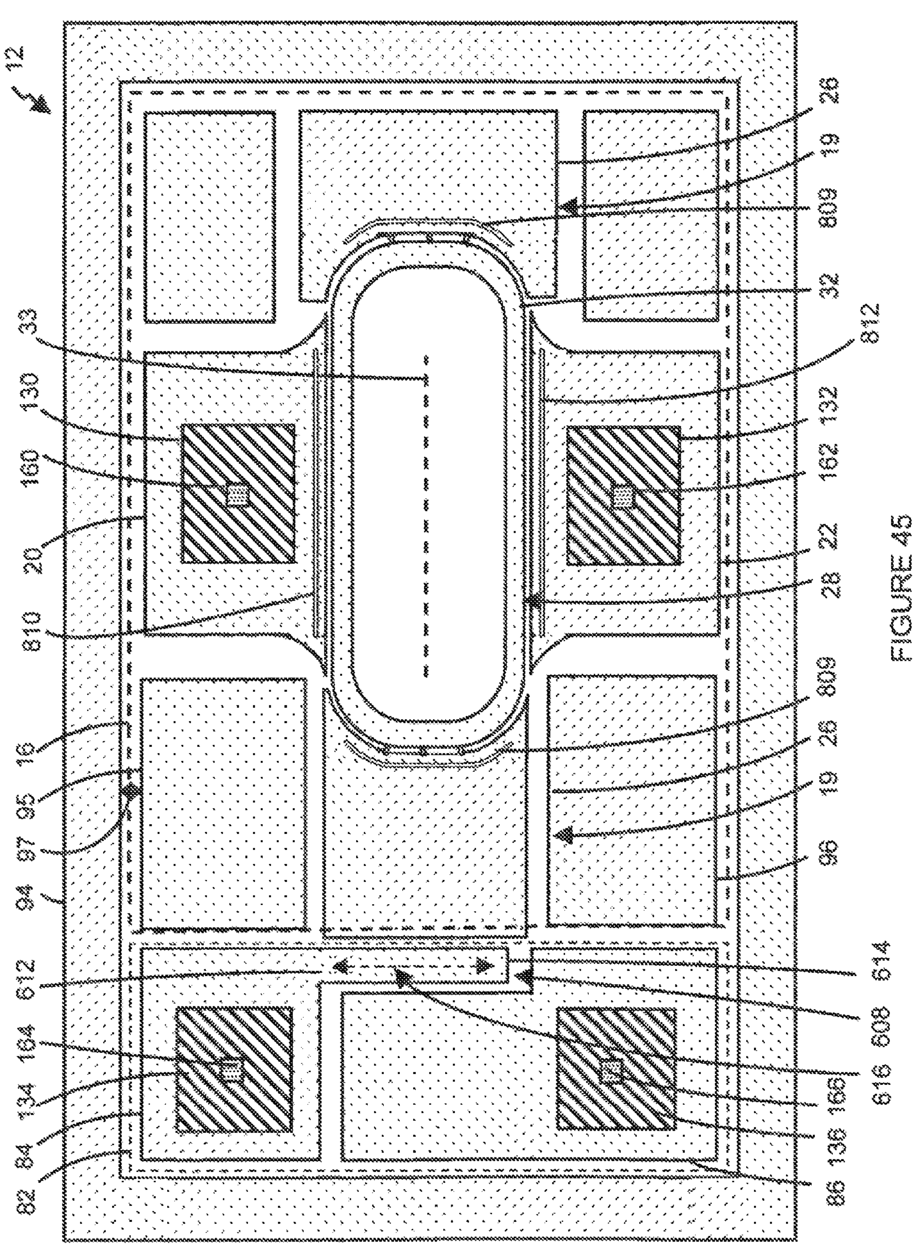
FIG. 45 illustrates a plan view of a portion of another micromachined mechanical structure that may be employed in the MEMS of FIG. 1, in accordance with certain aspects of the present invention.

For example, with reference to FIGS. 42-45, the vibrational energy to electrical energy 16 illustrated in FIGS. 38A-38C may be employed in conjunction with the one or more structures 82 of the micromachined mechanical structure 12 illustrated in FIGS. 14A-14B, 15A-15B (e.g., see FIG. 42), the one or more structures 82 of the micromachined mechanical structure 12 illustrated in FIGS. 20A-20B, 21A-21C (e.g., see FIG. 43), the one or more structures 82 of the micromachined mechanical structure 12 illustrated in FIGS. 26A-26B, 27A-27C (e.g., see FIG. 44) and/or the one or more structures 82 of the micromachined mechanical structure 12 illustrated in FIGS. 32A-32B, 33A-33B (e.g., see FIG. 45).

Each of the aspects and/or embodiments disclosed herein may also be used in combination with other methods and/or apparatus, now known or later developed.

Notably, the methods and/or structures disclosed herein are not limited to use in association with a micromachined mechanical structure that converts vibrational energy to electrical energy.

For example, the methods and/or structures disclosed herein may be employed in association with any method and/or structure and/or in any type of applications including, but not limited to, energy harvesting, transducers (e.g., accelerometers, gyroscopes, microphones, pressure sensors, strain sensors, tactile sensors, magnetic sensors and/or temperature sensors), resonators, filters or any combination thereof.

FIGS. 46A-46B and FIGS. 47A-47B illustrate plan views and a cross sectional view, respectively, of a portion of another micromachined mechanical structure 12 that may be employed in the MEMS 10 of FIG. 1, in accordance with certain aspects of the present invention. As with the micromachined mechanical structure of FIGS. 2A-2D and FIGS. 3A-3E, micromachined mechanical structure 12 illustrated in FIGS. 38A-38C includes a transducer 16, which may have electrical charge supplied thereto, stored thereon and/or trapped thereon. The transducer 16 may be any type of transducer, for example, as an energy harvesting device, a sensor (e.g., an accelerometer, a gyroscope, a microphone, a vibration sensor, a pressure sensor, a strain sensor, a tactile sensor, a magnetic sensor and/or a temperature sensor), a resonator, a resonant filter, and/or a combination thereof. In this embodiment, transducer 16 comprises a capacitive transducer, however, the transducer 12 is not limited to such.

In this embodiment, the micromachined mechanical structure 12 includes a transducer 16 including a plurality of mechanical structures disposed on, above and/or in substrate 14, including, for example, first and second electrodes 19, 20. The first and second electrodes 19, and/or other mechanical structures may be comprised of, for example, a semiconductor material, for example, silicon, (whether doped or undoped), germanium, silicon/germanium, silicon carbide, gallium arsenide, and combinations thereof, materials in column IV of the periodic table, for example silicon, germanium, carbon; also combinations of these, for example, silicon germanium, or silicon carbide; also of III-V compounds for example, gallium phosphide, aluminum gallium phosphide, or other III-V combinations; also combinations of III, IV, V, or VI materials, for example, silicon nitride, silicon oxide, aluminum carbide, or aluminum oxide; also metallic silicides, germanides, and carbides, for example, nickel silicide, cobalt silicide, tungsten carbide, or platinum germanium silicide; also doped variations including phosphorus, arsenic, antimony, boron, or aluminum doped silicon or germanium, carbon, or combinations like silicon germanium; also these materials with various crystal structures, including single crystalline, polycrystalline, nanocrystalline, or amorphous; also with combinations of crystal structures, for instance with regions of single crystalline and polycrystalline structure (whether doped or undoped).

The first and second electrodes 19, 20 and/or other mechanical structures may each have any configuration. In the illustrated embodiment, the first electrode 19 includes a fixed mechanical structure 26 and a movable mechanical structure 28 supported thereby. The second electrode 20 is a fixed mechanical structure.

Figure 46A:
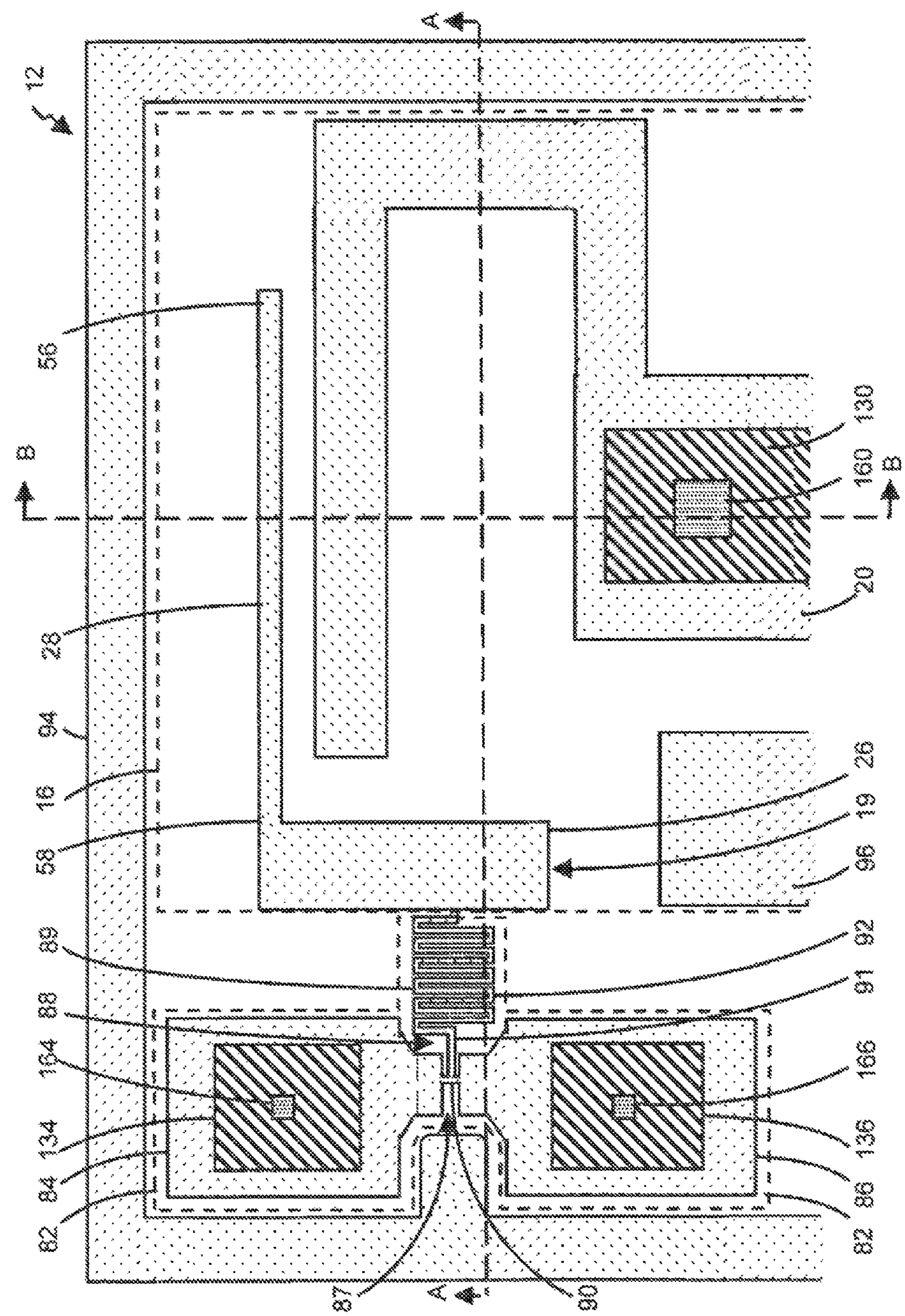
FIG. 46A illustrates a plan view of a portion of another micromachined mechanical structure that may be employed in the MEMS of FIG. 1, in accordance with certain aspects of the present invention.
Figure 46B:
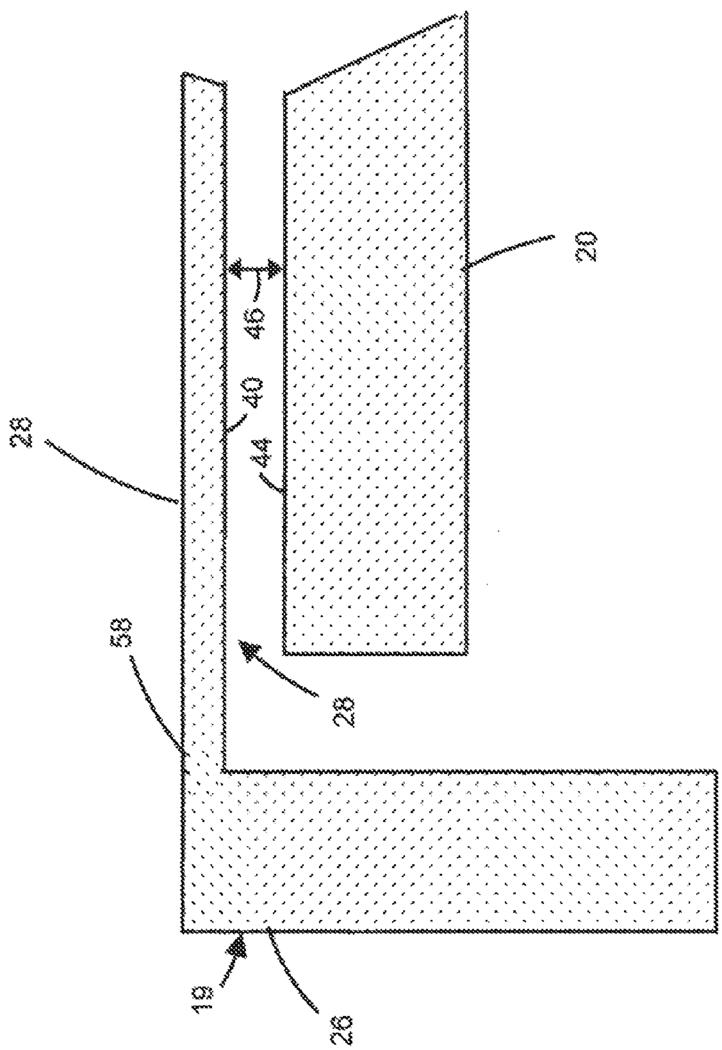
FIG. 46B illustrates an enlarged plan view of a portion of the micromachined mechanical structure of FIG. 46A, in accordance with certain aspects of the present invention.

With reference to FIG. 46B, the movable mechanical structure 28 of the first electrode 19 may include a first surface 40 that faces in a direction toward a first surface 44 of the second electrode 20 and may be spaced therefrom by a first gap 46. Movable mechanical structure 28 of the first electrode 19 may include first and second ends 56, 58. The first end 56 may be free. The second end 58 may connect to the fixed mechanical structure 26.

The first and second electrodes 19, 20 collectively define a capacitance. The magnitude of the capacitance depends (at least in part) on the configurations of the first and second electrodes 19, 20 and on the relative positioning of the first and second electrodes 19, 20.

As further described hereinafter, exposing the micromachined mechanical structure 12 to an excitation (e.g., acceleration, pressure, vibration, strain and/or temperature) causes the movable mechanical structure 28 of the first electrode 19 to move in a direction (e.g., in a lateral direction) that causes a change in the magnitude of the first capacitance.

One or more clearances e.g., clearances 76*a*, 76*b* (FIG. 47A), may be provided between one or more portions of the movable mechanical structure 28 and one or more other portions of the micromachined mechanical structure 12. Such clearances, e.g., clearances 76*a*, 76*b*, may reduce the possibility of friction and/or interference between the movable structure and the one or more other portions of the micromachined mechanical structure 12. In some embodiments, the one or more clearances, e.g., clearances 76*a*, 76*b*, provide clearance around each surface of the movable mechanical structure 28 except at end 58 where the movable mechanical structure 28 connects to the fixed mechanical structure 26, such that the movable structure is suspended from the fixed mechanical structure 26.

The micromachined mechanical structure 12 further includes one or more mechanical structures 82 disposed on, above and/or in substrate 14, for use in supplying, storing and/or trapping electrical charge on the first electrode 19

(and/or any other portion(s) of the micromachined mechanical structure 12 on which charge is to be stored). The one or more mechanical structures 82 may have any configuration. In this embodiment, the one or more mechanical structures 82 include a first electrode 84, a second electrode 86 and a breakable link 88. The first and second electrodes 84, 86 and breakable link 88 may each have any configuration. In the illustrated embodiment, for example, the first and second electrodes 84, 86 and breakable link 88 have configurations that are similar to that of the first and second electrodes 84, 86 and breakable link 88, respectively, of the one or more mechanical structures 82 illustrated in FIGS. 2A-2D and FIGS. 3A-3E.

Figure 47A:
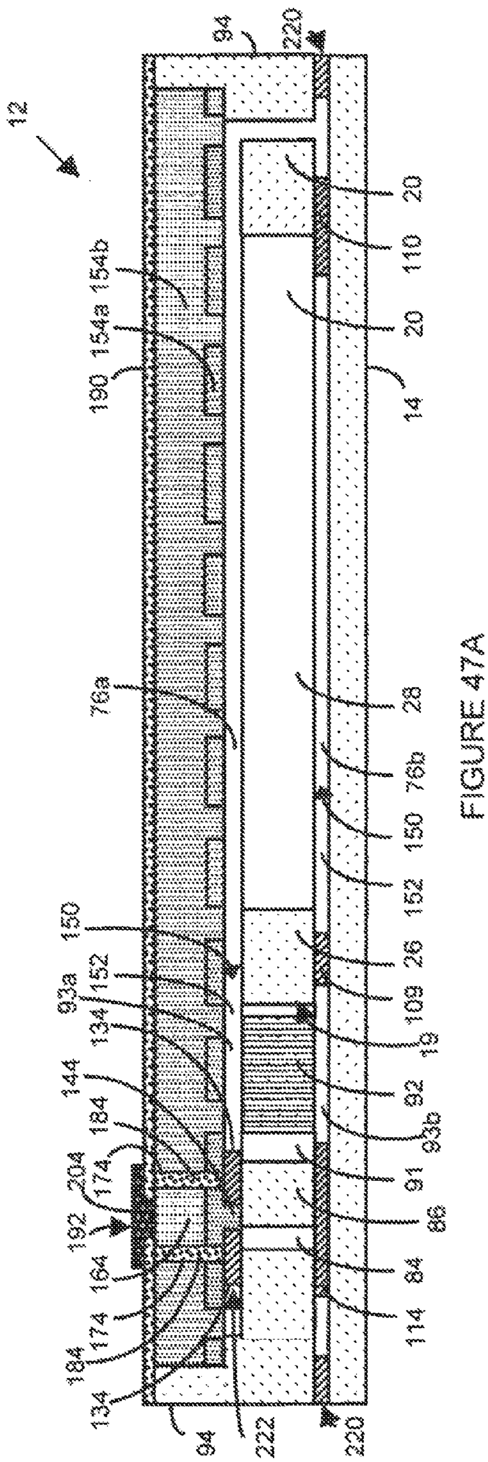
FIG. 47A illustrates a cross-sectional view (taken in the direction A-A of FIG. 46A) of the portion of the micromachined mechanical structure of FIG. 46A and one embodiment of an encapsulation structure that may be employed therewith, in accordance with certain aspects of the present invention.
Figure 47B:
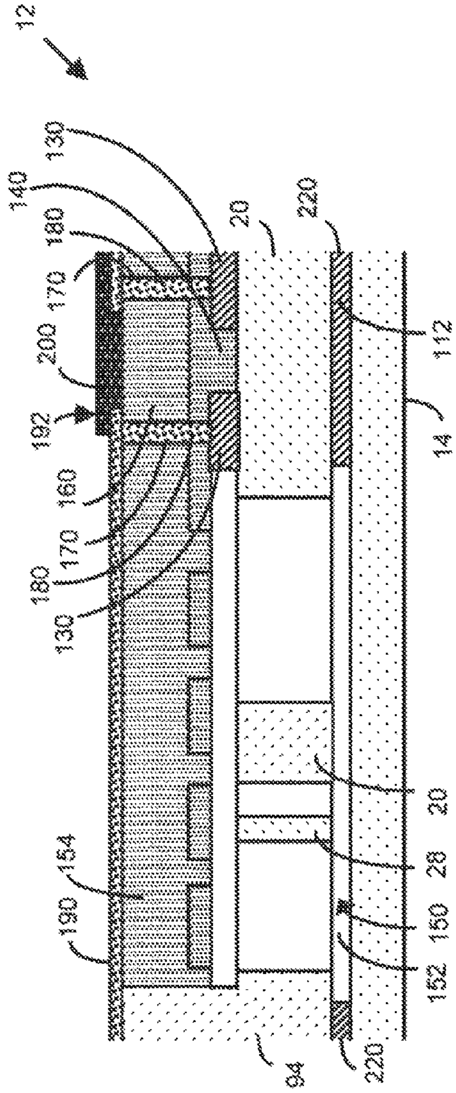
FIG. 47B illustrates a cross-sectional view (taken in the direction B-B of FIG. 46A) of the portion of the micromachined mechanical structure of FIG. 46A and one embodiment of an encapsulation structure that may be employed therewith, in accordance with certain aspects of the present invention.

With reference to FIG. 47B, as stated above, the micromachined mechanical structure 12 further defines a chamber 150 having an atmosphere 152 "contained" therein. The chamber 150 may be formed, at least in part, by one or more encapsulation layer(s) 154. In some embodiments, one or more of the one or more encapsulation layer(s) 154 are formed using one or more of the encapsulation techniques described and illustrated in the Microelectromechanical Systems Having Trench Isolated Contacts Patent, the entire contents of which, including, for example, the features, attributes, alternatives, materials, techniques and advantages of all of the inventions, are incorporated by reference herein, although, unless stated otherwise, the aspects and/or embodiments of the present invention are not limited to such features, attributes alternatives, materials, techniques and advantages.

Electrical charge may supplied to, stored on and/or trapped on one or more portions of first electrode 19, for example, using the stages of the embodiment described above with respect to FIGS. 6A-6D to supply, store and/or trap electrical charge on the electrode 19 of the micromachined mechanical structure 12 illustrated in FIGS. 2A-2D and FIGS. 3A-3E.

The charge stored on the first electrode 19 results in a voltage across the capacitance (e.g., defined by the second electrode 20 and the first electrode 19).

Figure 48A:
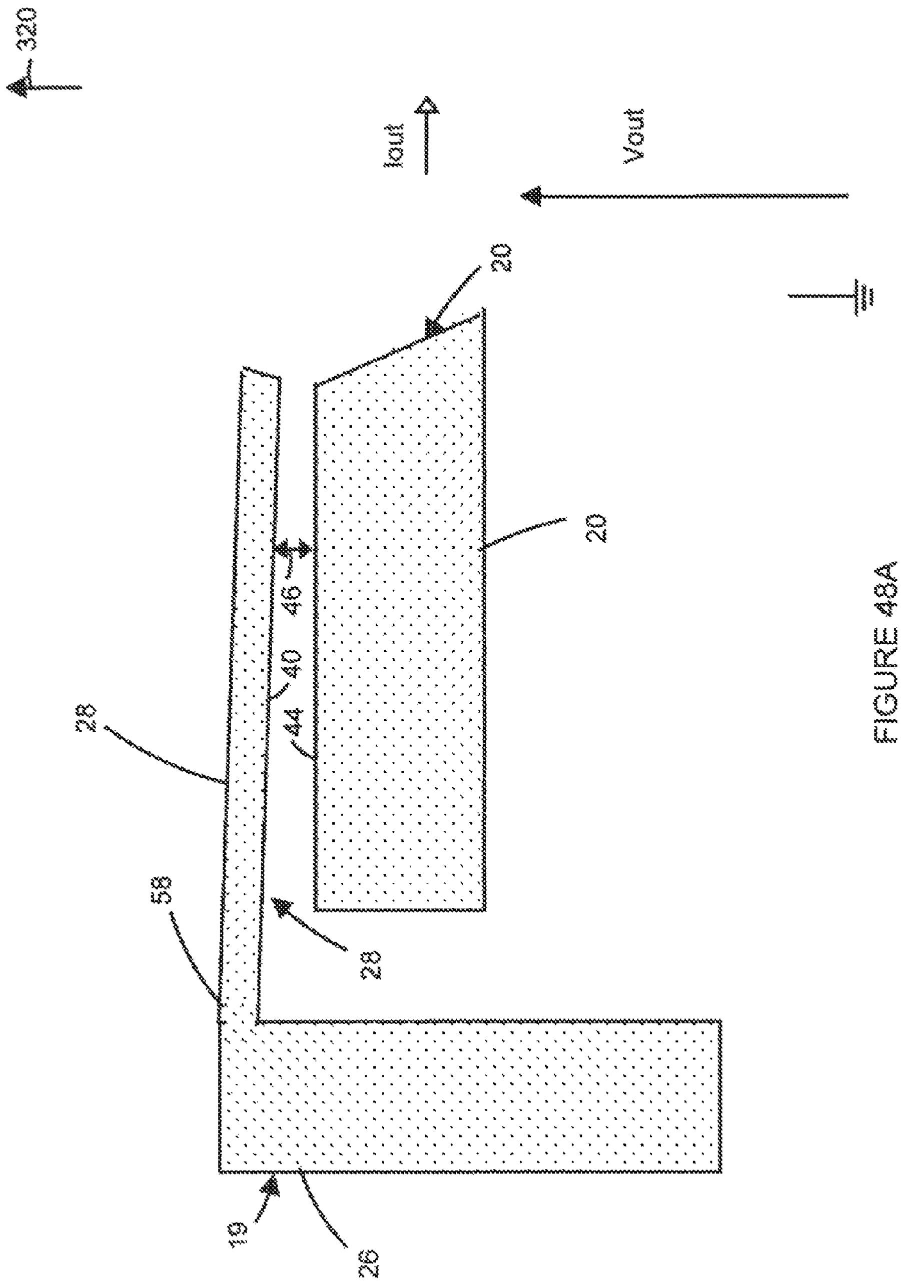
FIGS. 48A-48B illustrate plan views of the portion of micromachined mechanical structure of FIG. 46A, showing stages that may be employed in the operation of the micromachined mechanical structure of FIGS. 46A-46B and FIGS. 47A-47B, according to certain aspects of the present invention.

With reference to FIG. 48A, providing an excitation (e.g., acceleration, pressure, vibration, strain and/or temperature) having a lateral component, e.g., lateral component 320, causes the movable mechanical structure 28 of electrode 19 to begin to move in a lateral direction. For example, if the lateral component 320 is directed away from the second electrode 20, the movable mechanical structure 28 begins to move in a direction toward the second electrode 20, as shown, such that the size of the first gap 46 decreases. The decrease in the size of the first gap 46 causes an increase in the magnitude of the first capacitance (e.g., defined by the second electrode 20 and first electrode 19) and an electrical current out of the second electrode 20, thereby decreasing the voltage of the first electrode and increasing the charge differential and the voltage differential across the first capacitance.

Figure 48B:
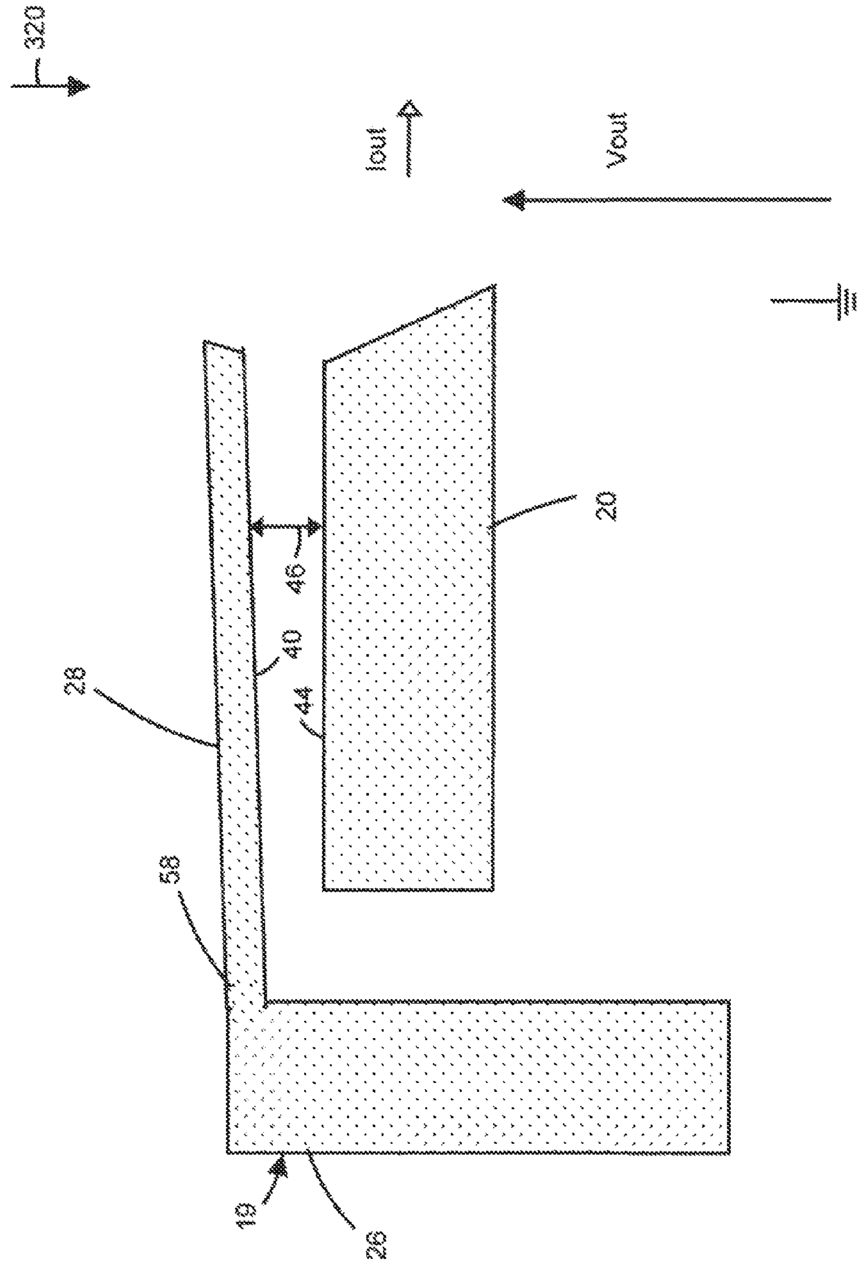

With reference to FIG. 48B, if the lateral component 320 is directed toward the second electrode 20, the movable mechanical structure 28 begins to move in a direction 324 away from the second electrode 20, such that the size of the first gap 46 increases. The increase in the size of the first gap 46 causes a decrease in the magnitude of the first capacitance (e.g., defined by the second electrode 20 and first electrode 19) and an electrical current into the second electrode 20, which in turn decreases the charge across the first capacitance.

If the transducer 16 is employed as an energy harvesting device, one or more portions of the electrical energy generated by the transducer 16 may be supplied, directly and/or indirectly, to one or more circuits and/or devices, and/or used, directly and/or indirectly, in powering one or more portions of one or more circuits and/or devices. For example, one or more of the voltages and/or one or more of the currents generated by the transducer 16 may be supplied, directly or indirectly, to one or more circuits and/or devices 326, and/or used, directly and/or indirectly, in powering one or more portions of one or more circuits and/or devices 326.

If the transducer 16 is employed as a sensor (e.g., a vibration sensor and/or accelerometer), one or more portions of the electrical energy generated by the transducer 16 may be supplied, directly and/or indirectly, to one or more circuits and/or devices, and/or used directly and/or indirectly, as an indication of one or more physical quantities (e.g., vibration and/or acceleration) sensed by the transducer 16. For example, one or more of the electrical signals (e.g., one or more of the voltages (e.g., the voltage across the first and/or second capacitance) generated by the transducer 16 and/or one or more of the currents (e.g., the current into and/or out of the first and/or second electrodes 19,20)) generated by the transducer 16, may be supplied, directly or indirectly, to one or more circuits and/or devices and/or employed as an indication of the one or more physical quantities (e.g., vibration and/or acceleration) sensed by the transducer 16.

The amount of the movement observed in the movable structure of the first electrode 19 may depend at least in part on the magnitude of the excitation (e.g., vibrational energy) applied to the micromachined mechanical structure 12.

The micromachined mechanical structure 12 may be fabricated using one or more of the methods disclosed herein and/or any other suitable technique.

FIGS. 49A-49J and FIGS. 50A-50J illustrate cross-sectional views of an exemplary embodiment of the fabrication of the portion of MEMS of FIGS. 46A-46B and FIGS. 47A-47B, including encapsulation that may be employed therewith, at various stages of the process, according to certain aspects of the present invention.

Figure 49A:
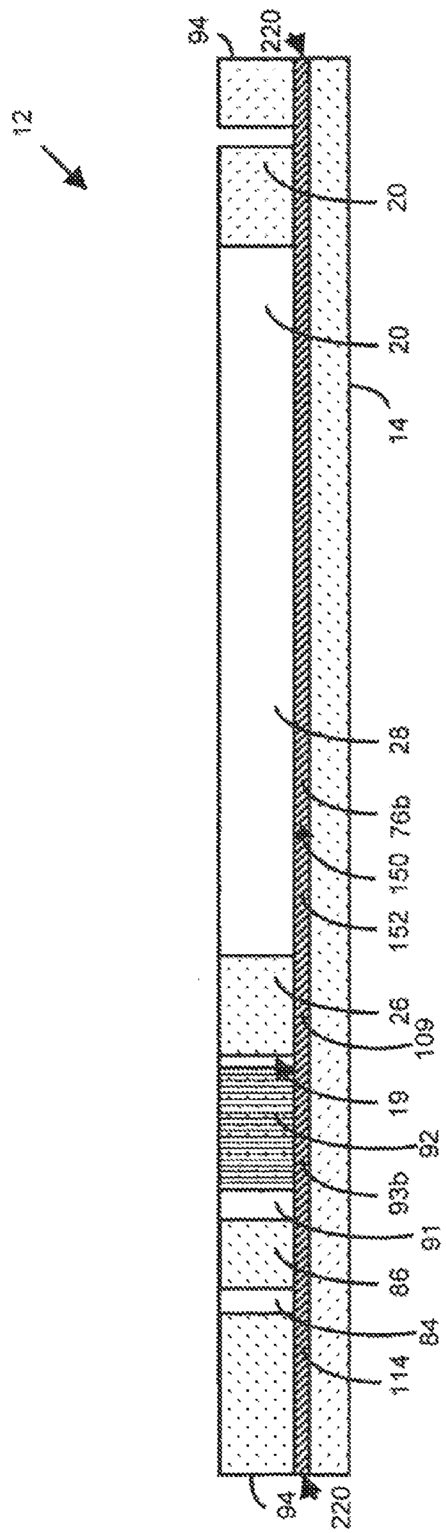
FIGS. 49A-49J illustrate cross-sectional views (taken in the direction A-A of FIG. 46A) of one embodiment of the fabrication of the portion of the micromachined mechanical structure of FIGS. 46A-46B and FIGS. 47A-47B including one embodiment of an encapsulation that may be employed therewith, at various stages of the process, according to certain aspects of the present invention.
Figure 49B:
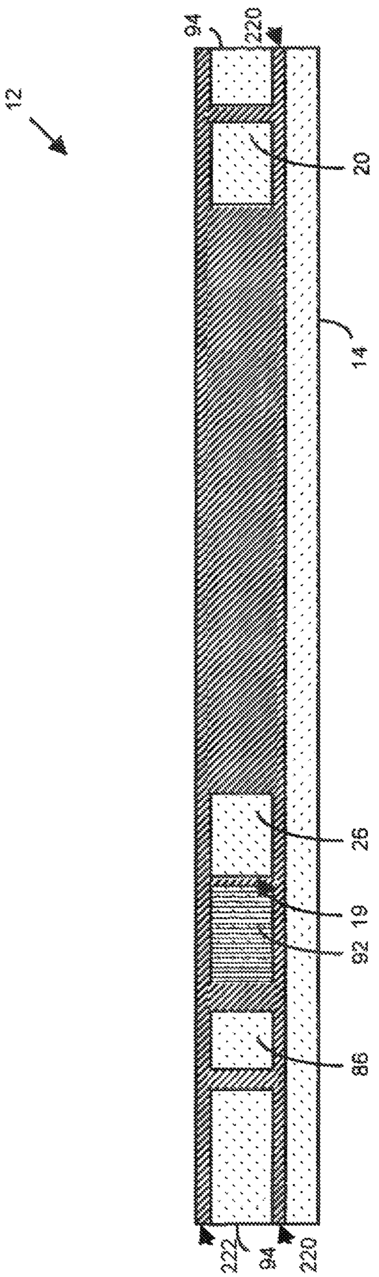
Figure 49C:
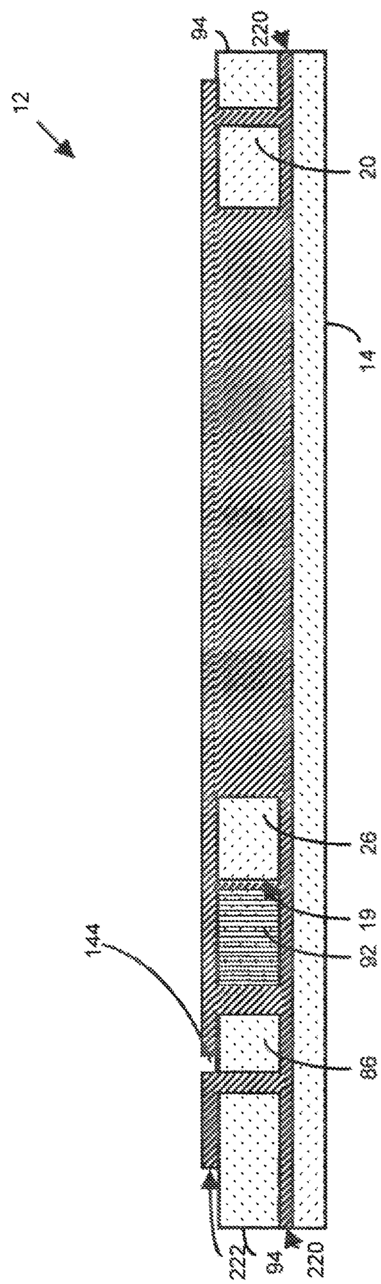
Figure 49D:
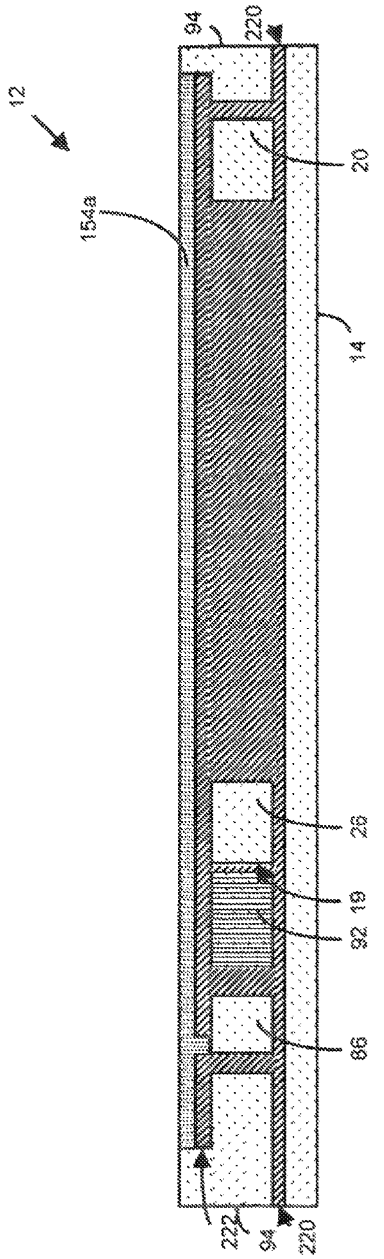
Figure 49E:
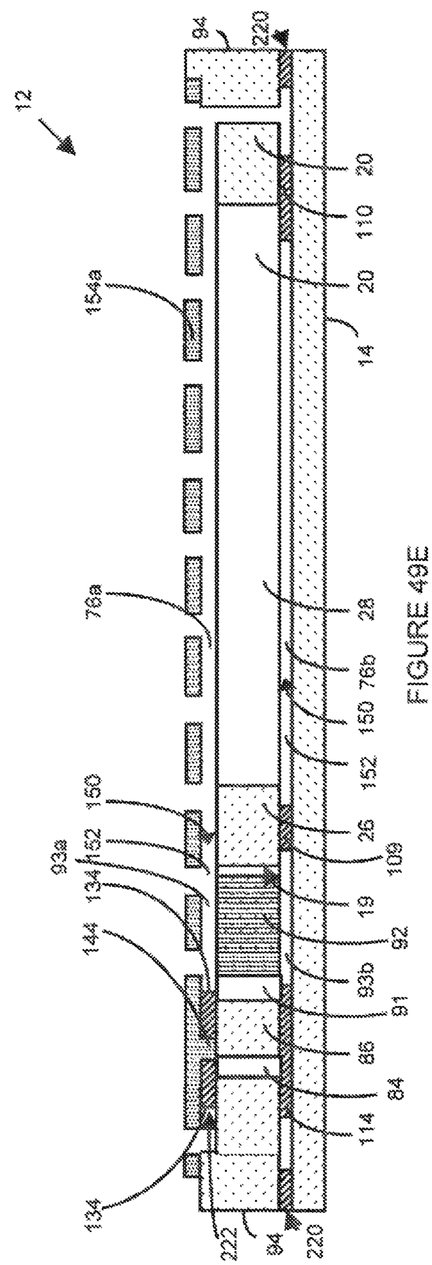
Figure 49F:
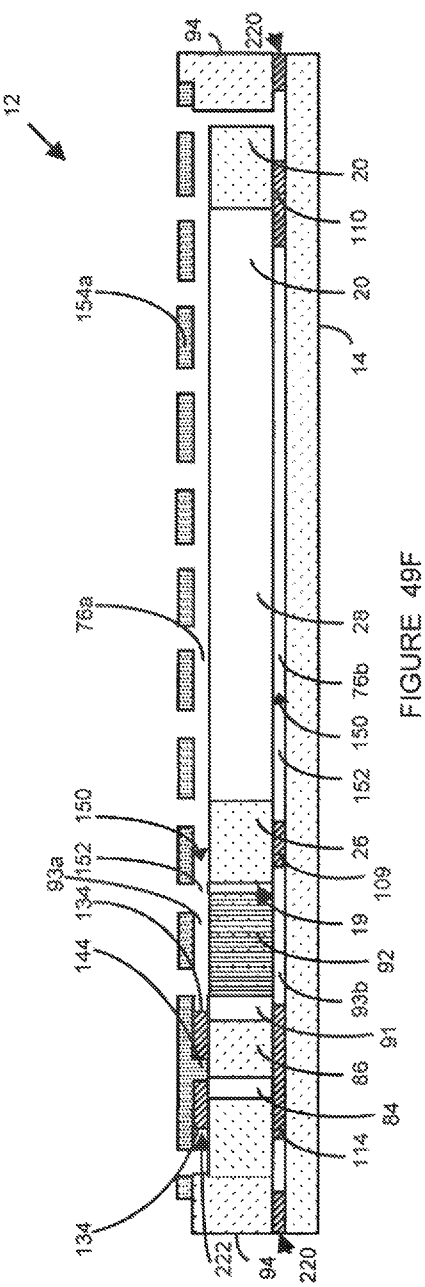
Figure 49G:
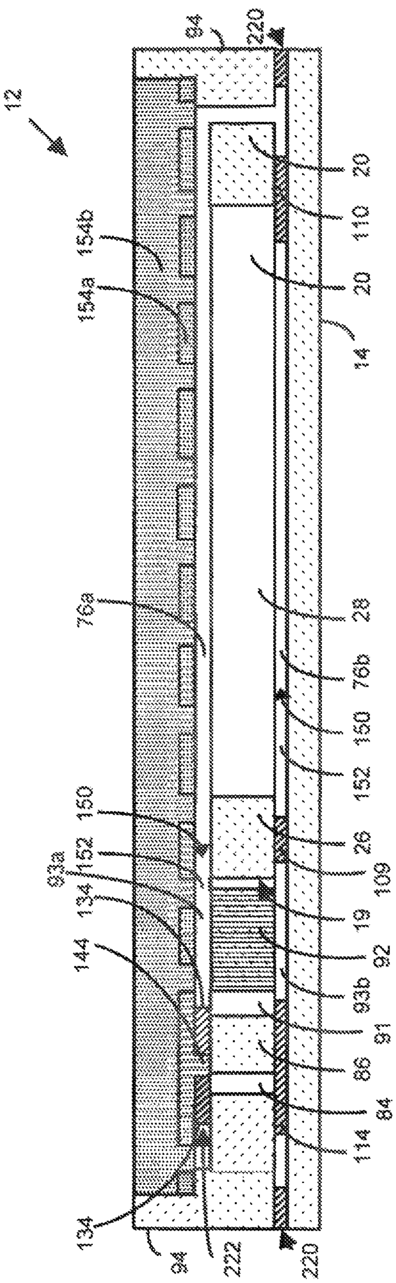
Figure 49H:
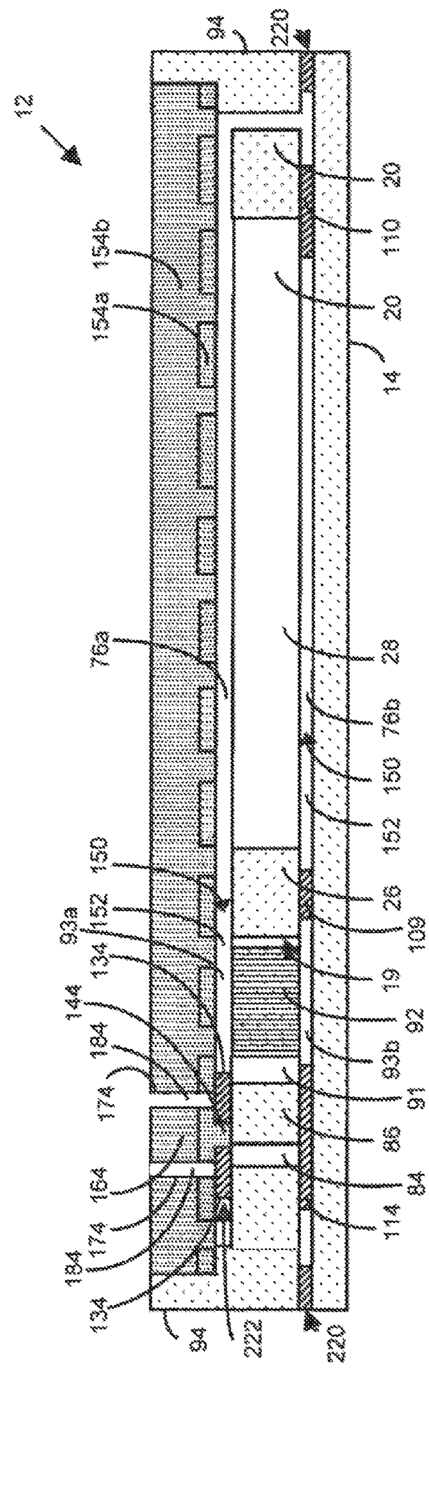
Figure 49I:
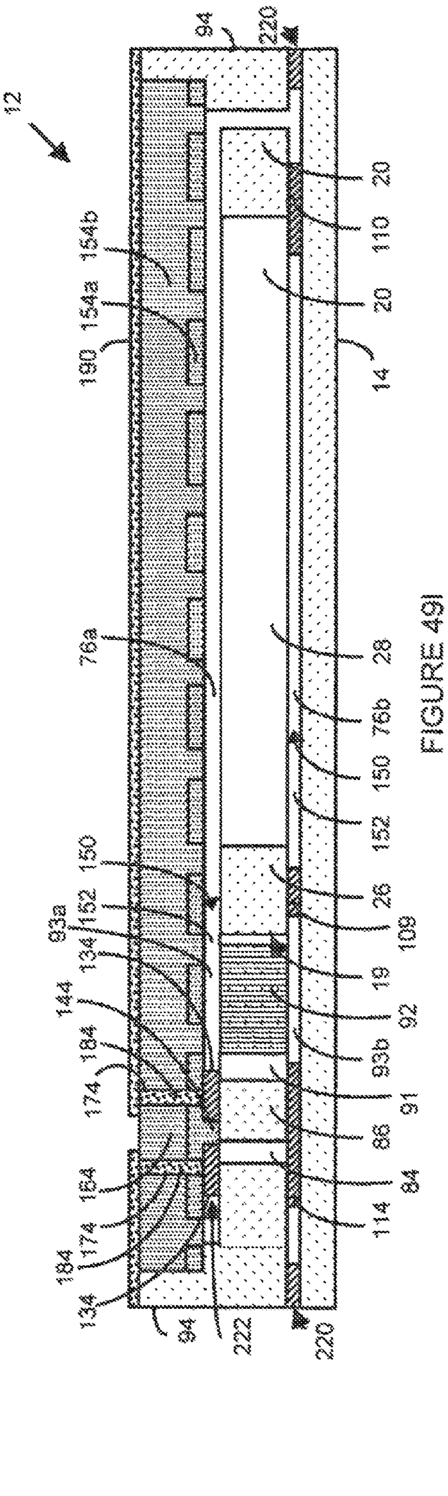
Figure 49J:
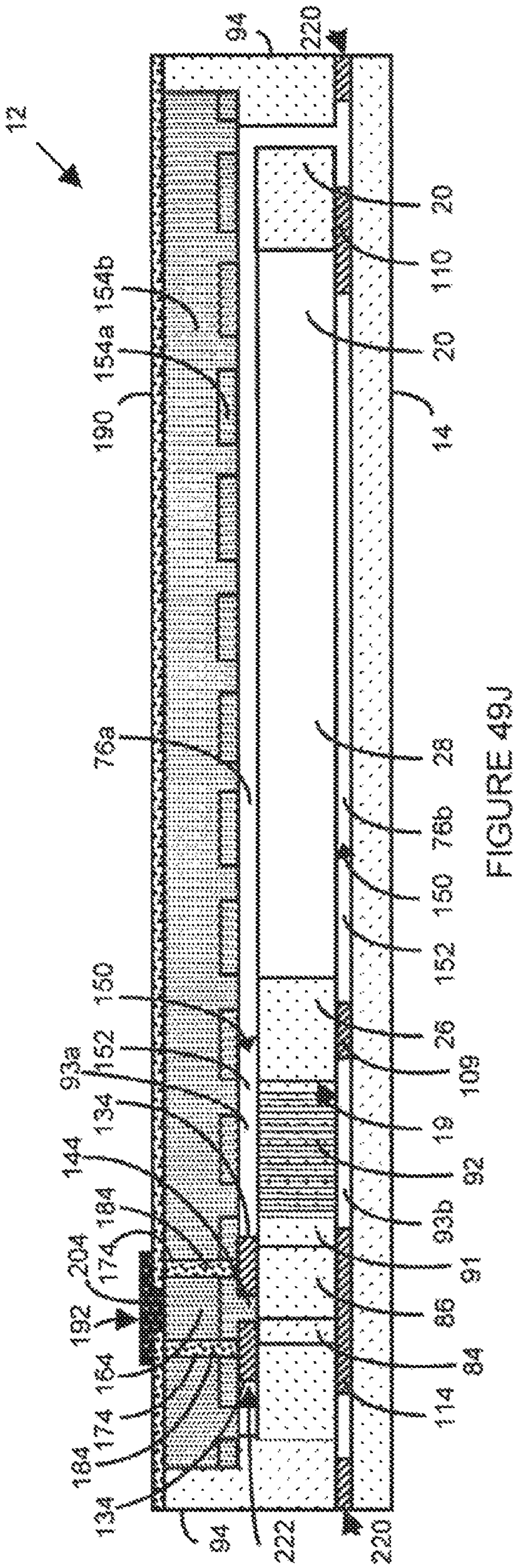
Figure 50A:
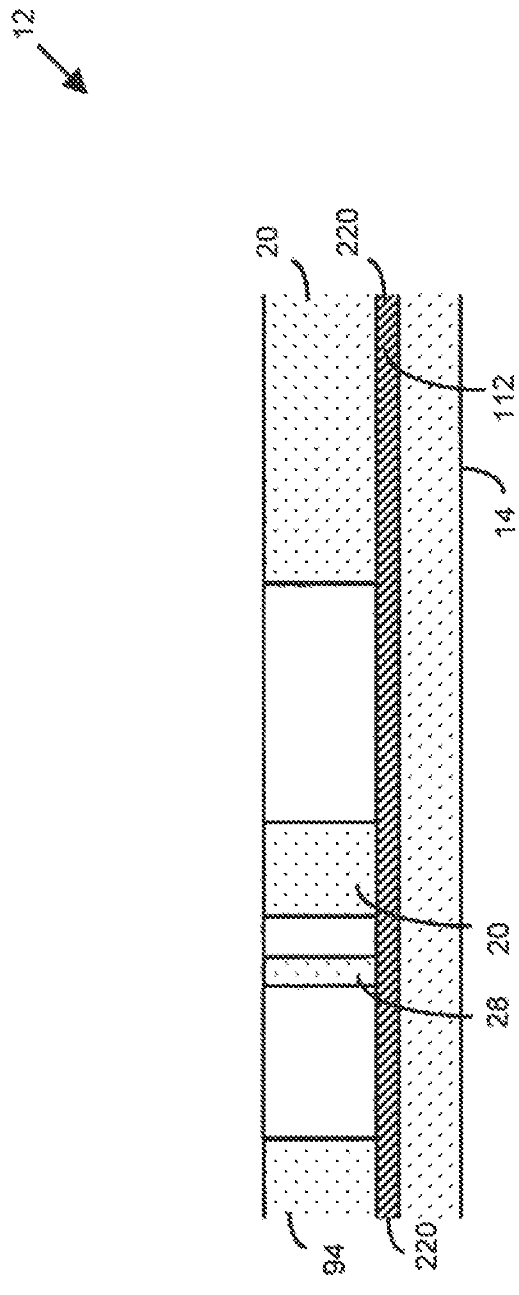
FIGS. 50A-50J illustrate cross-sectional views (taken in the direction B-B of FIG. 46A) of one embodiment of the fabrication of the portion of the micromachined mechanical structure of FIGS. 46A-46B and FIGS. 47A-47B including one embodiment of an encapsulation that may be employed therewith, at various stages of the process, according to certain aspects of the present invention.
Figure 50B:
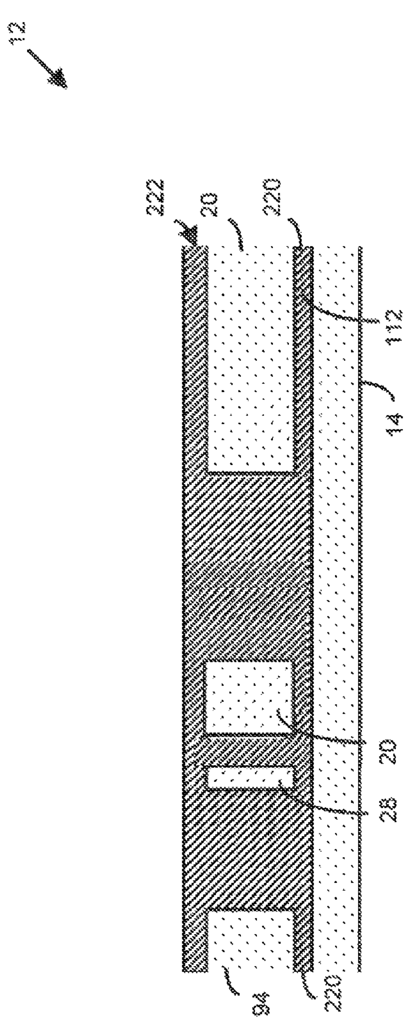
Figure 50C:
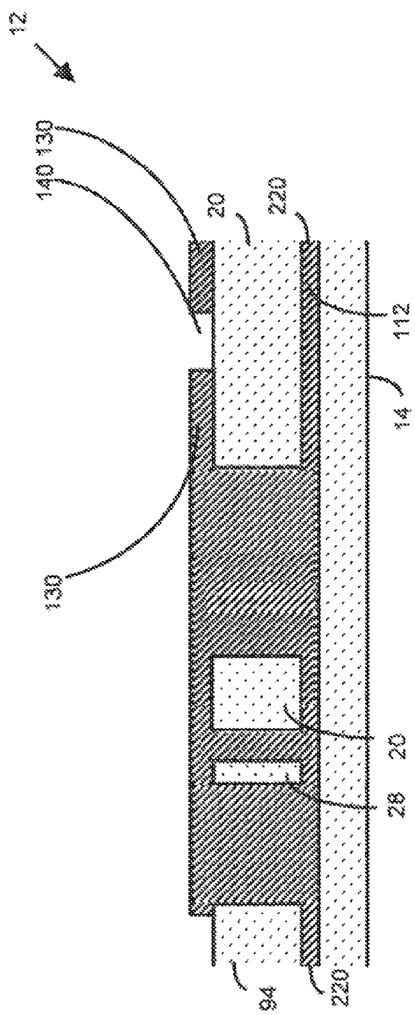
Figure 50D:
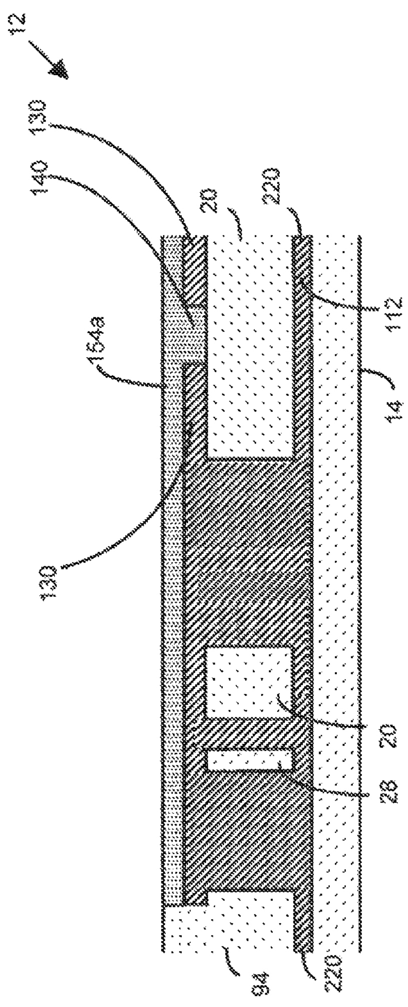
Figure 50E:
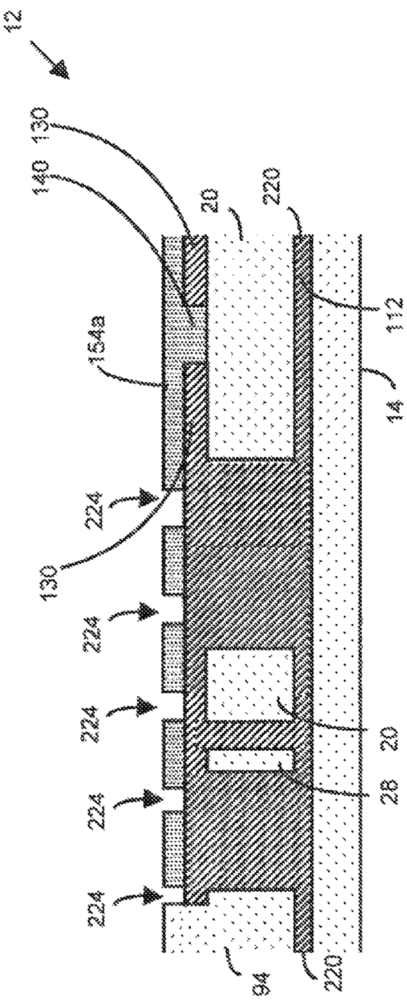
Figure 50F:
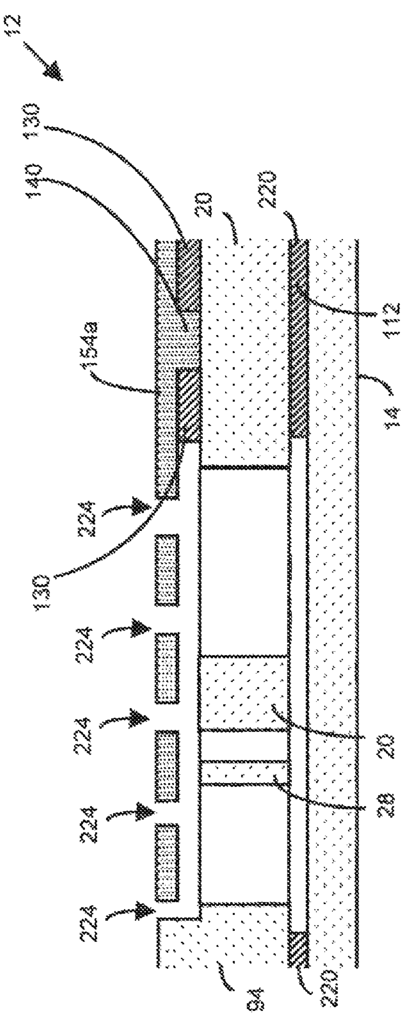
Figure 50G:
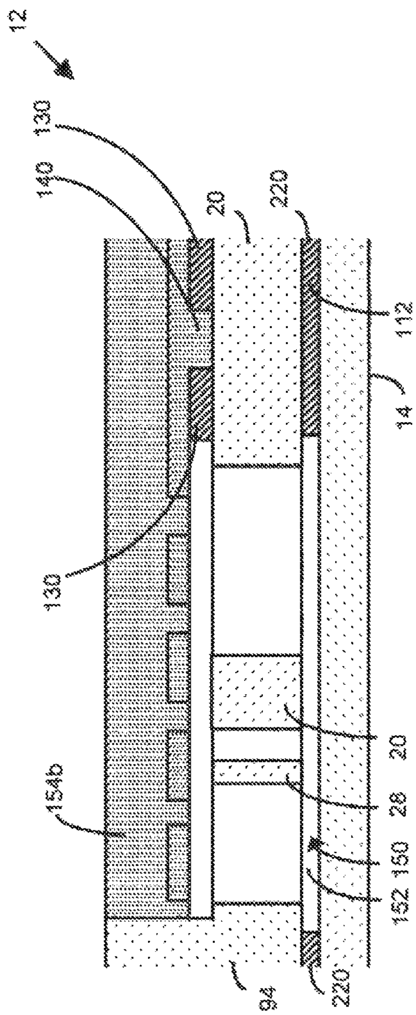
Figure 50H:
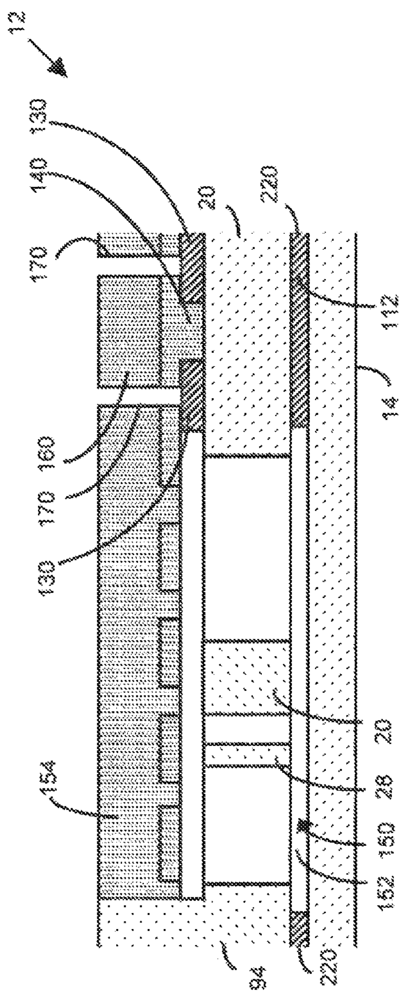
Figure 50I:
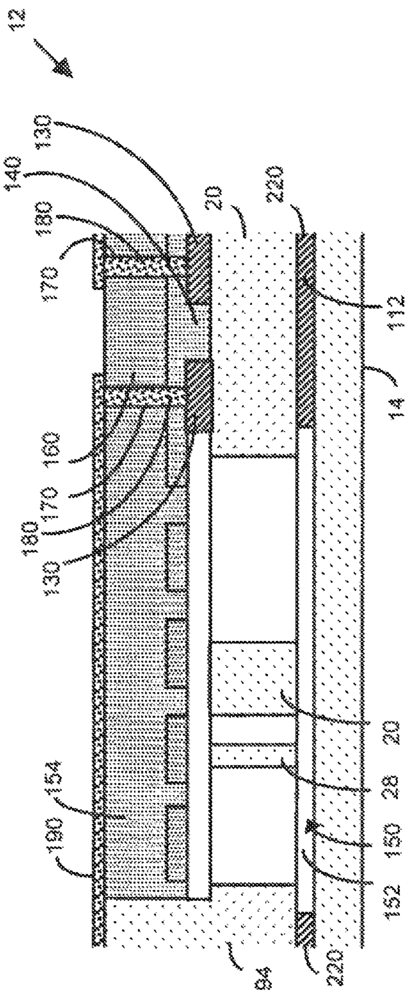
Figure 50J:
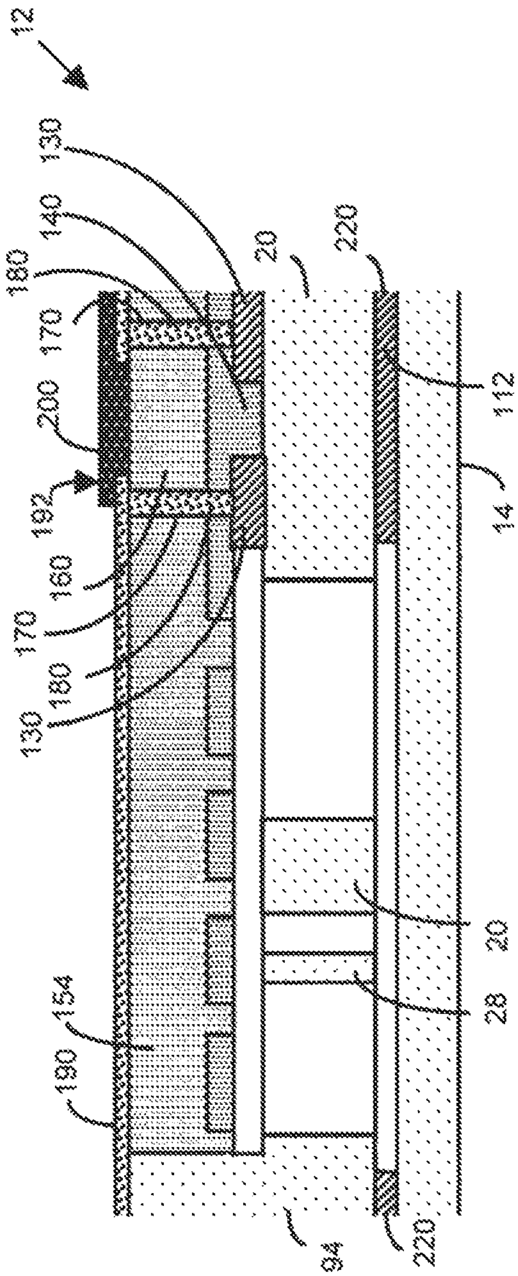

With reference to FIG. 49A and FIG. 50A, in the exemplary embodiment, fabrication of MEMS 10 having micromachined mechanical structure 12 with transducer 16 may begin with an SOI substrate partially formed device including mechanical structures, e.g., electrodes 84, 86, and electrodes 19, 20, disposed on a first sacrificial layer 220, for example, silicon dioxide or silicon nitride. The mechanical structures, e.g., electrodes 84, 86, and electrodes 19, 20, may be formed using well-known deposition, lithographic, etching and/or doping techniques as well as from well-known materials (for example, semiconductors such as silicon, germanium, silicon-germanium or gallium-arsenide).

Thereafter, the processing of MEMS 10 may proceed in the same manner as described above with respect to FIGS. 4B-4J. In this regard, an exemplary fabrication process of MEM 10 including transducer 16 is illustrated in FIGS. 49A-49J and FIGS. 50B-50J. Because the processes are substantially similar to the discussion above with respect to FIGS. 4B-4J, for the sake of brevity, that discussion will not be repeated.

As stated above, some embodiments of the present invention may be implemented in conjunction with one or more of the thin film encapsulation techniques described and illustrated in Microelectromechanical Systems and Method of Encapsulating Patent Application Publication incorporated by reference herein. In this regard, any and all of the embodiments described herein may employ one or more of the structures and/or techniques disclosed in the Microelectromechanical Systems and Method of Encapsulating Patent Application Publication. The present invention may also be employed in conjunction with wafer-bonding encapsulation techniques.

Figure 51:
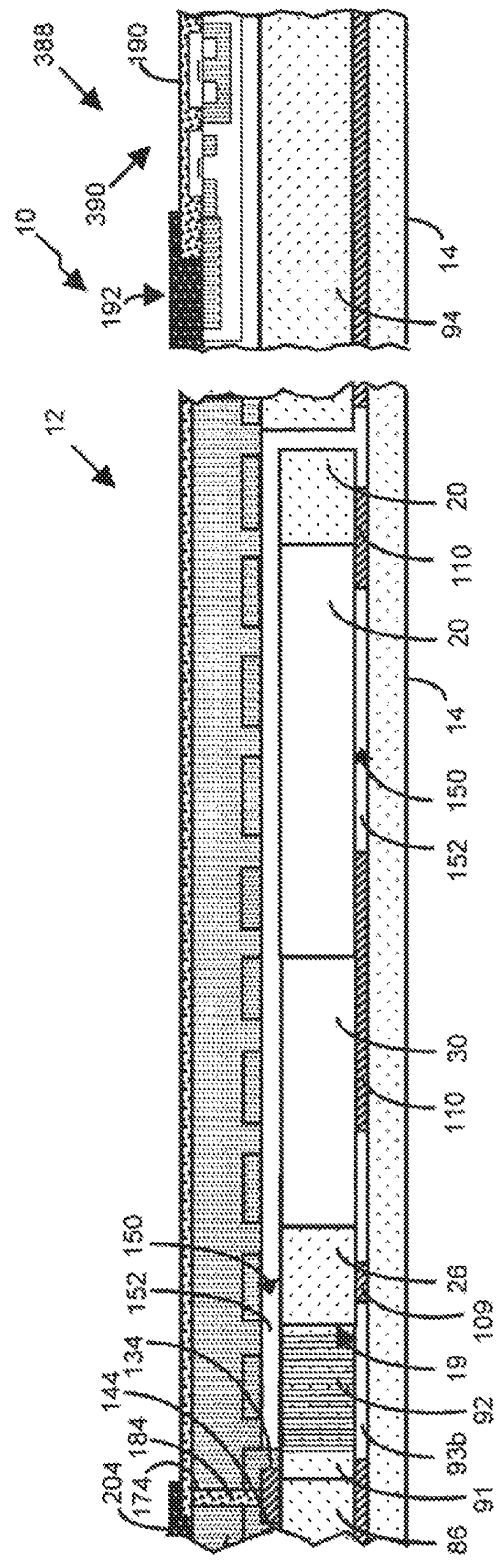
FIG. 51 illustrates a cross-sectional view of a MEMS according to certain aspects of the present inventions, including the portion of the micromachined mechanical illustrated in FIG. 46A (cross sectional view thereof taken in the direction A-A of FIG. 46A) and an integrated circuit portion, both portions of which are disposed or integrated on or in a common substrate.

As also stated above, MEMS 10 may include one or more other circuits and/or devices, e.g., other circuits and/or devices 226, 330 (FIGS. 10A-10L), charge storing circuit 332 (FIGS. 10B-10E, 10K-10L), DC/DC converter circuit 362 (FIGS. 10E-10G, 10L), data processing electronics 386 (FIG. 11 and FIGS. 12A-12D) and/or interface circuitry 388 (FIG. 11A and FIGS. 12A-12D). For example, with reference to FIG. 51, integrated circuits 390 may be fabricated using conventional techniques after definition of mechanical structure 12 using, for example, the techniques described and illustrated in Microelectromechanical Systems and Method of Encapsulating Patent Application Publication and/or Microelectromechanical Systems Having Trench Isolated Contacts Patent.

Figure 52A:
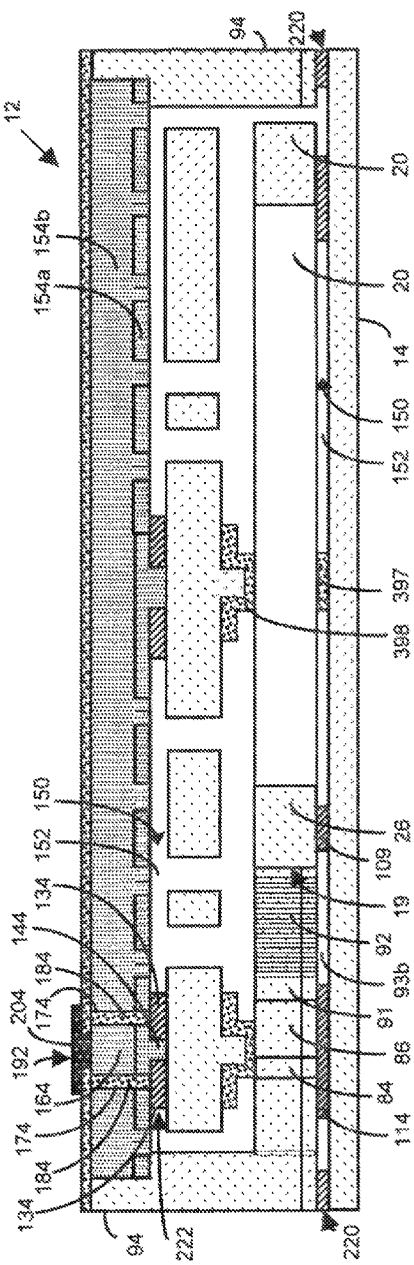
FIGS. 52A-52B illustrate cross-sectional views of micromechanical structures, which may be monolithically integrated on or within the substrate of a MEMS, in accordance with certain aspects of the present invention.
Figure 52B:
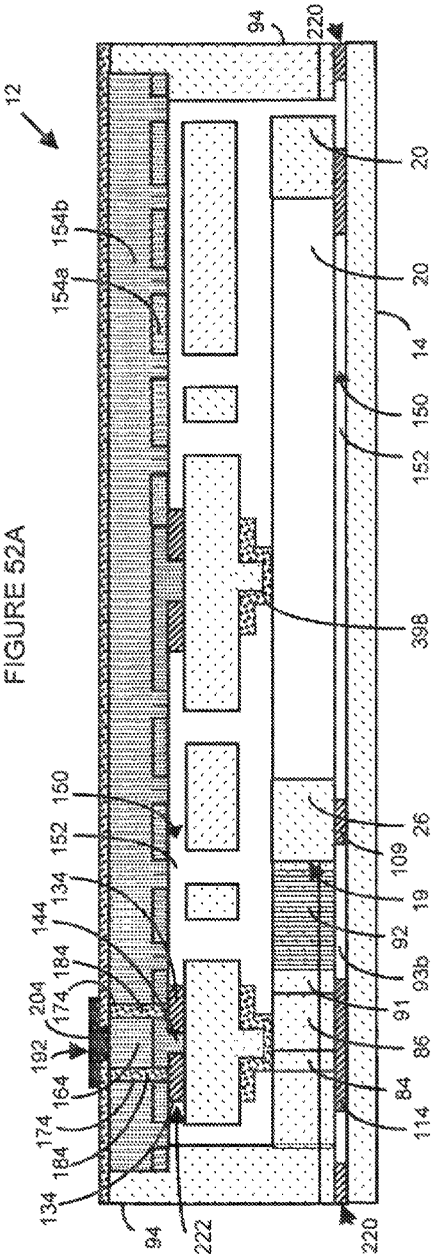
Figure 53:
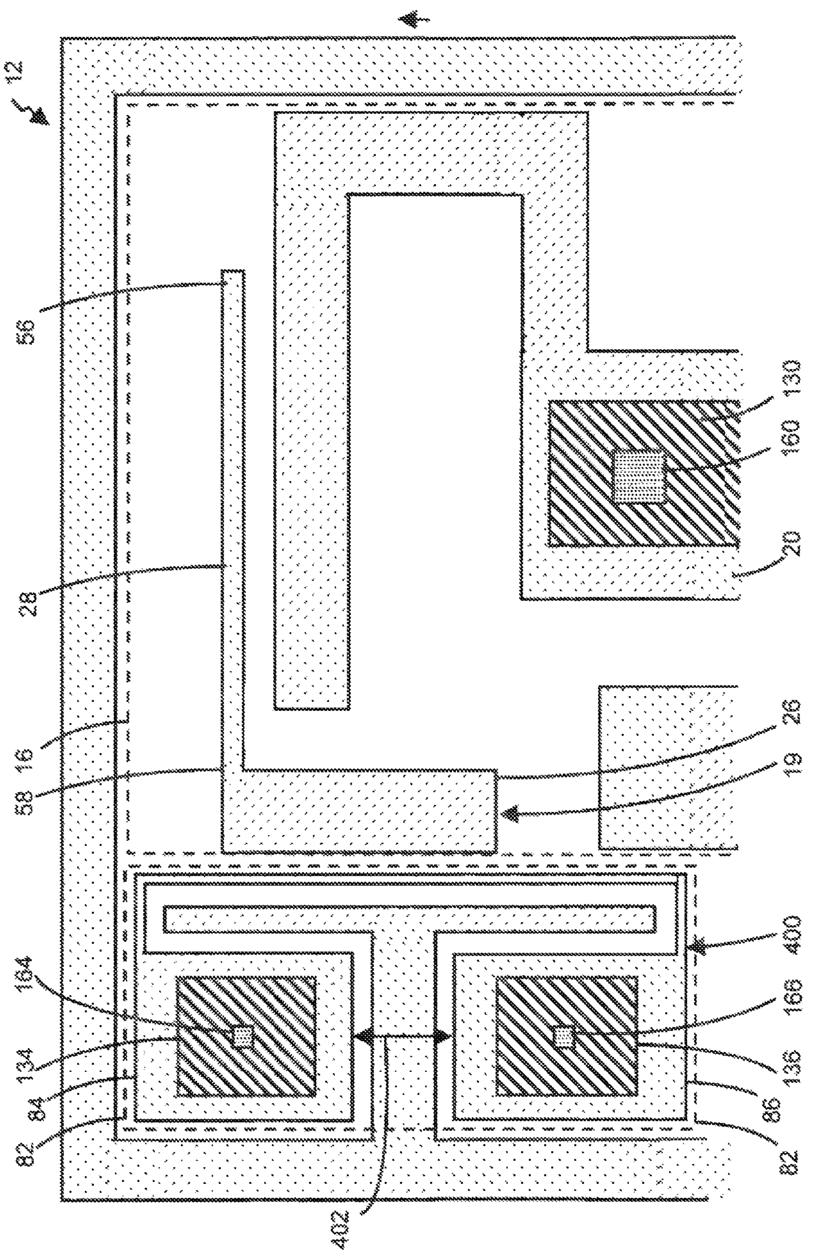
FIG. 53 illustrates a plan view of a portion of another micromachined mechanical structure that may be employed in the MEMS of FIG. 1, in accordance with certain aspects of the present invention.
Figure 54:
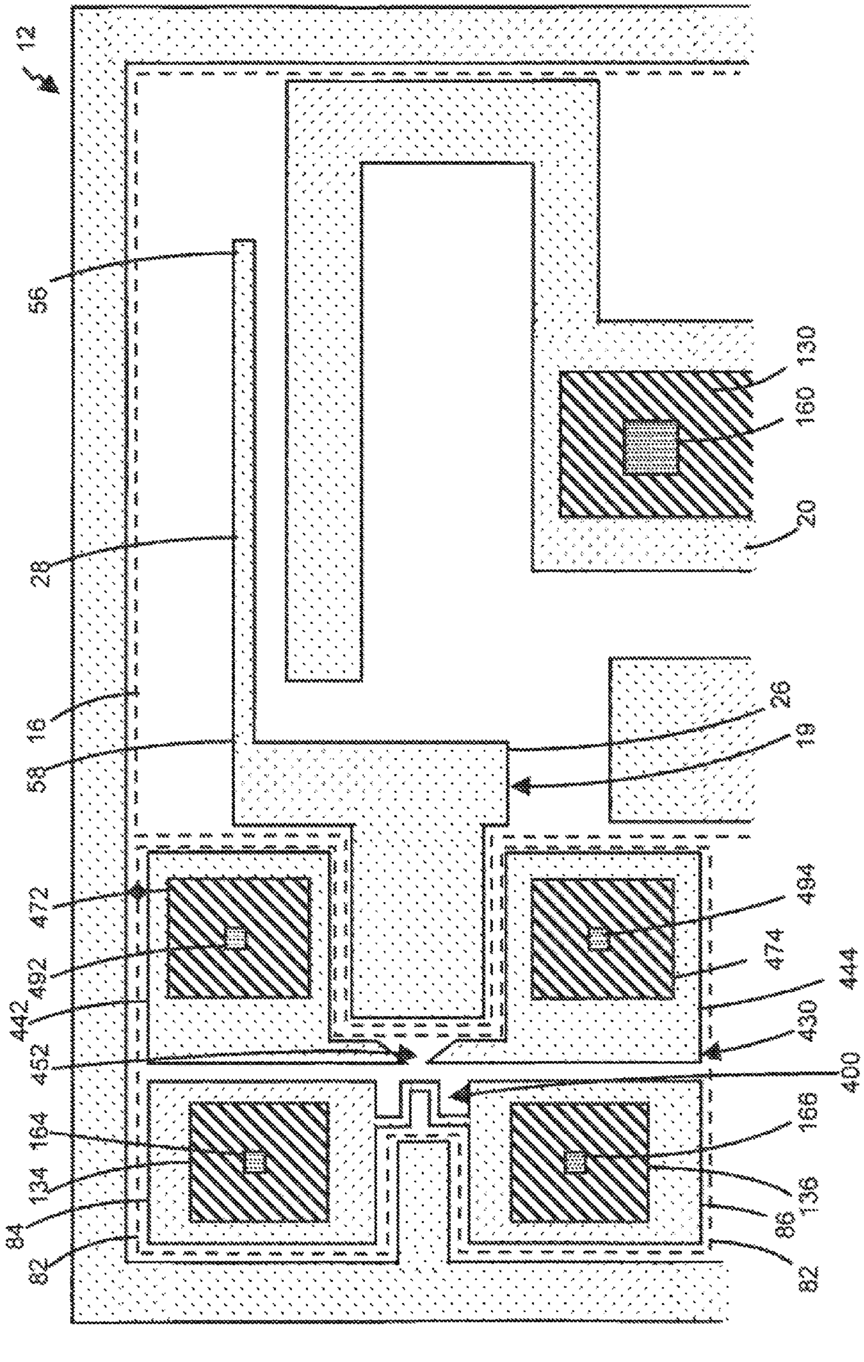
FIG. 54 illustrates a plan view of a portion of another micromachined mechanical structure that may be employed in the MEMS of FIG. 1, in accordance with certain aspects of the present invention.
Figure 55:
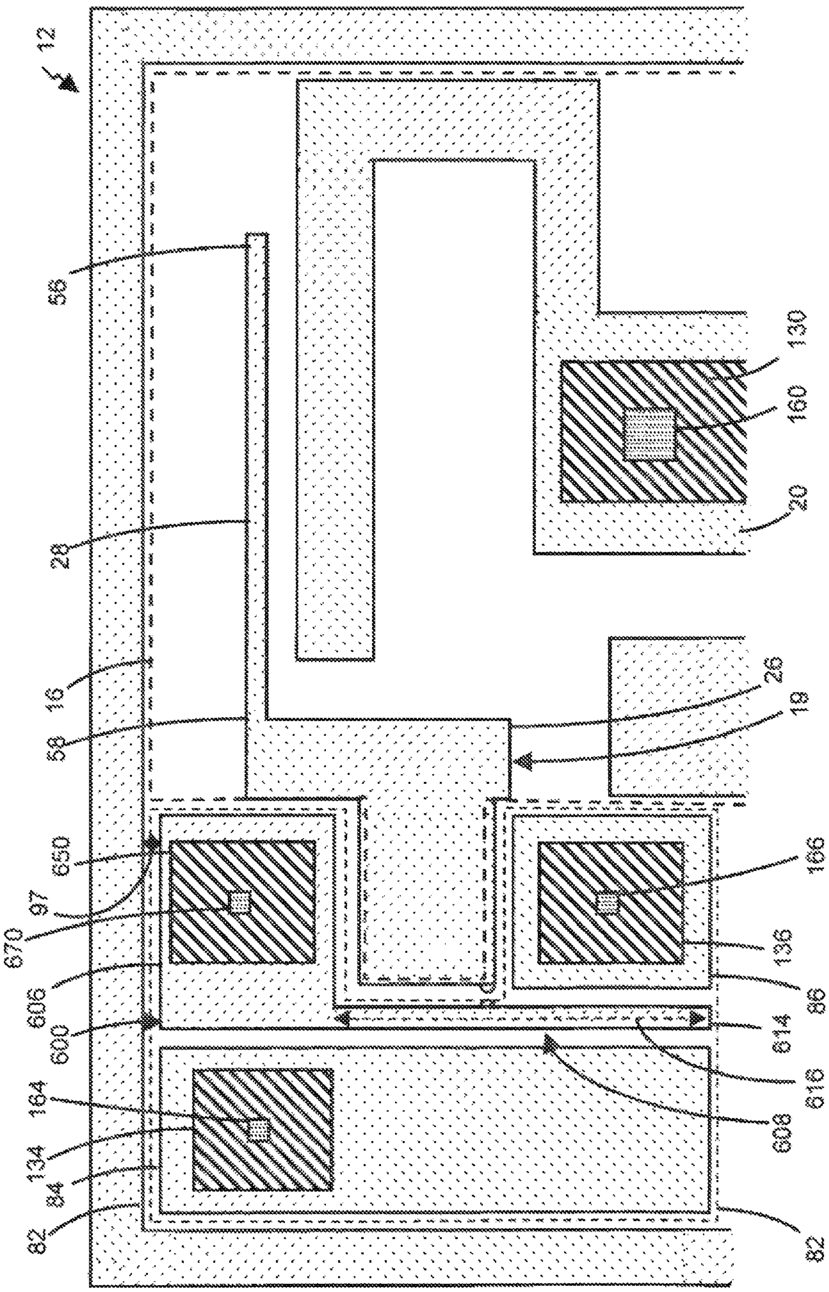
FIG. 55 illustrates a plan view of a portion of another micromachined mechanical structure that may be employed in the MEMS of FIG. 1, in accordance with certain aspects of the present invention.

Further, the various structures of the micromachined mechanical structure 12 may have any orientation including longitudinal, lateral, vertical any combination thereof. As stated above, any of the embodiments and/or techniques described herein may be implemented in conjunction with micromachined mechanical structures 12 having one or more transducers or sensors which may themselves include multiple layers that are vertically and/or laterally stacked or interconnected as illustrated in Microelectromechanical Systems and Method of Encapsulating Patent Application Publication and/or Microelectromechanical Systems Having Trench Isolated Contacts Patent, each of which is incorporated by reference herein. Accordingly, any and all of the inventions and/or embodiments illustrated and described herein may be implemented in, and/or employed in conjunction with, any of the embodiments of Microelectromechanical Systems and Method of Encapsulating Patent Application Publication and/or Microelectromechanical Systems Having Trench Isolated Contacts Patent that include multiple layers of mechanical structures, contacts areas and buried contacts that are vertically and/or laterally stacked or interconnected (see, for example, FIGS. 52A and 52B).

Moreover, the present inventions may implement the anchors and techniques of anchoring mechanical structures 16 to substrate 14 (as well as other elements of MEMS 10) described and illustrated in the Anchors for Microelectromechanical Systems Patent, which is incorporated by reference herein. Accordingly, any and all of the inventions and/or embodiments illustrated and described herein may be implemented in, and/or employed in conjunction with, any of the embodiments described and illustrated in the Anchors for Microelectromechanical Systems Patent, implemented in conjunction with the inventions described and illustrated herein (see, for example, FIGS. 52A and 52B).

As stated above, each of the embodiments set forth herein may be employed alone and/or in combination with one or more other embodiments set forth herein.

Figure 56:
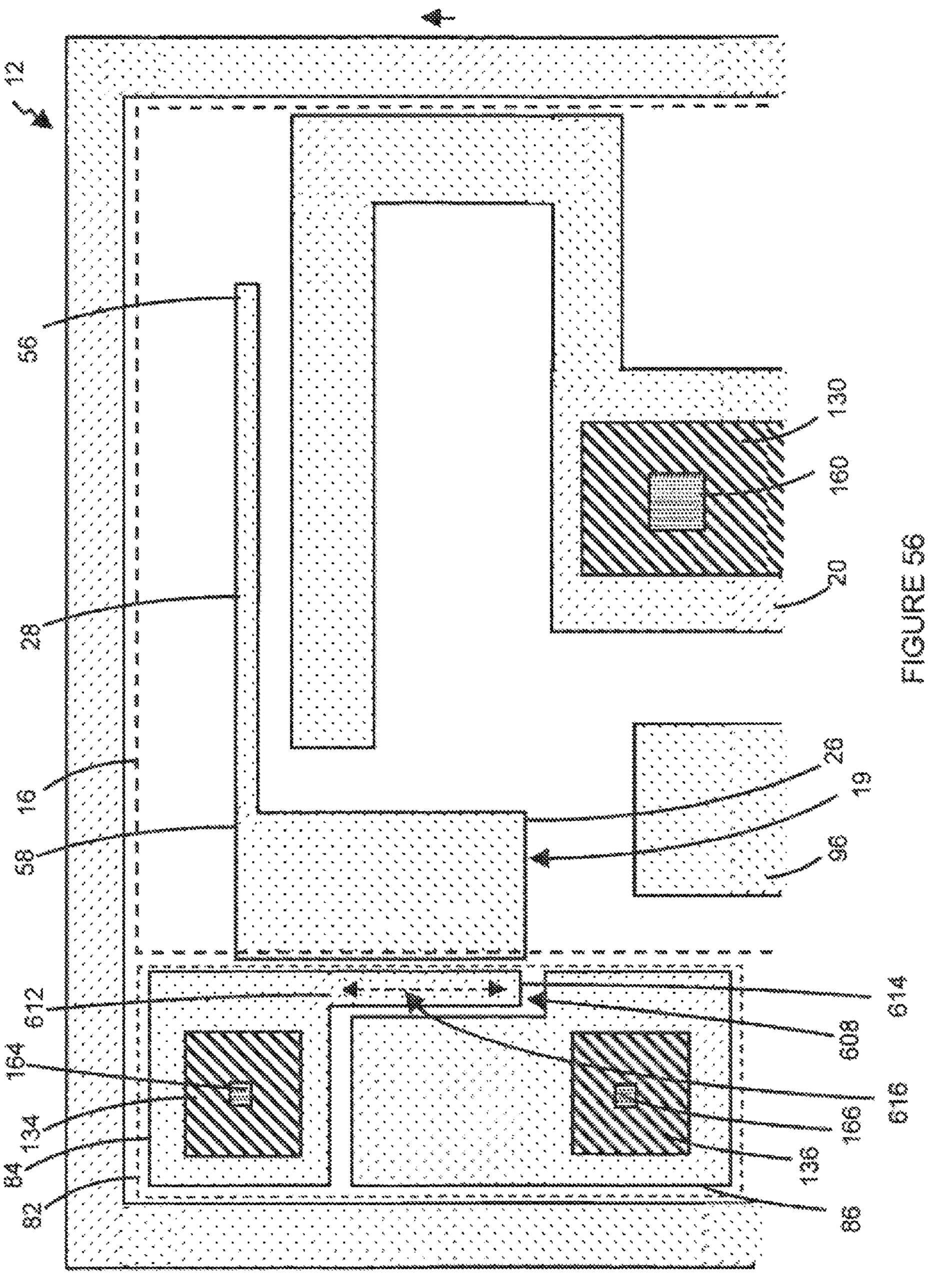
FIG. 56 illustrates a plan view of a portion of another micromachined mechanical structure that may be employed in the MEMS of FIG. 1, in accordance with certain aspects of the present invention.

Thus, for example, with reference to FIGS. 53-56, the transducer 16 illustrated in FIGS. 46A-46B and 47A-47B may be employed in conjunction with the one or more mechanical structures 82 of the micromachined mechanical structure 12 illustrated in FIGS. 14A-14B, 15A-15B (e.g., see FIG. 53), the one or more mechanical structures 82 of the micromachined mechanical structure 12 illustrated in FIGS. 20A-20B, 21A-21C (e.g., see FIG. 54), the one or more mechanical structures 82 of the micromachined mechanical structure 12 illustrated in FIGS. 26A-26B, 27A-27C (e.g., see FIG. 55) and/or the one or more mechanical structures 82 of the micromachined mechanical structure 12 illustrated in FIGS. 32A-32B, 33A-33B (e.g., see FIG. 56).

As stated above, the methods and/or structures disclosed herein are not limited to use in association with a micromachined mechanical structure that converts vibrational energy to electrical energy. Rather, the methods and/or structures disclosed herein may be employed in association with any method and/or structure and/or in any type of applications including, but not limited to, energy harvesting, transducers (e.g., accelerometers, gyroscopes, microphones, pressure sensors, strain sensors, tactile sensors, magnetic sensors and/or temperature sensors), resonators, resonant filters or any combination thereof.

For example, the methods and/or structures disclosed herein may be employed in association with micromachined mechanical structures that utilize a transducer, including, but not limited to, microphones, acceleration sensors, resonators and gyroscopes. The ability to store charge on one or more portions of such structures may improve the level of performance provided by the structure, in whole or in part. For example, the ability to store charge may facilitate the use of a higher operating voltage, and thereby increase the efficiency and/or the signal to noise ratio of the device.

In addition, as stated above, the ability to store charge on one or more portions of a structure may provide the structure and/or a device employing the structure with the ability to operate and/or supply one or more signals without a battery, an internal power supply and/or external power supply. In some embodiments, for example, a device, e.g., a microphone, includes with a transducer 16 that is employed as a sensor and operates and/or supplies one or more signals without a battery, an internal power supply and/or external power supply. Notably, a device may employ a transducer 16 as a sensor with or without an associated transducer 16 employed as an energy harvesting device 325.

FIGS. 57A-57F illustrate various embodiments of a microphone 900 that employ a transducer 16 as a sensor, in conjunction with one or more circuits or devices 910 that may be coupled thereto, in accordance with certain aspects of the present invention. In these embodiments, microphone 900 includes a housing 902, an input port 904 and transducer 16 in accordance with one or more aspects of the present invention. The transducer 16 may be coupled to the input port 904. For example, movable mechanical structure 28 (FIGS. 2A-2C, 3A-3E 14A-14B, 15A-15B, 20A-20B, 21A-21C, 26A-26B, 27A-27C, 32A-32B, 33A-33B, 38A-38C, 4245, 46A-46B, 47A-47B, 53-56)) of first electrode 19 (FIGS. 2A-2C, 3A-3E 14A-14B, 15A-15B, 20A-20B, 21A-21C, 26A-26B, 27A-27C, 32A-32B, 33A-33B, 38A-38C, 4245, 46A-46B, 47A-47B, 53-56)) may be in mechanical, electrical and/or flow communication with the input port 904. In operation, acoustic energy 906 may be supplied to the input port 904. One or more portions of the acoustic energy may cause movement of the movable structure, e.g., movable structure 28 (FIGS. 2A-2C, 3A-3E 14A-14B, 15A-15B, 20A-20B, 21A-21C, 26A-26B, 27A-27C, 32A-32B, 33A-33B, 38A-38C, 4245, 46A-46B, 47A-47B, 53-56)), and transducer 16 may generate one or more signals (e.g., one or more voltages and/or currents) at one or more of electrodes, e.g., electrode 20 (FIGS. 2A-2C, 3A-3E 14A-14B, 15A-15B, 20A-20B, 21A-21C, 26A-26B, 27A-27C, 32A-32B, 33A-33B, 38A-38C, 42-45, 46A-46B, 47A-47B, 53-56), in response thereto.

In some embodiments, one or more portions of transducer 16 has electrical charge stored thereon in accordance with one or more aspects of the present invention. For example, electrical charge may be stored on an electrode (see for example, first electrode 19 (FIGS. 2A-2C, 3A-3E 14A-14B, 15A-15B, 20A-20B, 21A-21C, 26A-26B, 27A-27C, 32A-32B, 33A-33B, 38A-38C, 4245, 46A-46B, 47A-47B, 53-56)). In some such embodiments, transducer 16 may be able to operate and/or supply one or more of the one or more signals without a battery, an internal power supply and/or an external power supply. Microphone 900 may be coupled to a communication system 908 that may couple microphone 900 and/or transducer 16 to one or more circuits and/or devices 910, e.g., a receiver and/or processor. Communication system 908 may include one or more communication links, e.g., communication link 912. With reference to FIG. 57B, in some embodiments, one or more of the one or more signals from transducer 16 may be supplied through communication system 908 to the one or more circuits and/or devices 910.

Figure 57C:
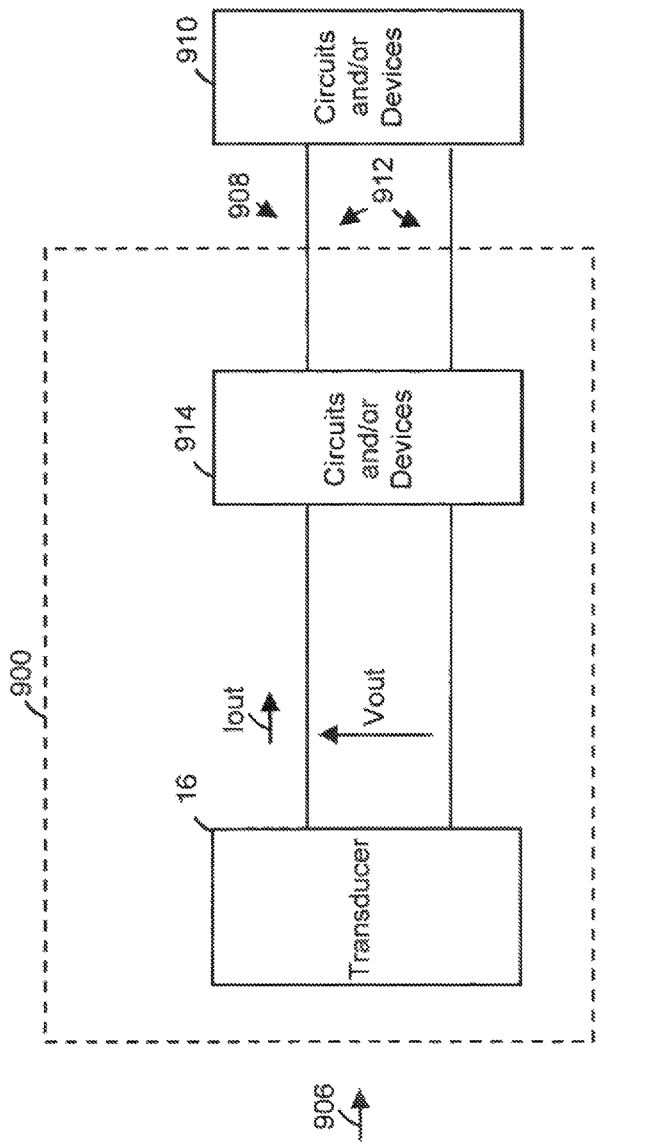

With reference to FIG. 57C, in one embodiment, microphone 900 further includes one or more circuits and/or devices 914 coupled to the transducer 16. The one or more circuits and/or devices may further be coupled to the communication system 908, which may in turn couple the one or more circuits and/or devices 914 to the one or more circuits and/or devices 910. In this embodiment, one or more of the one or more signals from the transducer 16 may be supplied to the one or more circuits and/or devices 914, which may generate one or more signals in response thereto. One or more of the one or more signals generated by the one or more circuits and/or devices 914 may be supplied to the communication system 908, which may supply one or more of the one or more signals to the one or more circuits and/or devices 910. One or more of the signals generated by the one or more circuits and/or devices 914 may be indicative of the acoustical energy supplied to input port of microphone 900 and/or the one or more signals generated by the transducer 16 in response thereto.

Figure 57D:
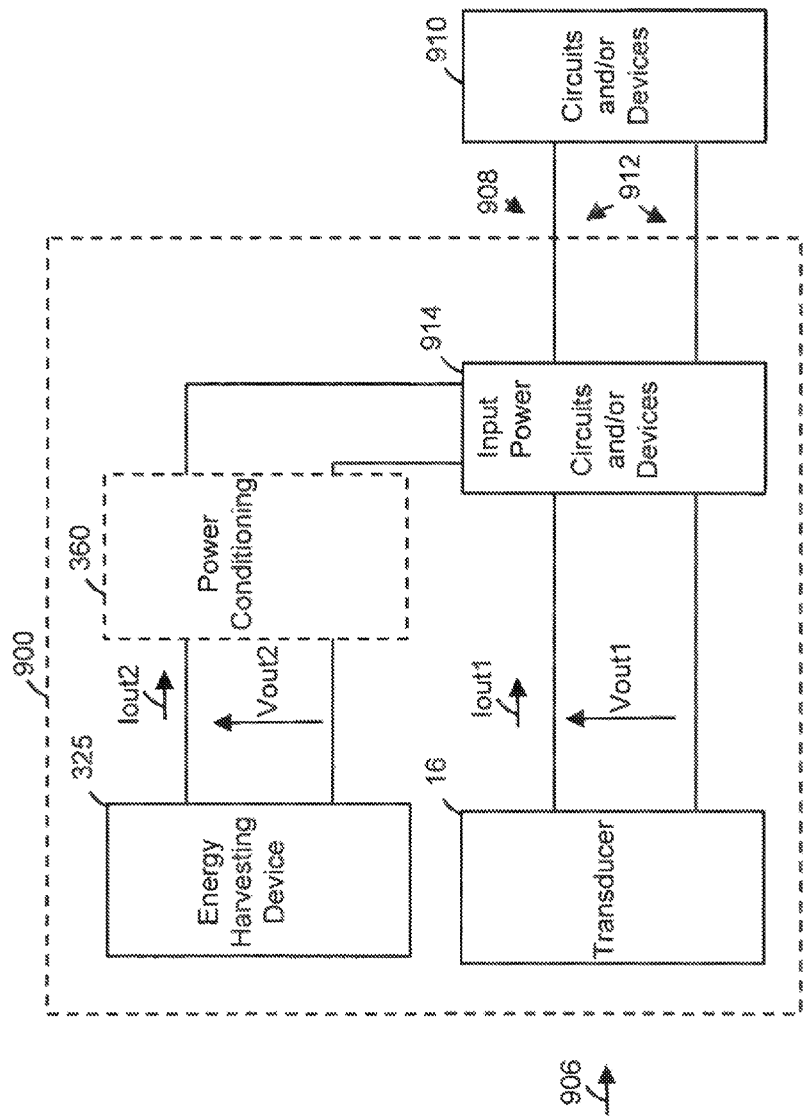
Figure 57E:
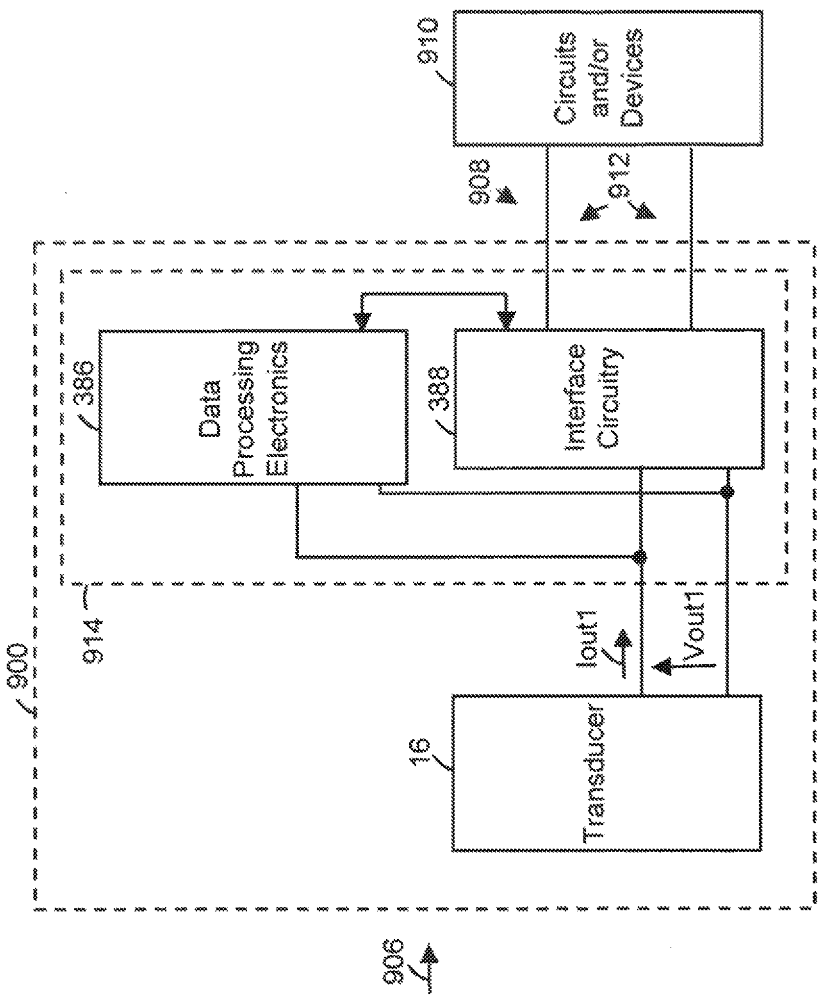

With reference to FIG. 57E, in some embodiments, the one or more circuits and/or devices 914 include data processing electronics 386 and/or interface circuitry 388. One or more of the one or more signals from the transducer 16 may be supplied to the data processing electronics and/or interface circuitry, which may generate one or more signals in response thereto. In some embodiments, for example, one or more signals from the transducer 16 may be supplied to data processing electronics 386, which may generate one or more signals in response thereto. One or more of the signals generated by the data processing electronics 386 may be supplied to interface circuitry 388, which may generate one or more signals in response thereto. Interface circuitry 388 may be a portion of communication system 908, which may supply the signal from the interface circuitry 388 to the one or more circuits and/or devices 910.

Figure 57F:
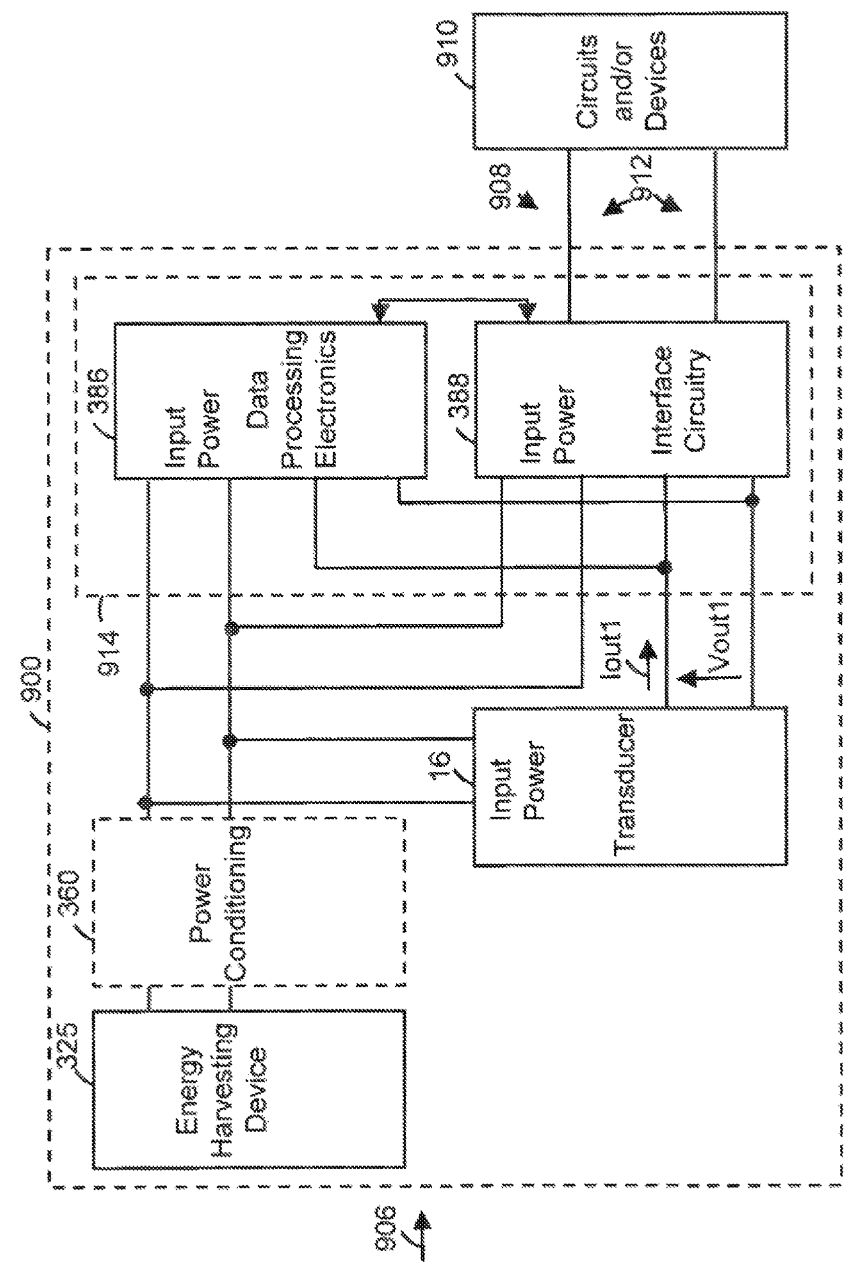

With reference to FIG. 57D and FIG. 57F, in some embodiments, microphone 900 includes an energy harvesting device 325, for example, an energy harvesting device 325 that receives vibrational energy (e.g., a portion of acoustic energy 906 and/or vibrational energy from another source of vibrational energy) and converts at least a portion of such energy to electrical energy. One or more portions of such electrical energy may be supplied, directly and/or indirectly, to the transducer 16 and/or one or more portions of the one or more circuits and/or devices 914 and/or used, directly and/or indirectly, to power one or more portions of the transducer 16 and/or one or more portions of the one or more circuits and/or devices 914, e.g., data processing circuitry 386 and/or interface circuitry 388 disposed in the microphone 900. In some embodiments, for example, microphone 900 may include a power conditioning circuit 360 that receives one or more portions of the electrical energy generated by the energy harvesting device 325 and generates a regulated voltage therefrom. The regulated voltage may be supplied, directly and/or indirectly, to the transducer 16 and/or the one or more circuits and/or devices 914 and may be used, directly and/or indirectly, in powering one or more portions of the transducer 16 and/or one or more portions of the one or more circuits and/or devices 914 or for any other purpose.

In some embodiments, transducer 16 and/or one or more circuits and/or devices 914 are powered entirely by one or more portions of the electrical power generated by the energy harvesting device 325, such that transducer 16, one or more circuits and/or devices 914 and/or a device employing transducer 16 and/or one or more circuits and/or devices 914 are able to operate and/or supply information indefinitely (or at least a period of time), without any need for a battery and/or an external power supply.

In some embodiments, the one or more circuits and/or devices 914, e.g., data processing circuitry 386 and interface circuitry 388, are disposed in or on and/or integrated in or on the same MEMS 10 as transducer 16. In some embodiments, the one or more circuits and/or devices 914, e.g., data processing circuitry 386 and interface circuitry 388 are disposed in or on and/or integrated in or on the same MEMS 10 as energy harvesting device 325. In some embodiments, transducer 16 and the one or more circuits and/or devices 914, e.g., data processing circuitry 386 and interface circuitry 388 are disposed in or on and/or integrated in or on the same MEMS 10 as energy harvesting device 325. Notably, although FIGS. 57A-57F illustrate various embodiments of the transducer 16, energy harvesting device 325 and other circuits and/or devices 914 in association with a microphone 900, it should be understood that any of the aspects and/or embodiments described herein may be employed in and/or in association with any type of circuit, device, system and/or method.

Indeed, as stated above, it should be understood that transducer 16 may be any type of transducer, for example, an energy harvesting device, a sensor (e.g., an accelerometer, a gyroscope, a microphone, a vibration sensor, a pressure sensor, a strain sensor, a tactile sensor, a magnetic sensor and/or a temperature sensor), a resonator, a resonant filter, and/or a combination thereof.

Moreover, the aspects and/or embodiments described herein may be employed in and/or in association with any type of circuit, device, system and/or method, for example, but not limited to any type of accelerometers, gyroscopes, vibration sensors, acoustic sensors, pressure sensors, strain sensors, tactile sensors, magnetic sensors, optical, temperature sensors, and/or optical or video sensors, resonators, resonant filters or any combination thereof, in any type of application, for example, but not limited to microphones, automobile tires (including, for example, but not limited to tire pressure, vibration, and/or temperature sensors), weather sensors (including, for example, but not limited to air pressure, temperature, and/or wind speed sensors), security (including, for example, but not limited to audio and/or video sensors) and industrial process (pressure, vibration, and/or temperature sensors), which may or may not include communication system via a communication link, for example, but not limited to a wireless communication link.

In accordance with further aspects of the present invention, the ability to store charge on one or more portions of a structure may be used to trim and/or change a resonant frequency of one or more resonators, gyroscopes and/or other type of mechanical structure. As stated above, the resonant frequency of a mechanical structure may depend at least in part on the amount of charge stored thereon. Thus, the resonant frequency of a resonator, gyroscope and/or other type of mechanical structure may be changed by storing electrical charge, and/or by changing the amount of stored electrical charge, on a portion of the mechanical structure.

For example, with reference to FIGS. 38A-38C, in some embodiments, movable mechanical structure 28 of transducer 16 is a resonator, for example, a closed-ended or double clamped tuning fork resonator, to generate a reference frequency. In such embodiments, elongated sections 802, 804 may define beams or tines of a resonator and may be anchored to the substrate 14 by the fixed mechanical structure 26, which may define an anchor. Electrodes 20, 22, which may be fixed electrodes, may be employed to induce a force to elongated sections 802, 804, to cause the elongated sections 802, 804 to oscillate (in-plane).

If the resonant frequency of the resonator is not equal to a desired reference frequency, one or more of the one or more mechanical structures 82 may be employed to supply, store and/or trap electrical charge on the first electrode 19 (and/or one or more other portions of micromachined mechanical structure 12) and thereby cause a change in the resonant frequency so that the resonator has a new resonant frequency that is closer to a desired reference frequency.

As stated above, the resonant frequency of a mechanical structure may depend at least in part on the amount of charge stored thereon. Thus, the resonant frequency of a resonator and/or gyroscope may be changed by storing electrical charge, and/or by changing the amount of stored electrical charge, on a portion of the mechanical structure.

Figure 58A:
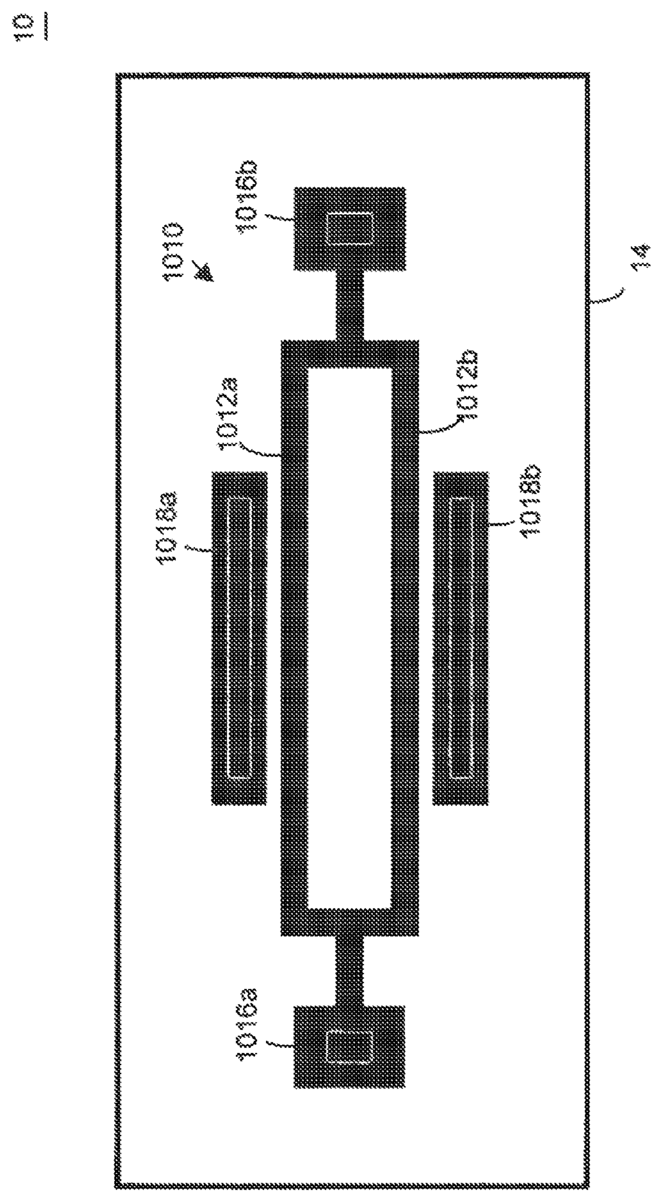
FIG. 58A illustrate plan view of a resonator that may have electrical charge stored on and/or trapped on one or more portions thereof, according to certain aspects of the present invention.

With reference to FIG. 58A, in another embodiment, a resonator 1010, e.g., a closed-ended or double-clamped tuning fork resonator, includes beams or tines 1012*a* and 1012*b*. The beams 1012*a* and 1012*b* are anchored to substrate 14 via anchors 1016*a* and 1016*b*. The fixed electrodes 1018*a* and 1018*b* are employed to induce a force to beams 1012*a* and 1012*b* to cause the beams to oscillate (in-plane). Such resonator architectures are often susceptible to changes in mechanical frequency of resonator 1010 by inducing strain into resonator beams 1012*a* and 1012*b* as a result of packaging stress. As a result, the resonator 1010 may not have the desired resonant frequency. It may thus be desirable to supply, store and/or trap electrical charge on one or portions of resonator 1010, e.g., one or more portions of anchors 1016*a* and 1016*b*, to cause a change in the resonant frequency of resonator 1010 so that the resonator 1010 has a new reference frequency that is closer to a desired resonant frequency.

In that regard, resonator 1010 may be employed in conjunction with the one or more mechanical structures 82 of the micromachined mechanical structure 12 illustrated in FIGS. 2A-2C, 3A-3E, the one or more mechanical structures 82 of the micromachined mechanical structure 12 illustrated in FIGS. 14A-14B, 15A-15B, the one or more mechanical structures 82 of the micromachined mechanical structure 12 illustrated in FIGS. 20A-20B, 21A-21C, the one or more mechanical structures 82 of the micromachined mechanical structure 12 illustrated in FIGS. 26A-26B, 27A-27C and/or the one or more mechanical structures 82 of the micromachined mechanical structure 12 illustrated in FIGS. 32A-32B, 33A-33B, in order to store electrical charge on one or more portions of resonator 1010, e.g., on beams or tines 1012*a*, 1012*b*.

Figure 58B:
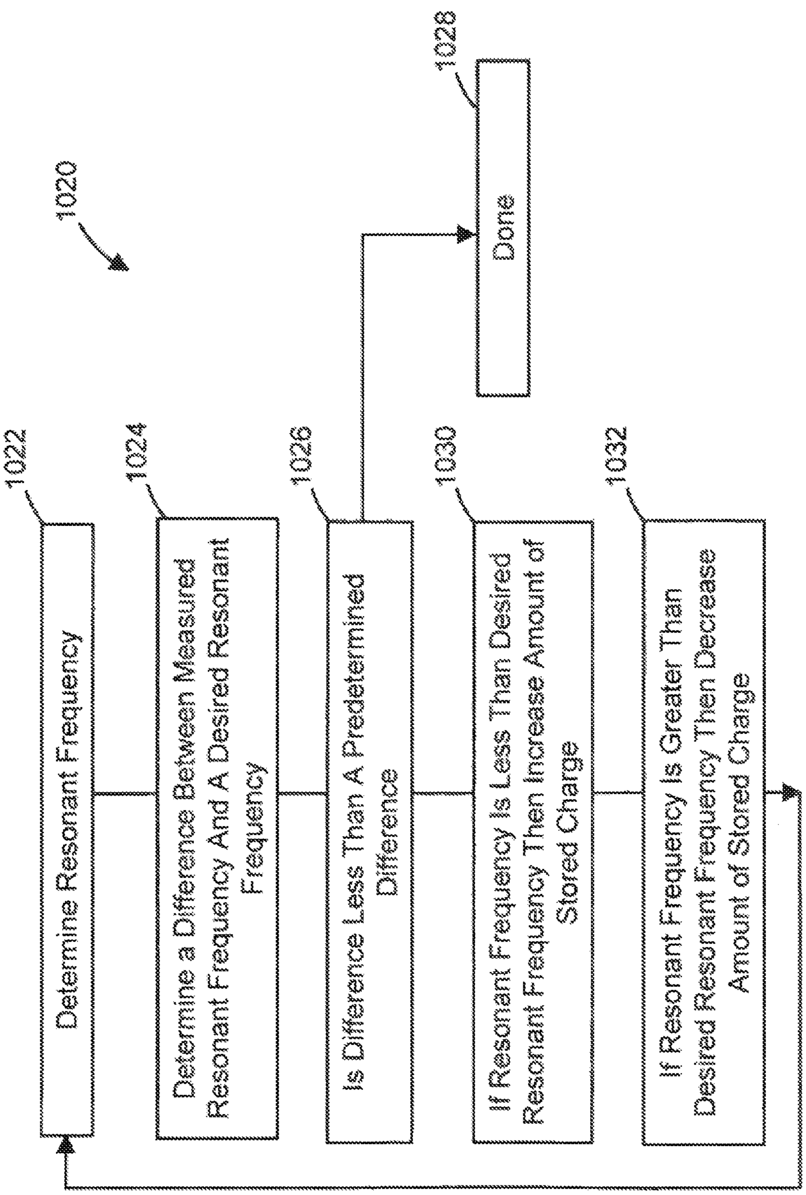
FIG. 58B illustrates a flowchart showing stages that may be employed in supplying, storing and/or trapping electric charge on one or more portions of a resonator, to change the resonant frequency of the resonator, according to certain aspects of the present inventions.

FIG. 58B illustrates a flowchart 1020 of stages in a process that may be employed in supplying, storing and/or trapping electrical charge on the first electrode 19 of the transducer 16 (and/or any other portion(s) of the micromachined mechanical structure 12 on which charge is to be stored) to trim the resonant frequency of the movable structure 28, according to certain aspects of the present invention. With reference to FIG. 58B, in a first stage 1022, the resonant frequency of the resonator is determined. Thereafter, in a stage 1024, a difference between the measured resonant frequency and the desired resonant frequency is determined. At a stage 1026, the difference is compared to a reference. If the magnitude of the difference is less than the reference, then execution passes to stage 1028 and no charge is supplied to and/or removed from the first electrode 19. Otherwise, execution passes to stage 1030. If the resonant frequency is less than the desired resonant frequency, then electrical charge is supplied to the first electrode 19. At a stage 1032, if the resonant frequency is greater than the desired resonant frequency, then an amount of electrical charge is removed from the first electrode 19. The stages in the process are repeated until the difference between the measured resonant frequency and the desired resonant frequency is less than the reference.

It should be understood that movable structures and resonators are not limited to the movable structures and resonators described above.

In accordance with further aspects of the present invention, the ability to supply, store and/or trap electrical charge may be employed in providing an electrostatic repulsive force and/or an electrostatic attractive force on one or more mechanical structures.

Figure 59:
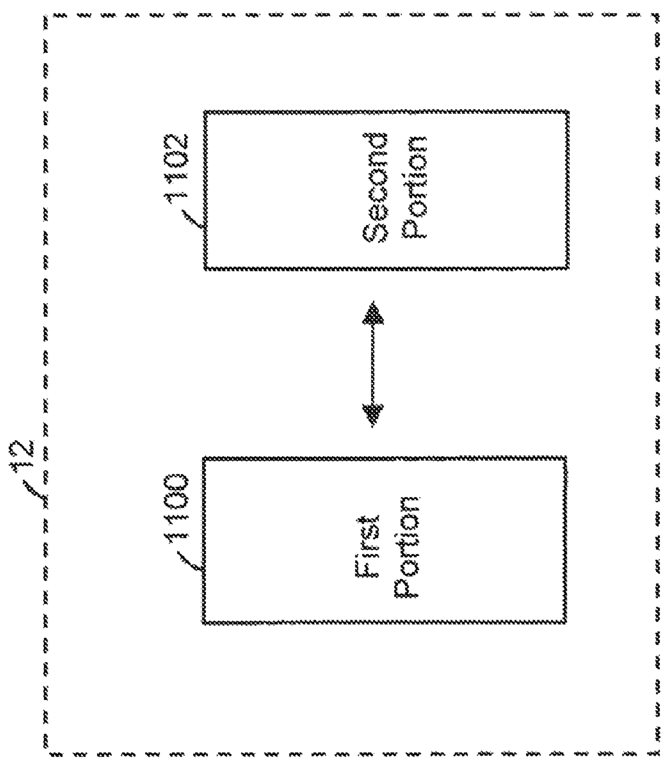
FIG. 59 illustrates a block diagram of one embodiment of electrostatic repulsion, in accordance with certain aspects of the present invention.

FIG. 59 illustrates a block diagram of one embodiment of electrostatic repulsion, in accordance with certain aspects of the present invention. In the illustrated embodiment, electrical charge is supplied to, stored on and/or trapped on two or more portions of a micromachined mechanical structure 12, e.g., first and second portions 1100, 1102, thereby resulting in an electrostatic repulsive force. If one or more of the portions 1100, 1102 is movable, the electrostatic repulsive force may cause the one or more of the portions 1100, 1102 to move.

In one embodiment, electrostatic repulsion and/or electrostatic attraction is employed in association with the transducer 16 illustrated in FIGS. 2A-2D, 3A-3E, 6A-6D, 7A-7C, 8A-8B, 9A-9B, 13A-13B, FIGS. 14A-14B, 15A-15B, 16, 18A-18B, 19A-19B, FIGS. 20A-20B, 21A-21C, 22, 24A-24B, 25A-25B, FIGS. 26A-26B, 27A-27C, 28A-28I, 30A-30B, 31A-31B, and FIGS. 32A-32B, 33A-33B, 34A-34D, 36A-36B and 37A-37B.

Figure 60A:
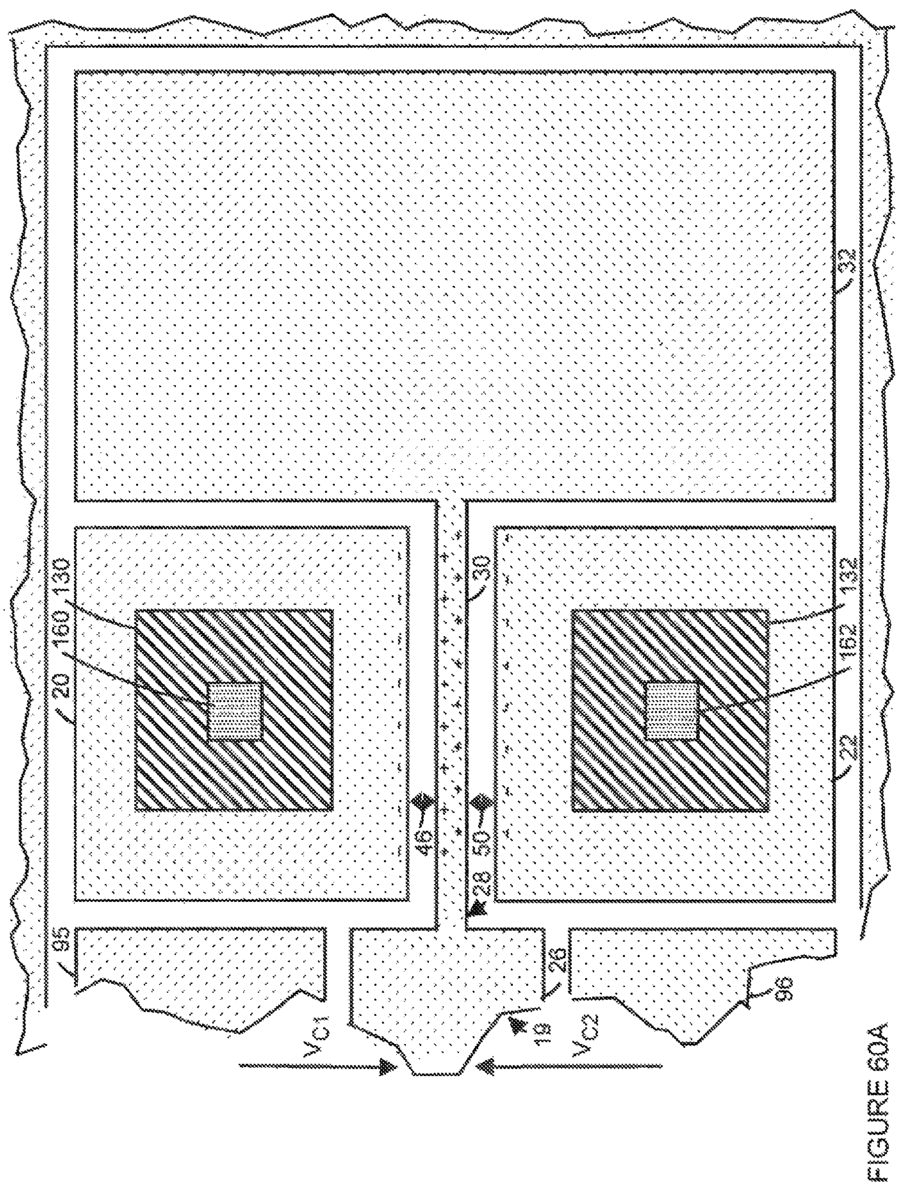
FIGS. 60A-60B illustrate plan views of a portion of micromachined mechanical structure of FIGS. 2A-2D, 3A-3E, 6A-6D, 7A-7C, 8A-8B, 9A-9B, 13A-13B, FIGS. 14A-14B, 15A-15B, 16, 18A-18B, 19A-19B, 20A-20B, 21A-21C, 22, 24A-24B, 25A-25B, FIGS. 26A-26B, 27A-27C, 28A-28I, 30A-30B, 31A-31B, 32A-32B, 33A-33B, 34A-34D, 36A-36B and 37A-37B, showing stages that may be employed in providing electrostatic repulsion and/or electrostatic attraction, according to certain aspects of the present invention.
Figure 60B:
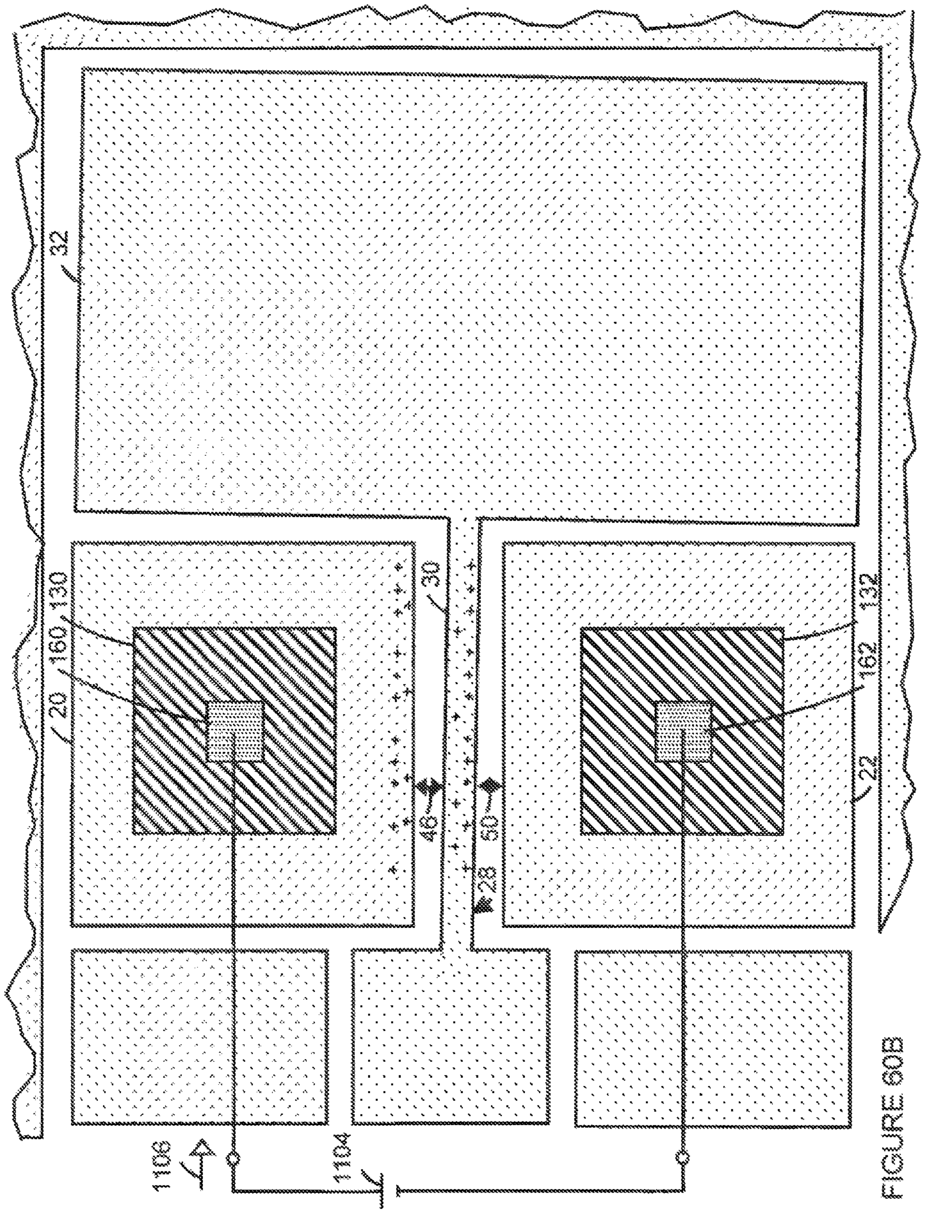

FIGS. 60A-60B illustrate plan views of a portion of the micromachined mechanical structure 12 showing stages that may be employed in association with providing electrostatic repulsion and/or electrostatic attraction in association with the transducer 16 illustrated in FIGS. 2A-2D, 3A-3E, 6A-6D, 7A-7C, 8A-8B, 9A-9B, 13A-13B, FIGS. 14A-14B, 15A-15B, 16, 18A-18B, 19A-19B, FIGS. 20A-20B, 21A-21C, 22, 24A-24B, 25A-25B, FIGS. 26A-26B, 27A-27C, 28A-28I, 30A-30B, 31A-31B, and FIGS. 32A-32B, 33A-33B, 34A-34D, 36A-36B and 37A-37B, in accordance with certain aspects of the present invention.

Referring to FIG. 60A, the charge stored on the first electrode 19 results in a first voltage V1 across the first capacitance (e.g., defined by the second electrode 20 and the first electrode 19) and a second voltage V2 across the second capacitance (e.g., defined by the third electrode 22 and the first electrode 19). With the movable structure 28 stationary and centered between the second electrode 20 and the third electrode 22, the first voltage V1 and the second voltage V2 may be equal to and opposite one another (or approximately equal to and opposite one another).

In the absence of an excitation (e.g., the electrostatic repulsion force and/or electrostatic attraction force to be provided) the movable mechanical structure 28 of the first electrode 19 may be stationary and disposed at a position approximately centered between the second electrode 20 and the third electrode 22. With the movable mechanical structure 28 at such position, the width of the first gap 46 may be approximately equal to the width of the second gap 50.

The first and second voltages V1 and V2 result in laterally directed, electrostatic forces on the movable structure 28.

With the movable structure 28 stationary and centered, as shown, the laterally directed electrostatic force due to the voltage V1 across the first capacitance may be equal to and opposite (or approximately equal to and opposite) the laterally directed, electrostatic force due to the voltage V2 across the second capacitance, so that the net electrostatic force on the movable structure 28 in the lateral direction may be equal to zero.

With reference to FIG. 60B, supplying charge to and/or removing charge from one or more of second and third electrodes 20, 22 (or other mechanical structure(s)) results in an electrostatic repulsive and/or attractive force, respectively, that causes the movable structure 28 of the first electrode 19 to move toward and/or away, respectively, from one or more of the second and third electrodes 20, 22 (and/or other mechanical structure(s)).

In illustrated embodiment, for example, electrical charge is supplied to the second electrode 20. Because charge is stored and/or trapped on the first electrode 19 (and/or other mechanical structures), the electrical charge supplied to the second electrode 20 results in an electrostatic repulsive force that causes the movable structure 28 of the first electrode 19 to move in a direction, e.g., direction away from the second electrode 20 and toward the third electrode 22, such that the size of the first gap 46 increases and the size of the second gap 50 decreases. Notably, if charge was not trapped on the first electrode 19, the charge supplied to the second electrode 20 would result in an attractive force, rather than a repulsive force.

If electrical charge is caused to flow from the third electrode 22, an electrostatic attractive force also results and causes the movable structure 28 of the first electrode 19 to move in a direction away from the second electrode 20 and toward the third electrode 22, such that the size of the first gap 46 increases and the size of the second gap 50 decreases.

The amount of the movement observed in the movable structure of the first electrode 19 may depend at least in part on the magnitude of the electrostatic repulsive and/or attractive force, the spring constant of the spring portion 30 and the mass of the mass portion 32. As stated above, in some embodiments, the mass of the mass portion 32 is in a range of from 0.01 milligram or about 0.01 milligram to one milligram or about one milligram.

Notably, electrostatic repulsion may be employed with or without electrostatic attraction. Similarly, the electrostatic attraction may be employed with or without electrostatic repulsion.

In some embodiments, electrical charge may be supplied to multiple structures and/or removed from multiple structures such that multiple electrostatic repulsive forces and/or multiple electrostatic attractive forces are provided.

Notably, the electrical charge may be supplied to and/or caused to flow from one or more of the second and/or third electrodes 20, 22 (and/or other mechanical structure(s)) before, during and/or after supplying, storing and/or trapping electrical charge on the first electrode 19 (and/or other mechanical structure(s)).

One embodiment for supplying electrical charge to the second electrode 20 (and/or other mechanical structure(s) on which charge is to be supplied to result in the electrostatic repulsive force) is as follows. The second electrode 20 is electrically connected to a first power source, e.g., a first voltage source 1104. The first power source, e.g., first voltage source 1104, supplies an electric current 1106 that flows to the second and third electrodes 84, 86 (and/or other mechanical structure(s)) to supply electrical charge thereto.

The charge supplying process may continue until a desired amount of charge has been supplied, e.g., until the electrode 20 (and/or other mechanical structure(s)) has a desired voltage. In some embodiments, first power source, e.g., first voltage source 1104, supplies a voltage that is equal to the voltage desired for second electrode 20 (and/or other mechanical structure(s)), and the charge supplying process proceeds until the voltage of the electrode 20 (or other mechanical structure (s)) is equal to the voltage supplied by the first power source, e.g., voltage source 1104, and then stops. In some embodiments, the desired voltage is within a range of from about 100 volts to about one thousand volts.

In some embodiments, MEMS 10 has one or more characteristics (e.g. a voltage, a resonant frequency) indicative of the amount of charge that has been supplied to the second electrode 20 (and/or other mechanical structure(s)). In such embodiments, one or more of such characteristics may be measured and compared to one or more reference magnitudes to determine whether the desired amount of charge has been supplied. For example, movable mechanical structure 28 of first electrode 19 may have a resonant frequency indicative of the amount of charge supplied to the second electrodes 20 (and/or other mechanical structure(s)). The resonant frequency of the movable mechanical structure 28 may thus be measured and compared to a reference magnitude indicative of a resonant frequency that would be exhibited by the movable mechanical structure 28 if the second electrode 20 (and/or other mechanical structure(s)), so as to determine whether the desired amount of charge has been supplied thereto. The charge supplying process may be stopped if it is determined that the desired amount of charge has been supplied (e.g., reached or exceeded).

The charge supplying process may be continuous or discontinuous (periodic or non-periodic), fixed in rate or time varying in rate, and/or combinations thereof. In that regard, the electric current 1106 may be continuous or discontinuous (e.g., periodic or non-periodic), fixed in magnitude or time varying in magnitude, direct current or alternating current, and/or any combination of the above.

If it is desired to reduce and/or stop the electrostatic repulsive force, it may be desirable to turn off the first power source 1104 and/or to disconnect the first power source, e.g., first voltage source 1104, from the micromachined mechanical structure 12 and/or the second electrode 20 (or other mechanical structure(s) on which charge was supplied to result in the electrostatic repulsive force).

In some embodiments, electrical charge is caused to flow from the third electrode 22 (and/or other mechanical structure (s)) using one or more of the structures and/or methods described above for supplying electrical charge to the second electrode 20 (and/or other mechanical structure(s).

As stated above, each of the aspects and/or embodiments set forth herein may be employed alone and/or in combination with one or more other aspects and/or embodiments set forth herein.

In that regard, in some embodiments, it may be desirable to store and/or trap the electrical charge supplied to second 20 (and/or any other mechanical structure(s)). To that effect, in some embodiments, one or more of the structures and/or techniques disclosed herein to store charge on the first electrode 19 (and/or other mechanical structure(s)) may be employed to supply, store and/or trap electrical charge on the second electrodes 20 (and/or any other mechanical structure (s)), such as, for example, the one or more mechanical structures 82 of the micromachined mechanical structure 12 illustrated in FIGS. 2A-2D, 3A-3E, the one or more mechanical structures 82 of the micromachined mechanical structure 12 illustrated in FIGS. 14A-14B, 15A-15B, the one or more mechanical structures 82 of the micromachined mechanical structure 12 illustrated in FIGS. 20A-20B, 21A-21C, the one or more mechanical structures 82 of the micromachined mechanical structure 12 illustrated in FIGS. 26A-26B, 27A-27C and/or the one or more mechanical structures 82 of the micromachined mechanical structure 12 illustrated in FIGS. 32A-32B, 33A-33B.

Figure 61:
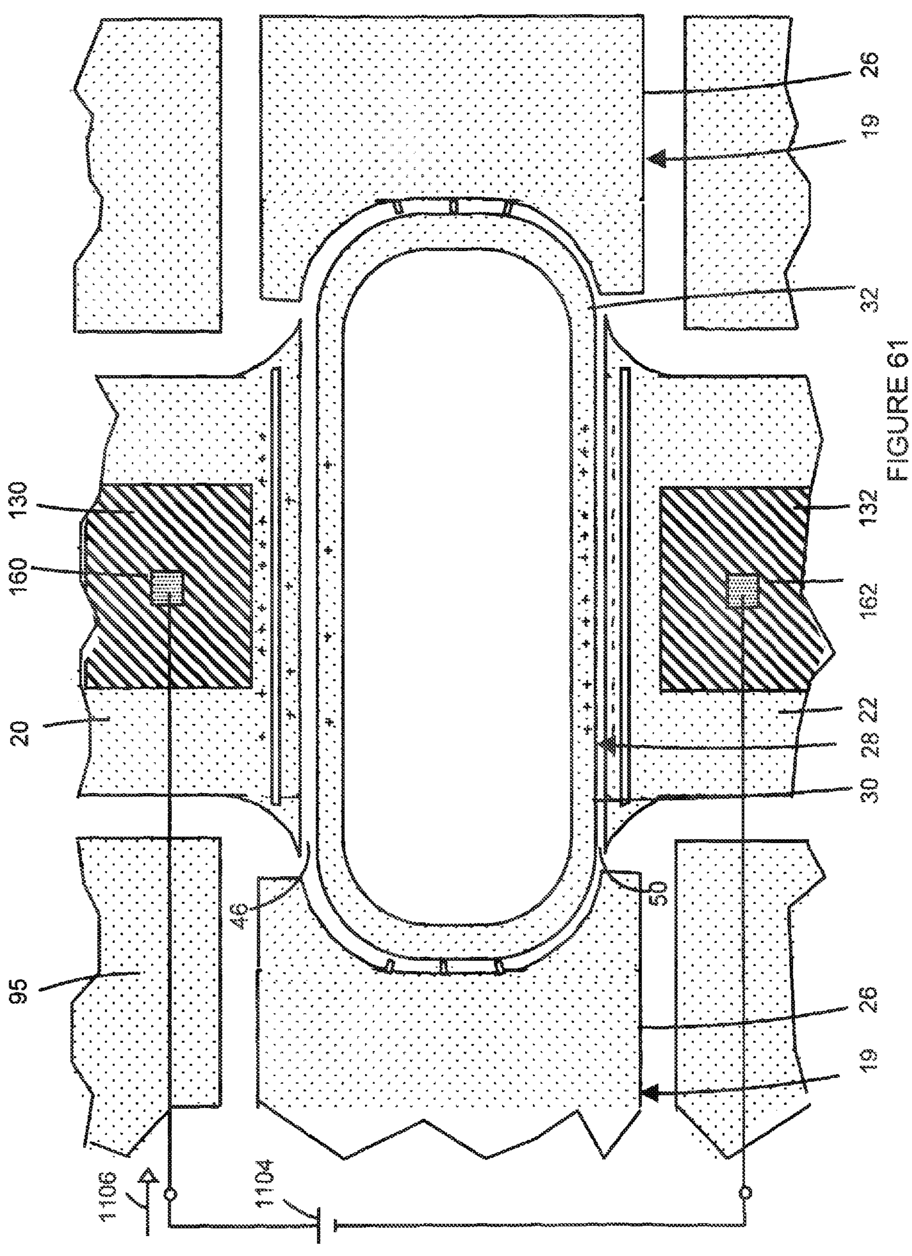
FIG. 61 illustrates a plan view of a portion of micromachined mechanical structure of FIGS. 38A-38C, 39A-39C, 40A-40J, 41 and 42-45, showing stages that may be employed in providing electrostatic repulsion and/or electrostatic attraction, according to certain aspects of the present invention.
Figure 62:
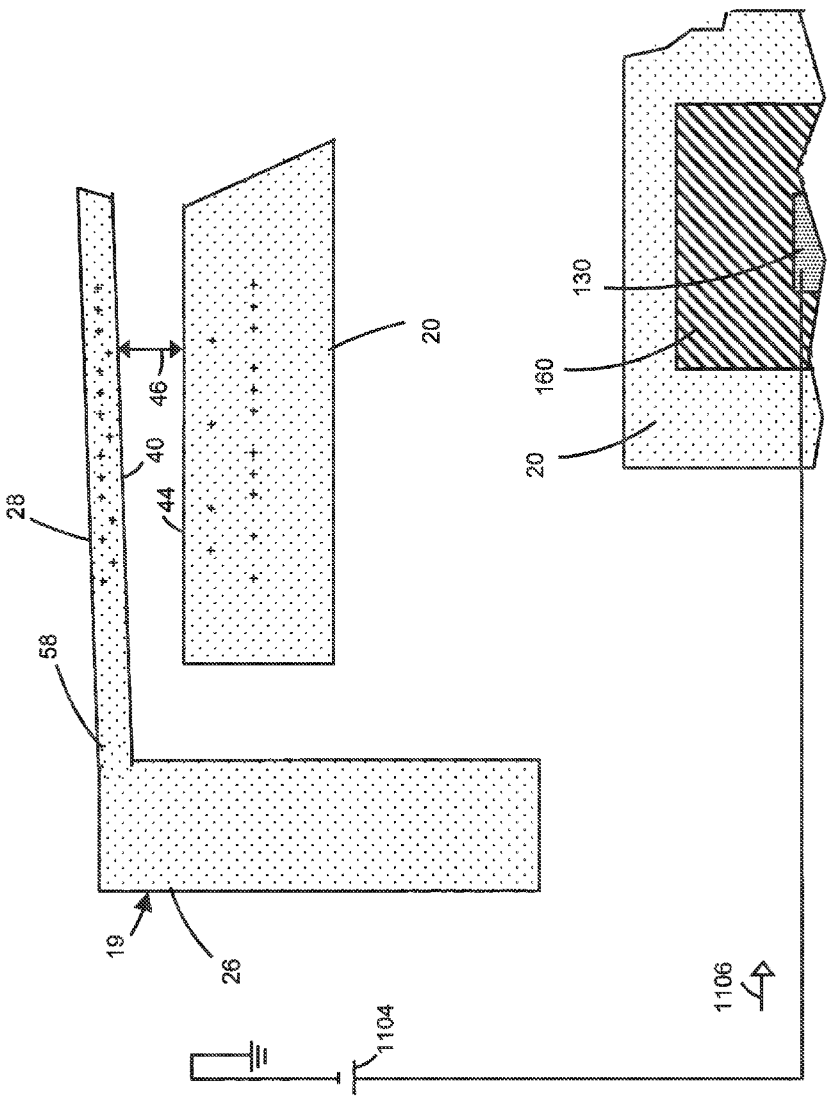
FIG. 62 illustrates a plan view of a portion of micromachined mechanical structure of FIGS. 46A-46B, 47A-47B, 48A-48B, 49A-49J, 50A-50J, 51, 52A-52B and 53-56, showing stages that may be employed in providing electrostatic repulsion and/or electrostatic attraction, according to certain aspects of the present invention.

It should also be understood that the electrostatic repulsion and/or electrostatic attraction illustrated in FIG. 59 and/or FIG. 60 may also be employed in association with the transducer 16 illustrated in FIGS. 38A-38C, 39A-39C, 40A-40J, 41, 42-45 (see for example, FIG. 61) and/or the transducer 16 illustrated in FIGS. 46A-46B, 47A-47B, 48A-48B, 49A-49J, 50A-50J, 51, 52A-52B and 53-56 (see for example, FIG. 62).

In some embodiments, the resonant frequency of a resonator, gyroscope and/or other type of mechanical structure depends at least in part on forces applied thereto. In such embodiments, the resonant frequency of the resonator, gyroscope and/or other type of mechanical structure, may be changed by providing and/or changing an electrostatic force thereon.

In accordance with further aspects of the present invention, an electrostatic repulsive force and/or an electrostatic attractive force may be employed to change the resonant frequency of a mechanical structure.

For example, with reference to FIGS. 38A-38C, in some embodiments, movable mechanical structure 28 of transducer 16 is employed as a resonator, for example, a closed-ended or double clamped tuning fork resonator, to generate a reference frequency. In such embodiments, elongated sections 802, 804 may define beams or tines of a resonator and may be anchored to the substrate 14 by the fixed mechanical structure 26, which may define an anchor. Electrodes 20, 22, which may be fixed electrodes, may be employed to induce a force to elongated sections 802, 804, to cause the elongated sections 802, 804 to oscillate (in-plane).

If the resonant frequency of the resonator is not equal to a desired reference frequency, one or more electrostatic repulsive forces and/or one or more electrostatic attractive forces may be provided to cause a change in the resonant frequency such that the resonator has a new resonant frequency that may be closer to the desired reference frequency.

In some embodiments, an electrostatic attractive force has the effect of reducing the resonant frequency of the resonator, which is similar to the effect that would be provided by providing the resonator with a softer spring. Thus, in the event that the resonant frequency of a resonator is greater than a desired resonant frequency, the availability of an electrostatic attractive force provides the capability to reduce the resonant frequency, sometimes referred to as tuning the resonant frequency down, so that the resonant frequency may be closer to the desired resonant frequency.

In some embodiments, an electrostatic repulsive force has the effect of increasing the resonant frequency of the resonator, which is similar to the effect that would be provided by providing the resonator with a firmer spring. Thus, in the event that the resonant frequency of a resonator is less than a desired resonant frequency, the availability of an electrostatic attractive force provides the capability to increase the resonant frequency, sometimes referred to as tuning the resonant frequency up, so that the resonant frequency may be closer to the desired resonant frequency.

In some embodiments, without the availability of an electrostatic repulsive force, there is no capability to tune the resonant frequency up. Thus, the availability of an electrostatic repulsive force may help provide a wider trimming range and may thereby help relax manufacturing constraints and/or allow resonator designers more design freedom.

In some embodiments, electrostatic attractive and electrostatic repulsive forces are employed as follows. An electrostatic attractive force is employed to reduce the resonant frequency in the event that the resonant frequency is greater than the desired resonant frequency. An electrostatic repulsive force is employed to increase the resonant frequency in the event that the resonant frequency is less than the desired resonant frequency.

Figure 63:
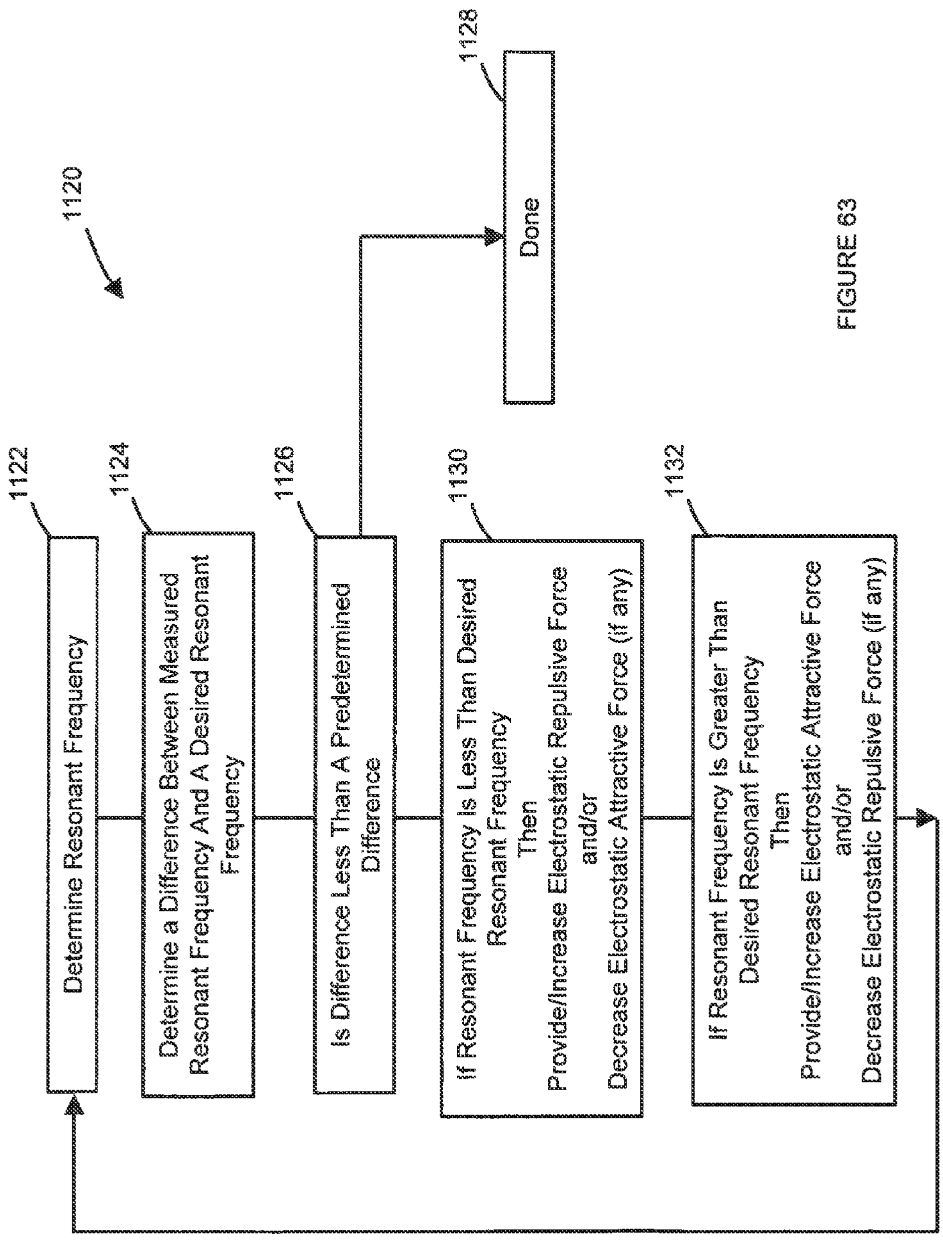
FIG. 63 illustrates a flowchart of stages in a process for employing an electrostatic repulsive force and/or an electrostatic attractive force to increase and/or decrease the resonant frequency of a movable structure, according to certain aspects of the present invention.

FIG. 63 illustrates a flowchart 1120 of stages in a process for employing an electrostatic repulsive force and/or an electrostatic attractive force to increase and/or decrease the resonant frequency of a movable structure, according to certain aspects of the present invention.

With reference to FIG. 63, in a first stage 1122, the resonant frequency of the resonator is determined. Thereafter, in a stage 1124, a difference between the measured resonant frequency and the desired resonant frequency is determined. At a stage 1126, the difference is compared to a reference. If the magnitude of the difference is less than the reference, then execution passes to stage 1128 and no charge is supplied to and/or removed from the first electrode 19. Otherwise, execution passes to stage 1130. If the resonant frequency is less than the desired resonant frequency, then an electrostatic repulsive force may be provided and/or increased, which has the effect of increasing the resonant frequency of the resonator.

If the first electrode 19 (and/or other mechanical structure to which the electrostatic force is to be applied thereto) has a positive voltage, the electrostatic repulsive force may be provided and/or increased by supplying charge to the second electrode 20 (and/or other structure associated with providing the electrostatic repulsive force). If the first electrode 19 (and/or other mechanical structure to which the electrostatic force is to be applied thereto) has a negative voltage, the electrostatic repulsive force may be provided and/or increased by removing charge from the second electrode 20 (and/or other structure associated with providing the electrostatic repulsive force).

In some embodiments, if an electrostatic attractive force is present, the electrostatic attractive force may be decreased, in addition to and/or in lieu of providing and/or increasing the electrostatic repulsive force, which may have the effect of increasing the resonant frequency of the resonator. If the first electrode 19 (and/or other mechanical structure to which the electrostatic force is to be applied thereto) has a positive voltage, the electrostatic attractive force may be decreased by supplying charge to the third electrode 22 (and/or other structure associated with providing the electrostatic attractive force). If the first electrode 19 (and/or other mechanical structure to which the electrostatic force is to be applied thereto) has a negative voltage, the electrostatic attractive force may be decreased by removing and/or causing charge to flow from the third electrode 22 (and/or other structure associated with providing the electrostatic attractive force).

At a stage 1132, if the resonant frequency is greater than the desired resonant frequency, then an electrostatic attractive force may be provided and/or increased, which has the effect of decreasing the resonant frequency of the resonator. If the first electrode 19 (and/or other mechanical structure to which the electrostatic force is to be applied thereto) has a positive voltage, the electrostatic attractive force may be provided and/or increased by removing and/or causing charge to flow from the third electrode 22 (and/or other structure associated with providing the electrostatic attractive force). If the first electrode 19 (and/or other mechanical structure to which the electrostatic force is to be applied thereto) has a negative voltage, the electrostatic attractive force may be provided and/or increased by supplying charge to the second electrode 22 (and/or other structure associated with providing the electrostatic attractive force).

In some embodiments, if an electrostatic repulsive force is present, the electrostatic repulsive force may be decreased, which has the effect of decreasing the resonant frequency of the resonator, in addition to and/or in lieu of providing and/or increasing the electrostatic attractive force. If the first electrode 19 (and/or other mechanical structure to which the electrostatic force is to be applied thereto) has a positive voltage, the electrostatic repulsive force may be decreased by removing and/or causing charge to flow from the second electrode 20 (and/or other structure associated with providing the electrostatic repulsive force). If the first electrode 19 (and/or other mechanical structure to which the electrostatic force is to be applied thereto) has a negative voltage, the electrostatic repulsive force may be decreased by supplying charge to the second electrode 20 (and/or other structure associated with providing the electrostatic repulsive force).

In some embodiments, the stages in the process may be repeated until the difference between the measured resonant frequency and the desired resonant frequency is less than the reference.

Notably, in some embodiments, electrostatic repulsion is employed with or without electrostatic attraction. Similarly, in some embodiments, electrostatic attraction is employed with or without electrostatic repulsion.

As stated above, movable structures and resonators are not limited to the movable structures and resonators described above.

Moreover, as stated above, the aspects and/or embodiments described herein may be employed in and/or in association with any type of circuit, device, system and/or method, for example, but not limited to any type of accelerometers, gyroscopes, vibration sensors, acoustic sensors, pressure sensors, strain sensors, tactile sensors, magnetic sensors, optical, temperature sensors, and/or optical or video sensors, resonators, resonant filters or any combination thereof, in any type of application, for example, but not limited to microphones, automobile tires (including, for example, but not limited to tire pressure, vibration, and/or temperature sensors), weather sensors (including, for example, but not limited to air pressure, temperature, and/or wind speed sensors), security (including, for example, but not limited to audio and/or video sensors) and industrial process (pressure, vibration, and/or temperature sensors), which may or may not include communication system via a communication link, for example, but not limited to a wireless communication link.

Again, there are many inventions described and illustrated herein.

Each of the aspects and/or embodiments set forth herein may be employed alone, in combination with one or more other aspects and/or embodiments set forth herein and/or in combination with one or more other structures and/or methods now known or later developed. Thus, for example, each of the aspects and/or embodiments disclosed herein, may be employed alone or in combination with one or more of the other aspects and/or embodiments disclosed herein, or portions thereof. In addition, each of the aspects and/or embodiments disclosed herein may also be used in combination with other methods and/or apparatus, now known or later developed. For example, the methods and/or structures disclosed herein may be employed separately and/or in association with any methods and/or structures, whether know known or later developed, and/or in any applications including, but not limited to, energy harvesting, transducers (e.g., accelerometers, gyroscopes, microphones, pressure sensors, strain sensors, tactile sensors, magnetic sensors and/or temperature sensors), resonators, resonant filters or any combination thereof.

Moreover, while embodiments and/or processes have been described above according to a particular order, that order should not be interpreted as limiting.

As stated above, the methods and/or structures disclosed herein are not limited to use in association with a micromachined mechanical structure that includes a capacitive transducer to convert vibrational energy to electrical energy.

Moreover, some aspects and/or embodiments may employ one or more of the structures and/or methods disclosed herein to supply, store and/or trap electrical charge without one or more of the other structures and/or methods disclosed herein.

An "energy harvesting device" may be any type of energy harvesting device. In this regard, energy harvesting devices are not limited to vibrational energy to electrical energy converters. Other sources of environmental energy include but are not limited to temperature and stress (e.g., pressure).

As stated above, a mechanical structure may have any configuration. Moreover, a mechanical structure may be, for example, a whole mechanical structure, a portion of a mechanical structure and/or a mechanical structure that together with one or more other mechanical structures forms a whole mechanical structure, element and/or assembly.

As used herein, the term "portion" includes, but is not limited to, a part of an integral structure and/or a separate part or parts that together with one or more other parts forms a whole element or assembly. For example, some mechanical structures may be of single piece construction or may be formed of two or more separate pieces. If the mechanical structure is of a single piece construction, the single piece may have one or more portions (i.e., any number of portions). Moreover, if a single piece has more than one portion, there may or may not be any type of demarcation between the portions. If the mechanical structure is of separate piece construction, each piece may be referred to as a portion. In addition, each of such separate pieces may itself have one or more portions. A group of separate pieces that collectively represent part of a mechanical structure may also be referred to collectively as a portion. If the mechanical structure is of separate piece construction, each piece may or may not physically contact one or more of the other pieces.

An electrode may also have any configuration (e.g., size, shape and orientation). For example, electrodes may each be rectangular (or generally rectangular) and similar to one another, but are not limited to such. Further, an electrode may include one or more fixed (e.g., stationary) mechanical structures, one or more movable mechanical structures and/or any combination thereof.

Further, unless otherwise stated, terms such as, for example, "in response to" and "based on" mean "in response at least to" and "based at least on", respectively, so as not to preclude being responsive to and/or based on, more than one thing. Moreover, the term "coupled to" includes connected directly to and connected indirectly to (i.e., through one or more elements). In addition, as used herein, terms such as, for example, "supply to" and "power" mean "supply directly or indirectly to" and "power directly or indirectly", respectively, so as not to preclude supplying and/or powering through something else. Further, unless specified otherwise, the term "depositing" and other forms (i.e., deposit, deposition and deposited) in the claims, means, among other things, depositing, creating, forming and/or growing a layer of material using, for example, a reactor (for example, an epitaxial, a sputtering or a CVD-based reactor (for example, APCVD, LPCVD, or PECVD). Further, in the claims, the term "contact" means a conductive region, partially or wholly disposed outside the chamber, for example, a contact area and/or contact via.

Note that, unless stated otherwise, terms such as, for example, "comprises", "has", "includes", and all forms thereof, are considered open-ended, so as not to preclude additional elements and/or features. In addition, unless stated otherwise, terms such as, for example, "a", "one", "first", are considered open-ended, and do not mean "only a", "only one" and "only a first", respectively.

It should be further noted that while the present inventions have been described in the context of microelectromechanical systems including micromechanical structures or elements, the present inventions are not limited in this regard. Rather, the inventions described herein are applicable to other electromechanical systems including, for example, nanoelectromechanical systems. Thus, the present inventions are pertinent to electromechanical systems, for example, gyroscopes, resonators, temperatures sensors and/or accelerometers, made in accordance with fabrication techniques, such as lithographic and other precision fabrication techniques, which reduce mechanical components to a scale that is generally comparable to, and/or smaller than, microelectronics.

In that regard, unless specified otherwise, the term "micromechanical structure", as used hereinafter and in the claims, includes, micromechanical structures, nanomechanical structures and combinations thereof. Indeed, any MEMS structure that is encapsulated is within the scope of the present invention.

Finally, as mentioned above, all of the embodiments of the present invention described and illustrated herein may be implemented in the embodiments of Microelectromechanical Systems and Method of Encapsulating Patent Application Publication and/or Microelectromechanical Systems Having Trench Isolated Contacts Patent and/or Anchors for Microelectromechanical Systems Patent. For the sake of brevity, those permutations and combinations will not be repeated but are incorporated by reference herein.

In addition, while various embodiments have been described, such description should not be interpreted in a limiting sense. Other embodiments, which may be different from and/or similar to, the embodiments described herein, will be apparent from the description, illustrations and/or claims set forth below. Further, although various features, attributes and advantages have been described and/or are apparent in light thereof, it should be understood that such features, attributes and advantages are not required except where stated otherwise.

What is claimed is:

1. A method for use in association with an electromechanical device having a substrate and an encapsulation structure, the encapsulation structure being disposed over at least a portion of the substrate and defining at least a portion of a chamber, the electromechanical device further having a micromechanical structure that includes a mechanical structure disposed in the chamber, the method comprising:

supplying electrical charge to the mechanical structure of the micromechanical structure through an electrical connection disposed in the chamber; and electrically isolating the mechanical structure such that at least a portion of the electrical charge is stored on the mechanical structure in electrical isolation from the electrical connection, wherein electrically isolating the mechanical structure includes breaking the electrical connection.

2. The method of claim 1 wherein the micromechanical structure comprises a micromachined mechanical structure.

3. The method of claim 1 wherein the mechanical structure comprises a semiconductor material.

4. The method of claim 3 wherein the semiconductor material is comprised of polycrystalline silicon, amorphous silicon, silicon carbide, silicon/germanium, germanium, or gallium arsenide.

5. The method of claim 1 wherein electrically isolating the mechanical structure includes electrically isolating the mechanical structure such that at least a portion of the electrical charge is stored on the mechanical structure for a period of at least one day.

6. The method of claim 1 wherein supplying electrical charge to the mechanical structure through an electrical connection disposed in the chamber includes supplying electrical charge to the mechanical structure through an electrical connection between the mechanical structure and another mechanical structure disposed in the chamber.

7. The method of claim 1 wherein electrically isolating the mechanical structure includes irreversibly breaking the electrical connection.

8. The method of claim 1 wherein supplying electrical charge to the mechanical structure through an electrical connection disposed in the chamber includes supplying electrical charge to the mechanical structure through a fuse disposed in the chamber.

9. The method of claim 8 wherein breaking the electrical connection includes blowing at least one portion of the fuse.

10. The method of claim 9 wherein blowing at least one portion of the fuse includes melting at least one portion of the fuse.

11. The method of claim 9 wherein blowing at least one portion of the fuse includes supplying at least one portion of the fuse with electrical current to heat the at least one portion of the fuse.

12. The method of claim 9 wherein blowing at least one portion of the fuse includes supplying at least one portion of the fuse with electrical current to cause the at least one portion of the fuse to dissipate energy and reach or exceed a temperature at which the at least one portion of the fuse blows.

13. The method of claim 9 wherein the micromechanical structure further includes a first electrode and a second electrode each disposed in the chamber, the fuse includes a first portion and a second portion, the first portion having a first end coupled to the first electrode and a second end coupled to the second electrode, the second portion having a first end coupled to the first portion of the fuse and a second end coupled to the mechanical structure, and wherein blowing at least one portion of the fuse includes blowing at least one portion of the first portion of the fuse and blowing at least one portion of the second portion of the fuse.

14. The method of claim 1 wherein supplying electrical charge to the mechanical structure through an electrical connection disposed in the chamber includes supplying electrical charge to the mechanical structure through an electrical connection that includes at least one portion of at least one movable structure disposed in the chamber.

15. The method of claim 14 wherein supplying electrical charge to the mechanical structure through an electrical connection disposed in the chamber includes moving at least one portion of the at least one movable structure disposed in the chamber to provide electrical contact between a first contact surface and a second contact surface.

16. The method of claim 15 wherein moving at least one portion of the at least one movable structure disposed in the chamber to provide electrical contact between a first contact surface and a second contact surface includes controlling the at least one portion of the at least one movable structure to provide electrical contact between the first contact surface and the second contact surface.

17. The method of claim 16 wherein controlling the at least one portion of the at least one movable structure to provide electrical contact between the first contact surface and the second contact surface includes providing at least one electrical signal that causes at least one electrostatic force that causes the at least one portion of the at least one movable structure to move and provide electrical contact between the first contact surface and the second contact surface.

18. The method of claim 16 wherein controlling the at least one portion of the at least one movable structure to provide electrical contact between the first contact surface and the second contact surface includes controlling the at least one portion of the at least one movable structure to provide electrical contact between a contact surface of the at least one portion of the at least one movable structure and a contact surface of the mechanical structure.

19. The method of claim 16 wherein controlling the at least one portion of the at least one movable structure to provide electrical contact between the first contact surface and the second contact surface includes driving the at least one portion of the at least one movable structure into mechanical resonance.

20. The method of claim 19 wherein driving the at least one portion of the at least one movable structure into mechanical resonance includes providing at least one electrical signal that causes at least one electrostatic force that causes the at least one portion of the at least one movable structure to resonate at one or more frequencies.

21. The method of claim 19 wherein driving the at least one portion of the at least one movable structure into mechanical resonance includes driving the at least one portion of the at least one movable structure into mechanical resonance, the first contact surface making electrical contact with the second contact surface during a portion of the mechanical resonance.

22. The method of claim 21 wherein driving the at least one portion of the at least one movable structure into mechanical resonance includes driving the at least one portion of the at least one movable structure into mechanical resonance, the first contact surface not making electrical contact with the second contact surface during a portion of the mechanical resonance.

23. The method of claim 1, wherein the electrically isolated mechanical structure provides electrical charge for operation of the electromechanical device.

24. A method for use in association with an electromechanical device having a substrate and an encapsulation structure, the encapsulation structure being disposed over at least a portion of the substrate and defining at least a portion of a chamber, the electromechanical device further including a micromechanical structure that includes a mechanical structure disposed in the chamber, the method comprising:

supplying electrical charge to the mechanical structure of the micromechanical structure through an electrical connection disposed in the chamber; and electrically isolating the mechanical structure such that at least a portion of the electrical charge will be stored on the mechanical structure for a period, the period being at least one month;

wherein electrically isolating the mechanical structure includes breaking the electrical connection.

25. The method of claim 24 wherein the period is at least one year.

26. The method of claim 24 wherein the period is at least ten years.

* * * * *